(12) United States Patent
Nazarathy et al.

(10) Patent No.: US 10,931,486 B2
(45) Date of Patent: Feb. 23, 2021

(54) TRANSMITTER, RECEIVER AND A METHOD FOR DIGITAL MULTIPLE SUB-BAND PROCESSING

(71) Applicant: Technion Research and Development Foundation Ltd., Haifa (IL)

(72) Inventors: Moshe Nazarathy, Haifa (IL); Alex Tolmachev, Karmiel (IL)

(73) Assignee: TECHNION RESEARCH AND DEVELOPMENT FOUNDATION LTD., Haifa (IL)

( * ) Notice: Subject to any disclaimer, the term of this patent is extended or adjusted under 35 U.S.C. 154(b) by 0 days.

(21) Appl. No.: 16/553,203

(22) Filed: Aug. 28, 2019

(65) Prior Publication Data
US 2020/0092146 A1 Mar. 19, 2020

Related U.S. Application Data

(63) Continuation of application No. 15/358,164, filed on Nov. 22, 2016, now Pat. No. 10,700,897, which is a
(Continued)

(51) Int. Cl.
| | |
|---|---|
| H04L 25/03 | (2006.01) |
| H03H 11/52 | (2006.01) |
| H04B 17/364 | (2015.01) |
| H03H 21/00 | (2006.01) |
| H03H 17/02 | (2006.01) |

(Continued)

(52) U.S. Cl.
CPC ....... *H04L 25/03891* (2013.01); *H03H 11/52* (2013.01); *H03H 17/0266* (2013.01); *H03H 21/0012* (2013.01); *H04B 7/005* (2013.01); *H04B 7/0413* (2013.01); *H04B 7/0452* (2013.01); *H04B 17/364* (2015.01); *H04L 25/02* (2013.01); *H04L 27/264* (2013.01); *H04L 27/2631* (2013.01); *H04L 27/2649* (2013.01); *H04L 27/2652* (2013.01); *H04L 27/2663* (2013.01); *H04L 27/2665* (2013.01); *H04L 27/2644* (2013.01)

(58) Field of Classification Search
CPC .. H04B 7/0413; H04B 7/0617; H04B 7/0417; H04B 7/0695; H04B 7/0452; H04B 7/088; H04B 17/12; H04B 1/40; H04B 17/309
USPC .......................................... 375/344; 370/286
See application file for complete search history.

(56) References Cited

U.S. PATENT DOCUMENTS

| | | |
|---|---|---|
| 5,727,023 A | 3/1998 | Dent |
| 6,240,192 B1 | 5/2001 | Brennan |
| | (Continued) | |

FOREIGN PATENT DOCUMENTS

| | | |
|---|---|---|
| CN | 1234149 | 11/1999 |

OTHER PUBLICATIONS

Fred Harris and Chris Dick, "Polyphase channelizer performs sample rate change required for both matched filtering and channel frequency spacing", Proceedings of the Forty-Third Asilomar Confrencee on Signals, Systems and Computers, p. 1283-1287 (2009).

(Continued)

*Primary Examiner* — David C Payne
*Assistant Examiner* — Sarah Hassan
(74) *Attorney, Agent, or Firm* — Reches Patent

(57) ABSTRACT

Highly efficient digital domain sub-band based receivers and transmitters.

9 Claims, 78 Drawing Sheets

Related U.S. Application Data continuation of application No. 14/123,229, filed as application No. PCT/IB2012/052931 on Jun. 10, 2012, now Pat. No. 9,503,284.

(60) Provisional application No. 61/495,533, filed on Jun. 10, 2011.

(51) Int. Cl.
| | |
|---|---|
| H04L 27/26 | (2006.01) |
| H04L 25/02 | (2006.01) |
| H04B 7/005 | (2006.01) |
| H04B 7/0452 | (2017.01) |
| H04B 7/0413 | (2017.01) |

(56) References Cited

U.S. PATENT DOCUMENTS

| | | |
|---|---|---|
| 6,456,657 B1 | 9/2002 | Yeap et al. |
| 2002/0031277 A1 | 3/2002 | Lubin et al. |
| 2002/0055796 A1 | 5/2002 | Katayama |
| 2003/0185310 A1 | 10/2003 | Ketchum |
| 2003/0202612 A1 | 10/2003 | Halder |
| 2004/0095951 A1 | 5/2004 | Park |
| 2004/0174937 A1 | 9/2004 | Ungerboeck |
| 2004/0208267 A1* | 10/2004 | Lee ............... H04L 27/266 375/354 |
| 2004/0252755 A1 | 12/2004 | Jaffe |
| 2005/0117069 A1* | 6/2005 | McNeely ........... H04N 21/4263 348/725 |
| 2006/0098754 A1 | 5/2006 | Kim |
| 2007/0097856 A1 | 5/2007 | Wang |
| 2008/0043867 A1 | 2/2008 | Blanz |
| 2008/0080634 A1 | 4/2008 | Kotecha |
| 2008/0316912 A1 | 12/2008 | Al Adnani |
| 2008/0317109 A1 | 12/2008 | Healey |
| 2009/0006518 A1 | 1/2009 | Flensburg |
| 2009/0063140 A1 | 3/2009 | Villemoes |
| 2012/0155571 A1 | 6/2012 | Yang |

OTHER PUBLICATIONS

B. Porat, A course in Digital Signal Processing, Wiley, 1997.
Fred Harris, "Multirate Signal Processing for Communication Systems", Prentice Hall, 2004.
DFT-Spread OFDM for Fiber Nonlinearity Mitigation Yan Tang, William Shieh, and Brian S. Krongold, IEEE Photonics Technology Letters, vol. 22, pp. 1250-1252, 2010.
X. Liu and S. Chandrasekhar, SPPCOM' I 1 (2011 ).
J. Tubbax et al, Proc. GLOBECOM'03,(2003).
Yan Tang, William Shieh, and Brian S. Krongold, "OFT-Spread OFDM for Fiber Nonlinearity Mitigation," IEEE Photonics Technology Letters, vol. 22, pp. 1250-1252, 2010.
2001 IEEE International Conference on Acoustics, Speech, and Signal Processing.Proceedings. (ICASSP). Salt Lake City, UT, May 7-11, 2001; [IEEE International Conference on Acoustics, Speech, and Signal Processing (ICASSP)], May 7, 2001; May 7, 2001-May 11, 2001 New York, NY : IEEE, US.
IEEE Transactions on Circuits and Systems II: Analog and Digitalsignal Processing, Nov. 1, 1995, Institute of Electrical and Electronics Engineers Inc, 345 East 47 Street, New York, N.Y. 10017, USA; The Institution of Electrical Engineers, Stevenage, GB.
Telecommunications in Modern Satellite, Cable and Broadcasting Service , 2003. TELSIKS 2003. 6th International Conference on Oct. 1-3, 2003, Oct. 1, 2003; Oct. 1, 2003-Oct. 3, 2003 Piscataway, NJ, USA,IEEE.

* cited by examiner

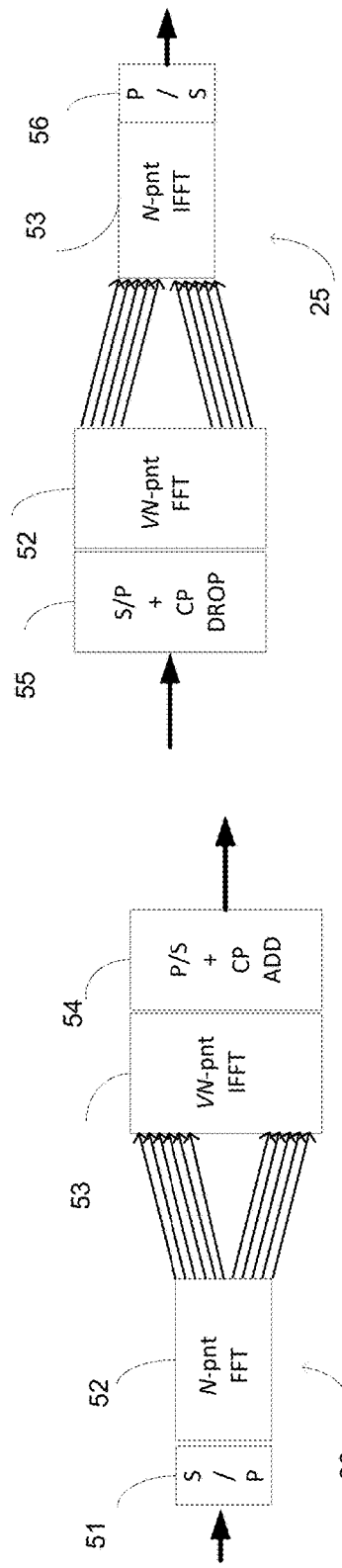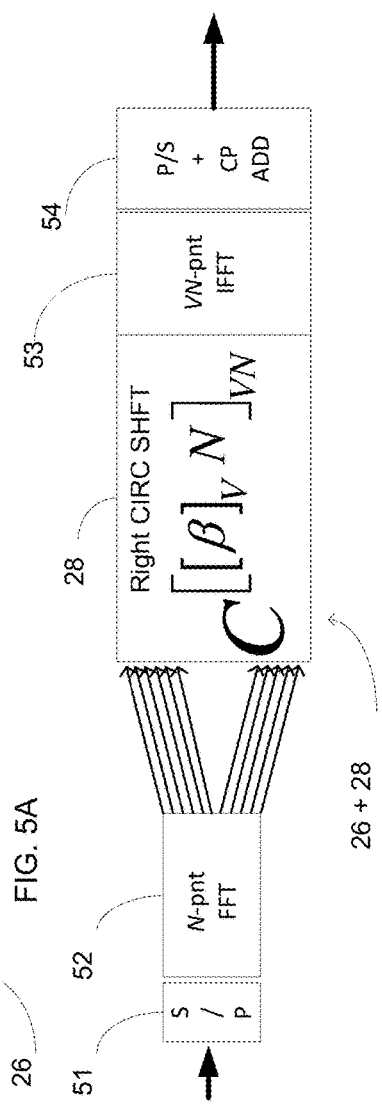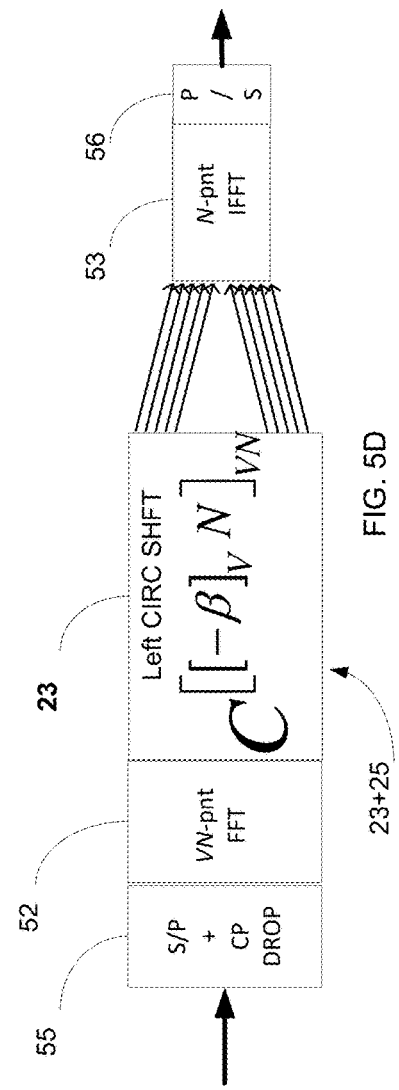
FIG. 5A
FIG. 5B
FIG. 5C
FIG. 5D
FIG. 5A-5D SC-MSBE Rx:
Sub-band processor
embodiment I

TRANSMITTER, RECEIVER AND A METHOD FOR DIGITAL MULTIPLE SUB-BAND PROCESSING

RELATED APPLICATIONS

This application is a continuation of U.S. patent application Ser. No. 15/358,164 filing date Nov. 22, 2018 which is a continuation of U.S. patent application Ser. No. 14/123,229 filing date Mar. 3, 2014 titled RECEIVER, TRANSMITTER AND A METHOD FOR DIGITAL MULTIPLE SUB-BAND PROCESSING which claims priority from provisional patent filing date Jun. 10, 2011, Ser. No. 61/495,533 all applications being incorporated herein in their entirety.

BACKGROUND OF THE INVENTION

Modern optical or wireless receivers and transmitters may apply optical or analog domain sub-band processing in order to enhance throughput.

There is a growing need to provide efficient optical or wireless receivers and transmitters of high throughput and low complexity.

SUMMARY OF THE INVENTION

There may be provided a transmitter and a method.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

FIGS. 5A, 5C, 6B, 7A, 7C, 7E, 8A, 8C, 9A, 9C, 9D, 10A, 26, 27A, 27B, 28, 29A, 29B, 30, 31, 35, 36 and 41 illustrate examples of transmitter modules;

FIGS. 5B, 5D, 6A, 7B, 7D, 8B, 9B, 9E, 9F, 10B, 10C, 11, 13, 15, 17, 18A, 18B, 18C, 19A, 19B, 19C, 20, 21, 22, 23A, 23B, 24A, 24B, 25A, 25B, 32, 33, 34, 37A, 37B, 38, 39, 40A, 40B and 42 illustrate examples of receiver modules;

Figure 1A:
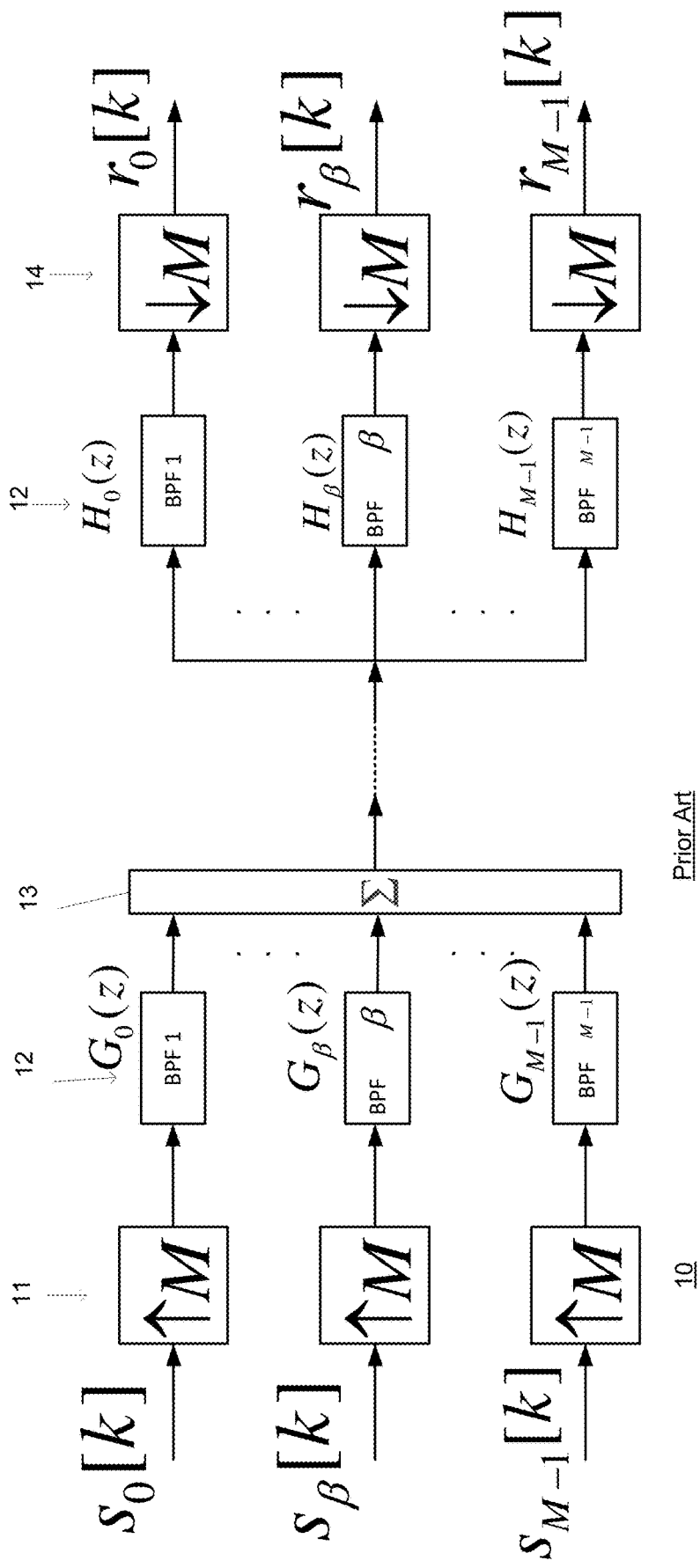
FIG. 1A illustrates prior art receivers and transmitters.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The following abbreviations and reference numbers are used in the following text and drawings:
- ADC=Analog to Digital Converter
- DAC Digital to Analog Converter
- CD Chromatic Dispersion
- FDE Frequency-Domain-Equalizer
- EQZ Equalizer
- OS OverSampled
- FD Frequency Domain
- SB Sub-Band
- rOS r-fold oversampled
- OS Over sampled
- LPF Low Pass Filter
- IR Impulse Response
- CR Carrier Recovery
- LMS Least Mean Squared
- PDM POL Division Muxing
- POL Polarization
- MSB Multi Sub-band
- DFT-S DFT Spread
- Tx Transmitter
- Rx Receiver
- SC Single Carrier
- NS-SC Nyquist Shaped Single Carrier
- MSBE Multi Sub-Band Equalized/Equalization)
- SSC Sub Single-Carrier
- IQ In-phase and Quadrature components
- IQI IQ Imbalance
- CFO Carrier Frequency Offset
- CTO Coarse Timing Offset
- E&C Estimation and Compensation
- FB Filter Bank
- PDM Polarization Division Multiplexed/Multiplexing)
- LO Local Oscillator
- FTO Fine Timing Offset
- SFO Sampling Freq. Offset
- CR Carrier Recovery
- MSDD Multi.Symbol.Delay.Det
- COMP Compensator DEMOD Demodulator
PN Phase Noise
PROC Processor
COH Coherent
FE Front-end
BE Back-end
CP Cyclic Prefix
SC-FDM Single-Carrier Frequency Division Multiplexing
ISI Inter Symbol Interference
ICI Inter Channel Interference
pnt Points (e.g. in size of (I)FFTs)

10  Prior art device
11  Upconverter
12  Band pass filter (BPS)
13  Adder
14  Downconverter
20  Interpolator
21  BPF, first filter
22  Downconverter
23  Circular shift module
24  BPF, second filter
25  Decimator
26  Interpolator
27  BPF, first filter
28  Circular shift module
29  Upconverter
30  Transmitter
31  BPF, second filter
32  Adder
33-45 Frequency spectrum
51  Serial to parallel converter (S/P)
52  Fast Fourier transform (FFT) module
53  Inverse fast Fourier transform (IFFT) module
54  Parallel to serial converter and cyclic prefix added (P/S + CP ADD)
55  Serial to parallel converter and cyclic prefix drop (S/P + CP DROP)
56  Parallel to serial converter (P/S)
57  Circular shift and sub-band extractor (CIRC + SB EXTRACT)
58  Zero padder and circular shift (ZP&CIRC SHIFT)
60  Filter bank, analysis filter bank (FB)
61  Sub-band processor (in transmitter)
62  Filter bank, synthesis filter bank (FB)
63  Sub-band processor (in receiver)
64  Sub-band OFDM transmitter
65  Sub-band OFDM receiver
70  Routing fabric
71  Optical receiver front end
72  Analog to digital converter (ADC) also includes I-ADC and Q-ADC
73  Routing and combining fabric
74  Single input multiple output (SIMO) filter, such as single input dual output (SIDO) filter or single input quadruple output (SIQO) filter
75  Delay unit
76  Outputs
77  Delay unit
78  Splitter
79  Splitting and routing fabric
80  Multiple input single output (MISO) filter, such as dual input single output (DISO) filter or quadruple input single output (QISO) filter
81  Polyphase Finite Impulse Response (FIR) filter array
82  QAM demapper and data multiplexor (QAM demapp + data mux)
83  Mis sub-band processor
84  OFDM sub-band processor
85  In phase-quadrate phase imbalance (IQI) compensator
86  Mixer
87  Joint IQI, CFO, CTO, SFO estimator
88  Half band extractor
89  Multiple input multiple output (MIMO) equalizer
90  Polyphase adaptive tracking module
91  MSSD decoder
92  Data demultiplexer and QAM mapper
93  Mid sub-band sparse insert
94  Guard tomes
95  Add into high or low half band
98  Coherent transmitter back end (COH Tx BE)
99  Digital to analog converter (DAC)
101  Joint IQI, CFO, CTO estimator
103  D&C based CTO + CFO joint EST
105  IQI estimator (IQI EST).
106  Multiplier
107  CFO compensator (CFO COMP)
108  CTO compensator (CTO COMP)
109  Divider
110  t-pointsMinn Algorithm blocks (t-pnt MA)
111  Autocorrelation based metrics
112  Square of absolute value module
113  Angle finder
114  Argmax operation module (argmax k)
115  IQI + CTO EST
116  Switch
117  Filter, loop filter
118  Local oscillator laser (LO laser)
119  Fiber There is provided a method and system for breaking the digital processing into multiple parallel virtual sub-channels, occupying disjoint spectral sub-bands. The optical community is well-used to this concept in the optical or analog sub-carrier domains, but it turns out that it can also be done efficiently in the digital domain. E.g., in our embodiment, in the optical Receiver (Rx) ASIC DSP, each exemplary 25 GHz WDM channel would be digitally partitioned into M=16 bands of ~1.6 GHz each. Remarkably, this digital demultiplexing into sub-bands may be performed efficiently, with low computational complexity, with neither spectral guard-bands in-between the 1.6 GHz sub-channels nor with spectral guard-bands between the 25 GHz WDM channels.

We emphasize that the sub-banding scheme is not analog, but it is rather purely digital, performed after A/D conversion for each individual channel in the WDM multiplex, amounting to a second tier of fine frequency division demultiplexing. Digital sub-banding provides benefits similar to those obtained in optically generating relatively narrowband bands (3-6 GHz) within a super-channel structure, an approach recently increasingly adopted in super-hero OFDM super-channel experiments [X. Liu and S. Chandrasekhar, SPPCOM'11 (2011).] However our digital sub-channel mux requires much simpler, lower cost and energy-efficient hardware. As our sub-banding realization is digital rather than analog, we do away with the cumbersome finely spaced multi-tone generator, and we eliminate a large number of DACs, ADCs, modulators, optical filters, analog optical receivers, which would be customarily used in transmission of a finely spaced (3-6 GHz) analog-generated super-channel. Nevertheless, we enjoy the full benefits of having narrowband frequency-flat sub-bands, which are now digitally (de-)muxed. Furthermore, despite efficiently crowding the multiple 1.6 GHz sub-bands with zero spectral guard-bands, we are nevertheless able to maintain a nearly perfect degree of orthogonality between the individual sub-bands (i.e., eliminate inter-sub-band crosstalk), which would have been impossible in a fine-muxed analog/optical generated super-channel.

The means to perform the digital sub-banding in the Tx and especially in the Rx is the usage of digital signal processing (DSP) structures in the real-time hardware processors, called Filter Banks. In particular, this invention addresses the so-called Uniform Filter Banks, where 'uniform' here indicates that the sub-bands of the filter-bank are all of the same spectral shape, and are uniformly distributed along the frequency axis, i.e., are regularly spaced. In the sequel we drop the 'uniform' qualifier, referring to uniform FB whenever we say FB. Moreover, this invention refers to oversampled (OS) filter banks. The OS qualifier describes FB configurations whereby the sampling rate of each of the sub-bands is higher than the Nyquist rate (difference between the highest and lowest frequency), whereas the Critically Sampled (CS) qualifier (sometimes referred to as maximally decimated/interpolated) describes the case when the sub-bands sampling rate precisely equals the Nyquist rate per sub-band (that is a fraction 1/M of the overall channel bandwidth, where M is the number of sub-bands).

Mathematical notations: Introducing the relevant mathematical conventions used in this application we shall use the zero-padding notation $(x[p])^{ZP[p]:L \to M}$ for a finite sequence with support of L points extended by zero-padding to a support of M points. Notice that the discrete variable p over which the zero-padding is performed is explicitly denoted in the ZP[p] superscript, to distinguish from additional indexes, if present.

The IDFT and DFT are defined by $$X[\beta] = {}^\beta IDFT_p^{M\text{-}pnt}\{x[p]\} = \sum_{p=0}^{M} x[p]\overline{W}^{p\beta}$$

$$x[p] = {}^\beta DFT_\beta^{M\text{-}pnt}\{X[\beta]\} = \frac{1}{M}\sum_{p=0}^{M} X[\beta]\overline{W}^{-\beta p},$$

where the right-subscript and left-superscript explicitly denote the input and output variables of the transformation, and we introduced the notation $\overline{W}_M \equiv \exp\{j2\pi/M\}$.

We denote the modulo-D operation by $[x]_D \equiv x \bmod D \Leftrightarrow x = \lfloor x/D \rfloor D + [x]_D$, for which we alternatively adopt either the regular unipolar convention specifying the division remainder to be non-negative, $0 \le [x]_D \le D$ or we alternatively adopt bi-polar a convention, $-D/2 < [x]_D \le D/2$. Notice that these definitions also work not only for integer D but also for real-valued D.

We define the linear shift (delay) operator $D_v^d\{X(v)\} \equiv X(v-d)$ as well as the circular shift modulo R operator $C_v^{[s]R}\{X(v)\} \equiv X([v-s]_R)$, defined for a range $v_0 \le v < v_0 + R$ for some agreed upon $v_0$, e.g. $v_0 = 0$ or $v_0 = R/2$. We notice that for a periodic function of period R, the linear shift of a periodic function of period P, restricted to a single period of the function starting at $v_0$ amounts to a circular shift. The shift operators were introduced here in the frequency domain but the same definitions apply to the continuous time or discrete-time domains with the frequency variable v replaced by the (discrete) time variable t (k).

Polyphase components of a discrete-time sequence are denoted as follows. The p-th polyphase component modulo P (P integer) of a sequence x[k] is defined as, $x^{[p]_P}[k] \equiv x[kP+p]$. Evidently, due to the modulo P operation in the subscript, there are precisely P polyphase components, which may be conventionally indexed in a unipolar notation $p=0, 1, \ldots, P-1$ or alternatively be indexed in bi-polar notation.

A sparse polyphase modulo Q definition is defined as an Q-fold upsampled (zero-filled) and q-delayed version of the conventional p-th polyphase:

$$x^{[q]\uparrow Q}[k] \equiv D^q\{\uparrow Q\{x^{[q]_Q}[k]\}\},$$

$p=0, 1, 2, \ldots, L-1$
where the upsampling is defined as
$\uparrow Q\{y[k]\} = \{y[0], 0, 0, \ldots, 0, y[1], 0, 0, \ldots, 0, y[3], 0, 0, \ldots 0, y[4], 0 \ldots\}$
and D is the unit delay operator ($z^{-1}$). Sparse polyphases are notationally distinguished from the regular polyphases by the presence of an up-arrow in the superscript $[q]_{\uparrow Q}$, reminding that not only are the polyphases taken modulo Q, but also Q-1 zeroes are inserted in between their samples and the resulting sequence is also delayed by q time units. The sparse polyphases satisfy the following decomposition for any sequence:

$$x[k] = \sum_{q=0}^{Q-1} x^{[q]\uparrow Q}[k] \qquad (1)$$

E.g. the sequence $x[k]=\{x[0], x[1], x[2], x[3], x[4], x[5], x[6], x[7] \ldots\}$ is the sum of the following sparse polyphases modulo Q=3:
$x^{[0]\uparrow 3}[k]=\{x[0], 0, 0, x[3], 0, 0, x[6], 0 \ldots\}$
$x^{[1]\uparrow 3}[k]=\{0, x[1], 0, 0, x[4], 0, 0, x[7] \ldots\}$
$x^{[2]\uparrow 3}[k]=\{0, 0, x[2], 0, 0, x[5], 0, x[7] \ldots\}$ We also introduce double polyphase components modulo P,Q as follows:
$x^{[p]_P[q]_Q}[k] \equiv (x^{[p]_P}[k])^{[q]_Q}[k] = x[P(Qk+q)+p] = x[PQk+Pq+p]$ Finally we may combine regular and sparse polyphases:

$$x^{[p]_P[q]\uparrow Q}[k] \equiv (x^{[p]_P}[k])^{[q]\uparrow Q}[k] = D^q\{\uparrow Q\{x^{[p]_P[q]_Q}[k]\}\}$$
$$= D^q\{\uparrow Q\{x[PQk+Pq+p]\}\}$$

Filter bank description: Introducing now the relevant terminology for filter banks, a synthesis (analysis) FB is essentially a collection of MBPFs sharing a sharing common output (summation node) or common input (splitter) with the said filters (referred to as bank filters) preceded (followed) by L-fold up (down) samplers. When M=L the FB is referred to as critically sampled (CS) whereas when M>L the FB is referred to as oversampled (OS).

In this text we shall label the BPFs by the index β or i, and we shall alternatively use both unipolar index notation $0 \le \beta \le M-1$ as well as bipolar index notation $-M/2+1 \le \beta \le M/2$, as most convenient in each circumstance. The prototype filter refers to the particular filter out the BPF collection of filters which is positioned at mid-band, in the center of the overall channel which contains the M sub-bands. In the complex-envelope domain (referred to the center frequency of the channel) this filter is actually not BPF but is rather LPF. The other M-1 bank filters in the digital domain are obtained by uniform circular shifts of the prototype filter, corresponding to modulations by harmonic tones in the time domain.

In the bi-polar index notation the LPF prototype filter at mid-band is assigned index β=0, whereas the BPFs in the left/right half-band of the channel are assigned positive/negative β index. For even M, which is of interest here, there is the β=0 center index, $$\frac{M}{2}-1$$

negative indexes and M/2 positive indexes out of which $$\frac{M}{2} - 1$$

are the mirror images of each other, namely $$\beta = \pm 1, \pm 2, \ldots, \pm\left(\frac{M}{2} - 1\right)$$

whereas the last index $$\beta = \frac{M}{2}$$

although positive, will be seen to correspond to two half sub-bands one which is at the extreme positive frequency and while the other one is at the extreme negative frequency. In this text we shall label the bank filters by both unipolar $0 \leq \beta \leq M-1$ and bipolar $-M/2+1 \leq \beta \leq M/2$ index notation as most convenient in each circumstance.

Let $g_\beta[k]$ ($h_\beta[k]$) denote the impulse response of the $\beta^{th}$ filter at the Tx (Rx) and let $G_\beta(z)$ ($H_\beta(z)$) denote the corresponding z-domain transfer functions. In the bi-polar index notation the bank filter שגיאה! קישור לא חוקי at the index $\beta=0$ is baseband, i.e. it is an LPF rather than a BPF. This filter coincides with the prototype filter and its impulse response is denoted $g_0[k]$ ($h_0[k]$) for the synthesis (analysis) FBs.

As the FBs considered here are always uniform, the frequency responses of all BPFs have the same spectral shape as that of the prototype LPF, and may be obtained by uniformly spaced spectral shifts of the prototype LPF, formally described in terms of the circular shift operator defined above as $G_\beta(e^{j2\pi\nu/R}) = C_\nu^{[\beta R/M]_R} G_0(e^{j2\pi\nu/R})$ where R is the Nyquist sampling rate and bandwidth of the overall channel.

The frequency shift corresponds in the time domain to the modulation relation $$g_\beta[k] = g_0[k] e^{j2\pi\frac{\beta}{M}k} = g_0[k] \overline{W}_M^{\beta k}$$

A similar relation holds for the analysis bank filters, with G replaced by H. All BPFs are obtained from the LPF prototype by frequency shifts as follows:
$H_\beta(e^{j2\pi\nu/R}) = C_\nu^{[\beta R/M]_R} H_0(e^{j2\pi\nu/R})$.

Thus, the $\beta^{th}$ BPF TF is obtained from the prototype TF by right circular shifting in the frequency domain by, applying a shift equal to $\beta S = \beta R/M$ where $S = R/M$ is the spectral extent of each sub-band.

In particular the largest positive shift corresponding to the largest filter index $\beta_{max} = M/2$, is $$\beta_{max} S = \frac{M}{2} \cdot \frac{R}{M} = \frac{R}{2}$$

yielding $G_{\beta_{max}}(e^{j2\pi\nu/R}) = C_\nu^{[R/2]_R} G_0(e^{j2\pi\nu/R})$. The BPF with the highest index then has center frequency R/2 right at the high end of the $[-R/2, R/2]$ channel band. Due to the spectral wrap-around of the digital domain transfer function, the spectral support of this filter ends up being split between the extreme positive and negative frequencies: one half of this filter spans the spectral interval $[R/2-S/2, R/2]$ while the other half spans $-R/2, R/2+S/2]$. We shall see that this extreme filter will not be used for carrying data. Rather its split spectral span will be reserved for the spectral transitions of ADC/DAC analog anti-aliasing/image-rejection filters.

There is provided a system-level applications at the Rx rather than Tx, namely the application OS FBs for high-speed optical transmission, but the disclosed techniques are also applicable to wireless communication. These novel system level embodiments, especially at the Rx side, build upon our additional disclosure of inventive embodiments at the subsystem level for both the analysis and synthesis OS FBs. Our OS FB embodiments (both analysis and synthesis FBs) have lower real-time computation complexity than the structures mentioned above prior art devices for the OS FBs. In particular the OS FBs disclosed in [fred harris] are based on extensive buffer data shifts, having to shuffle data in real-time at the input/output of the polyphase filter arrays with the data shifts in the buffers performed at the system clock rate, which is very costly in real-time ASIC realizations, especially at the high-speed required of optical communication. We first describe multiple alternative novel embodiments of the OS FB sub-system structure, disclosing both analysis and synthesis FBs, followed by system-level applications to realize novel optical receivers and also disclose novel optical Tx-s for single-carrier transmission which provide spectrally efficient Nyquist shaping and can be used with the novel optical Rx-s disclosed here, all of which are based on the OS FBs.

FIG. 1A describes a prior art Tx-Rx link formed by a CS synthesis FB at the Tx, acting as Frequency Division Multiplexer, combining the M sub-bands (sub-channels) in frequency, to form a single channel, which is M times wider band, to be transmitted over the link to the Rx. The Rx front-end comprises a CS analysis FB, acting as Frequency Division Demultiplexer, separating out the M sub-bands (sub-channels) in frequency to M distinct sub-channel outputs. Notice that as this is a prior art CS system, as the up-sampling $\uparrow M$ occurring in the synthesis FB as well as the down-sampling $\downarrow M$ in the analysis FB are by the same factor M, which is equal to the number of sub-bands.

Figure 1B:
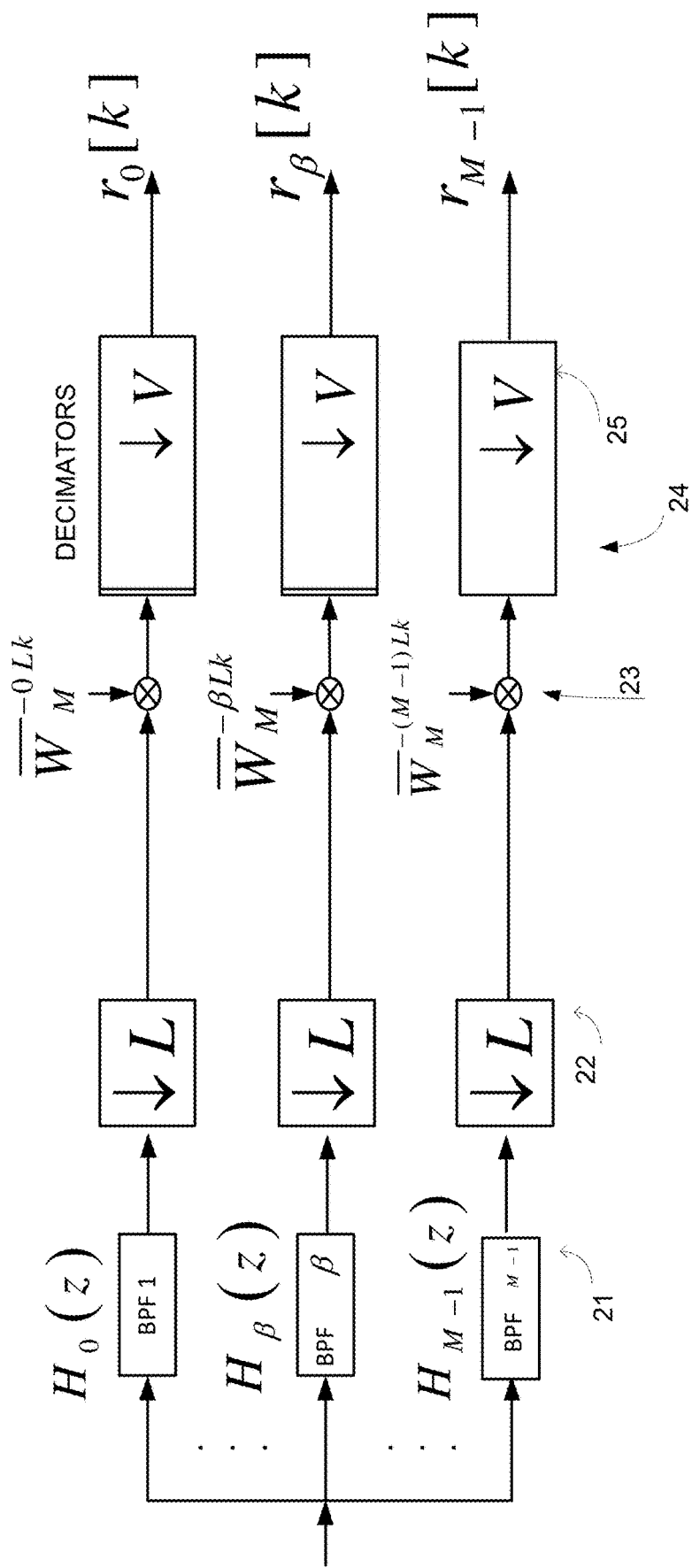
FIG. 1B illustrates an example of a receiver.
Figure 1C:
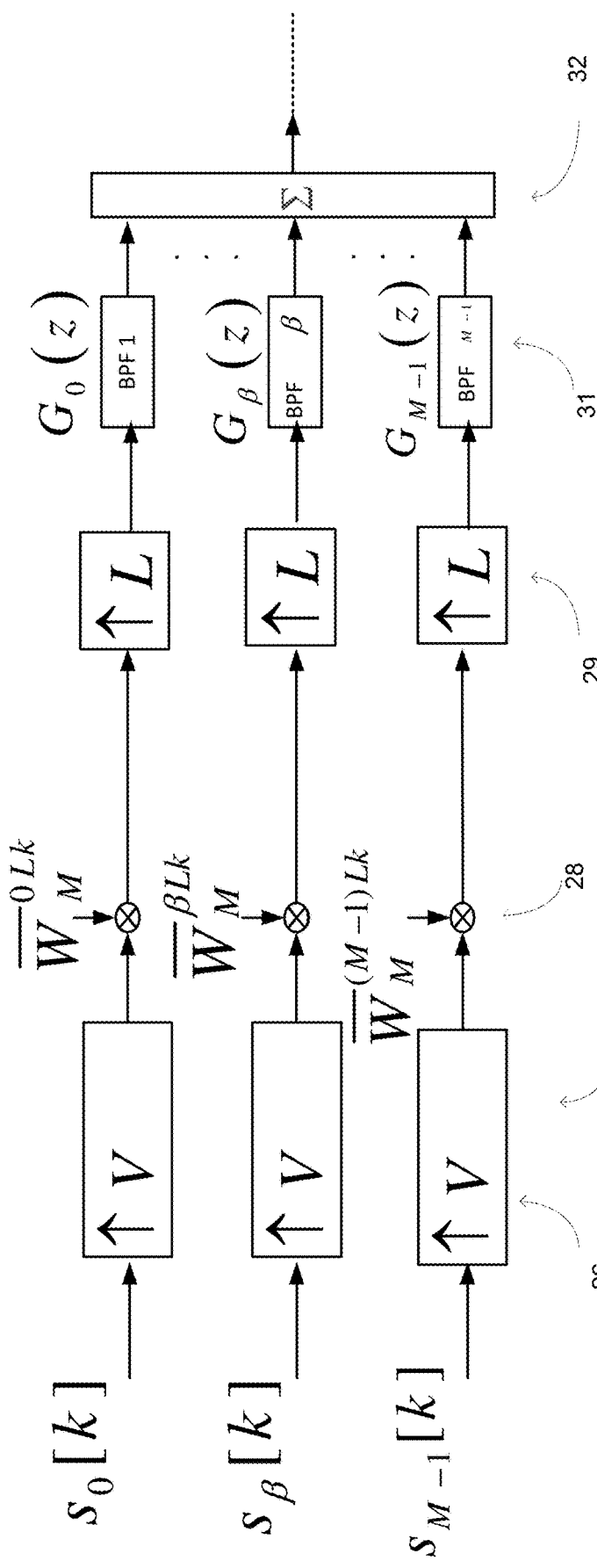
FIG. 1C illustrates an example of a transmitter.

In contrast, in FIGS. 1B-1C we present our novel structures of V-fold OS synthesis and analysis filter bank. In these respective FBs, the up/down-samplers, $\uparrow L$ and $\leftarrow L$ are by a factor L which satisfies $L<M$ such that $V \equiv M/L > 1$ is the oversampling factor. Here, according to the teachings of this invention, the synthesis FB of FIG. 1C at the Tx is preceded by specific per-sub-band processing comprising V-fold INTERPOLATORS (post-filtered up-sampling) and frequency up-shifting, and similarly the analysis FB of FIG. 1B at the Rx is followed by additional per-sub-band processing comprising V-fold DECIMATORS (pre-filtered down-sampling). The interpolation post-filtering occurring inside the interpolator blocks, and the anti-aliasing pre-filtering occurring in the decimator blocks are indicated by three wavy lines in our shorthand notation.

In addition, it is necessary to combine the interpolation/decimation with digital up-down frequency shift, as shown by the multipliers (modulators) with the linear phase factor $W_M^{+\beta L k}$ where k is discrete-time, $\beta$ is the index labeling the sub-band and the corresponding BPF (branch of the filter bank).

Back to the CS FB structure of FIG. 1A, it is readily seen that since the synthesis-analysis FBs act as frequency domain mux-demux, then for back-to-back operation of the Tx-Rx cascade, the simplest near-perfect reconstruction condition is that the BPF-s of the CS FB be shaped as frequency contiguous brick-wall filters, each of bandwidth B/M, where B is the total channel bandwidth. This perfect sharpness filtering condition on the frequency responses of the BPF is very stringent and in practice when using CS filter-banks, spectral guardbands may are inserted between the sub-bands, incurring tradeoffs between spectral efficiency, inter-sub-channel interference and the computational complexity of the filters, since sharper filters (closer to brickwall) require many more taps to realize.

Now, for the OS FB structure of FIGS. 1B-1C is to provide ideally perfect reconstruction, according to the teachings of this invention it turns out that it is no longer necessary that the FBs be perfect brick wall. It now suffices that the frequency responses of the bank filters each have their respective passbands flat over the extent of the corresponding sub-bands, however it is no longer necessary that the spectral transitions (from passband to stopband) of the filters be brick wall. Each of the BPF frequency responses still ought to be flat over its sub-band, i.e. the pass-band must coincide with the sub-band, however the transitions may occur in the neighboring sub-bands—the filter frequency responses are now allowed to more mildly slope down, yielding significant reduction of the number of taps required to realize the BPF filters of the FBs, relative to the nearly brick-wall filters required for the CS FBs of FIG. 1A. However, to compensate for the less sharp BPFs, operating at the high input rate of the overall channels, we must provide sharp filtering elsewhere in the system, actually in a more convenient location, namely in the sub-band processing section. The post-/pre-filters of the interpolators/decimators must now be brick wall (which will be seen to be an easier task), such that the spectral images arising in up-sampling and down-sampling be nulled out near-perfectly. While it seems that we have just shifted the sharp filtering challenge from one domain (the overall channel level) to another one (the sub-band processing level), nevertheless the sharp spectral shaping turns out easier to realize at the sub-band level, and its added computational complexity (relative to the CS structure where no such processing exists) is actually smaller than the computational savings attained for the BPFs due to the mild sloping characteristics of the BPFs inside the VxOS FBs themselves.

Figure 2:
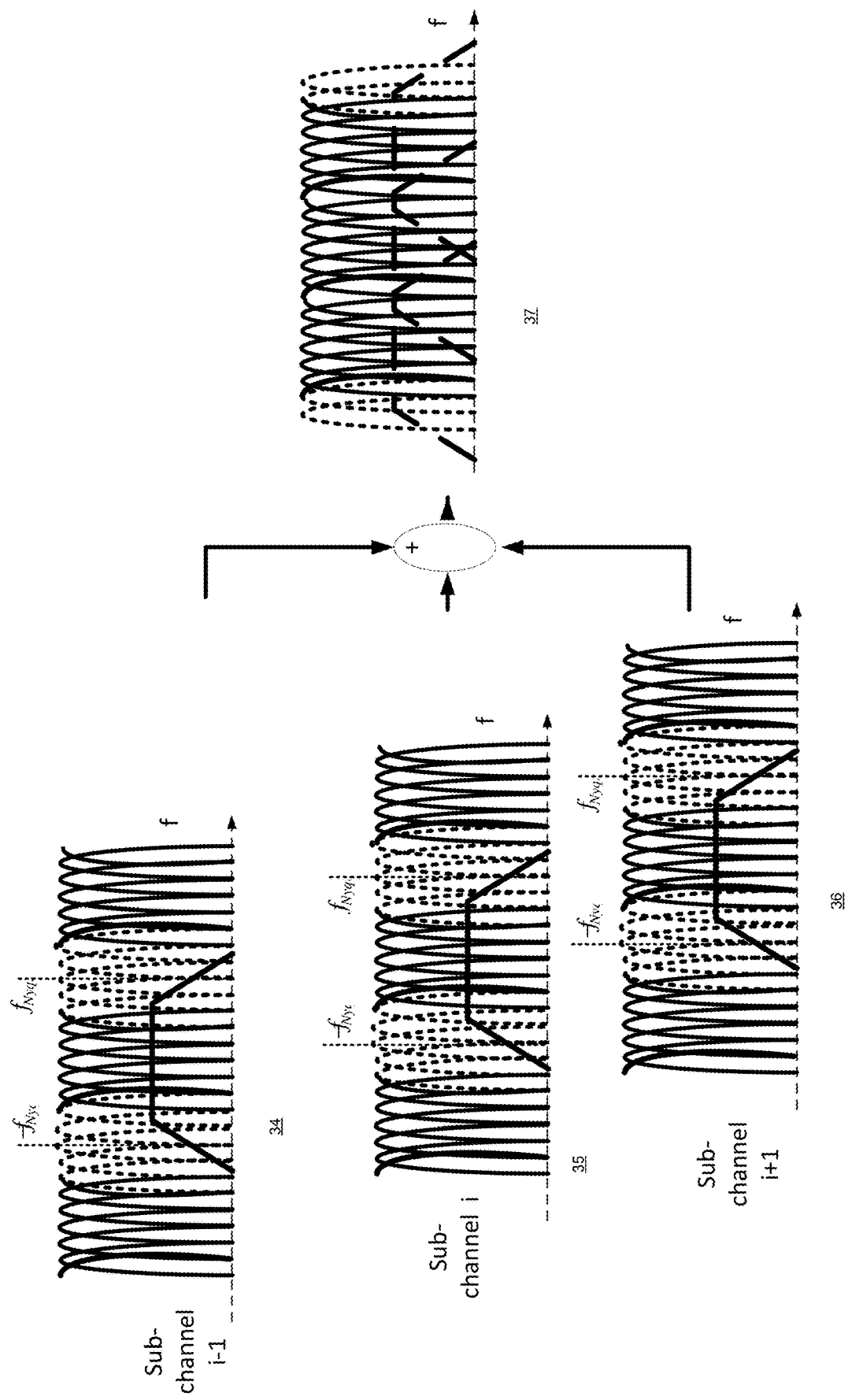
FIGS. 2-4 illustrate spectra of various filters according to various embodiments of the invention.
Figure 3:
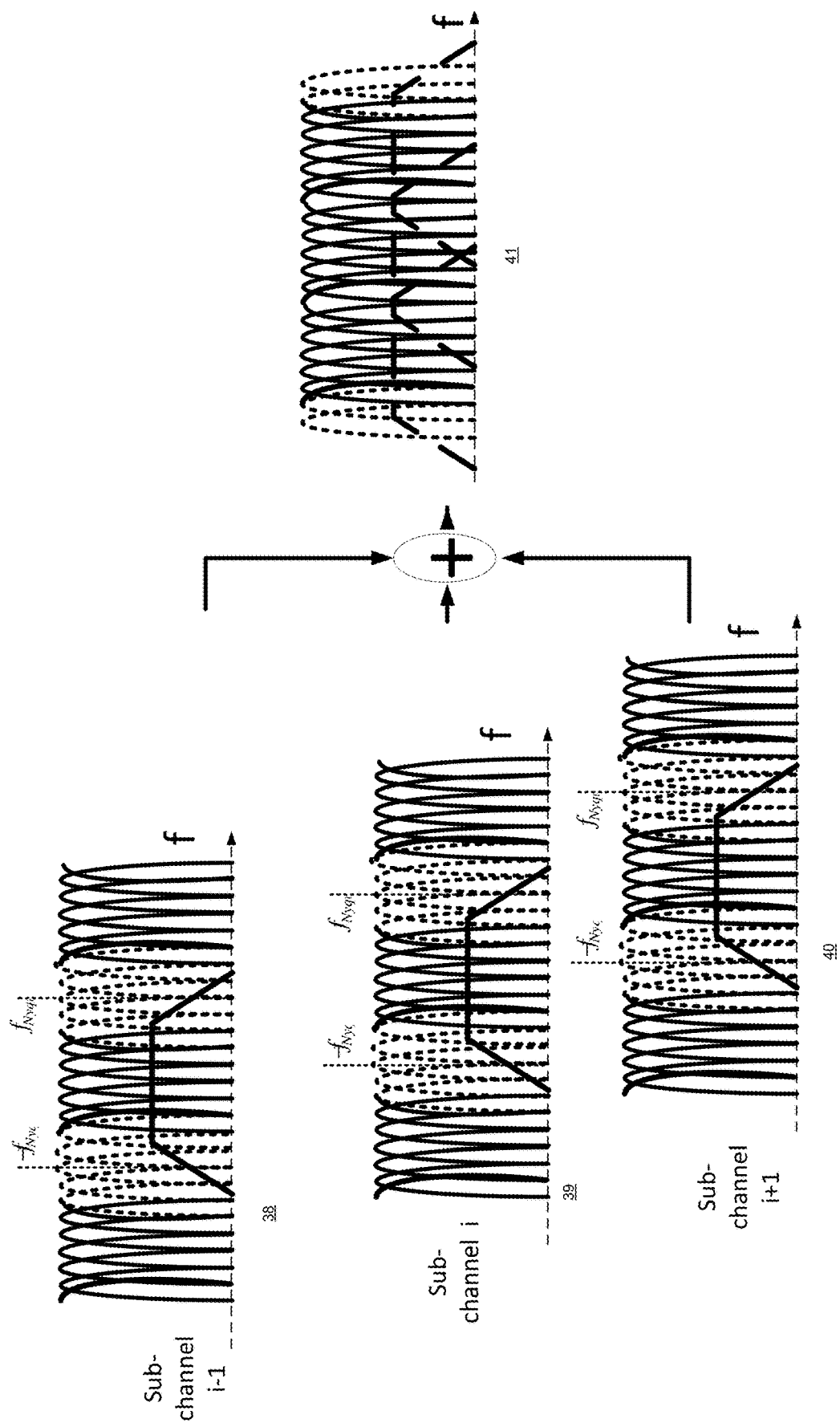
Figure 4:
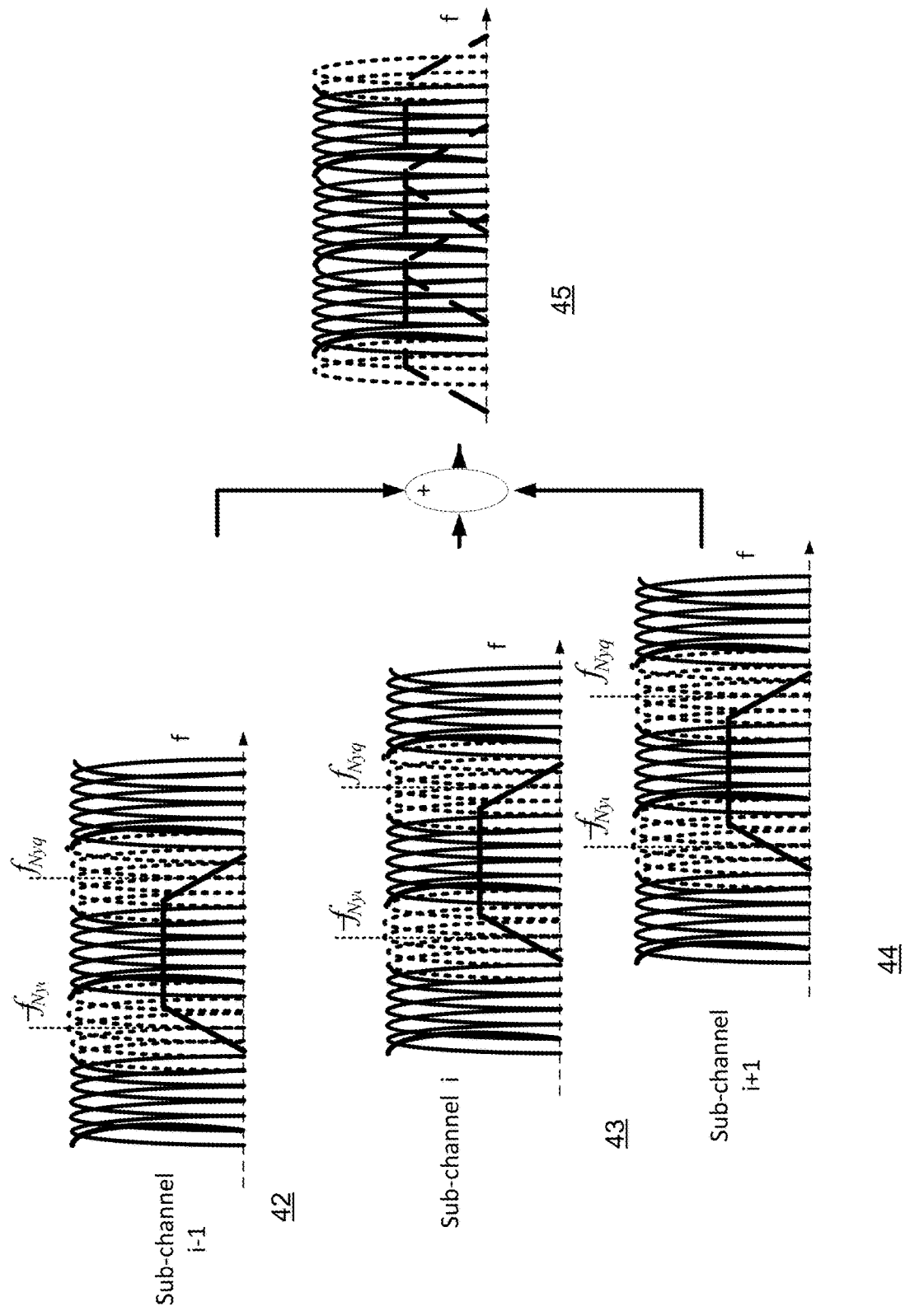

FIGS. 2-4 describe the principle of operation of the novel scheme of FIGS. 1B-1C in the frequency domain, exemplified for a particular value of V=M/L of 2, 4 and 4/3, which are also of interest in practical hardware applications. To understand the spectral manipulations, recall that the upsampling operation ↑L is described in the FD as an M-fold replication of the basic spectral period of the input digital signal, whereas the downsampling operation ↓L is described (up to a constant) by taking the input spectrum of spectral support R (equal to the sampling rate of the input signal) and uniformly shifting it at intervals R/L in order to generate L spectral images, and superposing these images. Following the signal flow for the $\beta^{th}$ sub-band in FIG. 1C from left to right, this sub-band input signal has spectral support S≡R/M, where R is the total channel bandwidth and M is the number of sub-bands. After the ↑V op, the sub-band spectrum is replicated V times. The sharp image rejection LPF (indicated by the three wavy lines in the interpolator block, blocks V-1 of these images, retaining just original baseband spectrum of the sub-band signal $s_\beta[k]$, but resulting in a null spectral guardband around the baseband spectrum. The overall spectral period of this V-fold interpolated 'digital' spectrum is now VS. Next the freq. up-shifter (modulation by $W_M^{\beta Lk} = W_V^{\beta k}$) circularly right shifts this periodic spectrum by a fraction β/V of its spectral period, i.e. by $$VS \cdot \frac{\beta}{V} = \beta S.$$

Measured in terms of the sub-band bandwidth, S, the shift is an integer number of units, β, however measured in terms of the over-sampled band, VS, the shift is by a rational number β/V.

The frequency shift operator corresponding to freq. up-conversion, is formally described as $C_v^{[\beta \cdot S]_{VS}} = C_v^{[[\beta]_V S]_{VS}}$.

In words, we evaluate $[\beta]_V$, and this yields the number of sub-band spectral units by which the baseband spectrum is shifted to the right at the output of the first block in the Tx, i.e. at the $\beta^{th}$ input port of the V-fold OS synthesis FB.

We shall exemplify the spectral analysis for three cases of interest, namely V=2, V=4 and V=4/3, the spectral analyses for which are shown in FIGS. 2-4.

For V=2 the spectral shift at the V-fold OS synthesis input is $[[\beta]_2 S]_{2S}$, i.e. for even $\beta ([\beta]_2=0)$ we have $[[\beta_2]_2 S]_{2S} = [0 \cdot S]_{2S} = 0$ i.e. there is no shift, whereas for odd β we have $[[\beta]_2 S]_{2S} = [S]_{2S}$, i.e. the shift is by one SB unit, i.e. half the 2S oversampled band, turning the spectrum from low-pass to high-pass, as shown in FIG. 2.

For V=4 (FIG. 3) the spectral shift at the V-fold OS synthesis input is $[[\beta]_4 S]_{4S}$, i.e., for the four polyphases of β modulo 4, referred to as quad-0, quad-1, quad-2, quad-3, we have the respective circular shifts $[0]_{4S}$, $[S]_{4S}$, $[2S]_{4S}$, $[3S]_{4S}$ of the 4S oversampled band.

For V=4/3 (FIG. 4) the spectral shift at the V-fold OS synthesis input is $$[[\beta]_{4/3} S]_{\frac{4}{3}S}.$$

As β cycles through 0, 1, 2, . . . , 15 $[\beta]_{4/3}$ yields
{0, −(⅓), −(⅔), ⅓, 0, −(⅓), −(⅔), ⅓, 0, −(⅓), −(⅔), ⅓, 0, −(⅓), −(⅔), ⅓}

Thus, for β=0, 1, 2, 3 the shifts are respectively $$[0]_{\frac{4}{3}S}, \left[-\frac{1}{3}S\right]_{\frac{4}{3}S}, \left[-\frac{2}{3}S\right]_{\frac{4}{3}S}, \left[\frac{1}{3}S\right]_{\frac{4}{3}S},$$

and then the cycle repeats.

Analytically considering a general V-value, still following the $\beta^{th}$ branch, this sparse oversampled band of extent VS enters the ↑L upconverter and is spectrally replicated L times. The L identical spectral images form an extended period of LVS=MS=R, occupying the full channel bandwidth.

At this point there comes the BPF, carving out one spectral image out of the L images. The $\beta^{th}$ BPF has its passband right over the $\beta^{th}$ SB, with center at position βS from the spectral origin.

The i-th oversampled band image has its center frequency at position iVS. The index i=$i_\beta$ of the spectral image capturing the center of the $\beta^{th}$ sub-band is determined from the condition that −½VS≤βS−iVS<½VS. Writing βS=$i_\beta$·VS+$[\beta S]_{VS}$ where $$i_\beta \equiv \left\lfloor \frac{\beta S}{VS} \right\rfloor = \left\lfloor \frac{\beta}{V} \right\rfloor$$

or equivalently $[\beta S]_{VS}=\beta S-i_\beta \cdot VS$ and recalling from the bi-polar modulo definition that we must have $-\frac{1}{2}VS \leq [\beta S]_{VS} < \frac{1}{2}VS$, it follows that we do satisfy $-\frac{1}{2}VS \leq \beta S - i_\beta \cdot VS < \frac{1}{2}VS$, i.e. the particular index $$i_\beta \equiv \left\lfloor \frac{\beta S}{VS} \right\rfloor = \left\lfloor \frac{\beta}{V} \right\rfloor$$

is the one sought for the spectral image which captures the center of the $\beta^{th}$ sub-band. Moreover, we have $[\beta S]_{VS}=\beta S-i_\beta \cdot VS$, meaning that the shift between the center of the $\beta^{th}$ sub-band and the center of the $i_\beta$ image capturing the sub-band center is precisely $[\beta S]_{VS}=[[\beta]_V S]_{VS}$. However, this is precisely the spectral shift which was applied at baseband by the up-converting modulator. Therefore, as the ↑L op rigidly shifted the baseband oversampled band to the $i_\beta^{th}$ spectral image, then the spectral shift which was applied at baseband precisely brings the baseband sub-band right into the passband of the $\beta^{th}$ BPF. Thus each of the up-shifted sub-bands is carved with nearly no distortion (ideally without distortion if the filter passband is perfectly flat), and all the shifted sub-bands are superposed by the adder terminating the V-fold OS synthesis FB. A multiplexed spectrum of M bands, occupying a spectral extent $\pm MS/2 = \pm R/2$ has been generated by the Tx.

Conversely, in the Rx (FIG. 1B) we have the V-fold OS analysis filter bank applying reverse transformations as follows:

The multiplexed spectrum, juxtaposing the M sub-bands in frequency, is presented in parallel to the filter bank of M BPFs, each of which carves a corresponding sub-band, with high precision over the extent of the sub-band (as each BPF is flat over a sub-band interval) however as the filters are allowed to mildly slope down in the two neighboring sub-bands around the pass-band sub-band, then each BPF also picks up out-of-sub-band spectral interference, which nevertheless is well separated from the targeted sub-band. The spectral support of each BPF is designed to be precisely $\pm VS/2$ around its center frequency, such that the (one-sided) pass-band frequency is $S/2$, the stop-band is $VS/2$, and the transition band occurs over the interval $VS/2-S/2=(V-1)S/2$. The spectral rolloff factor, $\alpha \equiv$ stopband/passband=$V$, i.e., it equals the oversampling factor. The larger the oversampling factor the milder the filter and less coefficients it requires. However larger oversampling factor means the filter must operate faster, therefore the computational complexity per unit time of each BPF turns out to be invariant in the OS factor, V.

The spectral support delineated by $+/-$ the stop-band frequency of the BPF around the BPF center frequency then occupies an oversampled band of extent VS. This band is manipulated by the ↓L down-sampling, in essence replicated L times and the images are superposed. These images are shifted at regular intervals equal to $B/L=MS/L=VS$, which are seen to equal the band limitation VS of the identical images to (traced to the original spectrum having been band limited by the BPF to VS two-sided). These spectral images then fit together with no aliasing overlap covering the full channel spectral region of $L \cdot VS=MS=R$. However, consistent with the VS-periodicity of the superposition of shifted images, the sampling rate at the down-sampler output now becomes VS, indicating that we have oversampling by a factor V relative to the output of the M-fold downsampling in the CS FB structure of FIG. 1A.

The VS-wide spectrum, which was replicated all the way down to around the origin, includes within it (possibly offset from the origin depending on the BPF index, $\beta$ and the OS factor, V) the clean sub-band with spectral interference around it. It is the role of the down-shifted decimator final stage to extract the clean sub-band and reject the interference. To this end, the spectrum is first shifted to baseband by the frequency down-shifter (multiplication by $W_M^{-\beta Lk}=W_V^{-\beta k}$ then the sharp anti-aliasing filter of the decimator removes the spectral interference around the desired sub-band which now falls at baseband. Finally the decimator replicates and superposes this spectrum V times, filling up the entire oversampled band of extent VS by V images of the sub-band, consistent with the sampling rate being reduced from VS down to S, which is precisely the Nyquist rate (equal to the two-sided bandwidth S or twice the one-sided bandwidth S/2). We notice that the operations occurring in the analysis FB in the Rx are the precise opposites obtained by time reversal, relative to the operations which occurred in the synthesis FB in the TX. Thus the spectral manipulations of FIGS. 2-4 should be read from the top down for the OS synthesis FB operation and from the bottom up for the OS analysis FB operation.

FIGS. 5A-5D address the efficient realization of the V-fold interpolator and decimator, also incorporating the up/down conversion operations. For relatively low values of V, a highly efficient high precision realization of these operations is based on cascades of IFFT and FFT back to back, achieving near-ideal interpolation and decimation with sharp rejection of images, provided some cyclic prefix extension is allowed as compatible with communication applications. The up/down frequency shifting functionality (multiplications by $\overline{W}_M^{\pm \beta Lk}=\overline{W}_V^{\pm \beta k}$) shown in FIGS. 1B-1C is implemented here not as time-domain modulation but equivalently as circular shifting in the frequency domain, at the interpolator IFFT input in the Tx and the decimator FFT output in the Rx.

In detail, ignoring the frequency-shifting initially, in FIG. 5A an interpolator is realized as an N-pnt FFT feeding a VN-pnt IFFT as shown with N/2 upper outputs of the N-pnt FFT being routed to the uppermost N/2 points of the VN-pnt IFFT, which points represent positive frequencies, while the N/2 lower outputs of the N-pnt FFT being routed to the lowermost N/2 points of the VN-pnt IFFT, which points represent negative frequencies. In between the two inserted N/2-pnt bands there are VN-V inputs into the VN-pnt IFFT which are zero-padded.

In the realization of the V-fold decimator of FIG. 5B the opposite process occurs, with the VN-V midpoints of the VN-pnt FFT being discarded (corresponding to anti-aliasing low-pass filterings, as these points represent the high-pass frequencies) and then two N/2 bands at the beginning and end of the VN-pnt FFT output are routed to the upper and lower halves of the N-pnt IFFT input as shown.

In FIGS. 5C,D we enhance the treatment to combine the interpolation/decimation with frequency up/down-shifting. In between the IFFT and FFT we place simple routing fabric modules, performing the following DSP functions:

For the modified interpolator at the Tx side (FIG. 5C), the routing fabric inserted in between the N-pnt FFT and the VN-pnt IFFT, called ZERO-PAD & CIRC SHIFT, performs zero-padding of the N-pnt FFT output to VN points, just as described in FIG. 5A, but now followed by a circular shift by $[\beta]_V N$ points of the VN-pnt resulting vector. The circularly shifted vector is applied to the VN-pnt IFFT input.

For the modified decimator at the Rx side (FIG. 5D), the routing fabric inserted in between the VN-pnt FFT and the N-pnt IFFT, called CIRC&SHIFT & SB EXTRACT, performs a circular shift by $[-\beta]_V N$ points of the VN-pnt output vector of the IFFT, followed by the inverse of zero-padding, namely extracting out the sub-band by stripping part of VN-pnt of the vector yielding an N-pnt vector which is applied to the N-pnt IFFT.

Actually, these routing fabrics, and their associated circular shifts do not perform actual shuffling of data, which would be cumbersome here we have no buffering and no data transfer from location to location within a buffer when we refer to 'circular shift', but there is just mapping of inputs to outputs, achieved by a static permutation of wires connecting the inputs or outputs of the smaller N-pnt (I)FFT to a particular sub-segment of the VN-pnt input or output of the larger VN-pnt (I)FFT.

Notice that if these two routing fabrics (the ZERO-PAD & CIRC SHIFT and the CIRC&SHIFT & SB EXTRACT) were cascaded back-to-back, then they would result in an identity system, as the Rx routing fabric is a time-reversed version of the Tx-routing fabric, i.e., the Rx routing fabric may be obtained by time-reversed traversing the Tx-routing fabric in the opposite sense. Next we describe the particular Tx (synthesis FB) routing fabrics for the special cases V=2, 4/3, 4. The corresponding routing fabrics for the Rx (analysis FB) are simply time-reversed of versions of the Tx ones.

We mention that in all these embodiments additional half-band shifts exchanging the positive and negative frequencies of the (I)FFTs inputs or outputs could be applied at the Tx, provided their mirror images will also be applied at the Rx in the corresponding (I)FFTs. These half-band shifts will result in different mappings of the routing fiber which are nevertheless equivalent, as the pairs of half-band shifts at the Tx and Rx will cancel each other in the overall cascade. In the specific examples to follow we do not incorporate these additional half-band shifts, nevertheless corresponding versions with different routing fibers may also be readily derived by applying such additional half-band shifts.

For the special case of V=2, the circular shifts at the Tx (FIG. 5C) are by $[\beta]_V N = [\beta]_2 N$ points, i.e. by 0 points (identity) for even $\beta$ and by N points for odd $\beta$. The Tx routing fabric then consists of inserting the output of the N-pnt FFT into either the low-pass half (for even $\beta$ branch of the FB) or high-pass half (for odd $\beta$ branch of the FB) of the VN=2N-pnt IFFT. In more detail, let us partition the 2N-pnt input of the IFFT into four quarters each containing N/2-pnt. For even $\beta$ there is no circular shift, thus mapping is precisely as described in FIG. 5A (taking the VN-pnt IFFT as 2N-pnt IFFT), i.e. into the top and bottom quarters of N/2 points of the 2N-pnt IFFT input, which may be characterized as the low-pass band.

For odd $\beta$, as the circular shift becomes N, the two N-pnt FFT output halves are now mapped into the two middle segments of the 2N-pnt IFFT input (which were previously zero-padded in the case of even $\beta$), which may be characterized as the high-pass band. Specifically labeling the four quarters of the of the 2N-pnt IFFT input from the top down by the indexes 0,1,2,3, then in the Tx, for even $\beta$, the top N/2-points of the N-pnt FFT output are mapped into quarter-0, whereas the bottom N/2-points of the N-pnt FFT output are mapped into quarter-3. At the Tx, for odd $\beta$ the top N/2-points of the N-pnt FFT output are mapped into quarter-2, whereas the bottom N/2-points of the N-pnt FFT output are mapped into quarter-1.

Dually, at the Rx (the sub-band processors for the analysis FB), the flow is reversed: for even $\beta$, quarter-0 of the 2N-pnt FFT output is mapped into the top N/2-points of the N-pnt IFFT output, quarter-3 of the 2N-pnt FFT output is mapped into the bottom N/2-points of the N-pnt IFFT. For odd $\beta$ quarter-2 of the 2N-pnt FFT output is mapped into the top N/2-points of the N-pnt IFFT output, quarter-1 of the 2N-pnt FFT output is mapped into the bottom N/2-points of the N-pnt IFFT.

Overall, for V=2 (twice OS FB), the Tx routing fabric may be characterized as ADD into HIGH/LOW HALF-BAND, whereas the dual Rx routing fabric may be characterized as EXTRACT HIGH/LOW HALF-BAND.

For V=4/3 at the Tx (synthesis FB), the circular shifts are by $[\beta]_V N = [\beta]_{4/3} N$ points. Since $\{[4\beta'+0]_{4/3}, [4\beta'+1]_{4/3}, [4\beta'+2]_{4/3}, [4\beta'+3]_{4/3}\} = \{0, 1, \frac{2}{3}, \frac{1}{3}\}$ then the right shifts applied by the circular fabric are by the following number of points: For $\beta$ mod 4=0 by 0 points (no circular shifts); For $\beta$ mod 4=1 by N-pnt;

For $\beta$ mod 4=2 by $\frac{2}{3}$ N-pnt; For $\beta$ mod 4=3 by $\frac{1}{3}$ N-pnt;

Further incorporating the zero-padding operation, the resulting cascade of zero-mapping and the circular shifts above may be described as follows: Partition the N-pnt FFT output into 6 sixths (each of N/6-pnt) and partition the 4/3N-pnt IFFT input into 8 eights (each also of N/6-pnt). Then, labeling the 6 sixths from top to bottom as 0, 1, ..., 5 and labeling the 8 eights from top to bottom as 0, 1, ..., 7, the 6 sixths are mapped into the 8 eights, including zero-padding of two of the 8 eights, as described next.

For $\beta$ mod 4=0, the sixths 0,1,2 are mapped into eights 0,1,2 while sixths 3,4,5 are mapped into eights 5,6,7.

For $\beta$ mod 4=1 we apply a circular shift of N-pnt (i.e. 6 mod 8 eights) to the eights obtained for $\beta$ mod 4=0. Thus, sixths 0,1,2 are mapped into eights 6,7,8 while sixths 3,4,5 are mapped into eights 3,4,5.

For $\beta$ mod 4=2 we apply a circular shift of $\frac{2}{3}$N-pnt (i.e. 4 mod 8 eights) to the eights obtained for $\beta$ mod 4=0. Thus, sixths 0,1,2 are mapped into eights 4,5,6 while sixths 3,4,5 are mapped into eights 1,2,3.

For $\beta$ mod 4=3 we apply a circular shift of $\frac{1}{3}$ N-pnt (i.e. 2 mod 8 eights) to the eights obtained for $\beta$ mod 4=0. Thus, sixths 0,1,2 are mapped into eights 2,3,4 while sixths 3,4,5 are mapped into eights 7,0,1. This concludes the complete description of the routing fabric at the Tx for V=4/3. As for the Rx side, the mappings are simply reversed with the 8 eights of the 4N/3-FFT output being mapped into the 6 sixths of the N-pnt IFFT input (after dropping two of the eights).

For V=4 at the Tx, circular shifts are by $[\beta]_V N = [\beta]_4 N$ points. Then the right shifts applied by the circular fabric are by the following number of points: For $\beta$ mod 4=0 by 0 points (no circular shifts); For $\beta$ mod 4=1 by N-pnt;

For $\beta$ mod 4=2 by 2N-pnt; For $\beta$ mod 4=3 by 3N-pnt;

Further incorporating the zero-padding operation, the resulting cascade of zero-mapping and the circular shifts above may be described as follows: Partition the N-pnt FFT output into two N/2-pnt halves and partition the 4N-pnt IFFT input into 8 eights (each also of N/2-pnt). Then, labeling the two halves from top to bottom as 0,1 and labeling the 8 eights from top to bottom as 0, 1, ..., 7, the 2 halves are mapped into the 8 eights, including zero-padding of 6 of the 8 eights, as described next.

For β mod 4=0 the halves 0,1 are mapped into eights 0,7. For successive values of β mod 4 in increments of unity the output eights 0,7 are shifted by N over the 4N record, i.e. by 2 mod 8 eights at a time.

For β mod 4=1 the halves 0,1 are mapped into eights 2,1. For β mod 4=2 the halves 0,1 are mapped into eights 4,3. For β mod 4=3 the halves 0,1 are mapped into eights 6,5.

This concludes the complete description of the routing fabric at the Tx for 17=4. As for the Rx side, the mappings are simply reversed with the 8 eights of the 4N-FFT output being mapped into the two halves of the N-pnt IFFT input being mapped into the two halves (after dropping 6 of the eights).

Having described the frequency shifted interpolator decimator realizations in FIG. 5 we substitute these realizations in the end-to-end diagram of FIG. 1B resulting in the overall realization of the FB synthesis-analysis cascade of FIG. 6.

Figure 6A:
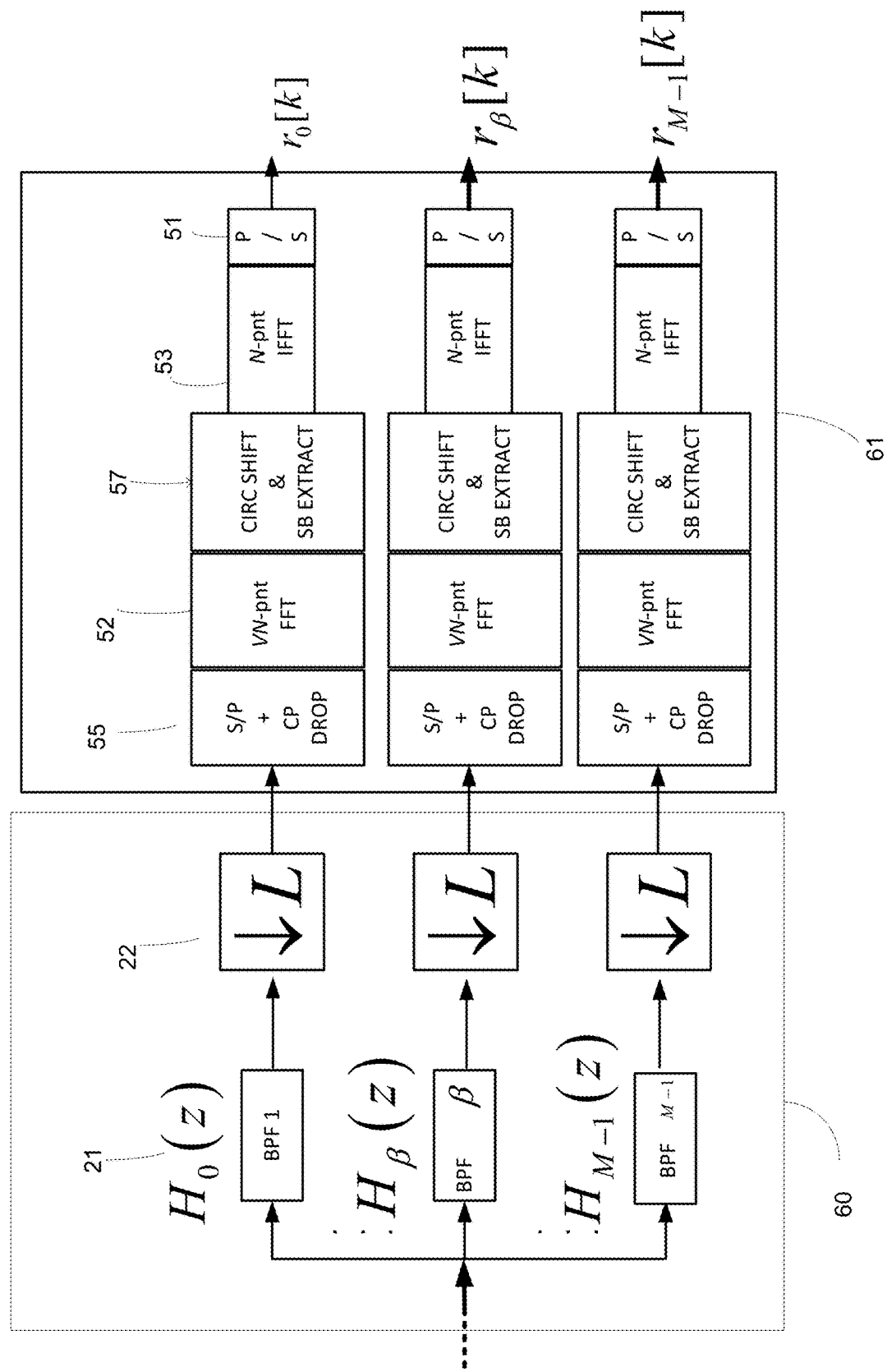
Figure 6B:
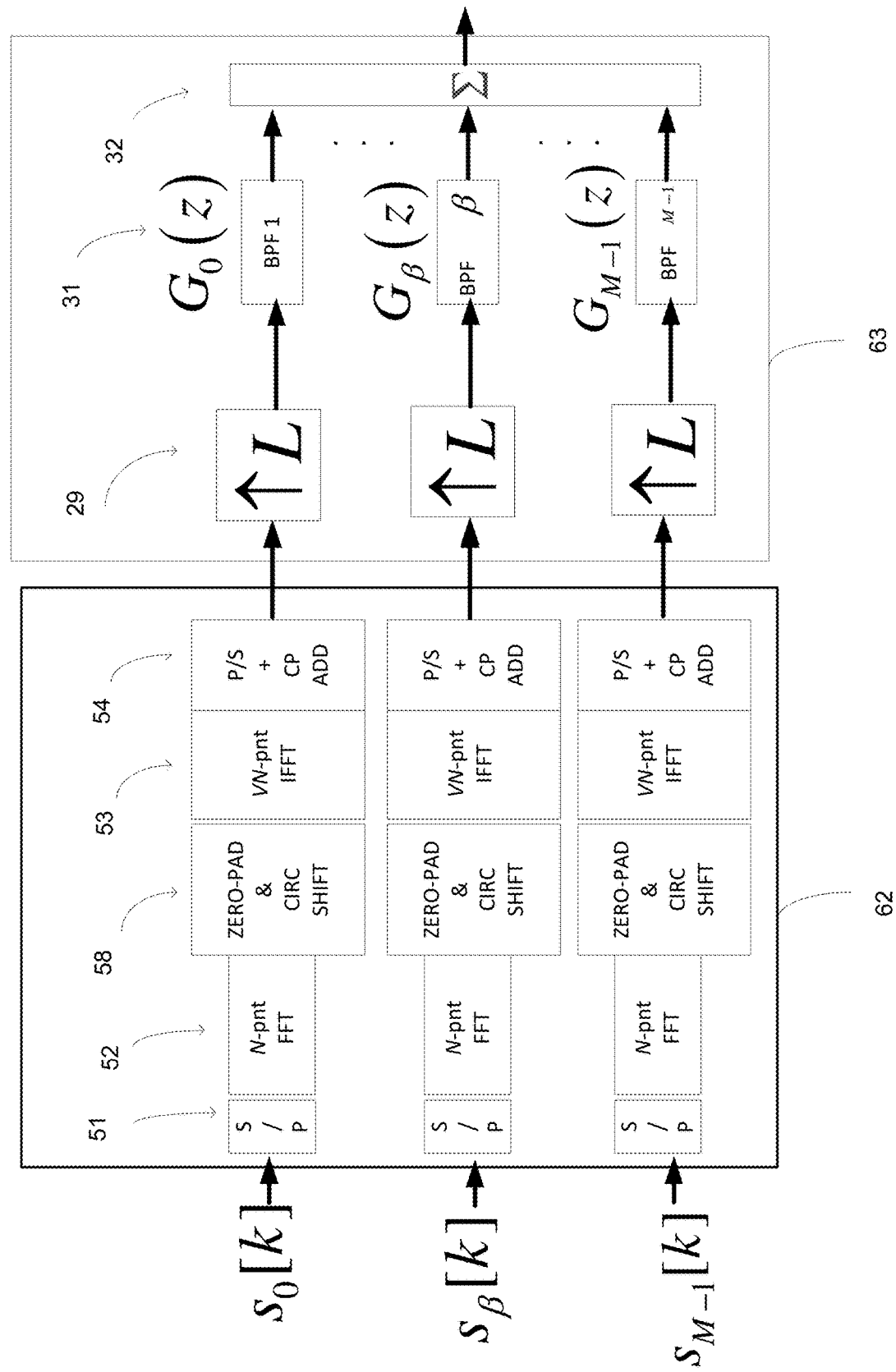

FIGS. 6A-6B describe the preferred realization of end-to-end the synthesis-analysis FB based link, which may be used to transmit in parallel over a total bandwidth B a collection of M tributary sub-channels, each of bandwidth B/M, carrying any type of modulation. FIG. 6A describes the Rx side which comprises an analysis filter bank followed by sub-band processors, while FIG. 6B describes the Tx side, which comprises a synthesis filter bank preceded by sub-band processors. The sub-band processors realize the frequency down-/up-shifted decimation/interpolation by means of back to back (I)FFTs with routing fabric.

Figure 7A:
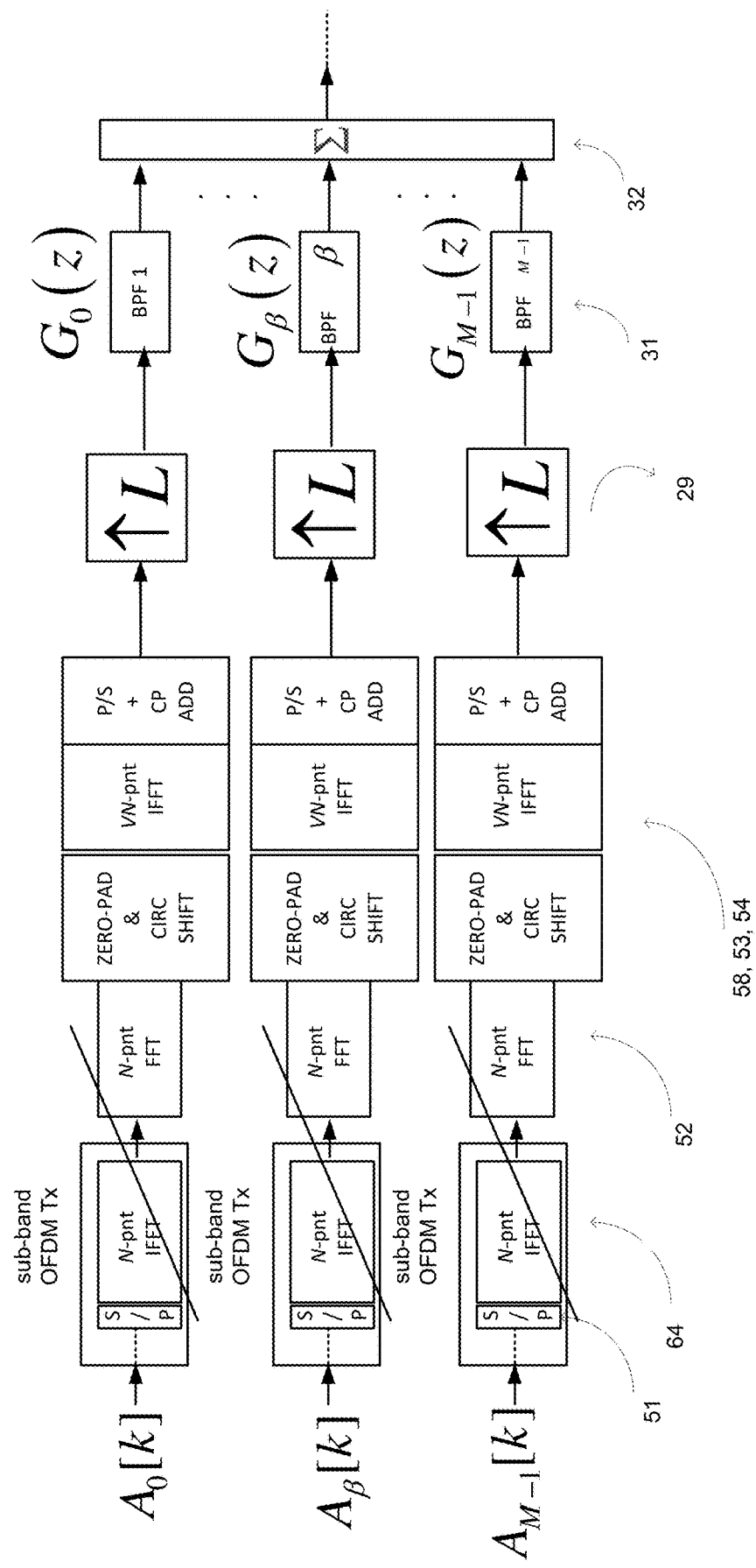
Figure 7B:
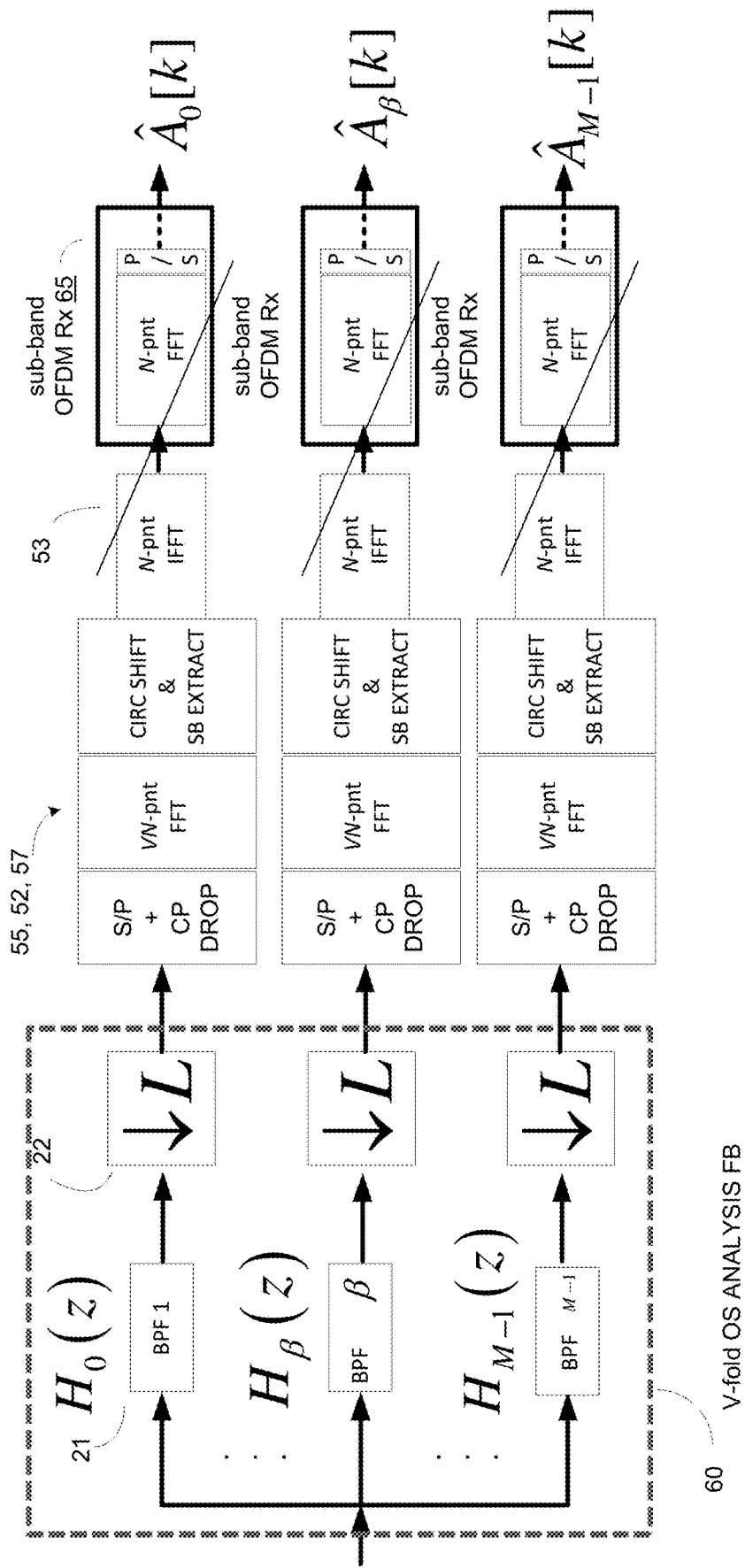
Figure 7C:
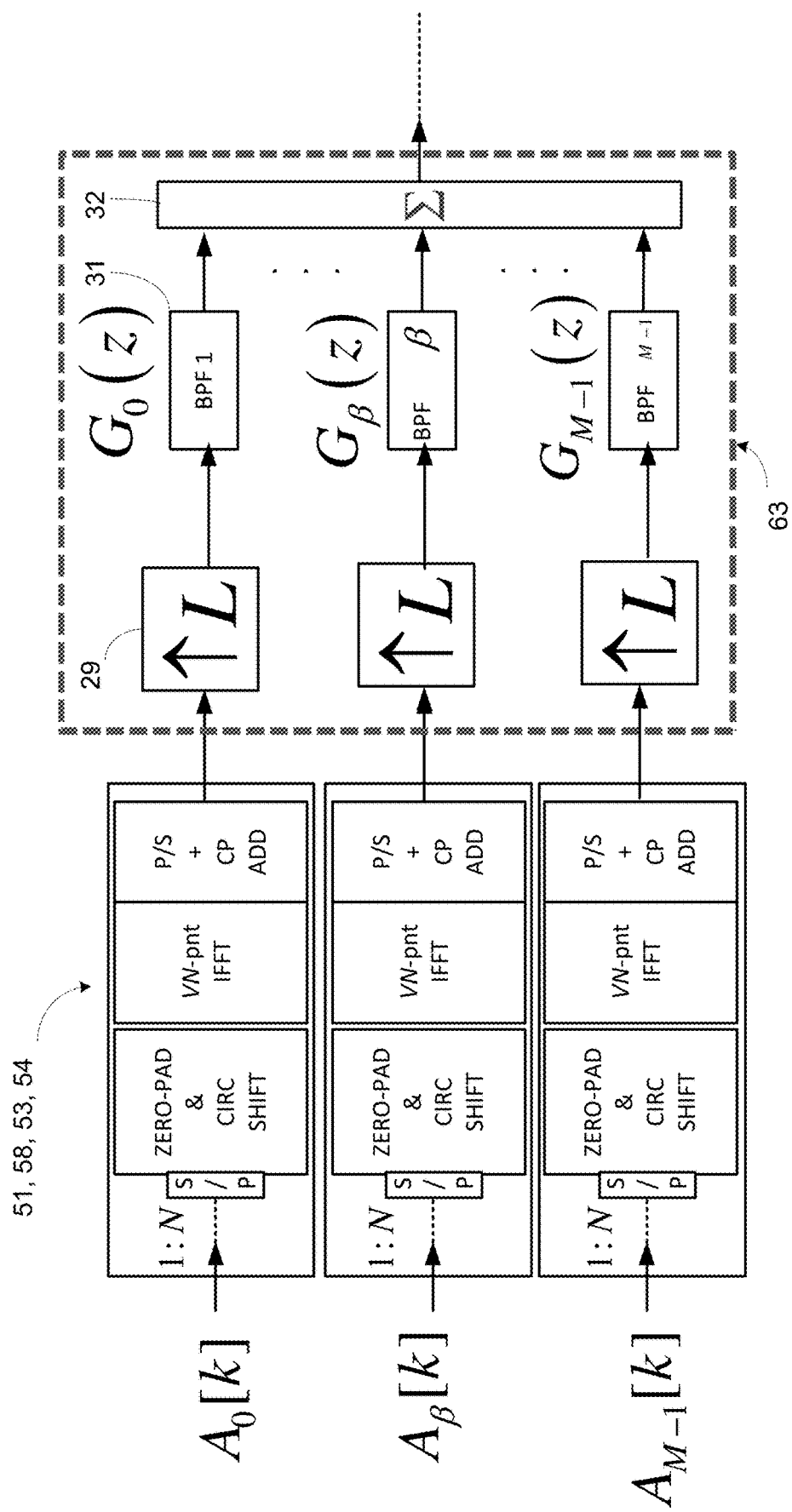

FIG. 7A-7E address the special case of transmission of tributary sub-channels bearing the OFDM modulation format, through a Tx aggregating these OFDM tributary sub-channels by means of an OS synthesis FB, and a Rx demultiplexing thee individual OFDM tributary sub-channels by means of an OS analysis FB. In FIG. 7A sub-band OFDM Tx-s are placed on each branch of the OS synthesis FB of FIG. 6B and likewise sub-band OFDM Rx-s are placed on each branch of the OS analysis FB of FIG. 6A. The inserted sub-band OFDM Tx-s are stylized here to just show the essential N-pnt IFFT functionality and likewise the sub-band OFDM Rx-s are represented by the essential N-pnt FFT functionality. The size N of the OFDM (I)FFTs is selected to equal that of the outer (I)FFT featuring in the V-fold interpolation and decimation modules. As a result, the OFDM (I)FFT at each end gets cancelled by the corresponding (I)FFT in the interpolation or decimation block, as shown. The resulting simplified diagrams for the Tx and Rx are shown in FIG. 7C,D. Now there is a single VN-pnt (I)FFT remaining in the up-/down-frequency-shifted interpolation/decimation module, which is now conceptually detached from the V-fold synthesis/analysis FB, rather viewed as part of the sub-band OFDM Tx/Rx. Finally, in FIG. 7E we detail the main functions of the sub-band OFDM Tx and Rx (top and bottom parts of the figure respectively). Additional conventional functions in the OFDM Tx and Rx which are not relevant to the FB sub-banding concept are not shown.

The sub-band OFDM Tx (top of FIG. 7E) features a 1:N S/P conversion followed by the mapping of inputs similar to that shown in FIG. 5D, then followed by a right circular shift, then a VN-pnt IFFT, then the addition of cyclic prefix (CP) and P/S to generate the output. The OFDM Rx essentially performs these functions in reverse, as shown in the bottom part of FIG. 7E.

FIGS. 8A-8C,9A-9F,10A-10D show embodiments applying the OS FBs for OFDM transmission, in effect detailing the general OFDM Tx/Rx structure of FIG. 7B,C for specific OS parameter values of typical interest: V=2, 4/3, 4.

Figure 8A:
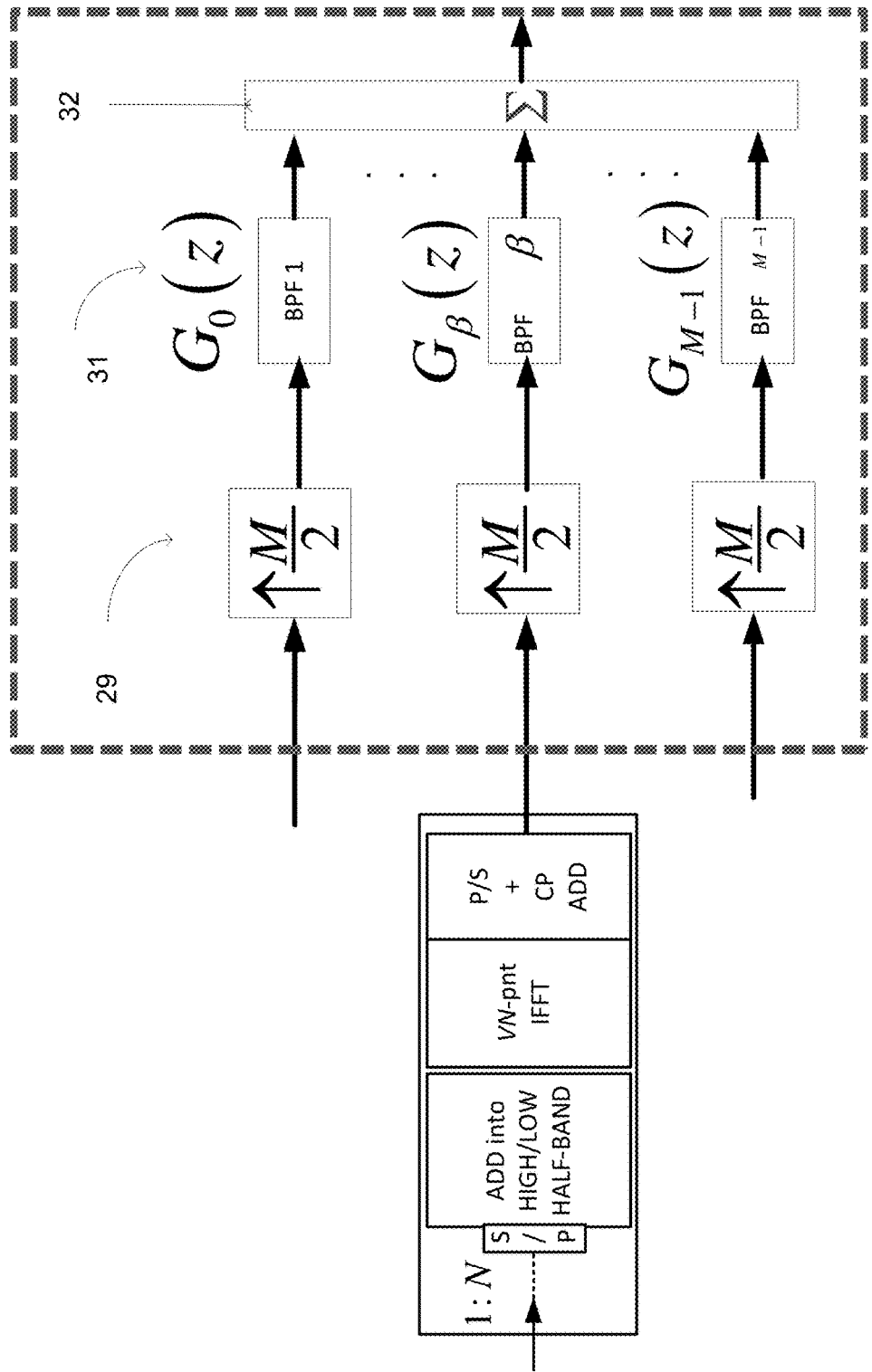
Figure 8B:
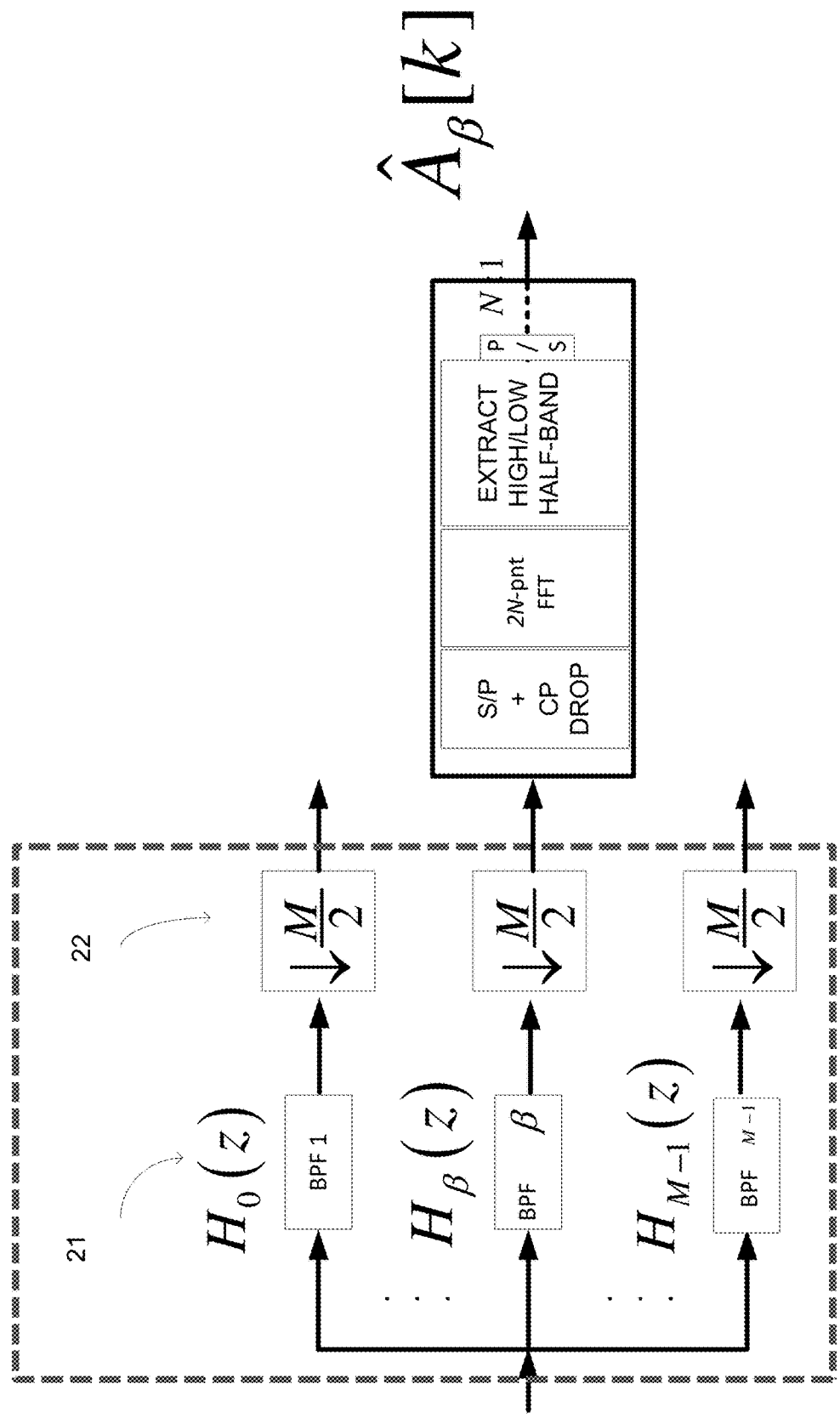
Figure 8C:
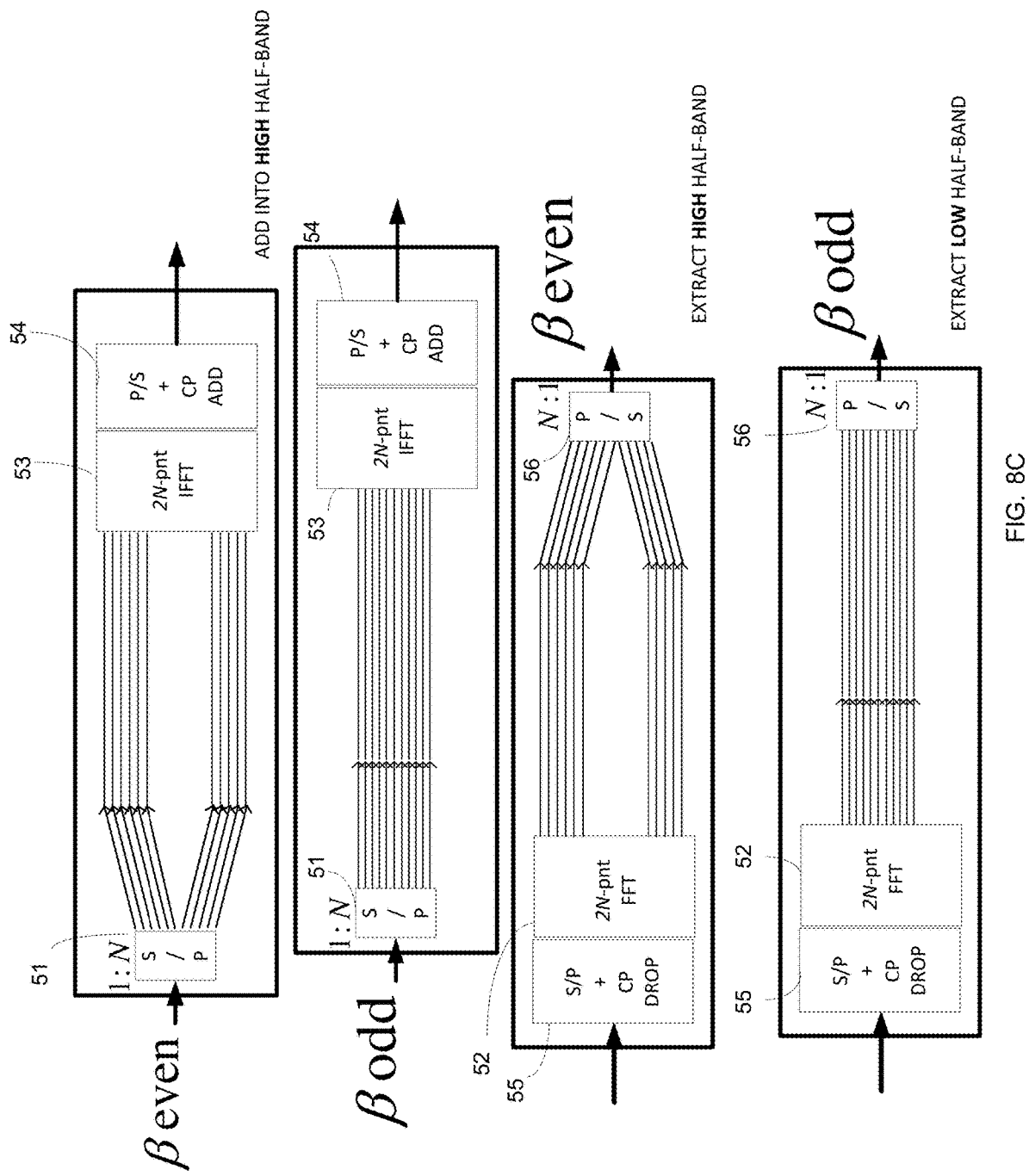

FIGS. 8A-8C address the V=2 OS FB based OFDM Tx/Rx, comprising the twice oversampled FBs and arrays of sub-band OFDM Tx-s and Rx-s as shown in FIGS. 8A and 8*b*.

FIG. 8C details the structure of the routing fabric in the sub-band OFDM Tx (top two parts of the figure) and sub-band OFDM Rx (bottom two parts of the figure), for even and odd values of the sub-band (or FB port) index β. Notice that relative to our earlier description of routing fabric for V=2, here we apply extra half-band shifts interchanging the two mapped halves, which is more convenient yet equivalent to our original specification of the routing fabric for V=2.

Thus, the routing fabric of the sub-band Tx/Rx for V=2 amounts to adding the vector of N OFDM sub-carriers into the high and low half bands of the twice oversampled band of 2N points which is mapped onto the IFFT inputs at the Tx (with an opposite process of extracting half of the 2N band (therefore dropping the complementary half) in order to down-sample by a factor of 2, transitioning from 2N points to N points.

Figure 9A:
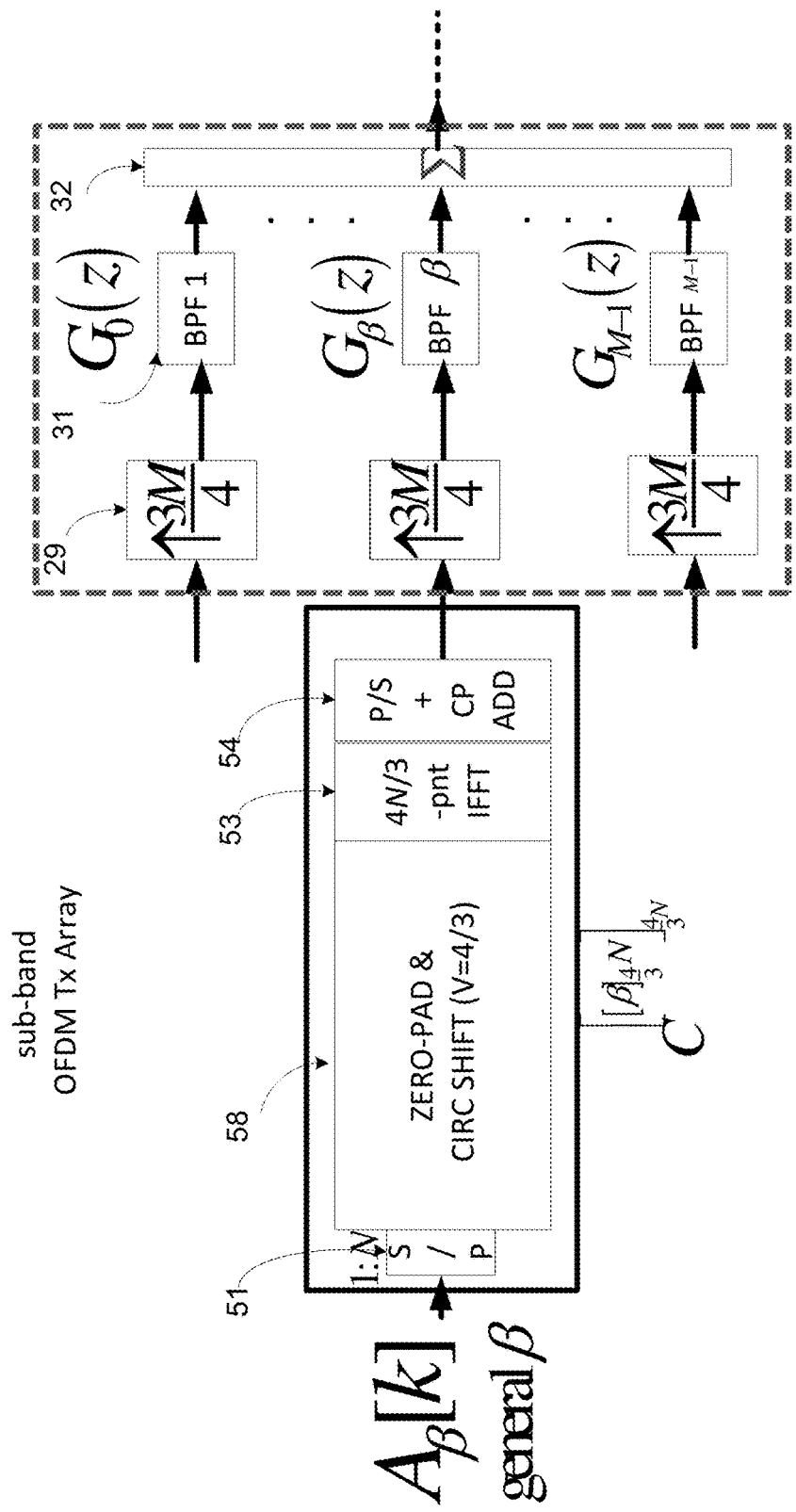
Figure 9B:
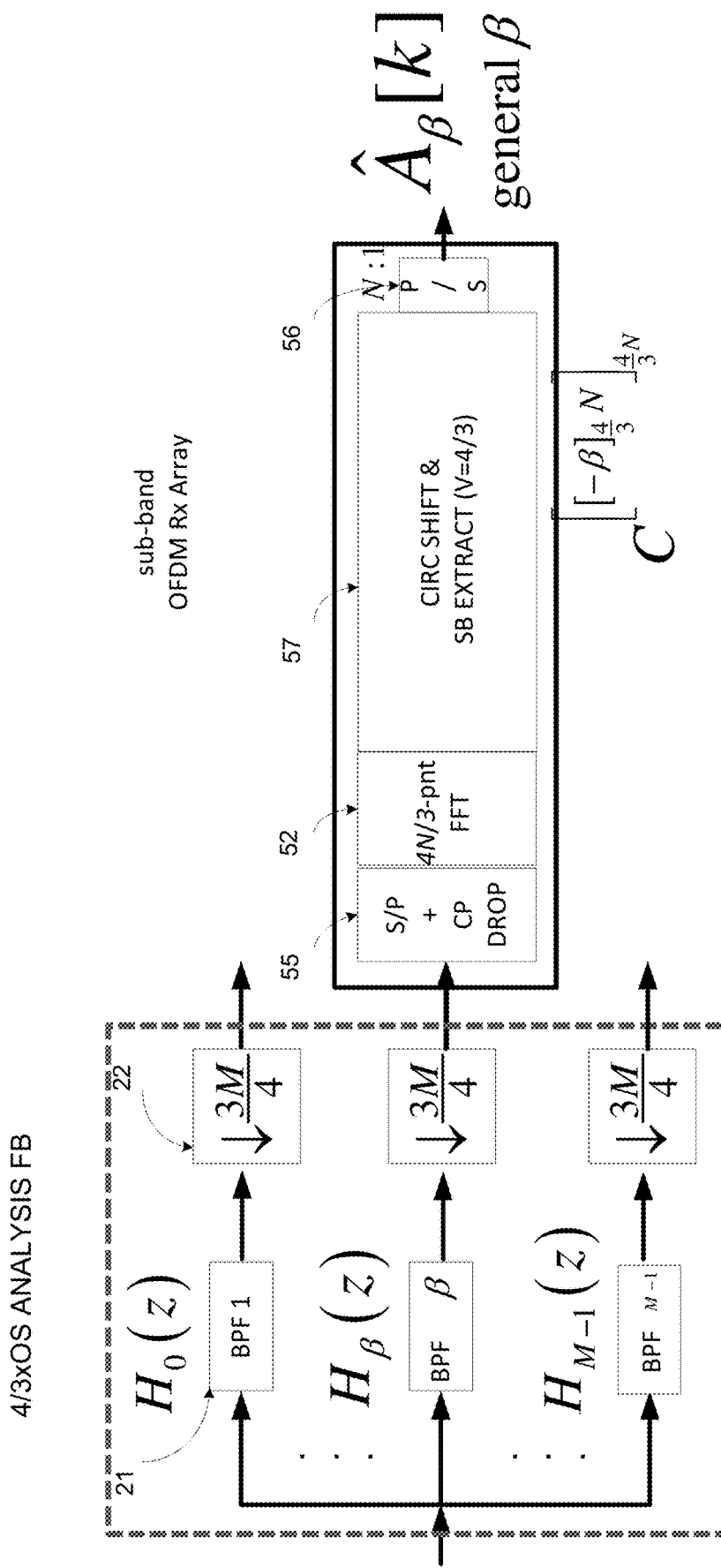
Figure 9C:
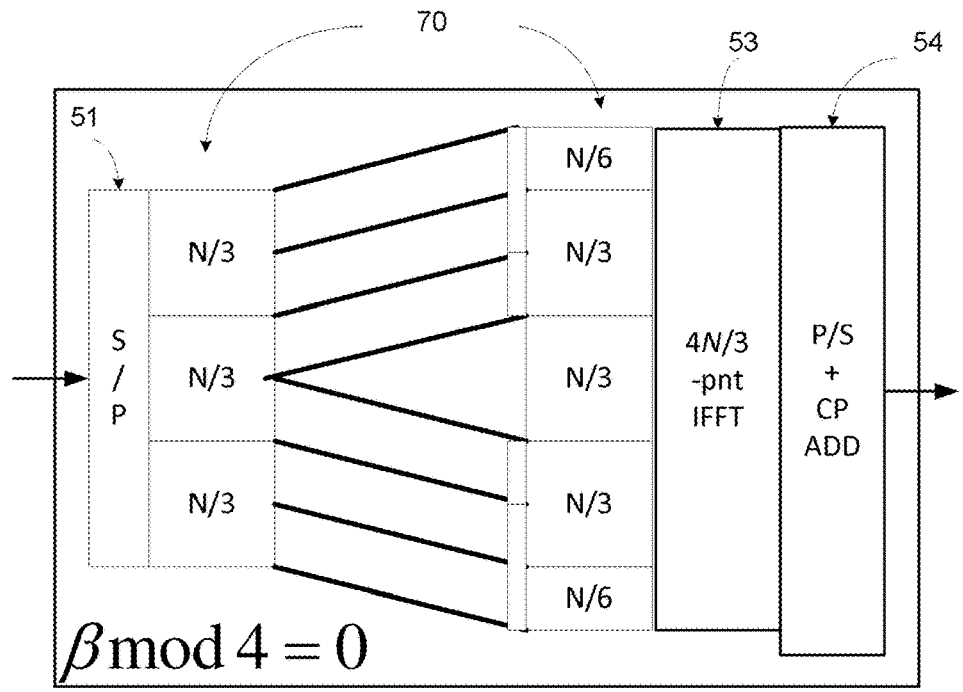
Figure 9C:
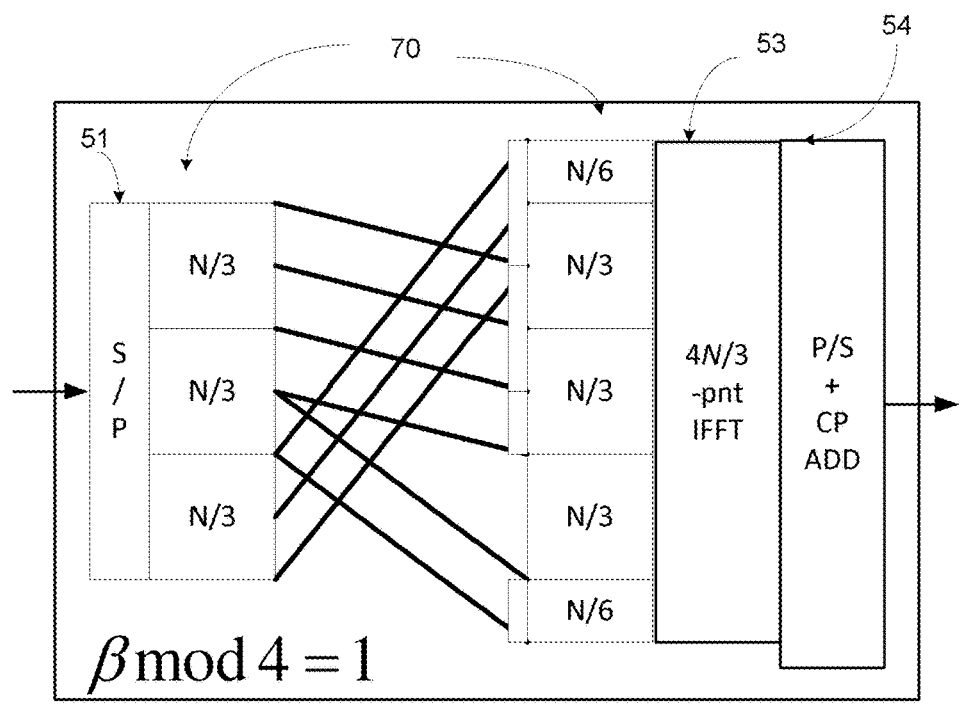
Figure 9D:
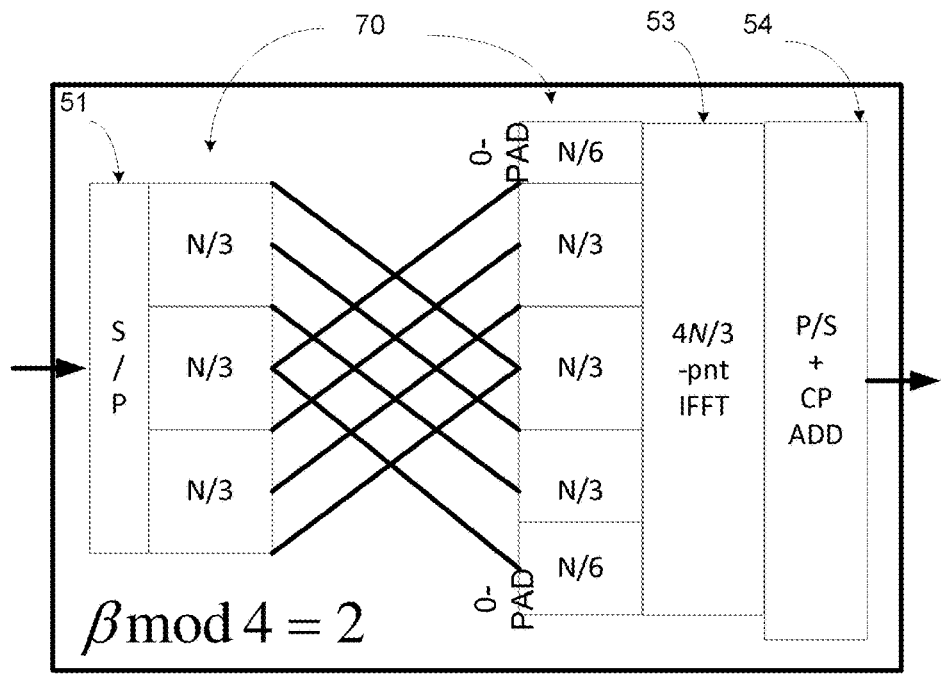
Figure 9D:
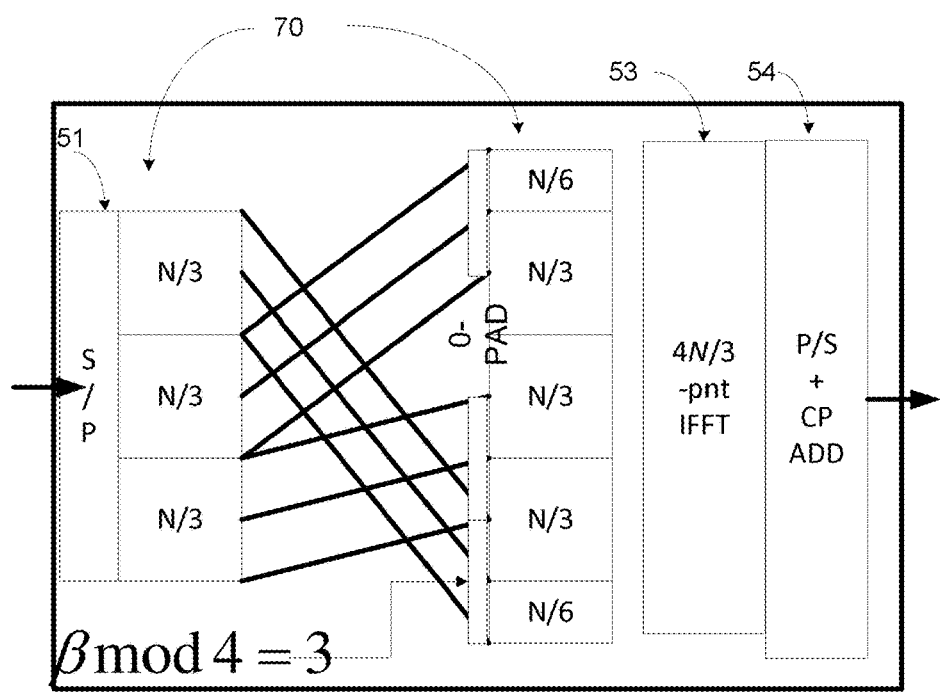
Figure 9E:
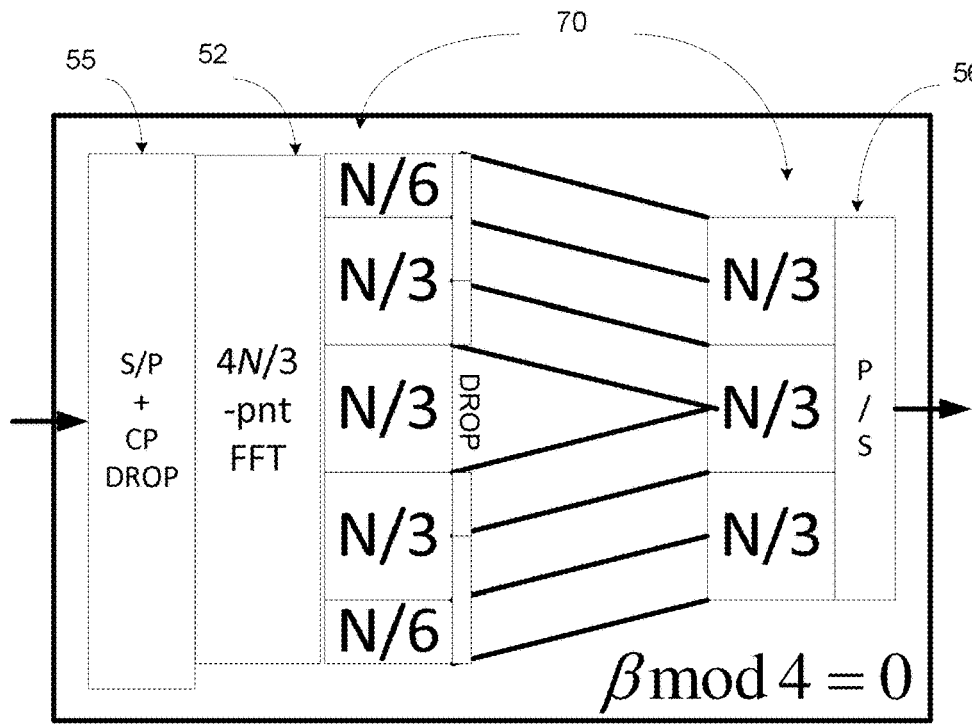
Figure 9E:
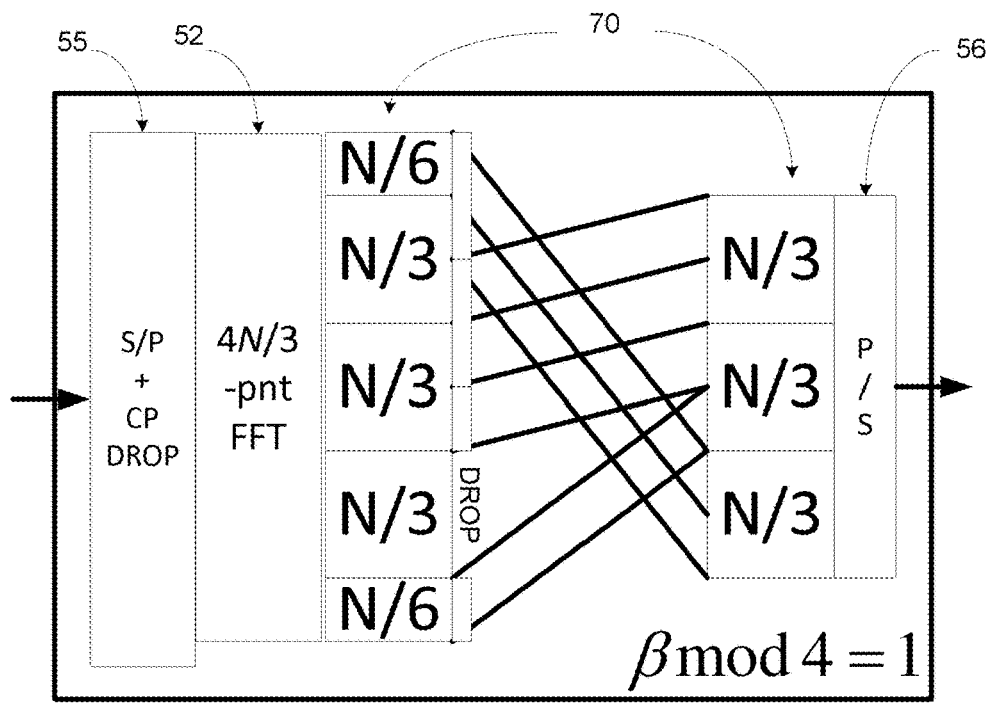
Figure 9F:
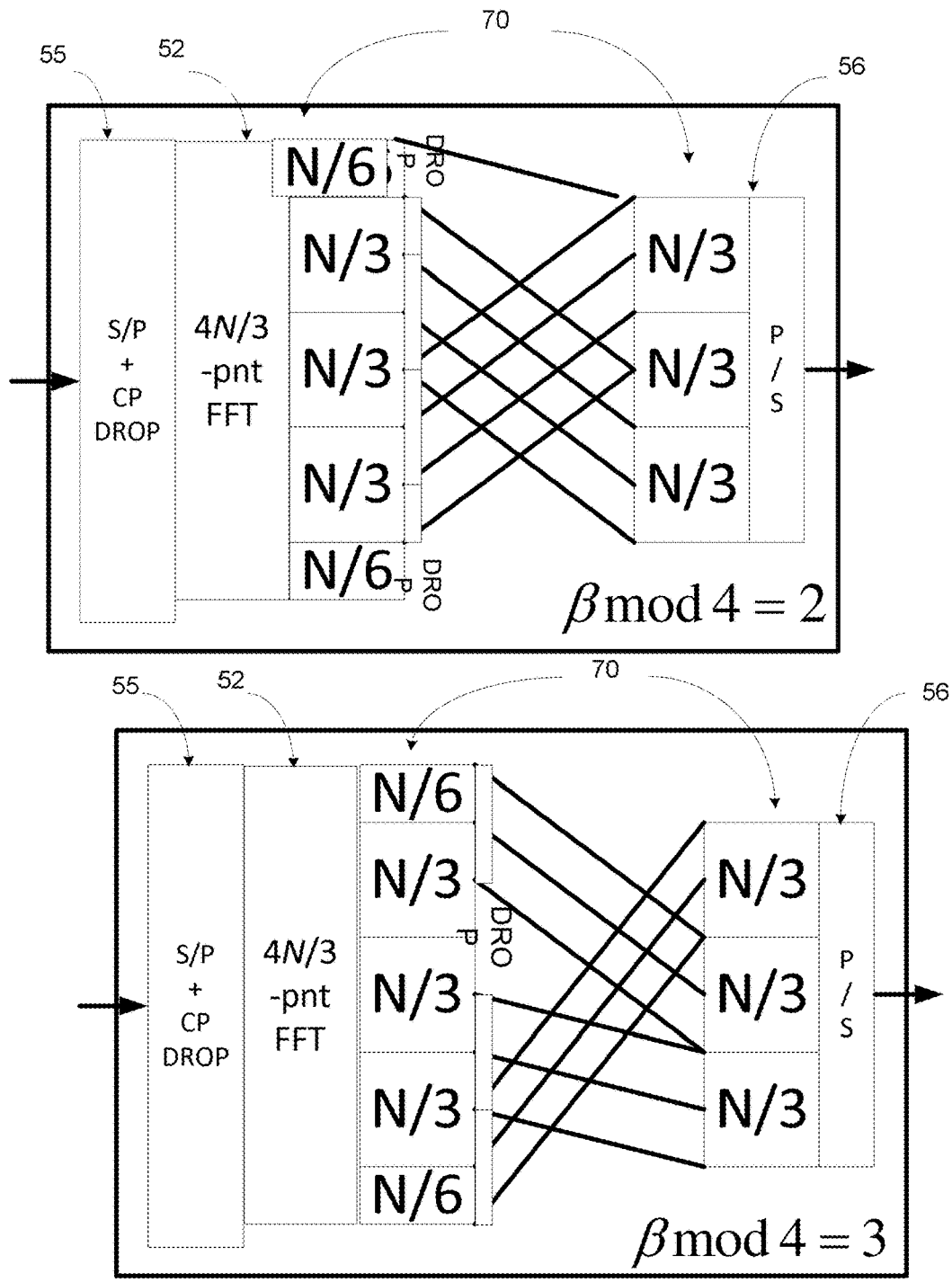
Figure 10A:
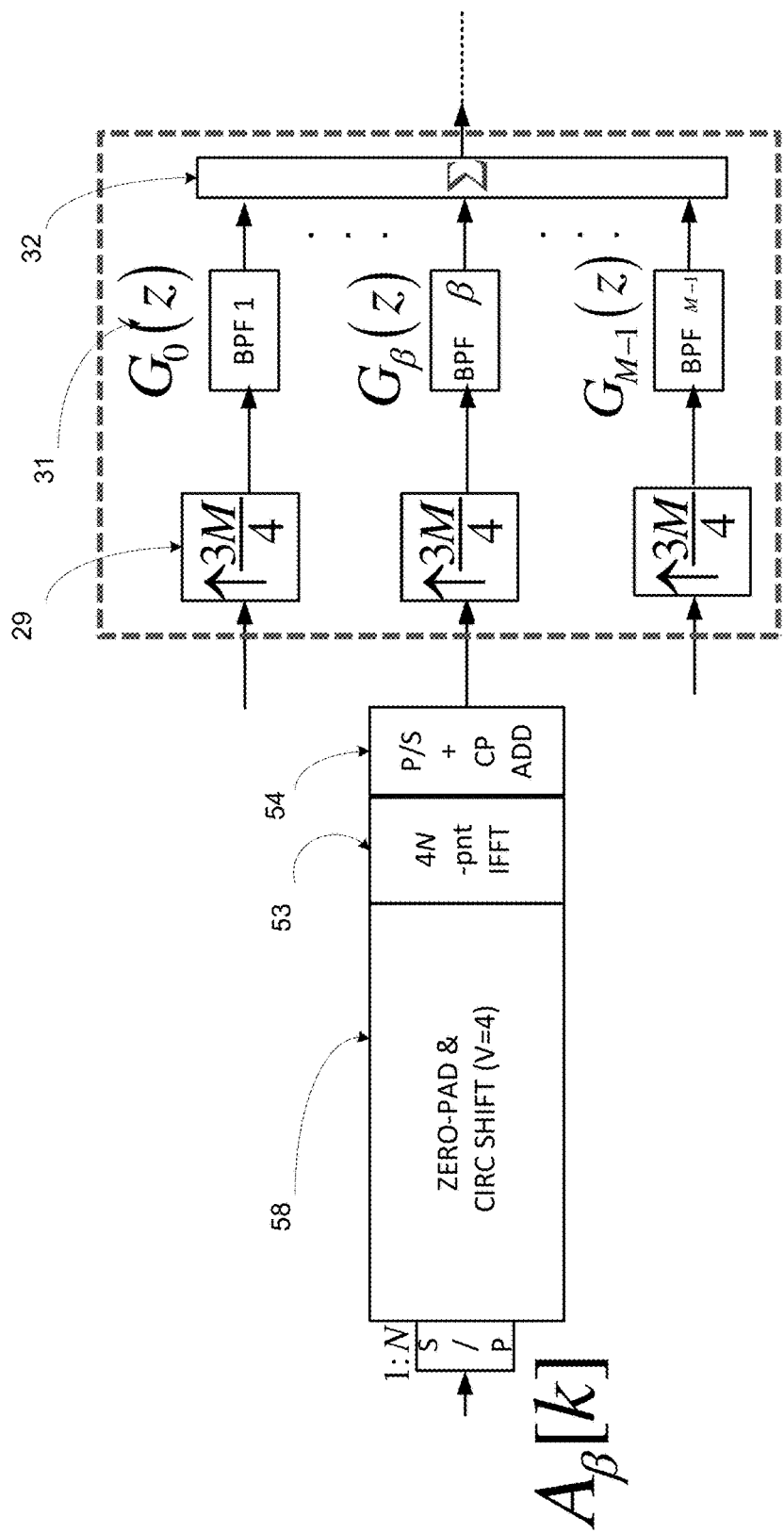
Figure 10B:
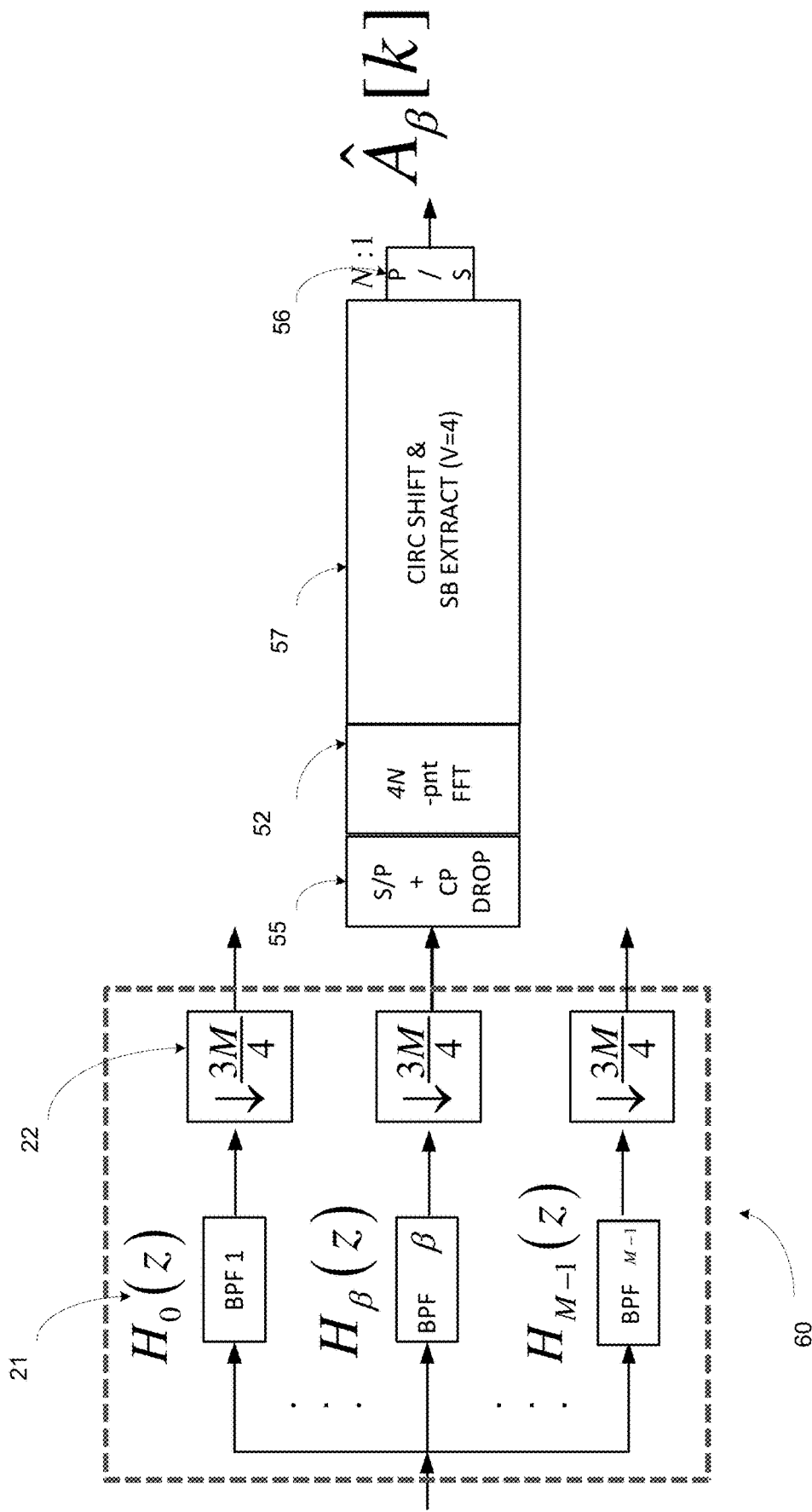
Figure 10C:
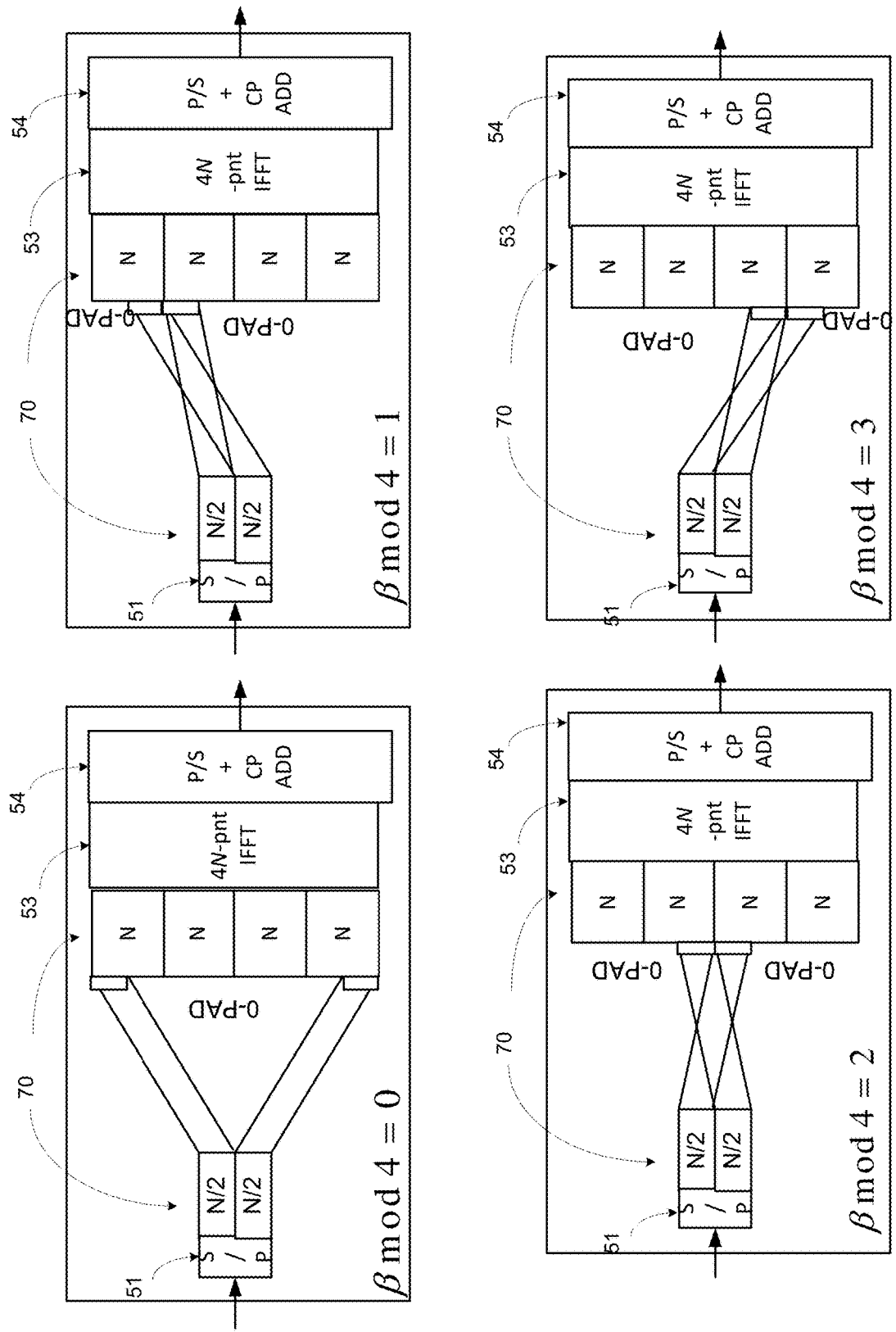
Figure 11:
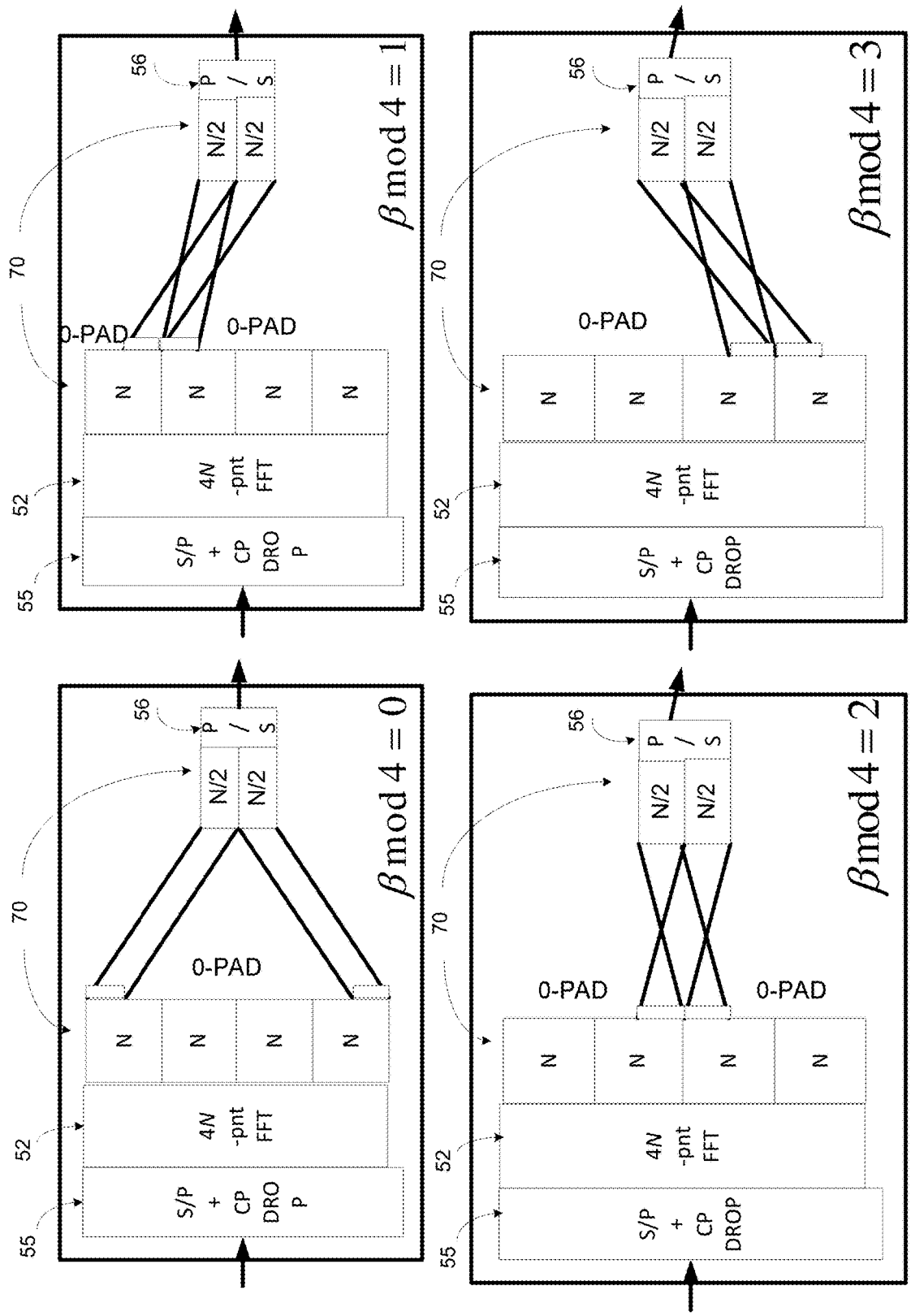

FIGS. 9A-9F address the V=4/3 OS FB based OFDM Tx/Rx. FIG. 9A-9B shows the generic sub-band OFDM Tx/Rx feeding/being fed from the OS synthesis/analysis FB. FIGS. 9C-9F detail the four flavors of sub-band OFDM Tx/Rx resulting for values of β which are classified according to the values of β mod 4 (0,1,2,3 respectively in a one-sided mod representation). FIGS. 9C,9D correspond to the Tx, detailing the routing fabrics performing zero-padding and circularly rotating the records, detailing the routing fabrics while FIGS. 9E,9F correspond to the Rx, detailing the routing fabrics derogating and dropping a part of the records.

FIGS. 10A-10C and 11 address the V=4 OS FB based OFDM Tx/Rx in a similar succession as shown in FIGS. 9A-9F.

Figure 7D:
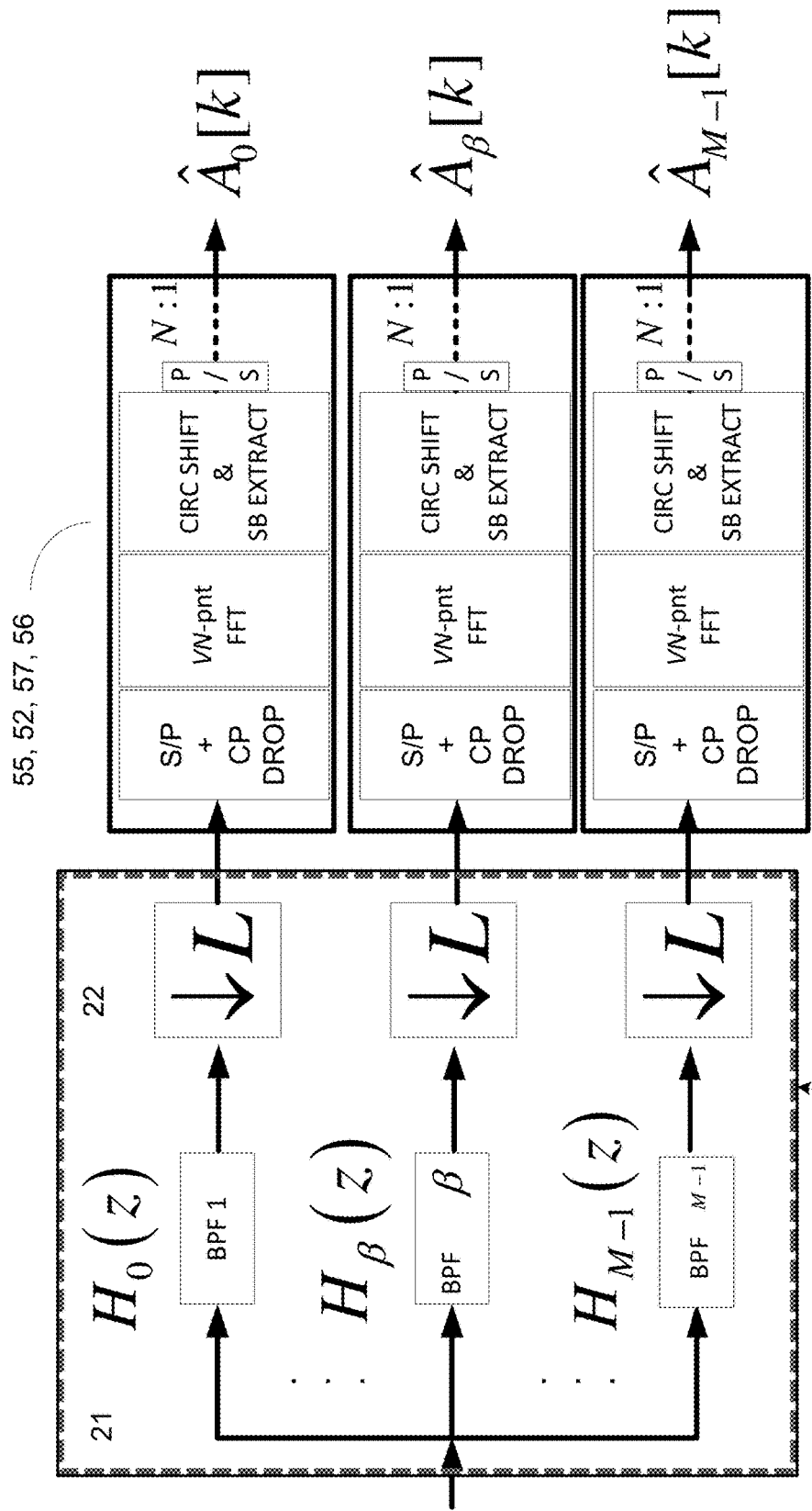
Figure 7E:
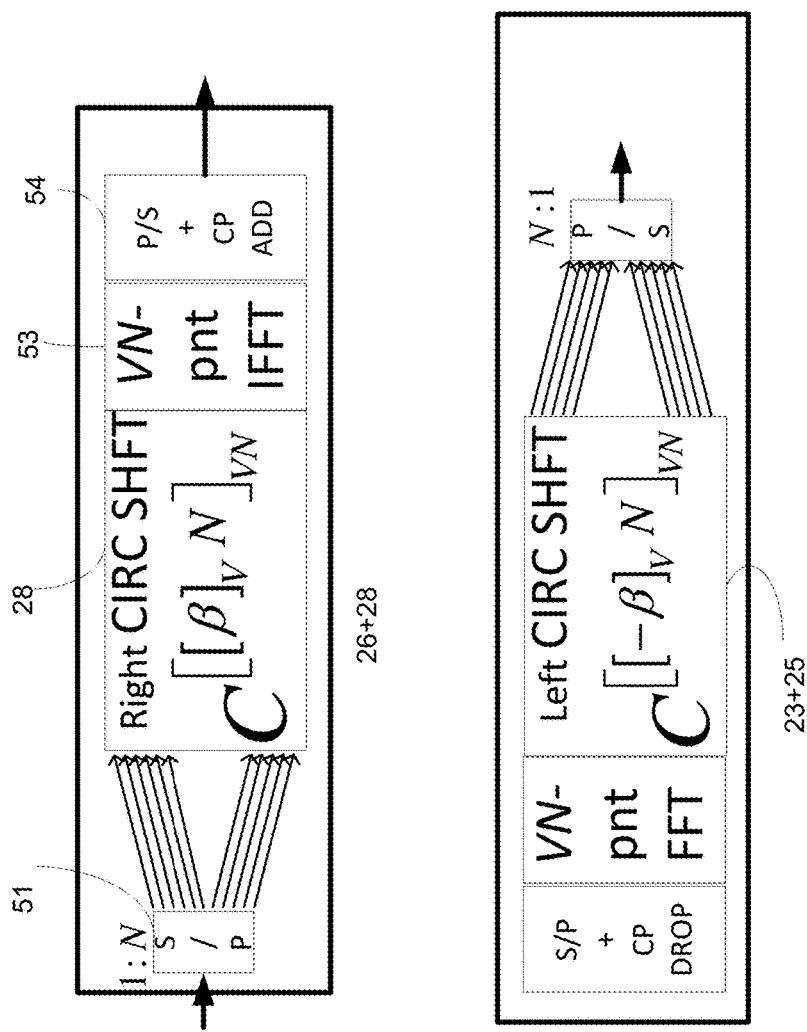
Figure 12:
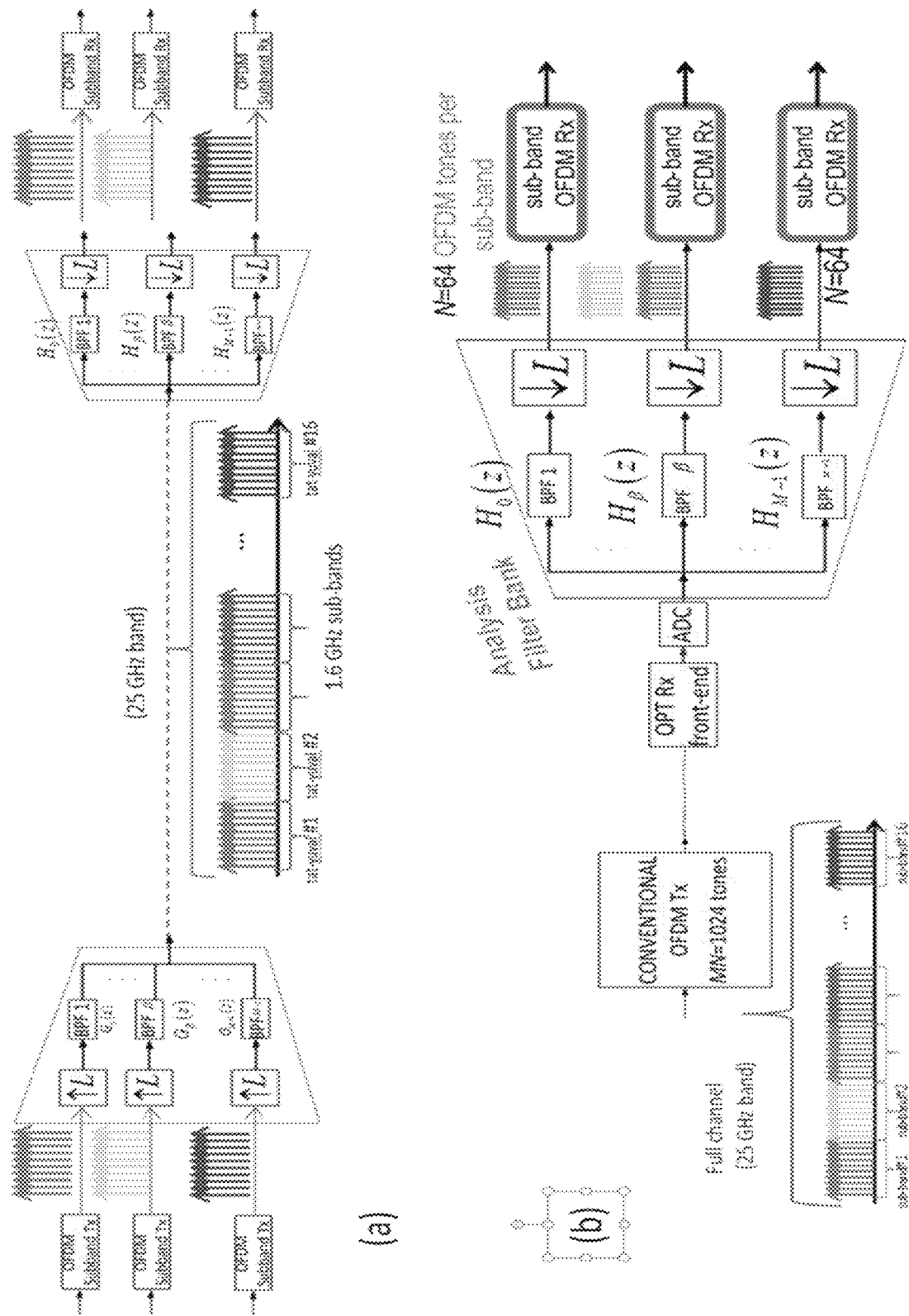
FIG. 12 illustrates an example of a receiver and a transmitter.

FIG. 12 concludes the OFDM transmission over OS FB structures, establishing that it is not necessary to use the OS FB OFDM Tx shown in FIG. 7B, even if our intent is to use the OS FB OFDM Rx in the RHS of FIG. 7D. We may instead use a conventional OFDM Tx over the full channel. In other words, our OS FB OFDM Rx is compatible with a conventional OFDM Tx as shown in the bottom part of the figure. The justification is that the process of FD muxing multiple OFDM signals each containing N sub-carriers, amounts to generating an extended bandwidth (M times spectrally wider) OFDM signal containing MN sub-carriers, as graphically indicated. At the Rx, the analysis FB separates the MN sub-carriers into M groups of N sub-carriers each, with each such group viewed as a "mini-"OFDM signal in itself, which is decoded by a sub-band OFDM Rx, one of M such Rx-s, arranged in a sub-band Rx array processing all the sub-bands in parallel.

Inspecting FIGS. 6A-6B for the OS FB synthesis-analysis chain and FIGS. 7C-7D for the same but in the OFDM case, it is apparent that the V-fold OS synthesis and analysis FBs (the inner two modules in thick dotted lines) are each described as a collection of MBPFs connected to up/down samplers, hence the hardware complexity of multiple BPFs is very high. The objective now is to find equivalent schemes of reduced hardware complexity for these OS FB modules.

Recall that the FB treated here are of the uniform type, namely all the bandpass filters have identical spectral shape but just differ in their uniform positioning along the band at intervals R/MS. The commonality between the filter shapes and the fixed spectral shifts from one filter to the next one suggest that it may be possible to share computational resources between these filters. Indeed, this is well known in prior art for CS FBs [B. Porat, A course in Digital Signal Processing Wiley, 1997] which are amenable to highly efficient implementation using a filter array of M polyphase components of the prototype filter as well as an M-pnt FFT. This implementation is also known in prior art as 'uniform DFT filter bank' Here we proceed to extend the efficient implementation from CS FBs to OS FBs.

Figure 13:
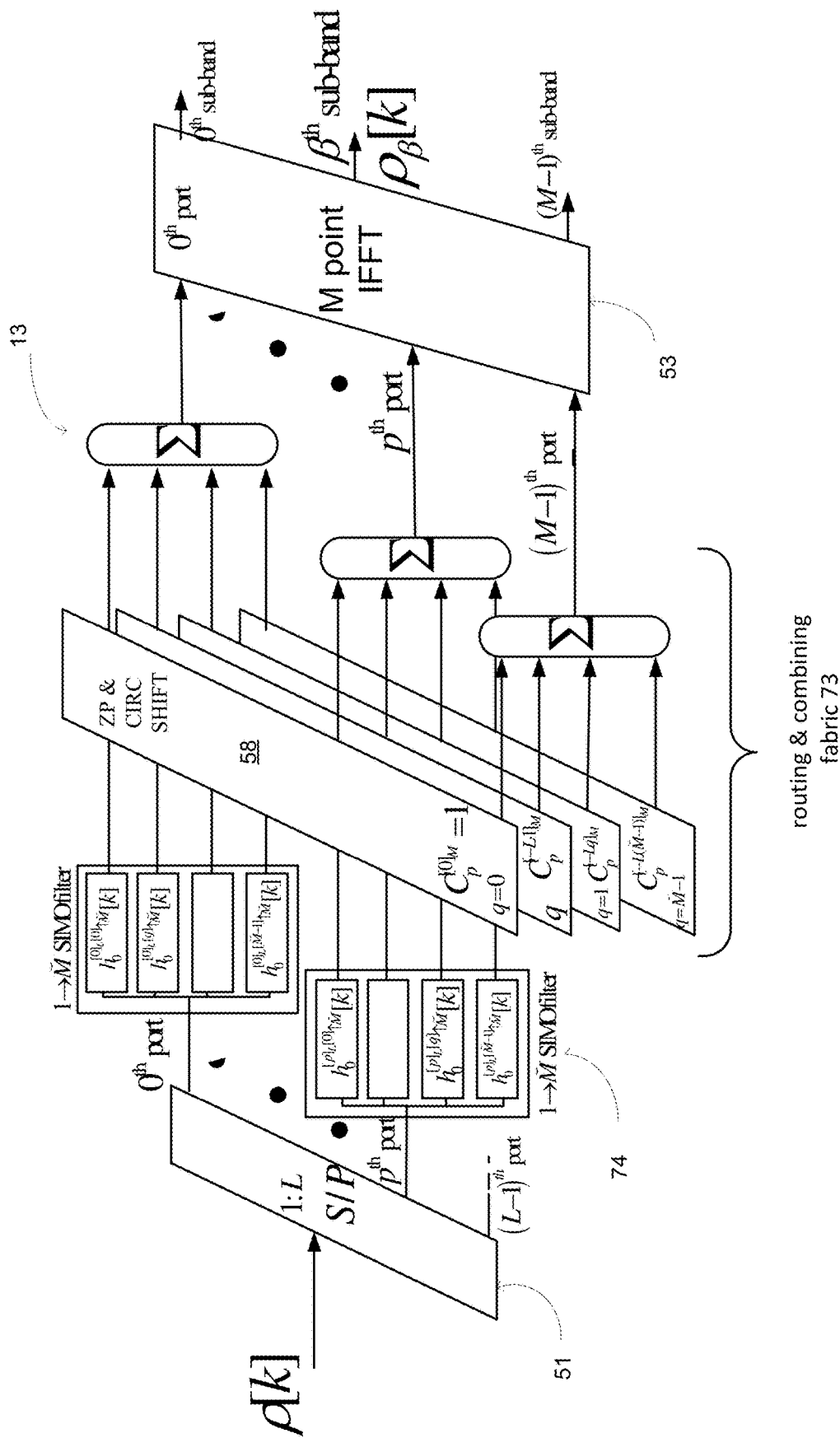

FIG. 13 discloses our embodiment of hardware-efficient implementation for the general V=M/L-fold OS Analysis Filter Bank. Here V>1, i.e. M>L, indicating oversampling of the M filter ports. This implementation is based on an M-pnt IFFT and a discrete-time filter array with impulse responses determined by the sparse polyphase modulo L components of the prototype filter.

The processing starts with a S/P (1:L splitting here rather than 1:M in the CS case), then the S/P outputs feed a polyphase filter array but the filters of the array are now arranged as Single-Input Multiple Output (SIMO) filters. Each such SIMO filter may be viewed as a filter bank of $\acute{M}$ SISO filters with common input. The SISO filters forming the p-th SIMO filter are all fed by a common output, which is the p-th output of the S/P. Here the integer $\acute{M}$ is the numerator obtained by reducing the fraction V=M/L, i.e. $\acute{M}$ is given by the ratio of M and the largest common divisor of M and L. Equivalently, we define $\acute{M}$, $\acute{L}$ as two relatively prime integers in the same ratio as M and L: V≡M/L=$\acute{M}$/$\acute{L}$, e.g. if (M,L)=(16,12), then ($\acute{M}$,$\acute{L}$)=(4,3).

The impulse responses of these SISO filters forming the SIMO filters will be specified below in terms of the polyphase components of the prototype filter impulse response. The SISO filters may be viewed as organized in a 2D array of dimension L×$\acute{M}$. Each of the L columns of this array of filters comprises $\acute{M}$ SISO filters forming a SIMO filter. We use the index q=0, 1, 2, ... $\acute{M}$−1 as a vertical label for the SISO filters within the p-th SIMO filter. The (p,q)-th SISO filter is denoted $h_0^{(p,q)}[k]$, labeled in terms of its coordinates (p,q) in the 2D filter array. According to the teaching of this invention, the (p,q)-th filter is specified as the sparse double polyphase component of the impulse response $h_0[k]$ of the prototype filter as follows:

$$h_0^{(p,q)}[k] = h_0^{[p]L[q]\acute{M}}[k] = D^q\{\uparrow \acute{M}\{x[L\acute{M}k + Lq + p]\}\}. \quad (2)$$

Therefore the SISO filters forming the $p_0^{th}$-th SIMO filter are $$\left\{h_0^{[p_0]L[q]} \uparrow \acute{M}[k]\right\}_{q=0}^{\acute{M}-1}.$$

Due to the sparse double polyphase nature of the filters, the total number of non-zero taps in this L×$\acute{M}$ array of sparse filters equals the number of taps P, of the LPF prototype filter. All SIMO filters operate at a rate which is a fraction 1/L of the input rate R into the filter bank (equal to the rate at each S/P output), thus the number of taps to be evaluated per second is PR/L and the number of taps to be evaluated per unit input sample is P/L.

The L×$\acute{M}$ outputs of array of filters are organized into $\acute{M}$ rows of L signals each, and each row is presented to one of the $\acute{M}$ ZP&CIRC SHIFT modules, which are vertically stacked above one another in the 3D representation of the figure. The ($q_0$)-th ZP&CIRC SHIFT module operates on the outputs $\rho^{[p]L}[k] \otimes h_0^{(p,q_0)}[k]$ of the L filters specified by (p,$q_0$), p=0, 1, 2, ..., L−1, according to $C_p^{[-Lq]M}\{(\rho^{[p]L}[k] \otimes h_0^{(p,q_0)}[k])^{ZP[p]:L \to M}\}$, i.e., it zero-pads the L-pnt vector of outputs to length M i.e. the index p is extended over the range p=0, 1, 2, ..., M−1 with the subset of values for p=L, L+1, ..., M−1 set to zero. Then a circular shift with the shift parameter given by $[-Lq]_M$ is performed upon the zero-padded M-pnt vector. This completes the description of the ZP&CIRC SHIFT modules.

Next, the signals coming out of the ZP&CIRC SHIFT modules (horizontal rows) are organized into vertical columns and the elements of each column are summed up. The outputs of the M summers are input into an M-pnt IFFT.

We note that each cyclic shifts just represents a fixed permutation of the L-input ports into L of the output ports, meaning that each row of outputs of the polyphase filters array may be just mapped into a permuted way onto M outputs providing the final vector to be applied to the M adders. Thus there is no hardware penalty as data does not need to be shuffled in real-time in actual buffers as in some prior art filter bank implementation. Rather each ZP& CIRC SHIFT routing fabric simply represents here a static wiring arrangement of L inputs to M outputs including zero-padding of M−L of the outputs.

The following final mathematical formula compactly specifies our highly efficient implementation of the V=M/L fold oversampled filter bank:

$$\rho_\beta[k] = {}^\beta IDFT_p^{M\text{-}pnt}\left\{\sum_{q=0}^{M-1} C_p^{[-Lq]M}\left\{\left(\rho^{[p]L}[k] \otimes h_0^{[p]L[q]} \uparrow \acute{M}[k]\right)^{ZP:L \to M}\right\}\right\} \quad (3)$$

where $\rho[k]$ is the input of the OS analysis FB, $\rho_\beta[k]$ is the $\beta^{th}$ sub-band output of the OS analysis FB, $\rho^{[p]L}[k]$ is the p-th output of the 1:L S/P, ⊗ denotes convolution, and the filter impulse responses are given by the sparse double polyphases of the prototype filter as specified in Eq. (2). Eq. (3) fully specifies our OS analysis FB efficient processing and is equivalent to the block diagram of FIG. 13.

We next consider some specific special cases for various values of the OS parameter, V:

V=M/L=4/3, $\acute{M}$ =4
V=M/L=4, $\acute{M}$ =4
V=M/L=2, $\acute{M}$ =4

Figure 14:
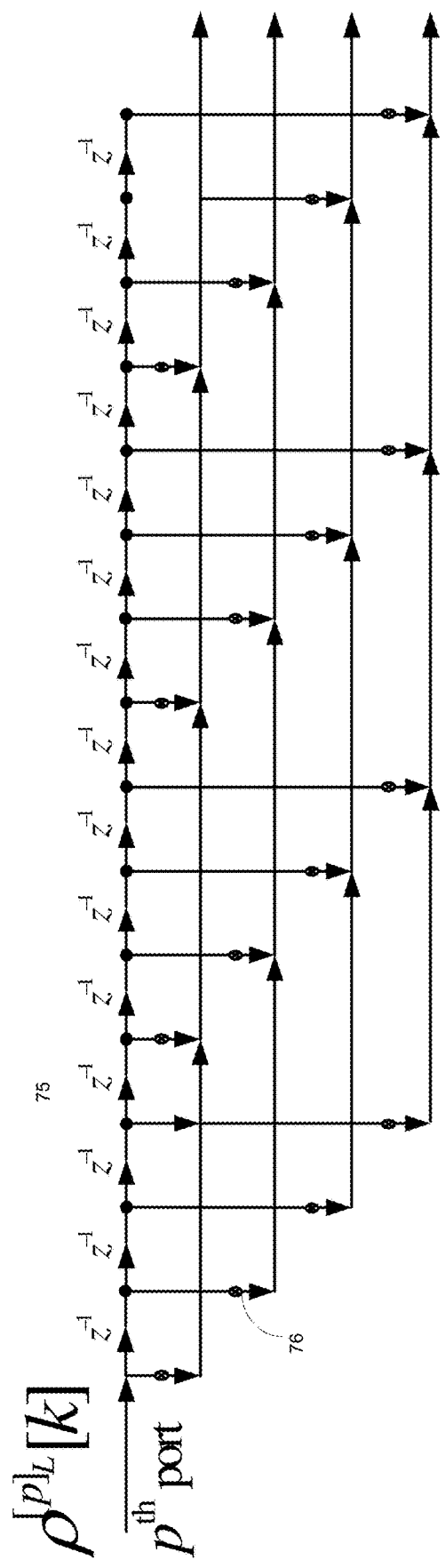
FIG. 14 illustrates an example of filters.

FIG. 14 considers an efficient implementation of the SIMO filters for the first two cases V=4/4=1 and V=4/1=4 for both of which we have $\acute{M}$ =4, i.e., each SIMO filter maps its input into four outputs. As the composing SISO filter responses are sparse, many of the taps of these filters are zero. Although there is no computational impact due to the presence of the filling zeros, it would nevertheless be more compact in terms of structuring the processing to have a lower number of non-sparse filters. The concept according to the teachings of this invention is to replace each row of $\acute{M}$ vertically stacked sparse polyphase filters by a single 1 by $\acute{M}$ SIMO-interleaved (SIMO ILV) filter, where the interleaving terminology describes how the wires leading to the multiplicative taps are interleaved as shown.

Although this could be shown in full generality, in FIG. 14 we exemplify the general case for $\acute{M}$ =4. The generalization to arbitrary values of $\acute{M}$ is evident. In the implementation shown in figure the null taps are eliminated by using a common delay line (chain of $z^{-1}$ delays) and tapping the various points along the line as shown. Multiple lines converging on a node represent here a summation node. The values of the taps are represented in three different ways, unstructured in terms of the original polyphases modulo L of the prototype filter, or structured as double polyphases mod-L mod-4, or structured in terms of polyphases mod-4L based on the relation This figure illustrates the following filters:

$$h_0^{[Lq+p]}{}_{LM}[k] = h_0^{[p]L[q]}{}_{M}[k]$$

which for $\dot{M} = 4$ reduces to
$h_0^{[Lq+p]4L}[k] = h_0^{[p]L[q]4}[k]$.

Now the structure is no longer sparse. There are 16 taps (complex multipliers shown by little circles) connected to the successive nodes from left to right along the delay line. Each delay element output (as well as the initial delay element input) feeds a taps. The taps from left to right are given by the following formulas:

$h^{[p]LM\square}[0] = h_0^{[p]L[0]4}[0] = h_0^{[p]L}$    [0]

$h_0^{[L+p]4L}[0] = h_0^{[p]L[1]4}[0] = h_0^{[p]L}$    [1]

$h_0^{[2L+p]4L}[0] = h_0^{[p]L[2]4}[0] = h_0^{[p]L}$    [2]

$h_0^{[3L+p]4L}[0] = h_0^{[p]L[3]4}[0] = h_0^{[p]L}$    [3]

$h_0^{[p]4L}[1] = h_0^{[p]L[0]4}[1] = h_0^{[p]L}$    [4]

$h_0^{[L+p]4L}[1] = h_0^{[p]L[1]4}[1] = h_0^{[p]L}$    [5]

$h_0^{[2L+p]4L}[1] = h_0^{[p]L[2]4}[1] = h_0^{[p]L}$    [6]

$h_0^{[3L+p]4L}[1] = h_0^{[p]L[3]4}[1] = h_0^{[p]L}$    [7]

$h_0^{[p]4L}[2] = h_0^{[p]L[0]4}[2] = h_0^{[p]L}$    [8]

$h_0^{[L+p]4L}[2] = h_0^{[p]L[1]4}[2] = h_0^{[p]L}$    [9]

$h_0^{[2L+p]4L}[2] = h_0^{[p]L[2]4}[2] = h_0^{[p]L}$    [10]

$h_0^{[3L+p]4L}[2] = h_0^{[p]L[3]4}[2] = h_0^{[p]L}$    [11]

$h_0^{[p]4L}[3] = h_0^{[p]L[0]4}[3] = h_0^{[p]L}$    [12]

$h_0^{[L+p]4L}[3] = h_0^{[p]L[1]4}[3] = h_0^{[p]L}$    [13]

$h_0^{[2L+p]4L}[3] = h_0^{[p]L[2]4}[3] = h_0^{[p]L}$    [14]

$h_0^{[3L+p]4L}[3] = h_0^{[p]L[3]4}[3] = h_0^{[p]L}$    [15]

Each of these formulas contains three equal expressions based on polyphases mod-4L, double polyphases mod-4 of polyphases mod-2 and polyphases mod-L.

Figure 15:
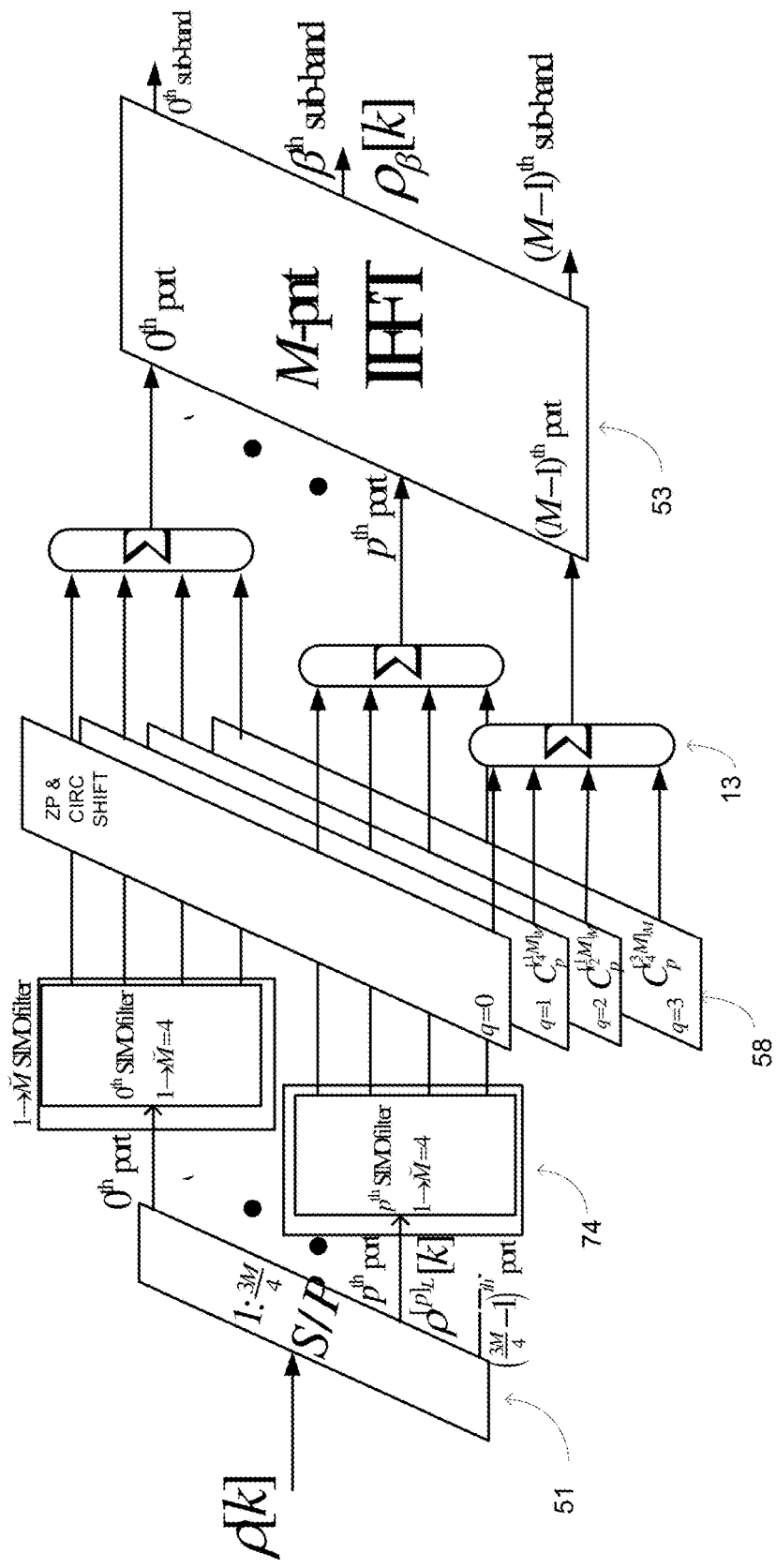

FIG. 15 considers the reduction of the general efficient analysis FB structure of FIG. 13 to the special case of an OS analysis FB with V=M/L=4/3, $\dot{M}$ =4. Here the SIMO filters may be realized as in FIG. 14. The figure also specifies the circular shift operators used after zero padding, marked onto each of the ZP&CIRC SHIFT modules. These shifts are obtained by substituting L=¾M in the general $C_p^{[-Lq]M}$ form: for $$V = M/L = 4/3: \; C_p^{[-Lq]_M} = C_p^{[-\frac{3}{4}Mq]_M} = \begin{cases} C_p^{[-\frac{3}{4}M \cdot 0]_M} = 1; q=0 \\ C_p^{[-\frac{3}{4}M \cdot 1]_M} = C_p^{[\frac{1}{4}M]_M}; q=1 \\ C_p^{[-\frac{3}{4}M \cdot 2]_M} = C_p^{[\frac{1}{2}M]_M}; q=2 \\ C_p^{[-\frac{3}{4}M \cdot 3]_M} C_p^{[\frac{3}{4}M]_M}; q=3 \end{cases}$$

Figure 16:
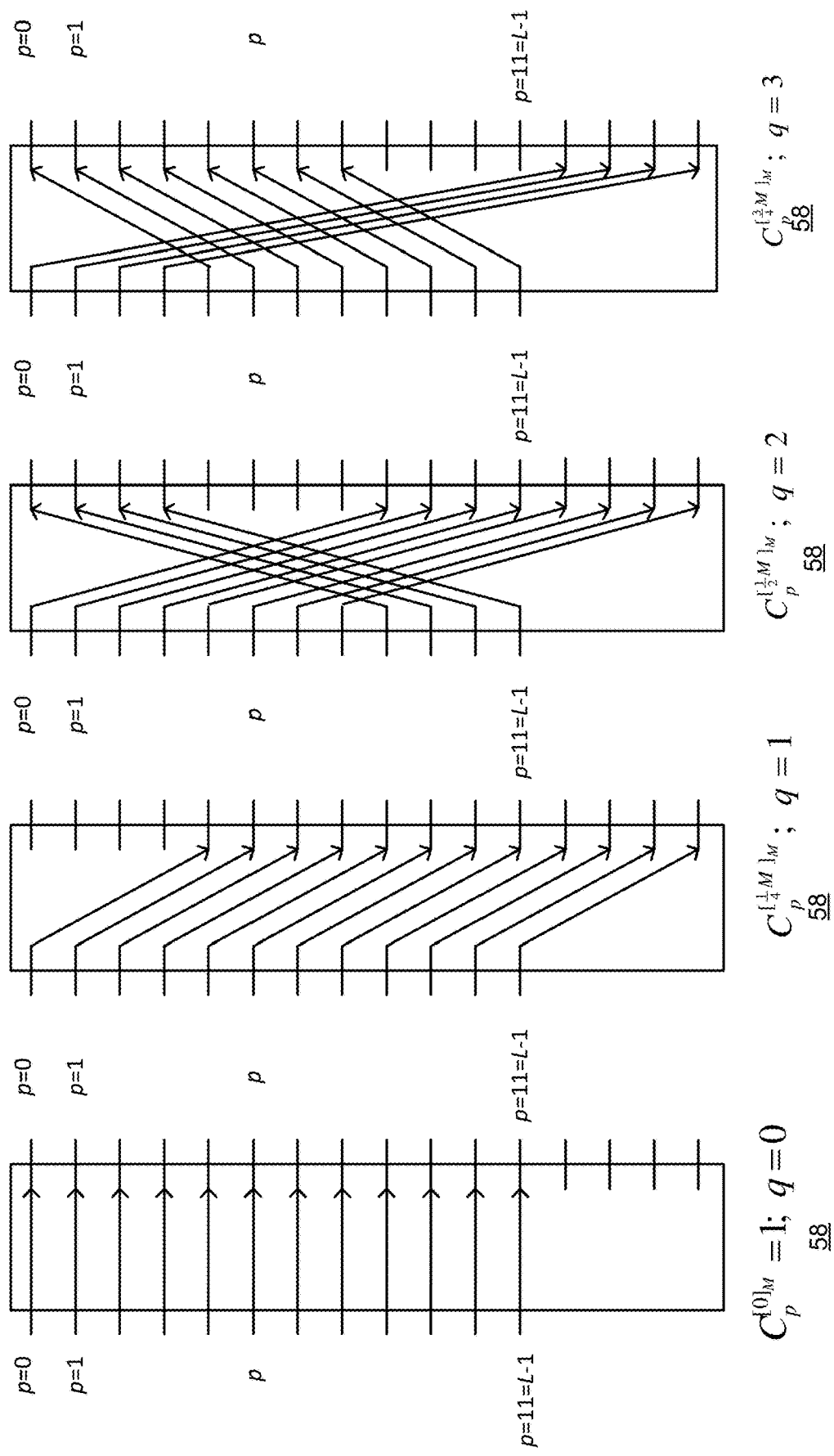
FIG. 16 illustrates a routing fabric.

FIG. 16 describes the routing fabric (wiring of inputs to outputs) corresponding the circular shifts $$\left\{1, C_p^{[\frac{1}{4}M]_M}, C_p^{[\frac{2}{4}M]_M}, C_p^{[3M]_M}\right\}$$

indicated in the last formula, as applicable to V=4/3-fold OS analysis FB of FIG. 15. The four routing fabrics comprise uniform right cyclic shifts given by {0, ¼M, ½M, ¾M} applied to the bottom-zero-padded M-points vector obtained from each row of 3M/4 outputs of the polyphase filter array.

The drawing considers the specific realization of the four ZP&CIRC SHIFT modules for L=16, M=16, though it is evident how to extend it for any value of M divisible by 4, by partitioning the output ports into four segments of M/4 ports each, and partitioning the input ports into three segments of M/4 ports each. The injective mapping of 3M/4 inputs into M outputs corresponds to the mapping of three segments into four segments in the manner shown.

Figure 17:
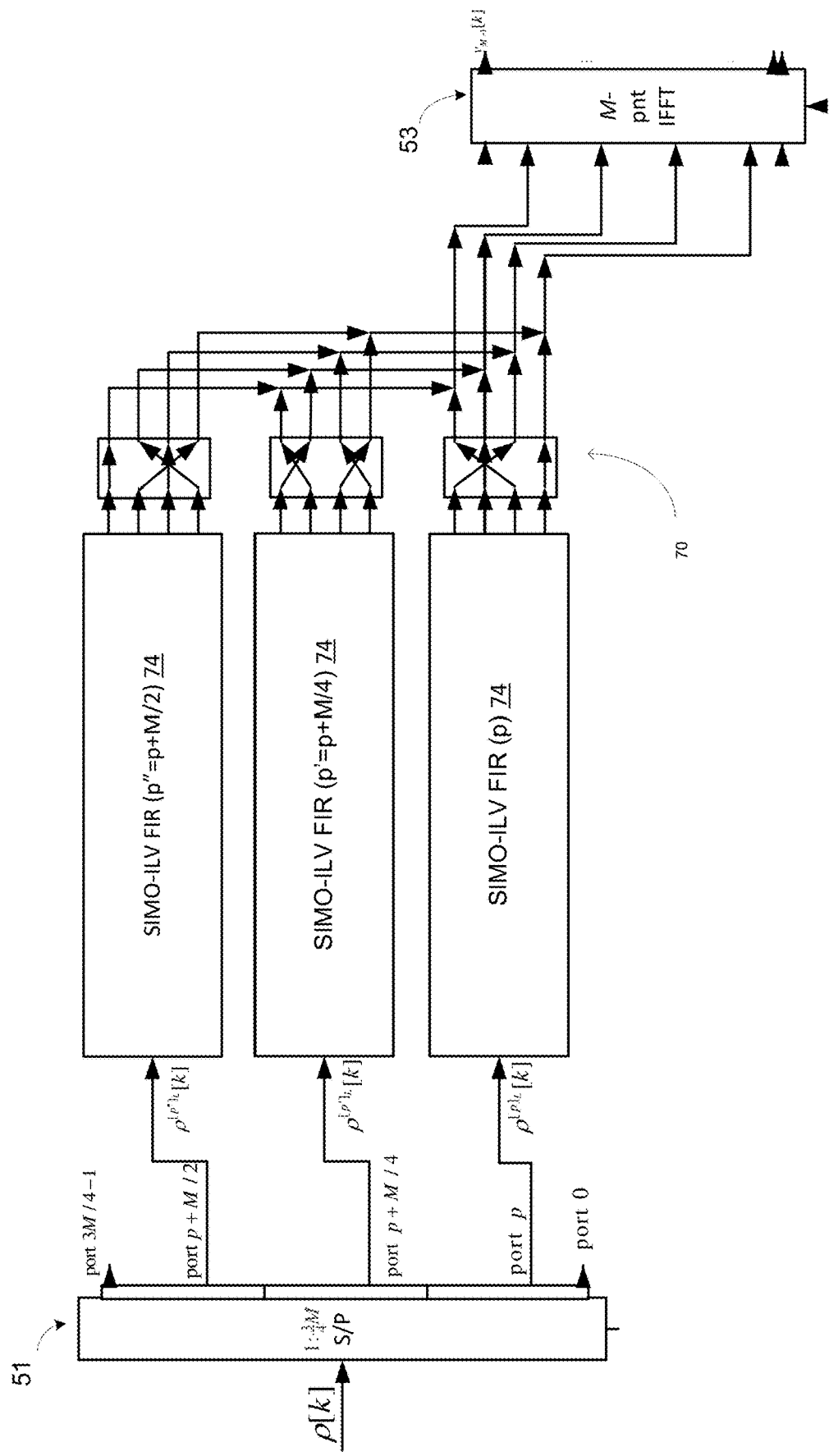

FIG. 17 also addresses the efficient OS analysis FB implementation for the V=M/L=4/3, $\dot{M}$ =4 case, presenting an alternative equivalent 2D layout of the 3D layout of FIG. 15, obtained by re-arranging the ZP&CIRC SHIFT and adders.

The processing is partitioned here in terms of polyphases modulo 4 of the P/S output ports and likewise polyphases modulo M/4 of the IFFT input ports. For each value of p modulo M/4 three of the polyphase filters participate, being fed by three consecutive values of the p-th polyphase modulo 4. The four respective outputs of each of the SIMO filters are permuted as shown and are then added up (multiple lines converging on a node denote addition). The four summing junction outputs are mapped onto four consecutive inputs of the IFFT, with indexes separated by M/4 as shown.

Figure 18A:
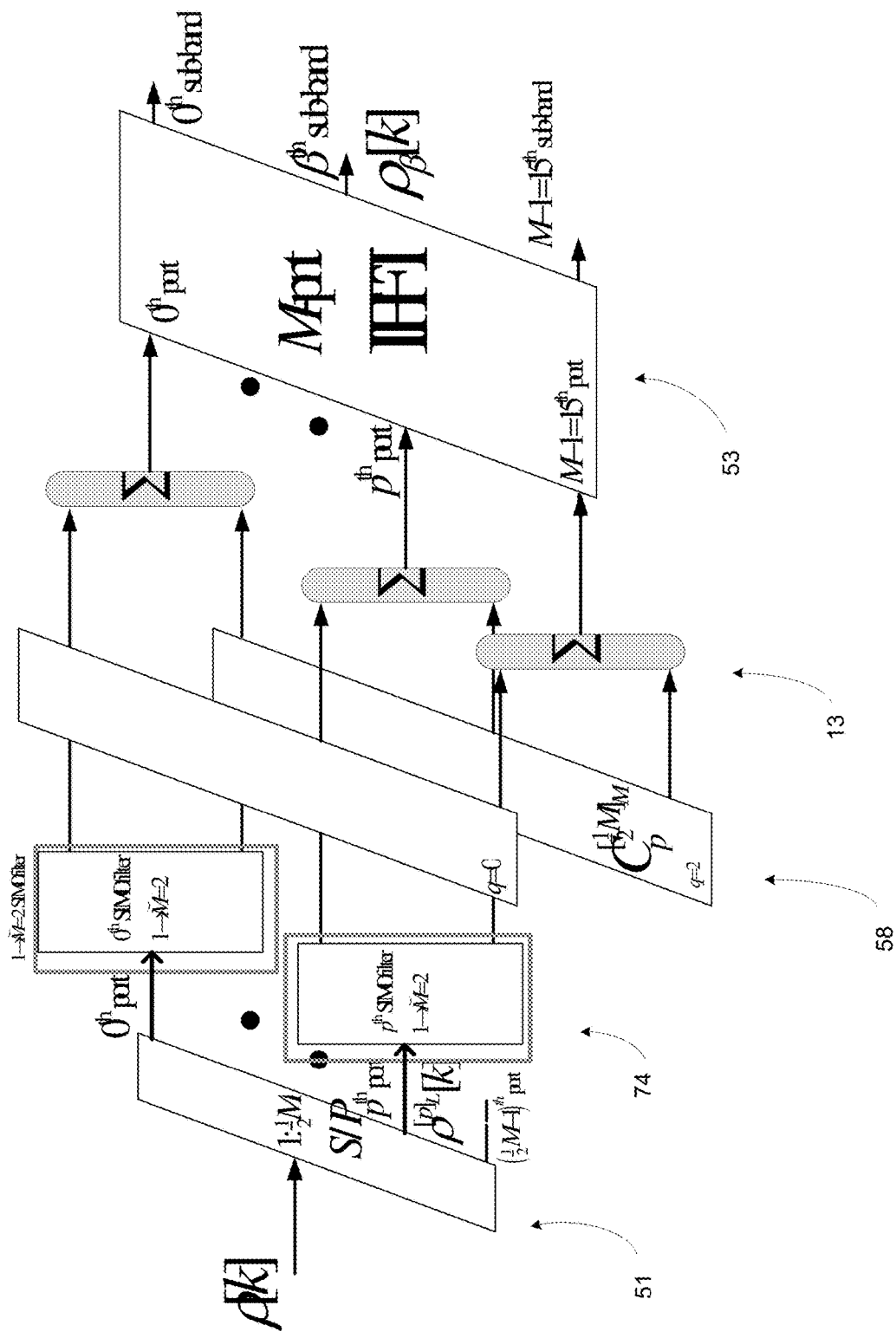
Figure 18B:
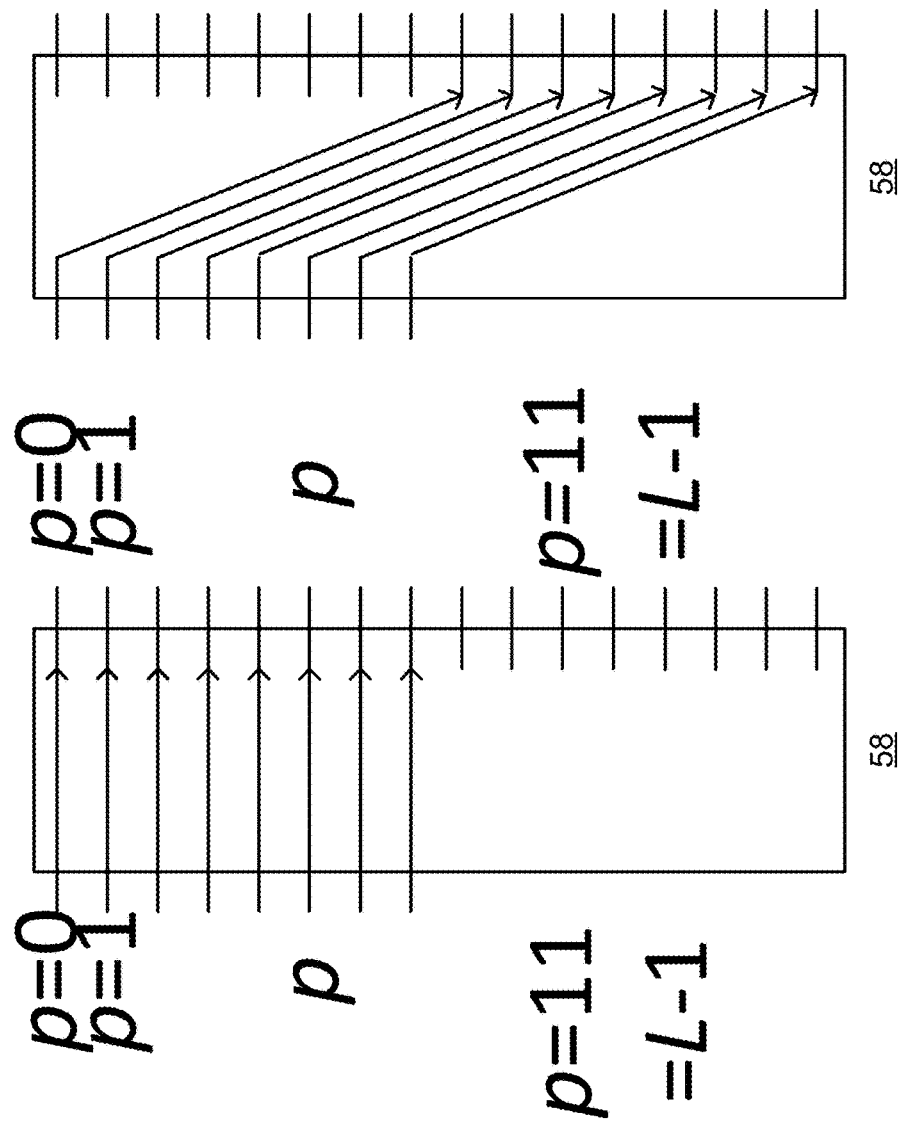
Figure 18C:
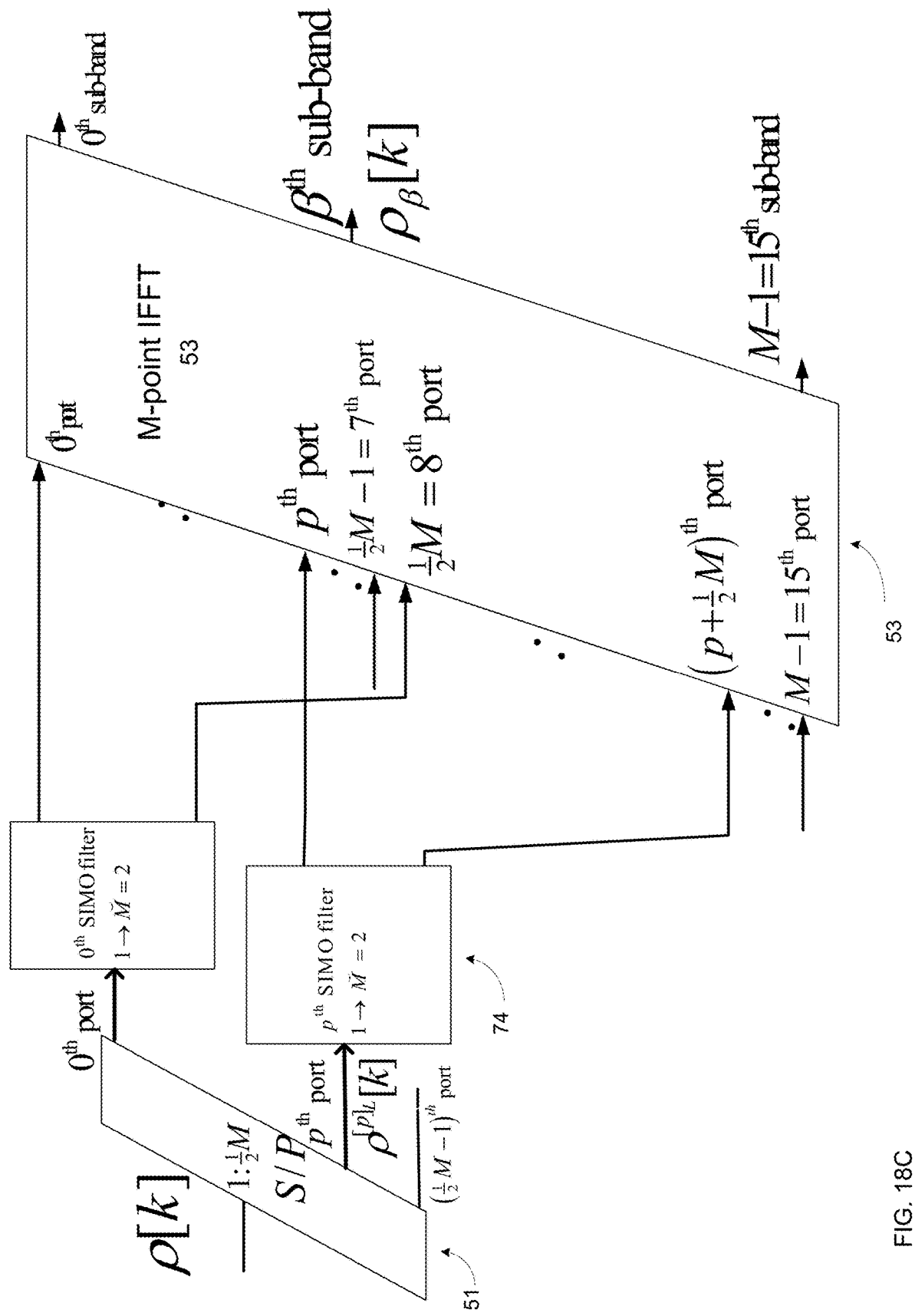

FIGS. 18A-18C proceed to address the efficient OS analysis FB implementation for the V=M/L=2, $\dot{M}$ =2, L=M/2 case. For definiteness the specific case of M=16 is further assumed, though the labeling in the drawing also corresponds to a generic M value. Now, as $\dot{M}$ =2, the SIMO filters become Single Input Dual Output (SIDO) ones, and there are just two ZP&CIRC SHIFT modules, with circular shifts given by $$C_p^{[-Lq]_M} = C_p^{[-\frac{1}{2}Mq]_M} = \begin{cases} C_p^{[-\frac{1}{2}M \cdot 0]_M} = 1; q=0 \\ C_p^{[-\frac{1}{2}M \cdot 1]_M} = C_p^{[\frac{1}{2}M]_M}; q=1 \end{cases}$$

Thus, as shown in FIG. 18B the top ZP&CIRC SHIFT module comprises just the zero padding copying the M/2 inputs into the first M/2 outputs and adding M/2 zeros underneath, whereas the bottom one corresponds to mapping the M/2 inputs into the lower half of the output M points, with the top half consisting of zeros.

Notice that the M/2 non-zero elements in the two M-pnt outputs of the two ZP&CIRC SHIFT modules do not overlap in index. This means that the 2-pnt adders are always presented with a single non-zero input, while the other input is zero, thus the adders may be discarded and the non-zero inputs which were supposed to go into the adders may be directly routed to the input of the IFFTs where the adder was supposed to be connected. This implies that the ZP&CIRC SHIFT modules as well as the adders may be discarded. Instead, as shown in FIG. 18C, the upper outputs (labeled q=0) collected from all the L=M/2 SIDO filters are then directly mapped onto the top half of M/2 inputs of the IFFT, while the bottom outputs (labeled q=1) of the L=M/2 SIDO filters are directly mapped onto the bottom half of M/2 inputs into the IFFT.

Figure 19A:
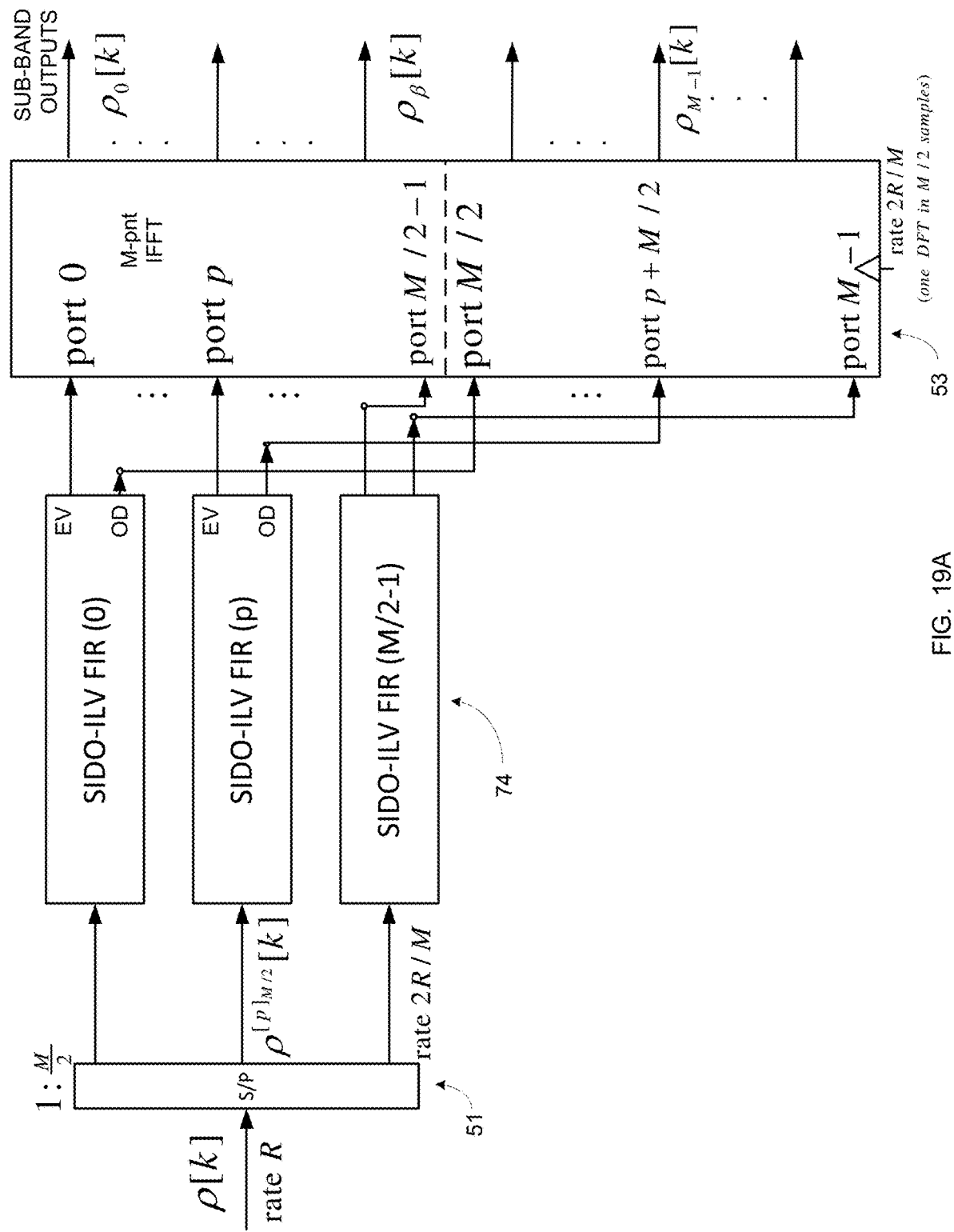
Figure 19B:
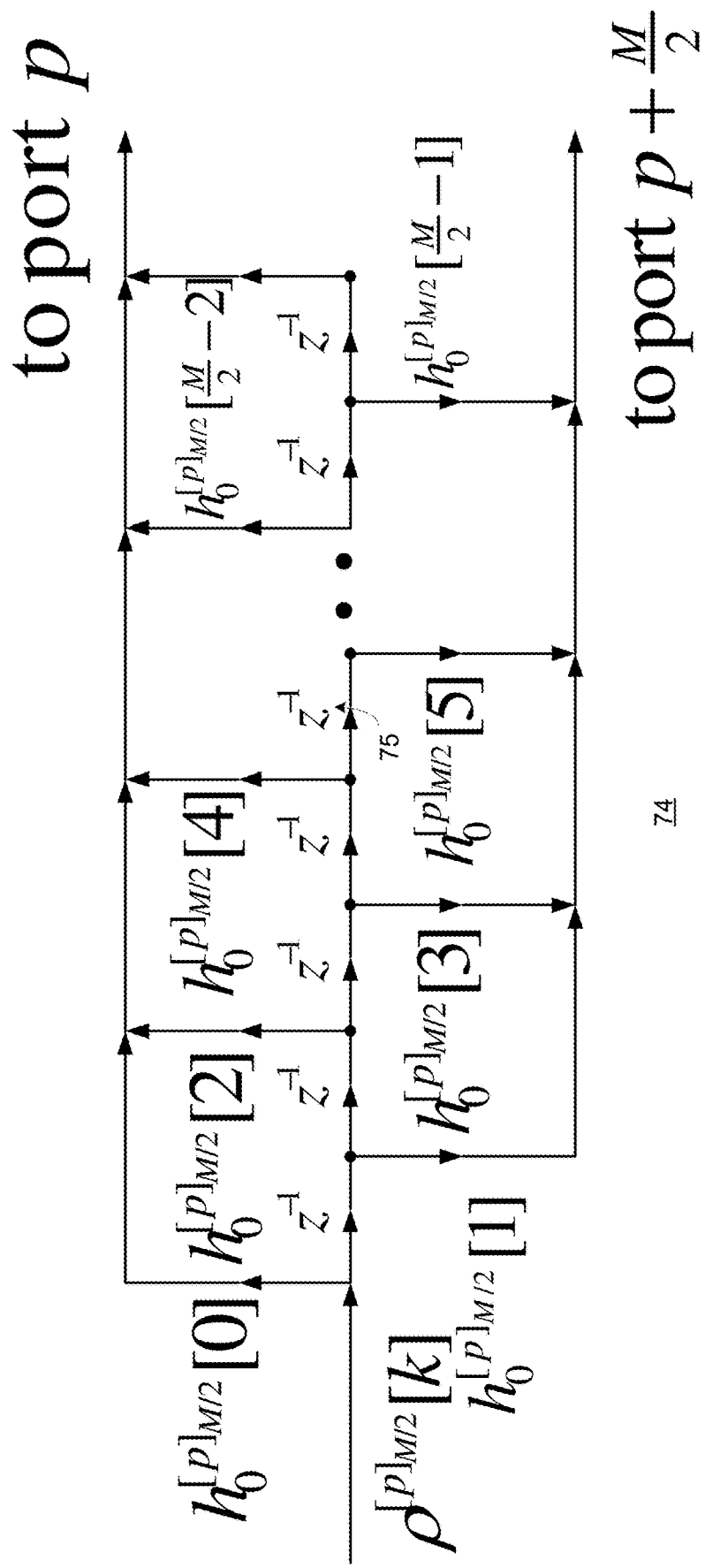
Figure 19C:
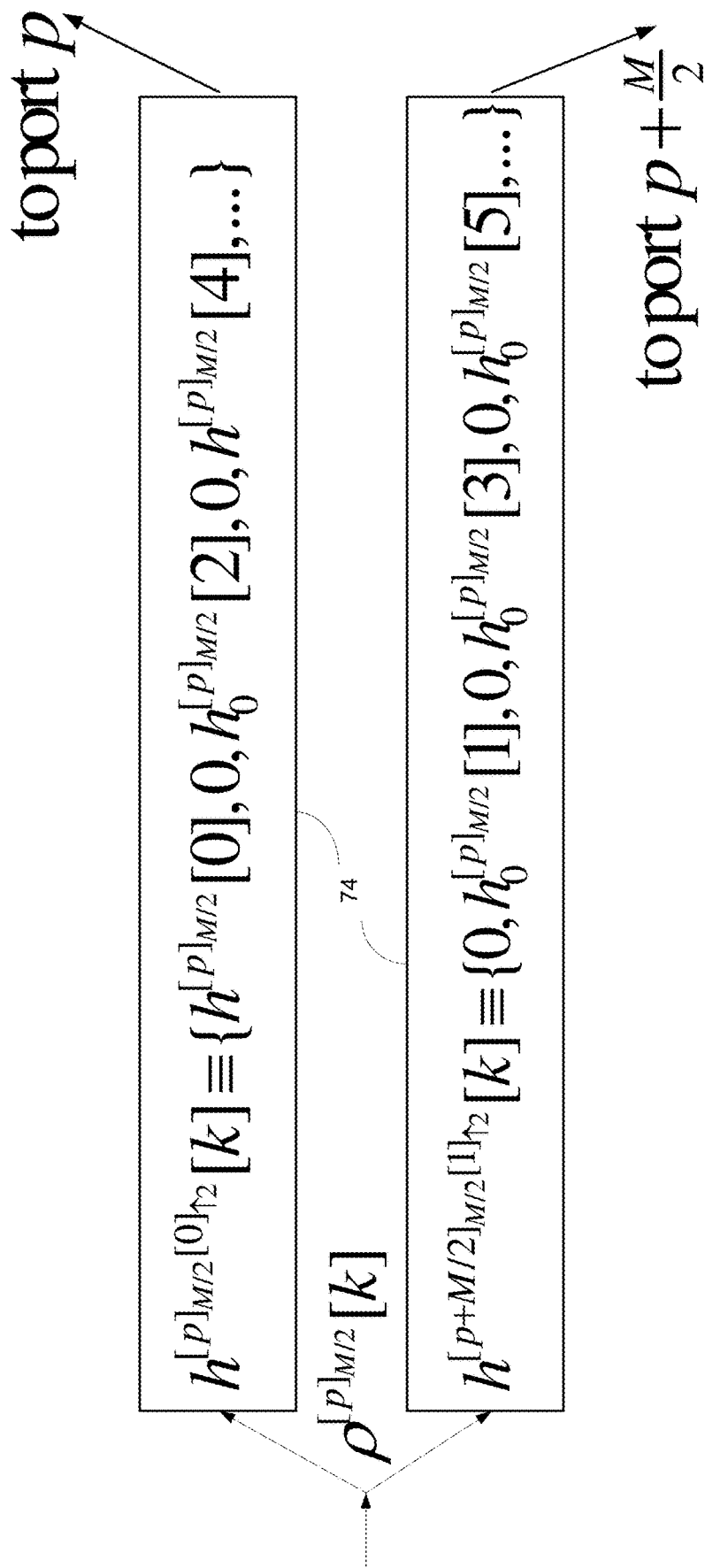

FIGS. 19A-19C present a planar block diagram layout equivalent to the 3D diagram of FIGS. 18A-18C. FIG. 19A is based on L=M/2 SIDO-ILV filters with inputs fed by the L=M/2 outputs of the S/P, and the pair of outputs of the p-th filter are connected to the p-th and (p+M/2)-th input ports of the IFFT. FIGS. 19B-19C detail two alternative equivalent implementations of the SIDO filters.

Figure 20:
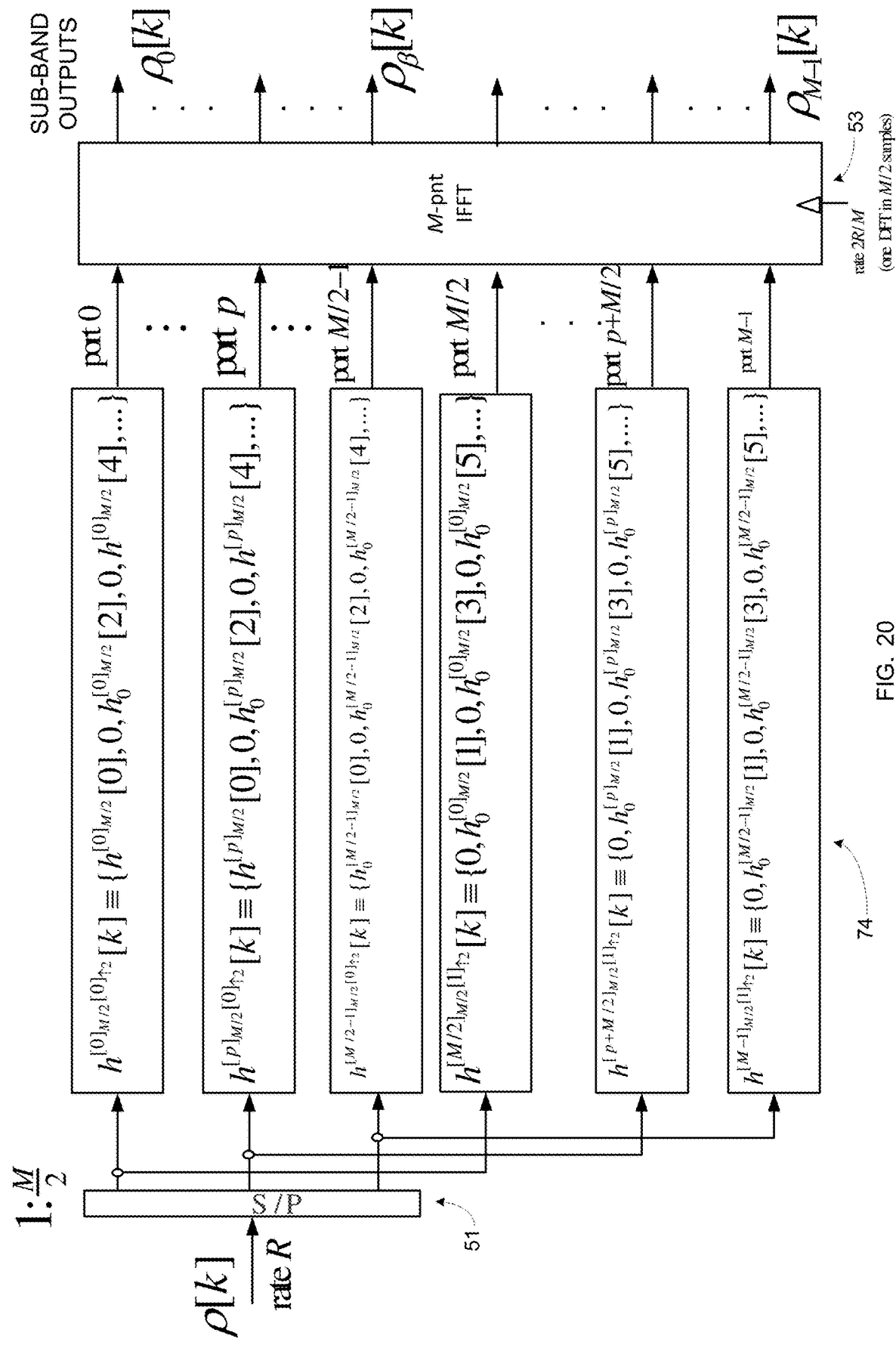

FIG. 20 shows an alternative embodiment of the efficient OS analysis FB implementation for the v=m/L=2, $\tilde{M}$=2, L=M/2 case. This embodiment is based on an array of M filters with impulse responses given by the sparse double polyphase components modulo 2 of the polyphase components modulo M/2 of the prototype filter impulse response, the definition of which is repeated here: Even/Odd (sparse) polyphases of the polyphase components modulo M/2 of the prototype filter h$_0$ [k]:
h$_0^{[p]M/2[q]_2}$[k]=h$_0$[½M(2k+q)+p]
h$_0^{[p]M/2[q]↑2}$[k]=D$^q${↑2{h$_0$ [½M(2k+q)+p]}}

This figure may be derived from FIG. 19C viewing each SIDO filter as a pair of SISO filters in parallel (each given by the corresponding sparse double polyphase components), then modifying the resulting block diagram by moving the pair of SISO filters without altering the topology, say, having the first SISO filter of the p-th SIDO filter drawn opposite to the p-th input to the IFFT while the second SISO filter of the p-th SIDO filter is drawn opposite to the (p+M/2)-th IFFT input. The two block diagrams of FIGS. 19A and 20 have the same computational complexity, though FIG. 19A with SIDO filters given by 19B may be more compact to realize as it avoids the zero taps and shares the delay lines across the two SISO filters forming each SIDO filter.

Figure 21:
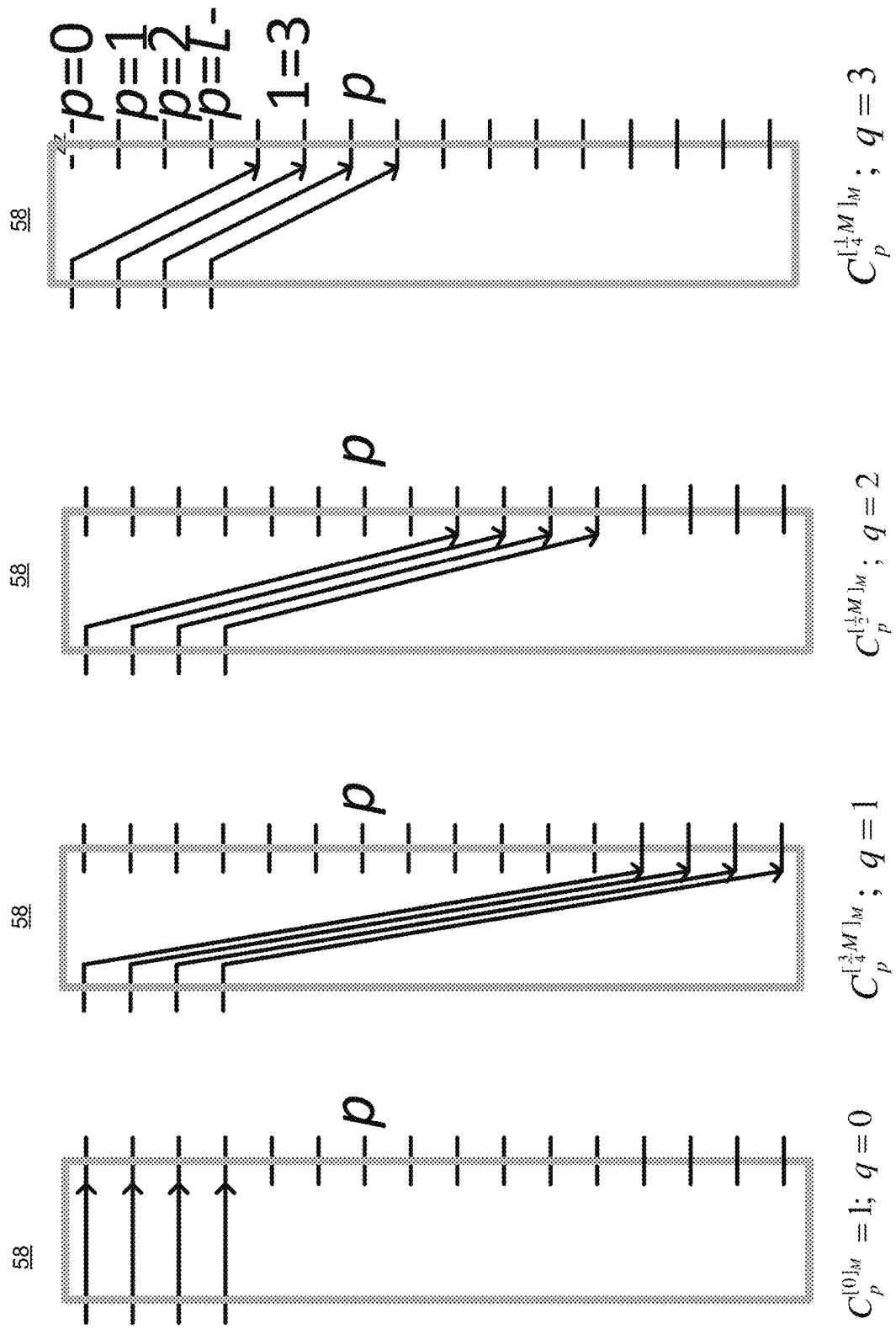
Figure 22:
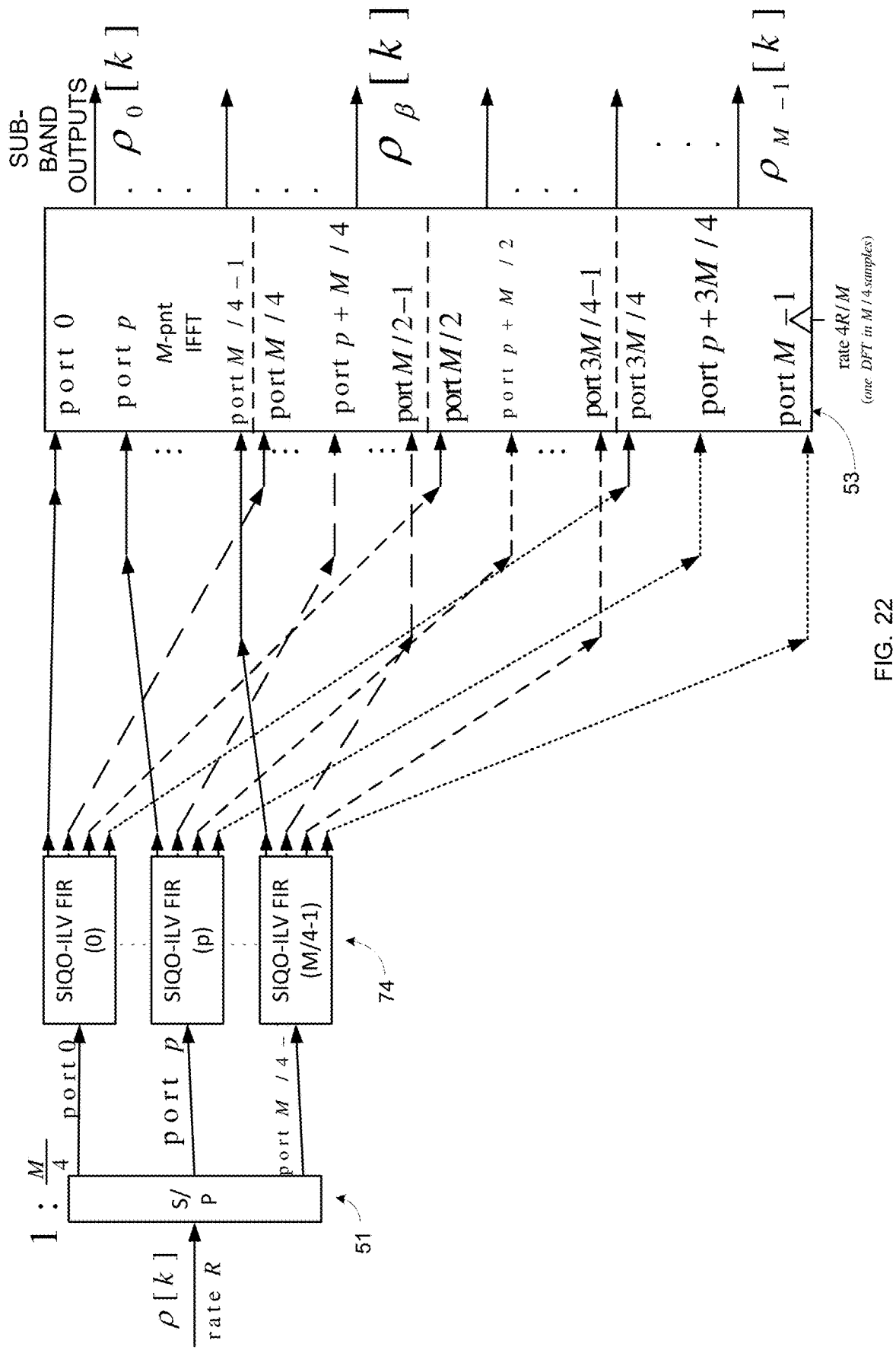

FIGS. 21,22 proceed to address the efficient OS analysis FB implementation for the V=M/L=4, $\tilde{M}$=4, L=M/4 case, starting with specifying in FIG. 21 the routing fiber corresponding V=4. For definiteness the specific case of M=16 is further assumed, though the labeling in the drawing also corresponds to a generic M value.

As the value of $\tilde{M}$=4 is identical to that obtained for the previously treated V=4/3 case, a routing fabric structure similar to that of FIG. 16 will be obtained in FIG. 21, also featuring 1 by 4 SIMO filters as well as four ZP&CIRC SHIFT modules though now the number of SIMO filters and the number of inputs into each ZP&CIRC SHIFT module is M/4 rather than 3M/4. The SIMO filters are identically wired internally, i.e. the diagram of FIG. 14 equally applies to the two cases V=4/3 and V=4, however as the values of L are different (L=3M/4 vs. L=M/4), the polyphases from which the taps are derived are also different, hence the resulting taps values are different. The respective sets of taps in the two respective cases are obtained by substituting L=3M/4 vs. L=M/4 in the tap formulas which were specified above for FIG. 14. The current FIG. 21 describes the structure of the four ZP&CIRC SHIFT modules for the current V=4 case, which now differ from the those shown in FIG. 16 for the previous V=4/3 case. Now there are evidently just L=M/4 non-zero inputs, and the applicable circular shifts are now given by:
for V=M/L=4:

$$C_p^{[-Lq]_M} = C_p^{[-\frac{1}{4}Mq]_M} = \begin{cases} C_p^{[-\frac{1}{4}M \cdot 0]_M} = 1; q = 0 \\ C_p^{[-\frac{1}{4}M \cdot 1]_M} = C_p^{[\frac{3}{4}M]_M}; q = 1 \\ C_p^{[-\frac{1}{4}M \cdot 2]_M} = C_p^{[\frac{1}{2}M]_M}; q = 2 \\ C_p^{[-\frac{1}{4}M \cdot 3]_M} C_p^{[\frac{1}{4}M]_M}; q = 3 \end{cases}$$

These circular shifts are implemented by the wiring diagrams of the figure, shown for the particular value M=16, though the wiring is generalized in an evident way for any value of M which is a multiple of 4.

FIG. 22 reduces the general 3D diagram of FIG. 13 for the V-fold OS analysis FB to the specific case that V=4, taking advantage of the specific structure of the ZP&CIRC SHIFT outputs as was shown in FIG. 21. One key observation evident from inspecting FIG. 21 is that that the M/4 non-zero elements in the four M-pnt outputs of the four ZP&CIRC SHIFT modules do not overlap in their indexes. This means that the 4-pnt adders of the generic block diagram of FIG. 13 are always presented with a single non-zero input, while the other three inputs are zero, thus the adders may be discarded and the non-zero inputs which were supposed to go into the adders may be directly routed to the inputs of the IFFTs, whereat the adders were supposed to be connected. This implies that the ZP&CIRC SHIFT modules as well as the adders may be discarded. Instead, as shown in the current FIG. 22, the top row of outputs (labeled q=0) of the L=M/4 SIDO filters are then directly mapped onto the top quarter of M/4 inputs into the IFFT, the second row of outputs (labeled q=1) of the L=M/4 SIDO filters are then directly mapped onto the second quarter of M/4 inputs into the IFFT, the third row of outputs (labeled q=2) of the L=M/4 SIDO filters are then directly mapped onto the third quarter of M/4 inputs into the IFFT and finally the bottom row of outputs (labeled q=3) of the L=M/4 SIDO filters are then directly mapped onto the bottom quarter of M/4 inputs into the IFFT. Thus, this scheme discards the ZP&CIRC SHIFT altogether, instead mapping the M outputs of the 2D array of the sparse double polyphase filters directly onto the M inputs of the IFFT, row by row into a corresponding quarter segment of the IFFT inputs as shown.

FIGS. 23A-23B, 24A-24B and 25A-25B show yet another set of embodiments for the OS analysis FB for V=2, 4/3, 4 respectively. The idea here is to use the CS FB known prior art building blocks in order to realize the novel OS FB structures, by combining multiple CS FBs with additional 'glue' elements in order to generate the new OS FBs. Such an approach, re-using the simpler CS FBs as building blocks, allows for structured hardware design, as the CS FB is a well-defined element, which is just repeated several times. Moreover, hardware cores are made available by FPGA vendors, enabling rapid prototyping of OS FB in terms of the more elementary CS FB building blocks. It should be mentioned that all the M filters impulse responses in these drawings correspond to the M polyphases modulo M of the prototype filter, although we do not use the notation for polyphases as used throughout this application, but we label these filter impulse responses in these figure by an evident simplified shorthand notation.

Figure 23A:
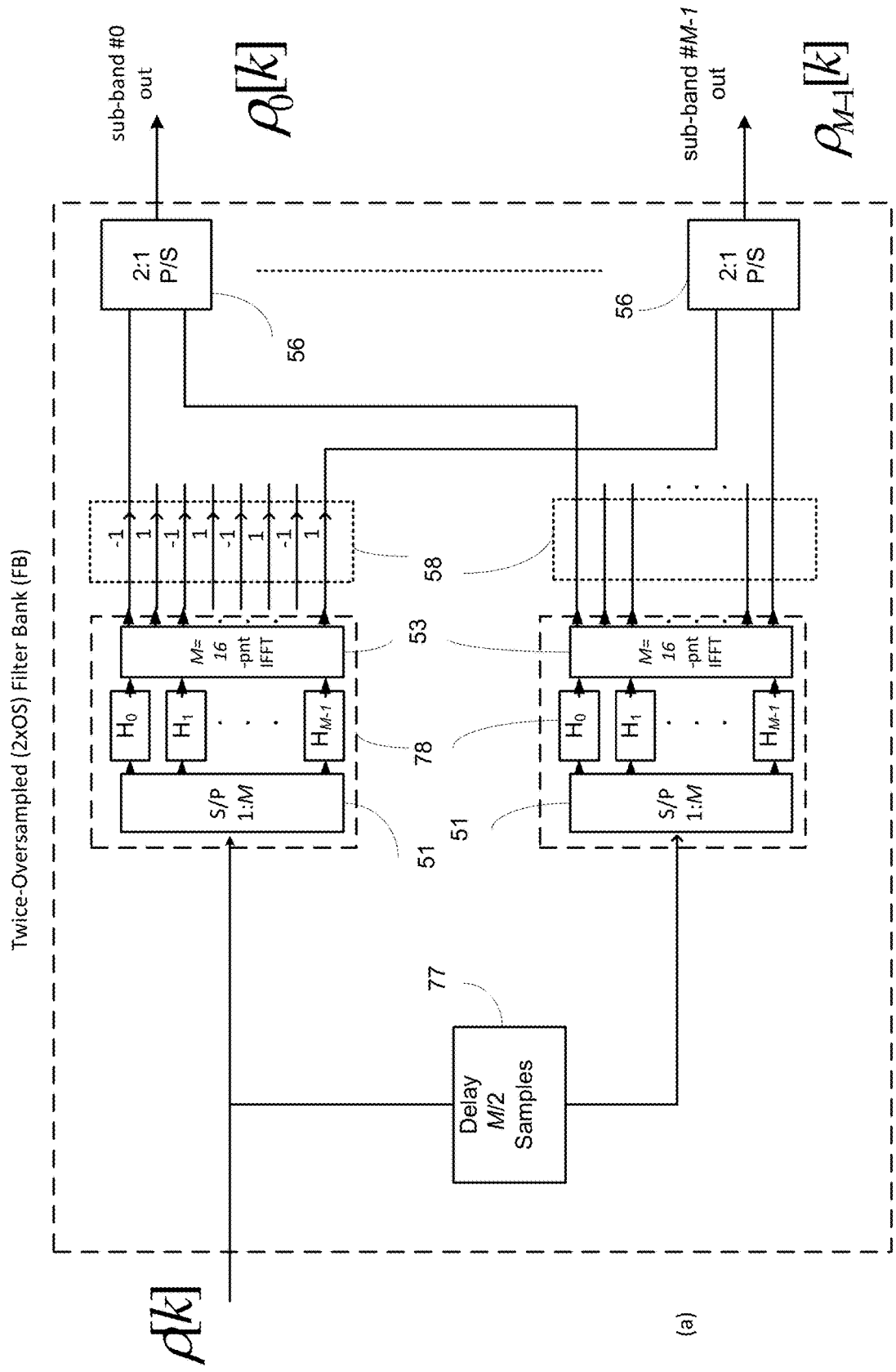
Figure 23B:
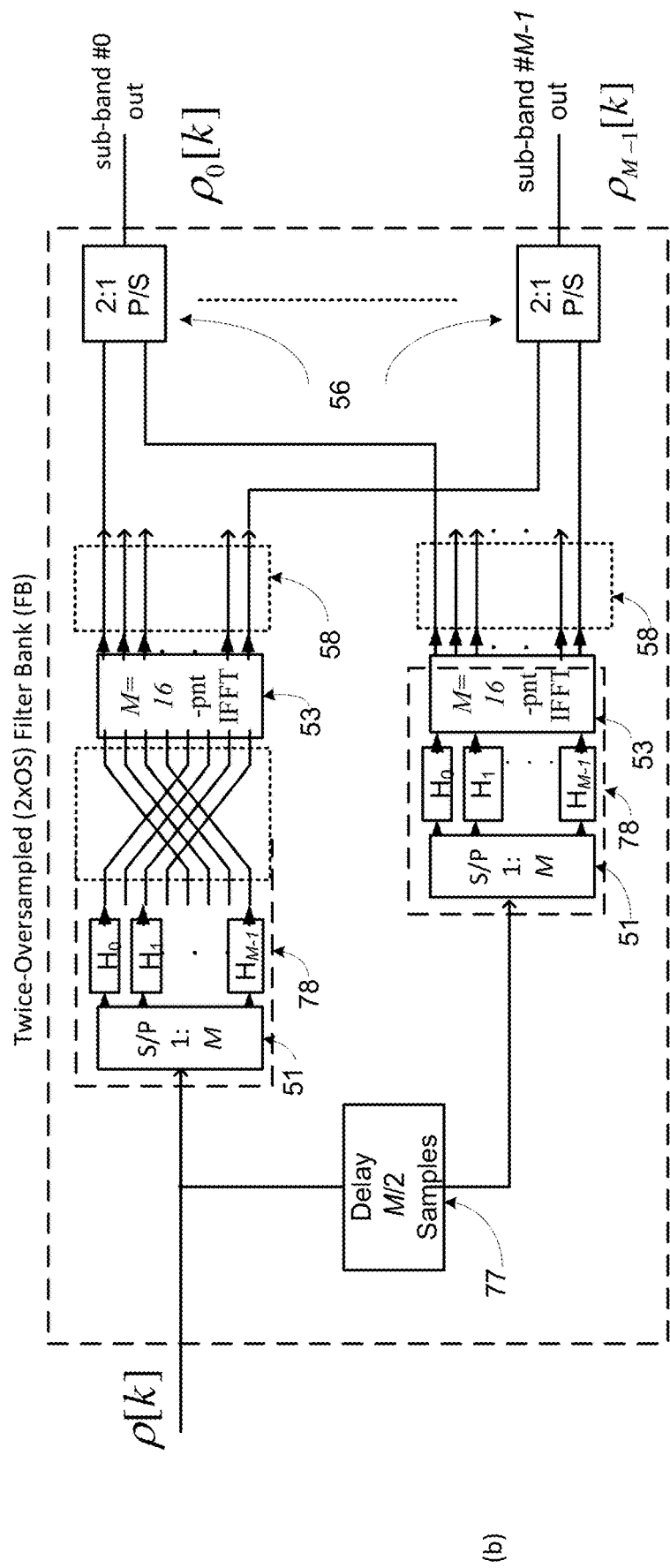

FIGS. 23A-23B describes the alternative construction of the twice OS (17=2) analysis FB based on a pair of interconnected identical M-pnt CS FBs. In both figures the input signal into the FB is split into two copies, one of which is delayed by M/2 samples (half the number of output ports of the FB) relative to the other. The two copies are input into two identical CS analysis filter banks, realized efficiently as per prior art based on a 1:M S/P an array M filters with impulse responses given by polyphase components modulo M of the prototype filter, and an M-pnt IFFT, as described in FIG. 12. In FIG. 23A the M outputs of the CS analysis FB, to which the input signal was not delayed, are modulated by alternating $(-1)^\beta$ factors, where $\beta=0, 1, 2, \ldots, M-1$ is the output port index of the IFFT. Therefore, the sign of every other IFFT output is flipped. The corresponding elements of resulting M-pnt vectors are then paired up (the $\beta^{th}$ element of the first vector is paired up with the $\beta^{th}$ element of the second vector) and the pairs are input into 2:1 P/S modules, such that the $\beta^{th}$ such module generates the $\beta^{th}$ FB output $\rho_\beta[k]$. In FIG. 23B the alternating $(-1)^\beta$ modulation is replaced by a half-band circular shift of the inputs to the IFFT, as described by the $C_p^{[M/2]_M}$ operator, in effect interchanging the first M/2 and the second M/2 inputs, as depicted in the crossed wires diagram. The rest of the processing is like in FIG. 23A.

In terms of operating rates, starting at rate R, the rate of arrivals of M-pnt blocks is R/M, after the S/P 1:M operation the blocks appear in parallel at the M outputs of the S/P; this rate is maintained throughout the filtering and the IFFT, which produces parallel blocks of M samples at the same rate of R/M per second. This is also the rate at which samples appear in each of the output ports of the IFFTs. Every two ports of corresponding index across the four IFFTs are collected into a parallel pair of signals which are time-division multiplexed by the 2:1 P/S modules, bringing the rate up by a factor of 2 to a 2R/M output rate per output wire (cf. the rate R/M per wire out of an M-pnt CS analysis FB here the rate is V=2 times faster).

Figure 24A:
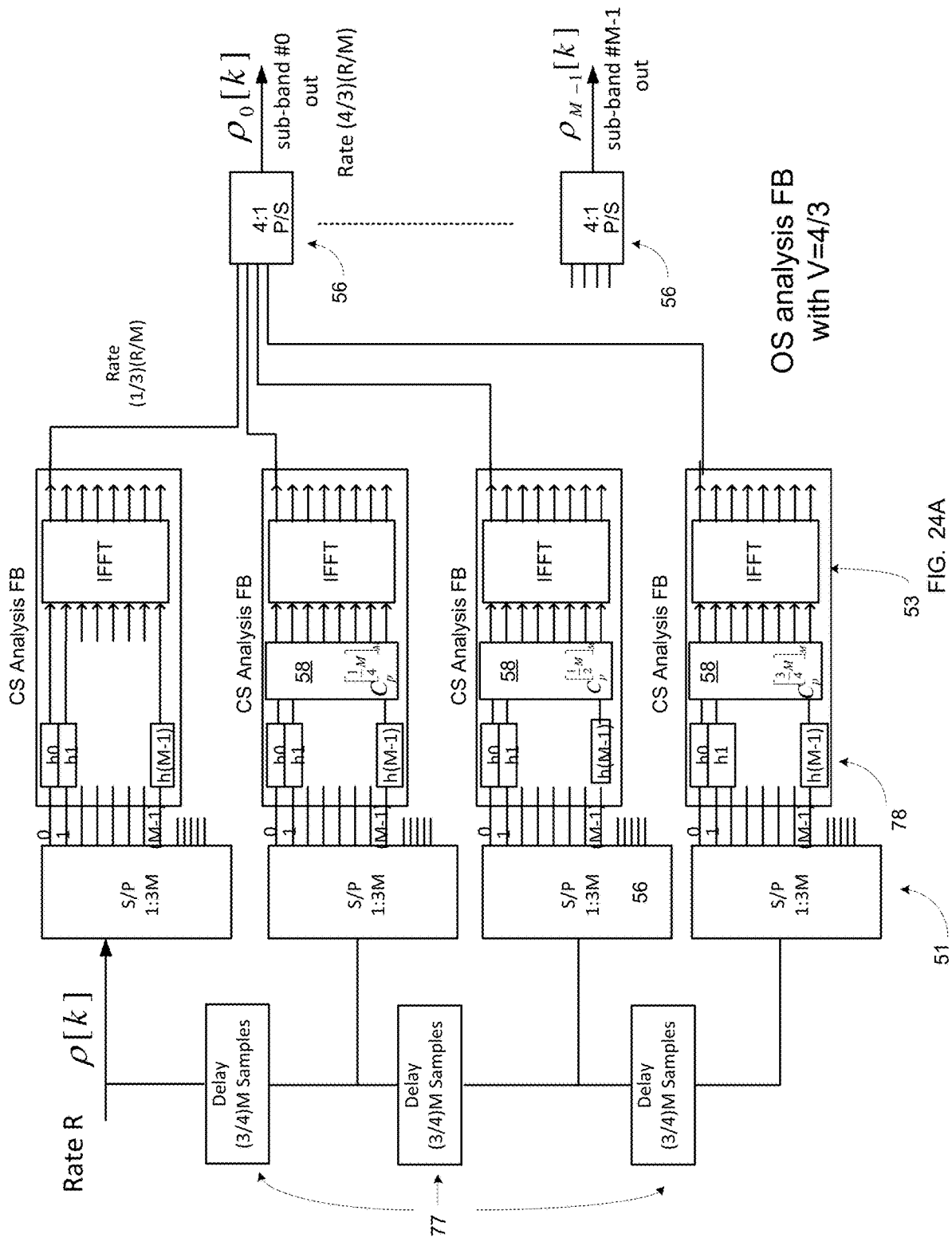
Figure 24B:
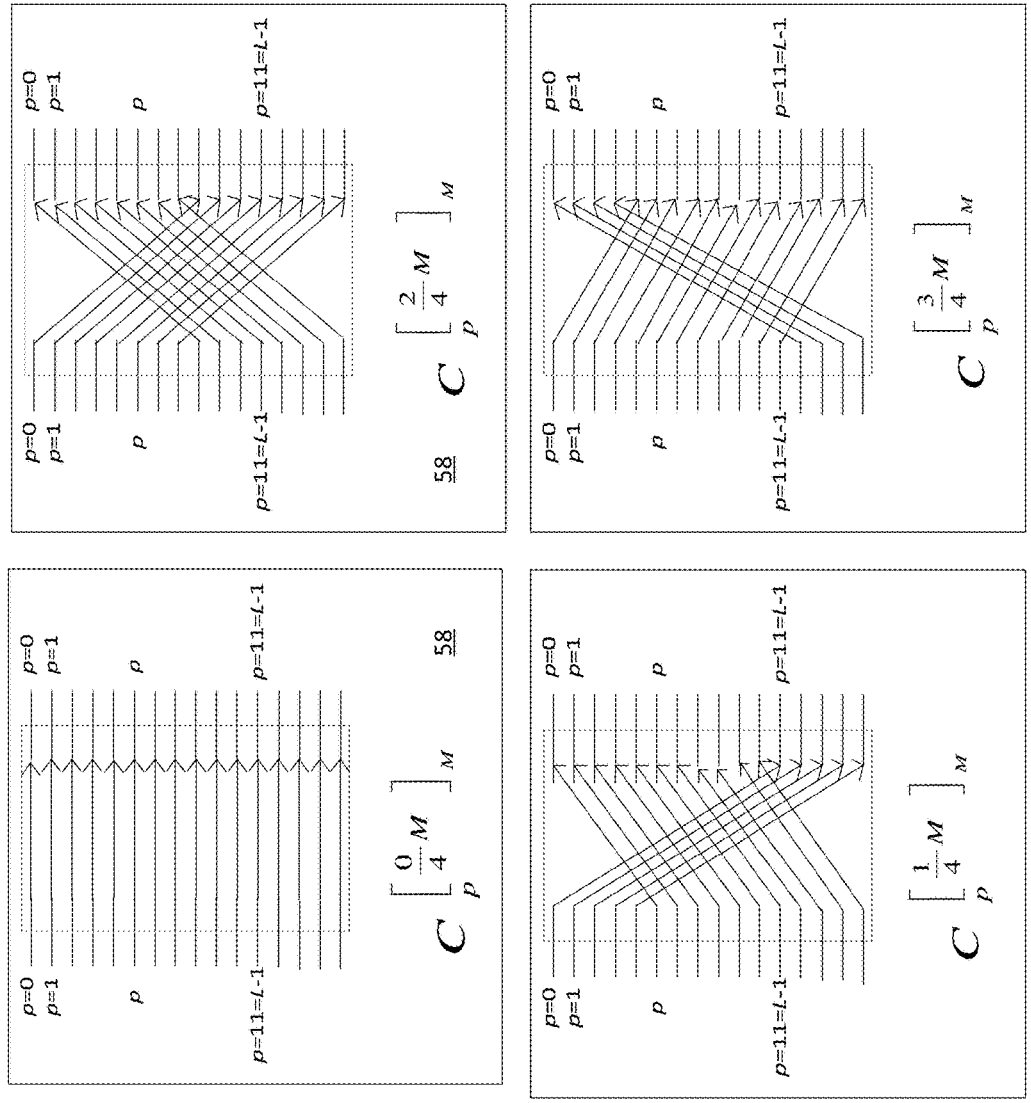

FIGS. 24A-24B describe the alternative construction of the V=4/3 OS analysis FB based on four interconnected identical M-pnt CS FBs. Four copies of the input signal, relatively delayed in steps of L=3M/4, are generated as shown using three delay elements of L=3M/4 samples each. Each of these four signals is input into a modified CS analysis FB, which has been altered as follows:
(i): The conventional 1:M S/P is replaced by a 1:3M SIP, at the output of which just the top M inputs are retained. This corresponds to slowing down the processing rate following this S/P by a factor of 3, as (input into the polyphase filter array), since the next 2M samples following the retained M samples are discarded, then a new set of M samples is retained and passed to the polyphase filter array, etc., i.e. we process M samples every 3M samples which corresponds to 3-fold downsampling of the input rate. Notice that this is not equivalent to down-sampling by a factor of 3 followed by a 1:M S/P, nor to a 1:M S/P followed by down-sampling by a factor of 3, but this is a different kind of block-oriented down-sampling, where we retain one block out of each 3 consecutive input blocks.
(ii): The CS FBs are modified to include circular shifts at the IFFT inputs amounting to a permutation of the filters outputs by means of the circular shifters, prior to their applications to the IFFTs. The wiring diagrams of the circular shifters are shown in FIG. 24B. Alternatively, not illustrated, the circular shifts in FIG. 24A may be removed at the IFFT inputs and rather implemented as modulations by the respective phase rotator factors $1^\beta$, $(-j)^\beta(-1)^\beta$, $j^\beta$ applied at the outputs of each of the four IFFTs. Thus, the four structures combined in FIG. 24A to yield the overall OS analysis FB are not strictly CS analysis FBs, but are very close in the sense that they use the same polyphase filter components modulo M, and the same M-pnt IFFT size.

The corresponding elements of four resulting M-pnt vectors at the four modified CS analysis FB outputs are then organized in quadruples (the $\beta^{th}$ elements of each of the four vectors are paired up together) and the resulting quads of signals are input into 4:1 P/S modules (M of them), such that the $\beta^{th}$ such module generates the $\beta^{th}$ FB output $\rho_\beta[k]$.

In terms of operating rates, starting at input rate R, the rate of arrivals of blocks of M points is R/M, after the S/P 1:3M operation the rate of retained blocks is R/(3M), this rate is maintained throughout the filtering and the IFFT, which produces parallel blocks of M samples at the same rate of R/(3M) per second. This is also the rate at which samples appear in each of the output ports of the IFFTs. Every four ports of corresponding index across the four IFFTs are collected into a parallel quad of signals which are time-division multiplexed by the 4:1 P/S modules, bringing the rate up by a factor of 4 to a 4R/(3M) output rate per output wire (cf. the rate R/M per wire out of an M-pnt CS analysis FB here the rate is V=4/3 times faster).

Figure 25A:
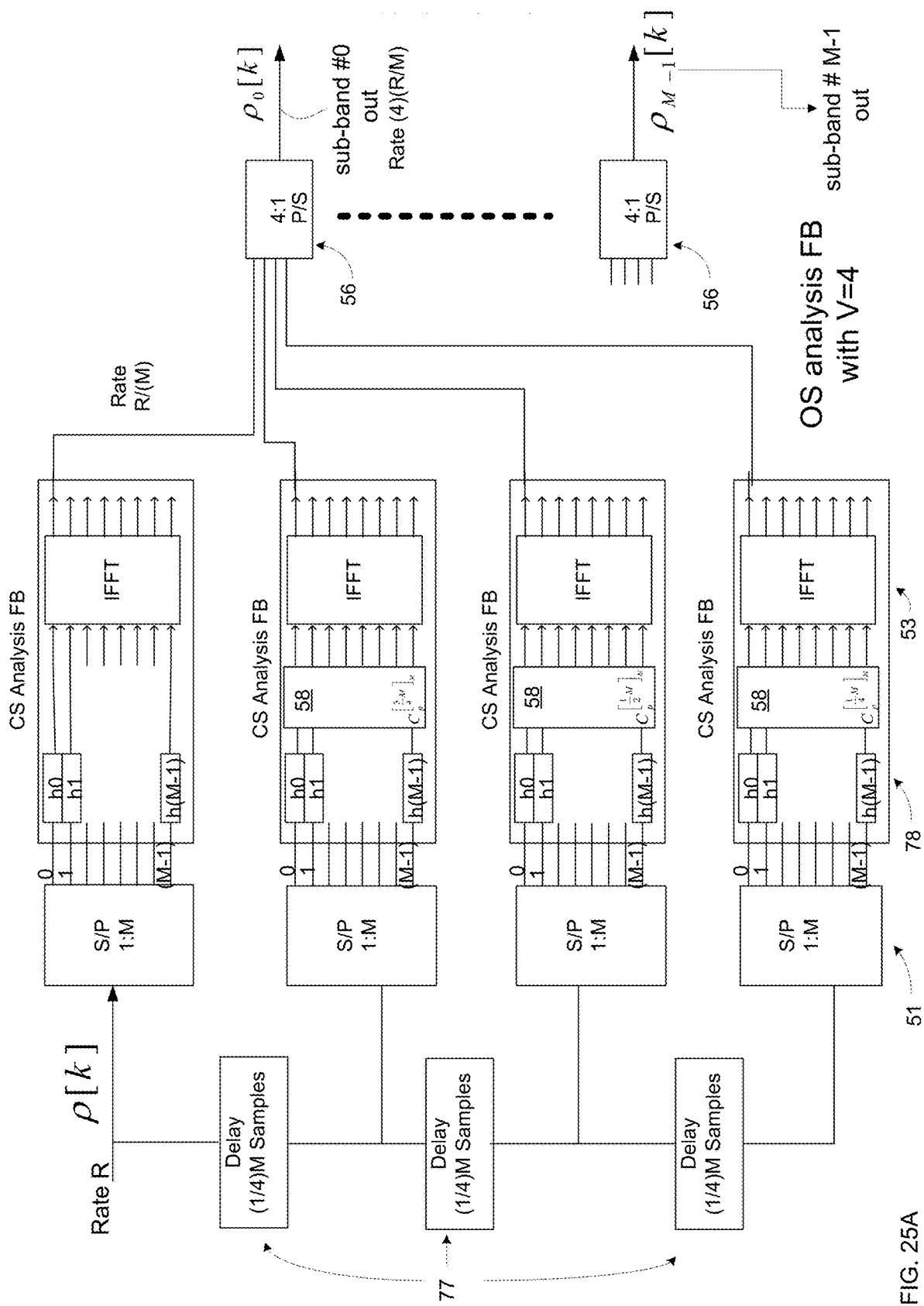
Figure 25B:
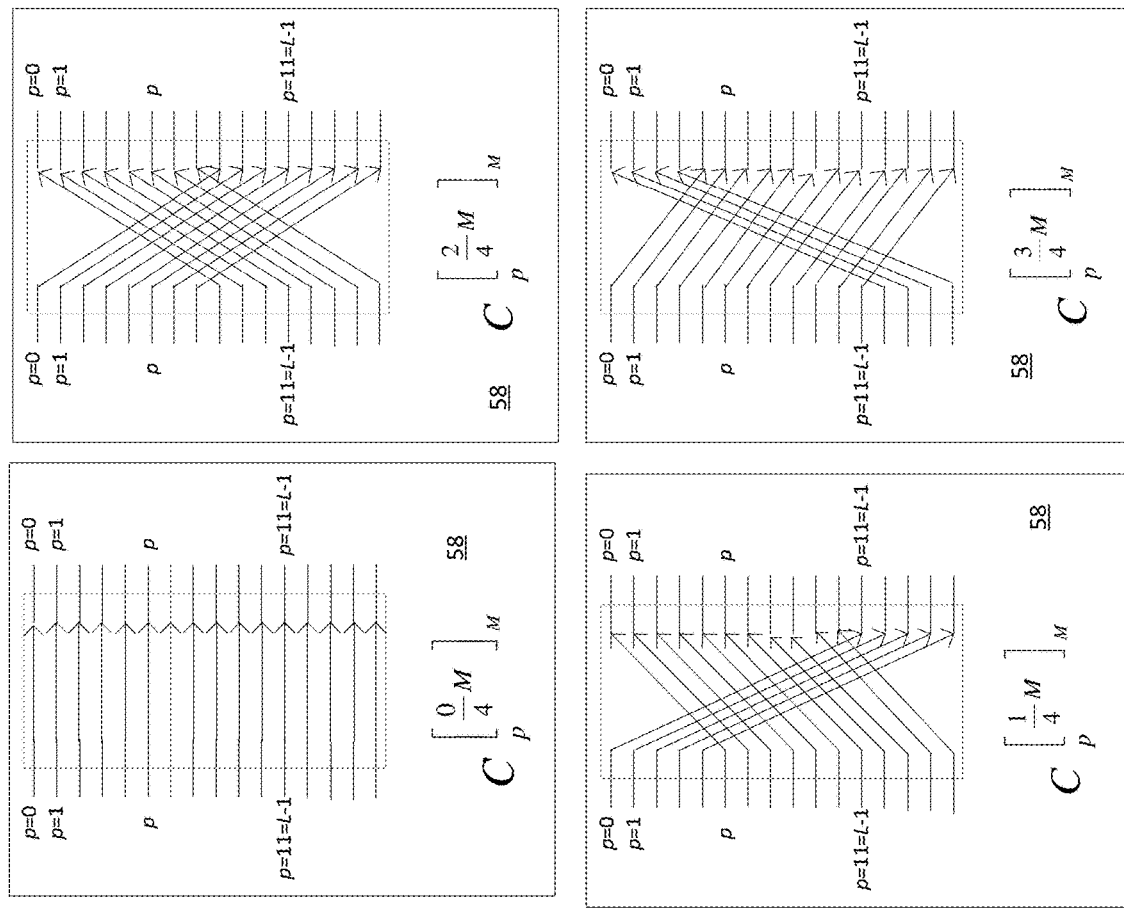

FIGS. 25A-25B describes the alternative construction of the V=4 OS analysis FB based on four interconnected identical M-pnt CS FBs. Four copies of the input signal, relatively delayed in steps of L=M/4, are generated as shown using three delay elements of L=M/4 samples each. Each of these four signals is input into a modified CS analysis FB which incorporates circular shifts ahead of the IFFTs as shown on the right of the figure.

In terms of operating rates, starting at rate R, the rate of arrivals of M-pnt blocks is R/M, after the S/P 1:M operation the blocks appear in parallel at the M outputs of the S/P; this rate is maintained throughout the filtering and the IFFT, which produces parallel blocks of M samples at the same rate of R/M per second. This is also the rate at which samples appear in each of the output ports of the IFFTs. Every four ports of corresponding index across the four IFFTs are collected into a parallel quad of signals which are time-division multiplexed by the 4:1 P/S modules, bringing the rate up by a factor of 3 to a 4R/M output rate per output wire (cf. the rate R/M per wire out of an M-pnt CS analysis FB here the rate is V=4 times faster).

FIGS. 26, 27A-27B, 28, 29A-29B, 30 and 31 describe various embodiments of the OS synthesis FBs. In fact for every embodiment we heretofore derived for OS analysis FB we may readily generate a corresponding embodiment of an OS synthesis FB by using a signal processing duality property which states the following: by exchanging adders-splitters, P/S-S/P, FFT-IFFT, SIMO-MISO and by reversing the order (labeling) of FIR filter taps (time reversing the tap sequences), a meaningful dual circuit generating the inverse function of the original circuit is obtained. In particular notice that multiple arrows coming in into a junction denote summations of the signals on the incoming arrows, which is the dual of multiple arrows coming out of a junction indicating a splitter.

While in the OS analysis FB diagrams shown heretofore the signal flow has always been from left-to-right, in these dual synthesis FB figures, the signal flow is reversed, proceeding from right-to-left and applying the duality mapping of elements. Thus, the duality property amounts to time-reversal reversing the direction of flow through the signal processing structures.

Figure 26:
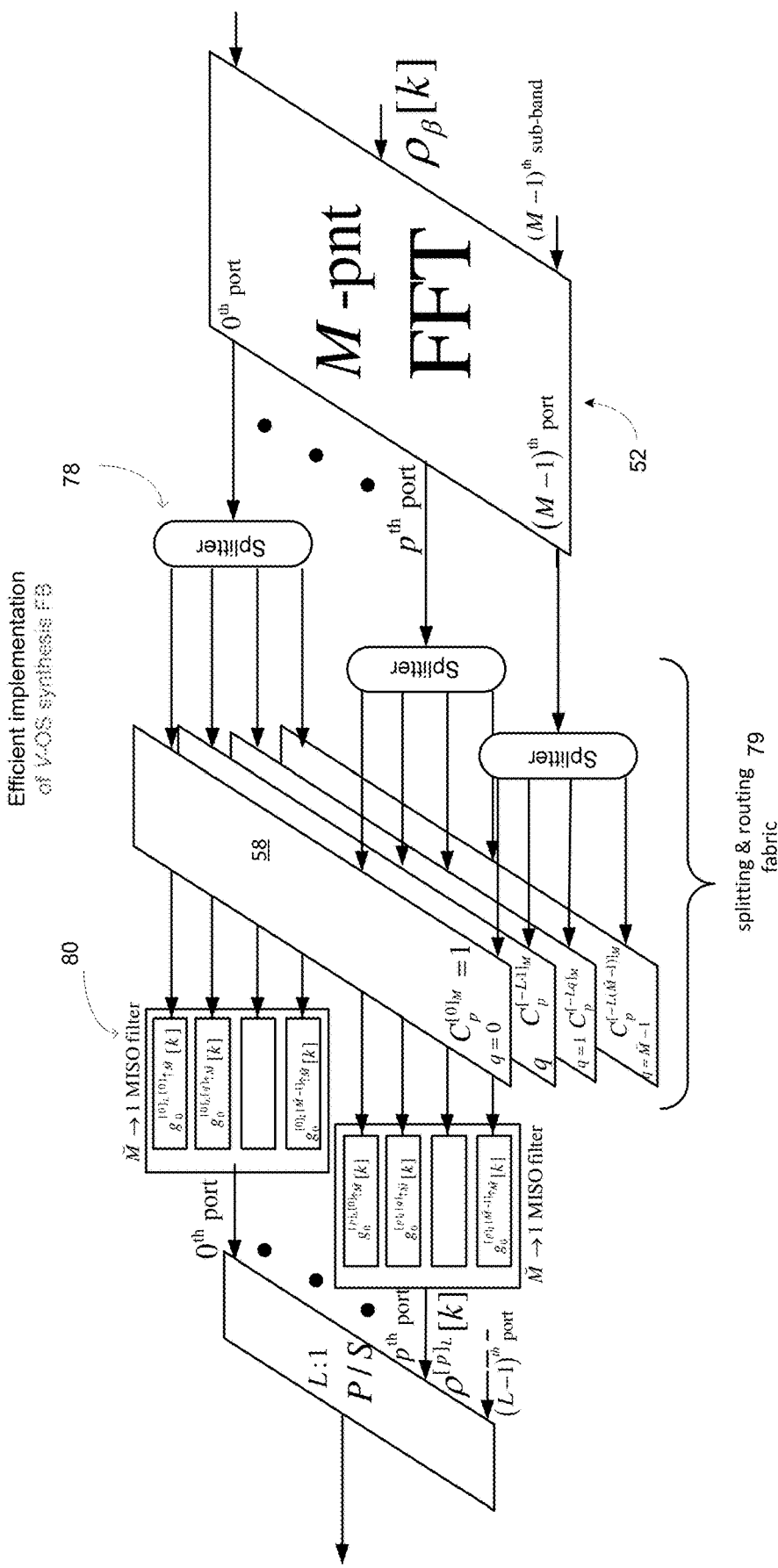

FIG. 26—the duality property is applied to a general V-fold analysis filter bank of FIG. 13 in order to generate the hardware-efficient generic V-fold synthesis filter bank of the current figure.

Figure 27A:
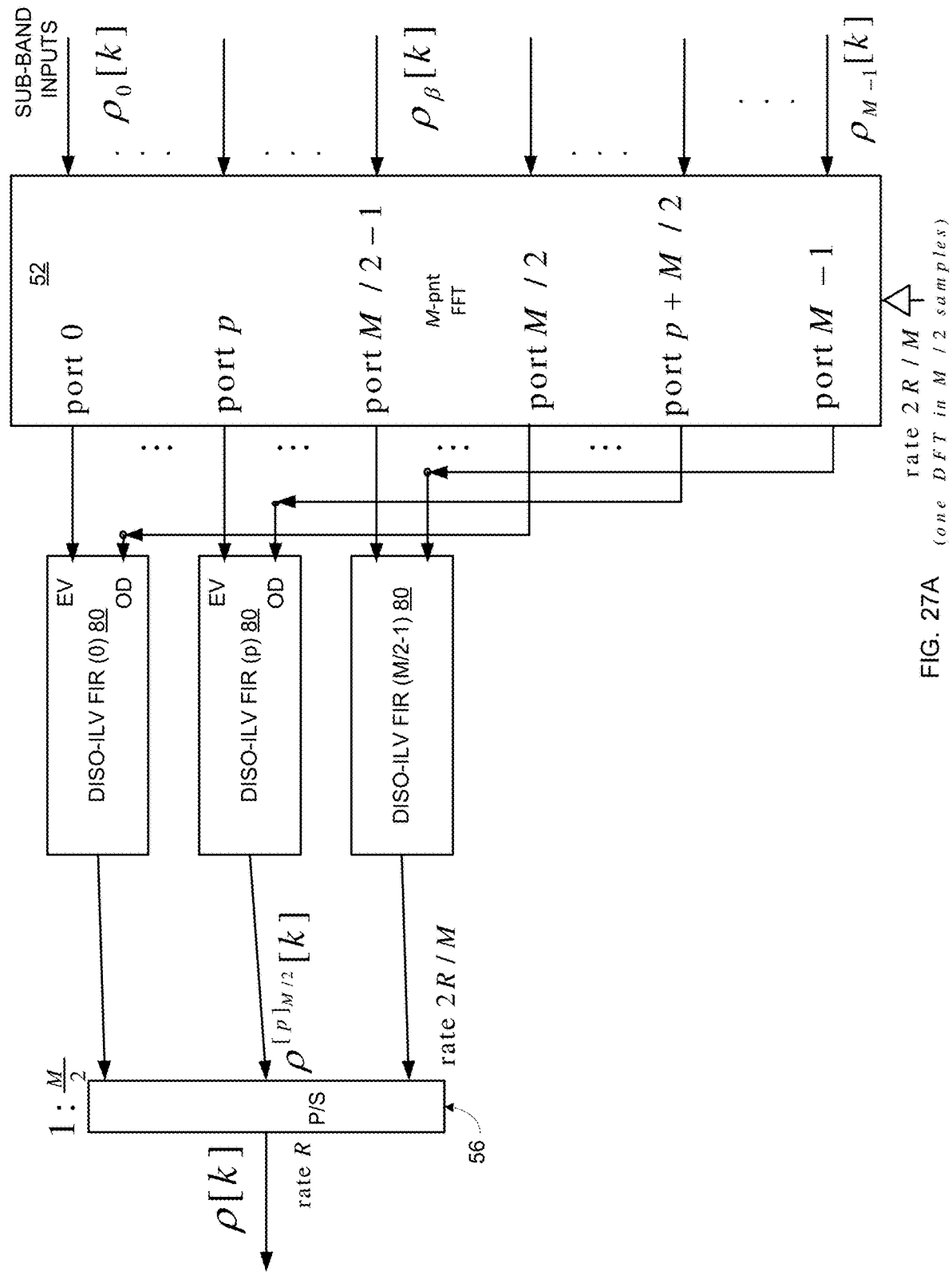
Figure 27B:
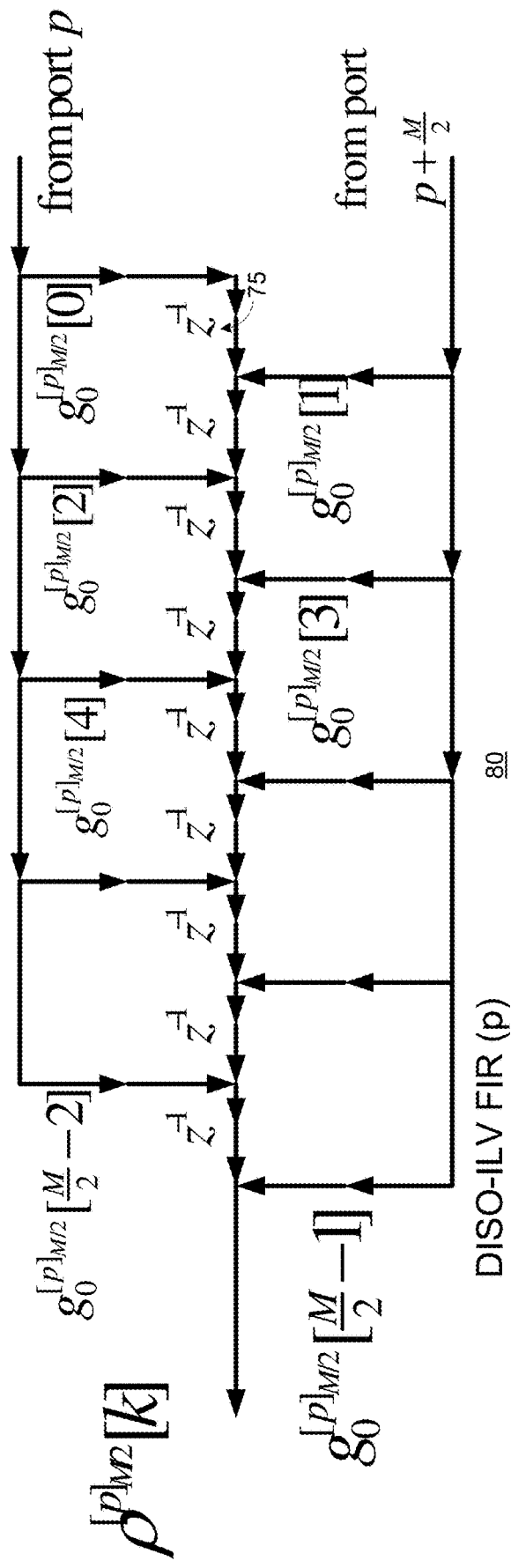

FIGS. 27A-27B presents the embodiment of a hardware-efficient 2×OS synthesis filter bank in terms of Dual Input Single Output (DISO) filters. This figure may be either obtained as a special case of the general V-fold synthesis, or readily derived by duality from the 2×OS analysis FB structure of FIG. 19A. The SIDO filters of FIG. 19A are replaced here by DISO filters, the IFFT of FIG. 19A is replaced by an FFT, the S/P there replaced here by a P/S, etc. In FIG. 23B we detail the DISO filters. This figure is the dual of FIG. 19B.

Figure 28:
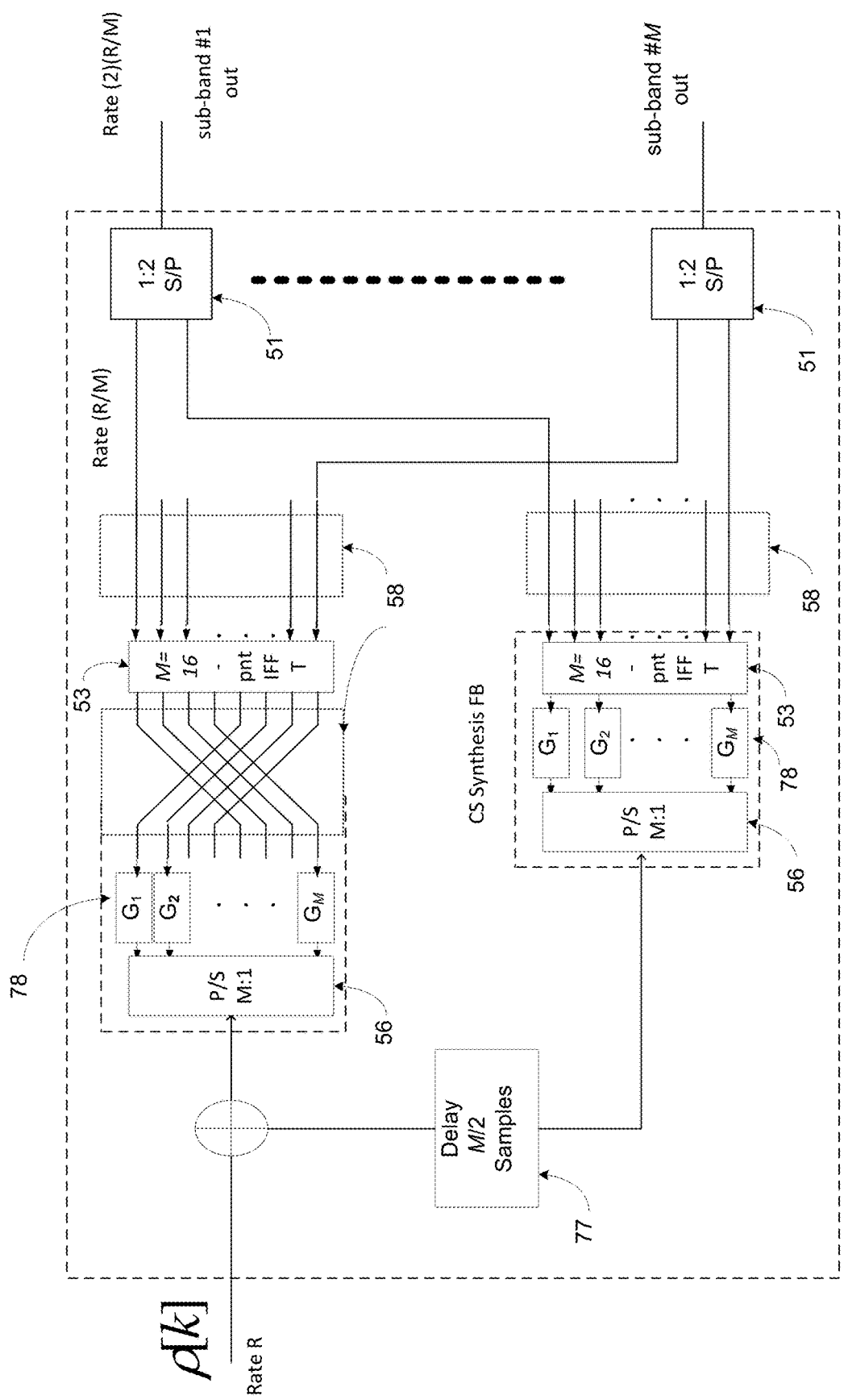
Figure 29A:
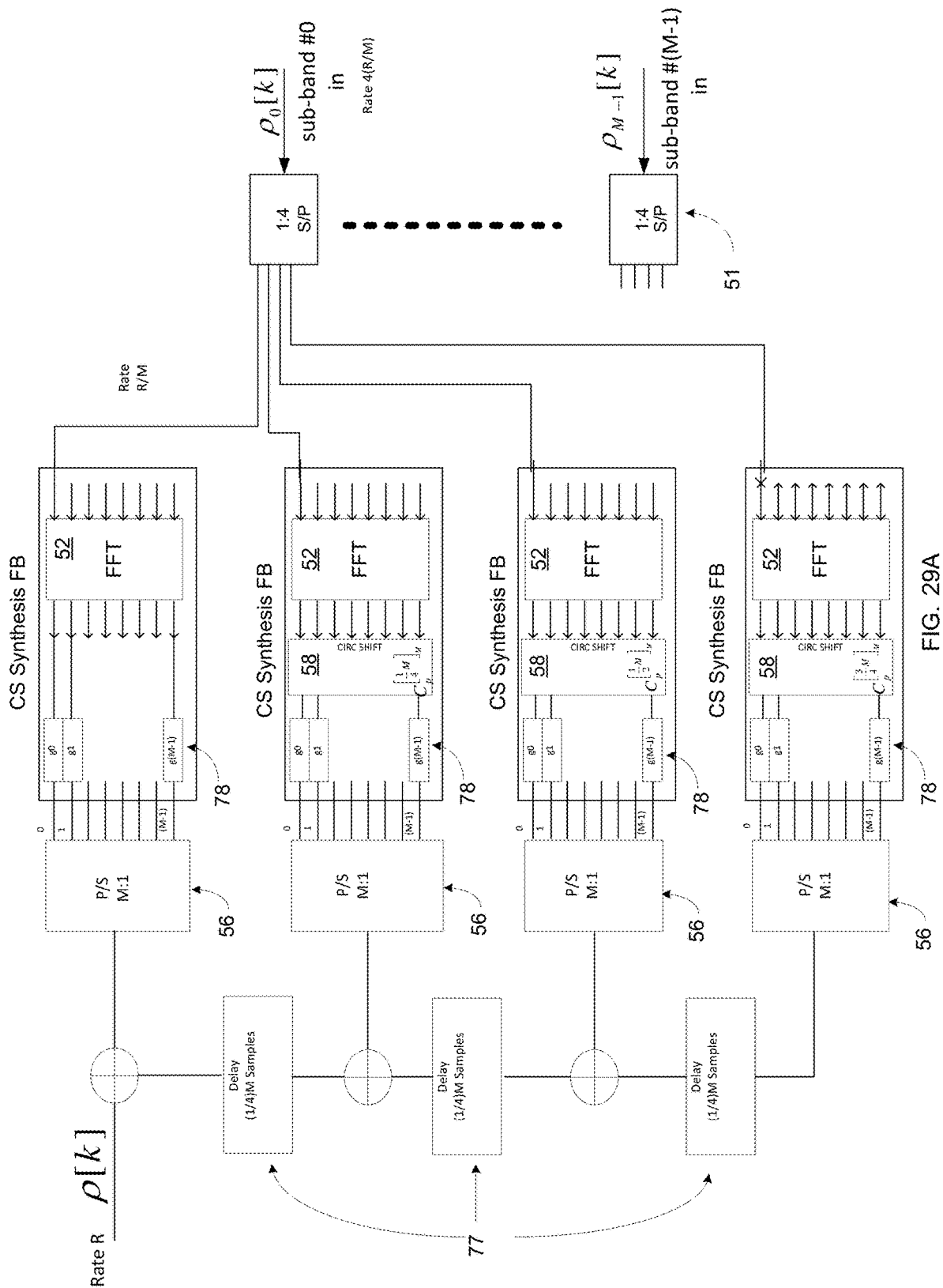
Figure 29B:
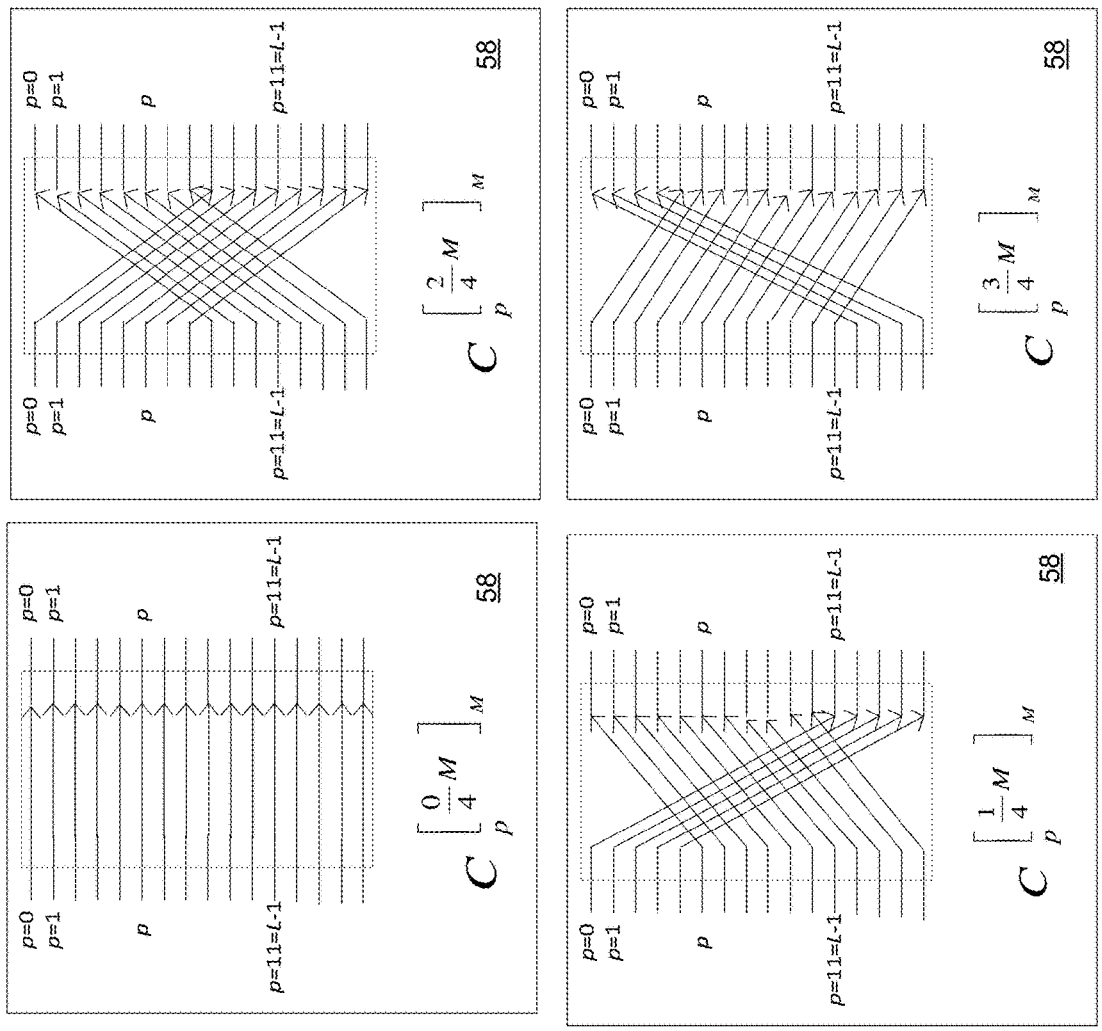

FIG. 28 presents an alternative embodiment of a hardware-efficient 2×OS synthesis filter bank in terms of a pair of CS synthesis FBs. This figure is the dual of the 2×OS analysis FB realization of FIG. 23B.

Figs. A-29,B present the embodiment of a hardware-efficient V=4/3 OS synthesis filter bank. The duality with respect to the hardware-efficient V=4/3 OS analysis filter bank of FIG. 24A-24B is evident. In terms of processing rates, each input sub-band is presented at OS rate $$\frac{4}{3}\frac{R}{M}$$

rather than the CS rate of $$\frac{R}{M}.$$

The TDM demuxing means that each of the four inputs out of the 1:4 S/P has ¼ of the rate i.e.

$$\frac{1}{4}\left(\frac{4}{3}\frac{R}{M}\right) = \frac{1}{3}\frac{R}{M}.$$

This is the rate at which blocks are collected across the FFT inputs, and also the rate of the filtering array, thus M-pnt blocks appear at each filtering array outputs at this rate. The 3M:1 P/S TD muxing action raises the sampling rate by a factor of 3M, yielding the output rate $$3M\left(\frac{1}{3}\frac{R}{M}\right) = R.$$

The four P/S outputs are superposed at this rate yielding the final output rate R.

Figure 30:
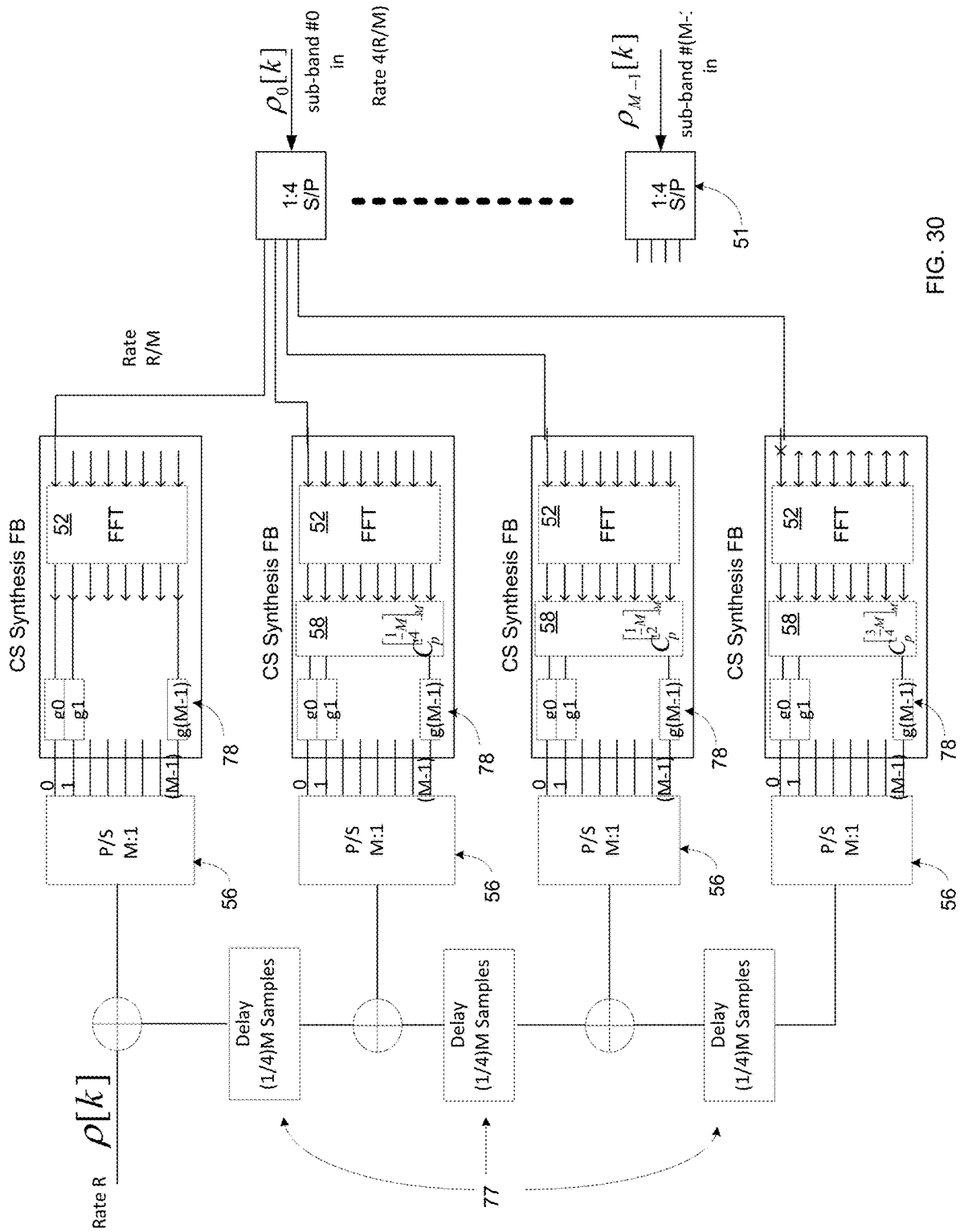
Figure 31:
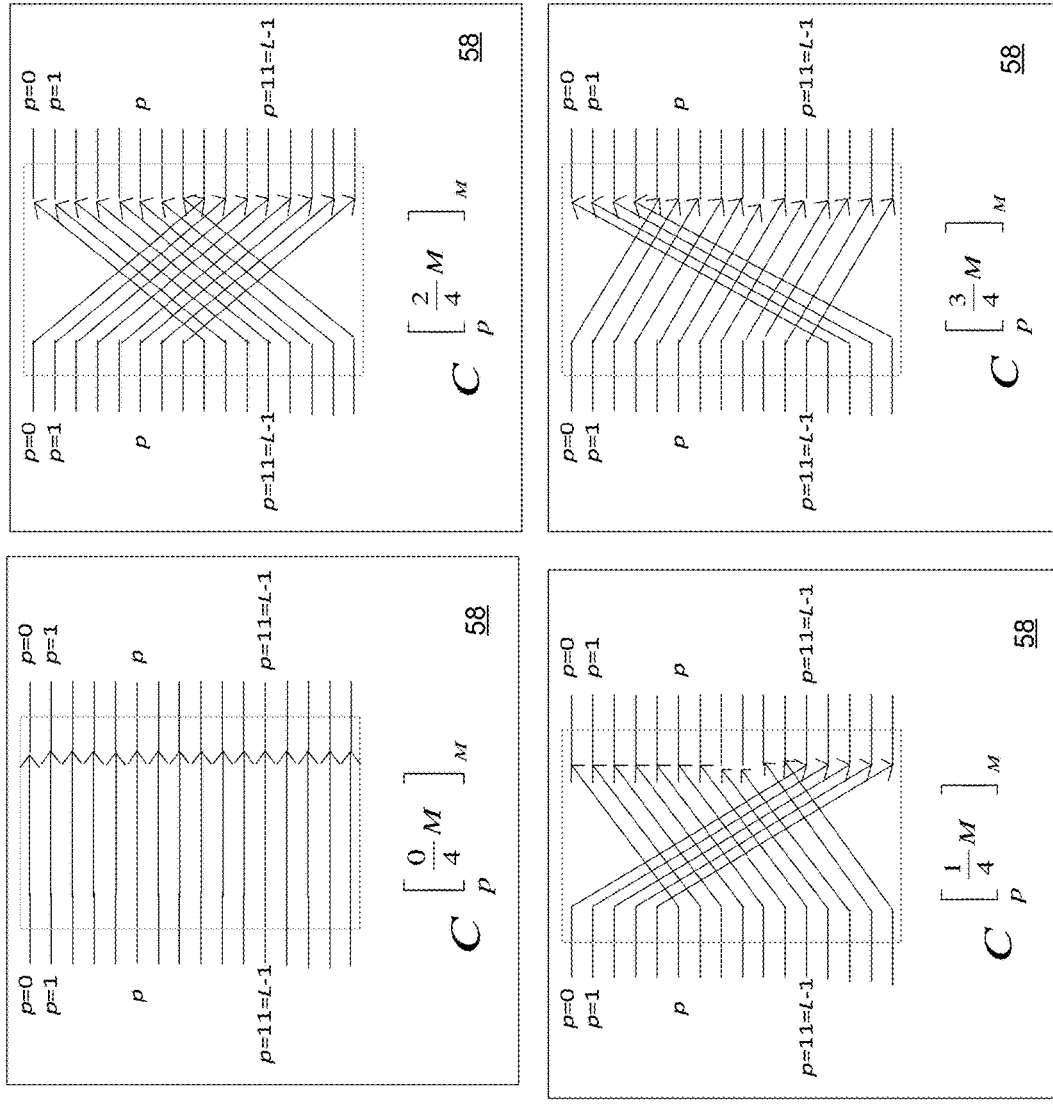

FIGS. 30 and 31 present the embodiment of a hardware-efficient V=4 OS synthesis filter bank. The duality with respect to the hardware-efficient V=4 OS analysis filter bank of FIGS. 25A-25B is evident.

This completes the disclosure of oversampled filter bank processing structures. The OS FB modules are next used as building blocks form more complex systems for optical transmission, namely the optically coherent transmitters (Tx) and (Rx), based on OFDM and single-carrier (SC) modulation formats. Overviewing these following embodiments, OFDM Rx-s using oversampled filter banks will be referred to as Multi-Sub-Band OFDM Rx-s. We shall also introduce an OS FB version of the prior-art DFT-spread (DFT-S) OFDM [DFT-Spread OFDM for Fiber Nonlinearity Mitigation Yan Tang, William Shieh, and Brian S. Krongold, IEEE PHOTONICS TECHNOLOGY LETTERS, VOL. 22, pp. 1250-1252, 2010] referred to as MSB DFT-S OFDM. We also introduce Nyquist shaped single carrier Tx and corresponding OS FB Rx embodiments referred to as SC-MSBE as well as a new class of embodiments with variable numbers of sub-single-carriers per channel, using sub-band bonding, referred to as bonded-MSBE.

In this application there is also provided Parallel-to-Parallel P/P module specified by the ratio p:q where p,q are two integers one of which divides the other. The P/P module is specified to take p parallel lines and produces q parallel lines. E.g. when p>q and q divides p, i.e. we 'down-parallelize' then you can realize the P/P as the parallel juxtaposition of q P/S modules, each being (q/p): 1 sized. Notice that P/P with p:p, i.e. p=q is just a trivial identity system taking p parallel lines as input and presenting the same p parallel lines as output. We shall resort to the p:p P/P module (an identity system) as a graphical means to compactly depict a multiple wires conduit. Many of the block diagrams of this disclosure comprise parallel to serial and serial to parallel converters. These conversion modules may actually be used in their strict defining sense, as conceptual representation of data flow, however in practice the nominal serial inputs or outputs to these P/S and S/P conversion modules are often not serialized at all but are handled in parallel in order to ease the high speed processing. Thus, the p:1 P/S modules are often implemented as p:q P/P modules and the 1:p S/P modules are often implemented as q:p P/P with the q number of parallel ports corresponding to the nominal serial input or output possibly differing from p, selected according to hardware processing convenience. Thus, whenever we mention S/P and P/S in the claims it should be understood that these models may be implemented in practice as P/P.

Figure 32:
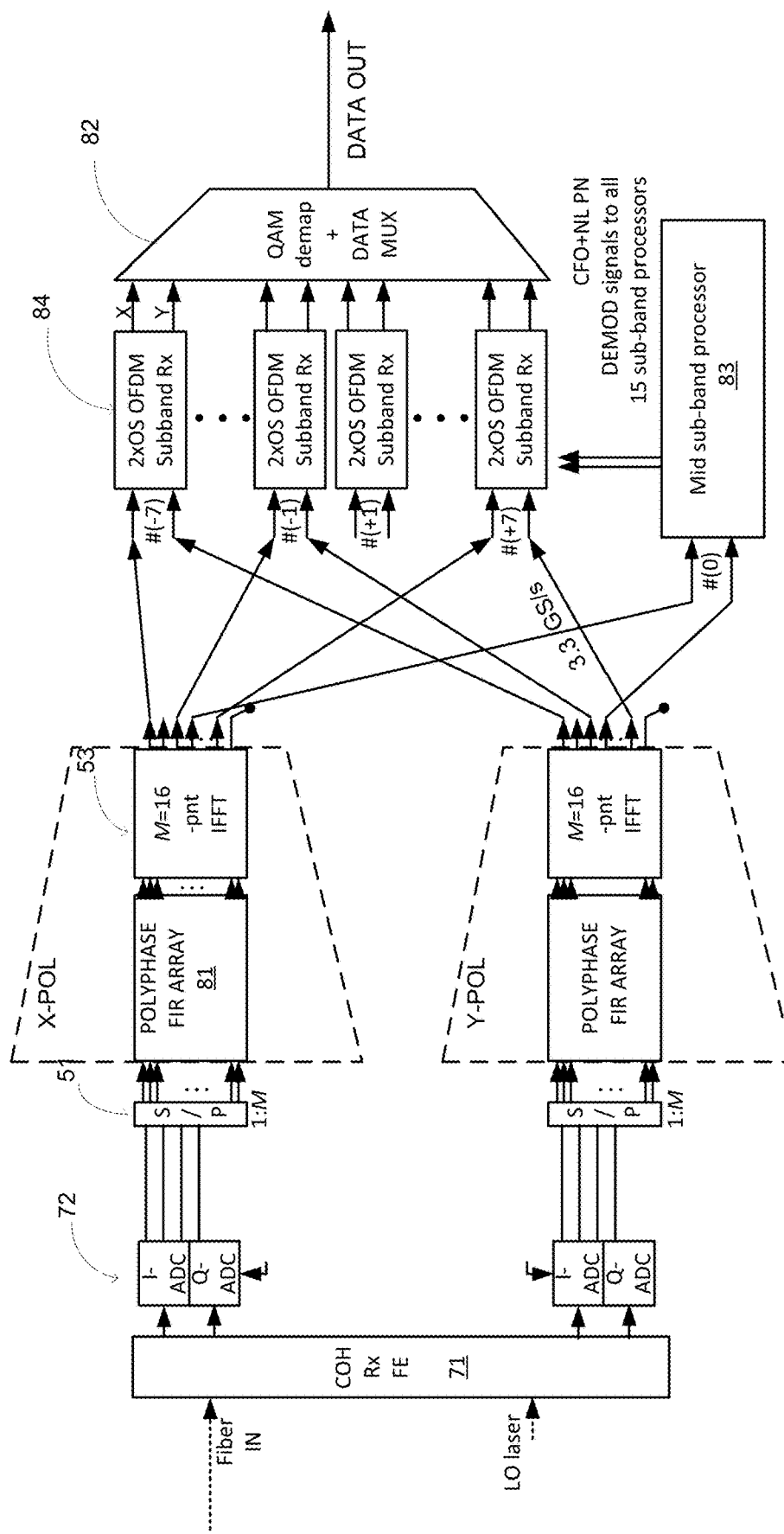

FIG. 32,33 present our MSB OFDM PDM Rx preferred embodiment as per the teaching of this invention. At the top level view of the Rx (FIG. 32) each of the complex-valued signals for each of the two X and Y polarizations is passed through a 1:M 2×OS analysis filter bank to separate the sub-bands to M distinct output ports. In our exemplary system the total channel bandwidth is B=25 GHz, and M=16, i.e. each polarization signal is FD demultiplexed by the FB into 16 sub-bands. The extreme sub-band which is split between the two ends of the spectrum, is dedicated to an ADC anti-aliasing filter guard-band, whereas the remaining 15 sub-bands fill up the channel information bandwidth, taken here in this exemplary system as 25 GHz. The exemplary ADC sampling rate is then $$R = \frac{M}{M-1}B = \frac{16}{15}(25 \text{ GHz}) = 26.6 \text{ GS/s},$$

allowing to accommodate the ADC anti-alias guardband over the 16th sub-band, and leaving 15 sub-bands for processing and detecting the net data modulated over the 25 GHz, i.e., each sub-band has a spectral width of 1/15(25 GHz)=1.66 GHz. The sub-bands with corresponding indexes from the X and Y FBs are paired up to feed identical sub-band Rx-s, in turn detailed in FIG. 33. The QAM-demapped X and Y digital output pairs of each of the sub-band Rx-s, are and data-multiplexed to generate the overall DATA OUT bitstream.

Adopting a bi-polar indexing convention for the M−1 sub-bands (and not counting the extreme ADC-transition sub-band), the 1-th X-sub-band and 1-th Y-sub-band outputs of the two FBs are routed to feed the 1-th Rx of the sub-band processor array, for i=−7, −6, . . . , −1, +1, . . . , +7. Notice that the i=0 index is skipped, since in our preferred embodiment we dedicate this mid-sub-band to pilot tone transmission, hence this sub-band is not routed to one of the sub-band Rx-s of the sub-band processor array but is routed instead to a mid-sub-band processor, used to extract the transmitted pilot in order to assist in channel estimation and linear and nonlinear phase noise compensation. It is not necessary however to adopt this pilot sub-band strategy, dedicating a whole sub-band to the pilot signal, however in our preferred embodiment we do so.

Figure 33:
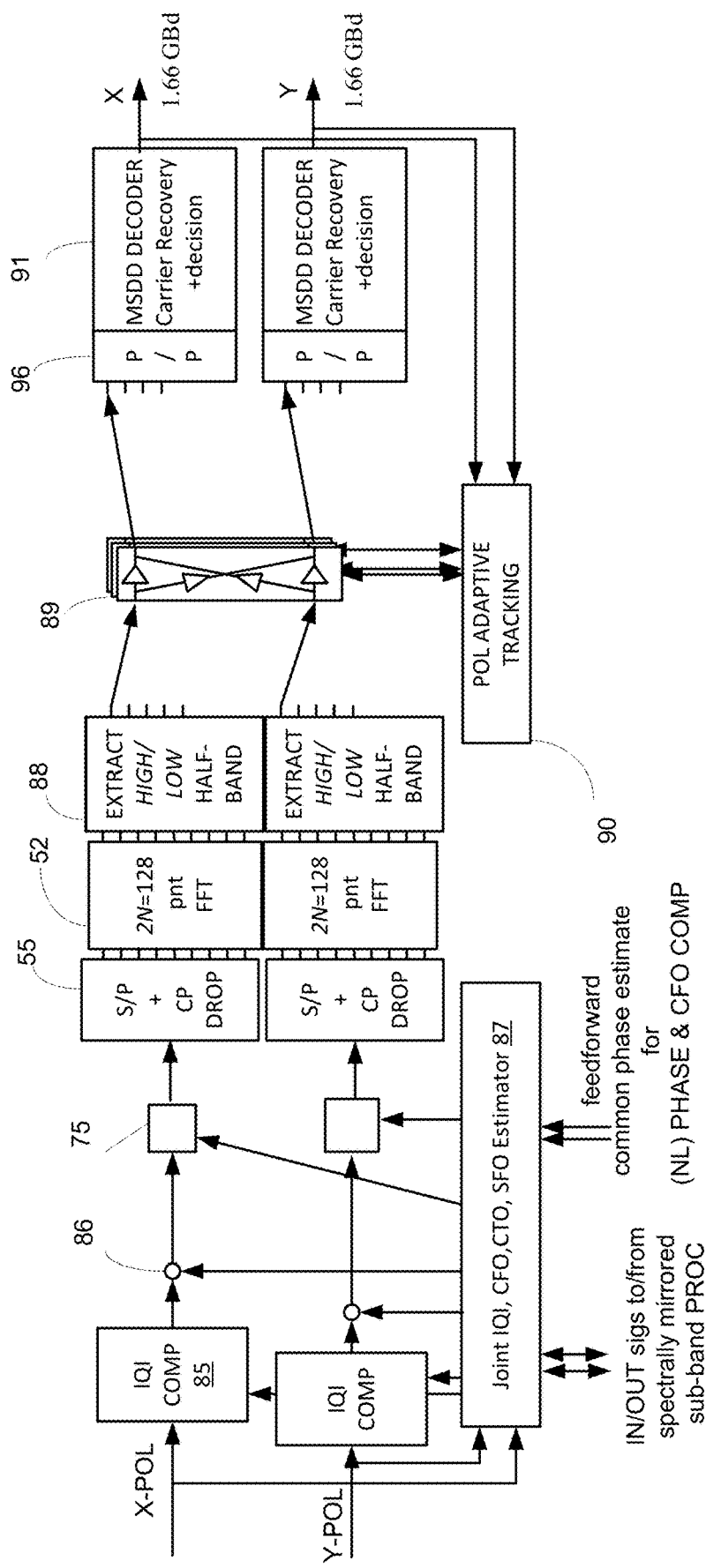

The sub-band processing associated with the MSB OFDM Rx of FIG. 32 is shown in FIG. 33, which details the sub-band OFDM Rx. As our analysis FBs are 2×OS (V=2), the twice overampling implies that for the 1.66 GHz sub-bands the sampling rate at each of the 15 FB output ports will be 2×1.66=3.3 GS/s. Following a single polarization, say the X one, the SB signal is input to the IQI COMP module used for compensating the IQ imbalance. This module is further described in FIG. 43A-43F. Then the signal undergoes CFO and (NL) PN demodulation, removing frequency offset (deviation of the frequency of the laser LO relative to the incoming optical signal center frequency) and also removing some of the linear and non-linear phase noise. Next, the signal is passed through the CTO recovery, applying a suitable integer delay in order to temporally align the signal with the beginning of the valid FFT window for OFDM. The impairment parameters IQI, CFO, CTO and also possibly SFO, to be applied to the chain of compensators, are derived from a Joint IQI, CFO, CTO, SFO estimation module, the internals of which are detailed in FIG. 43A-43F.

Notice that the uniformly spaced frequency offsets of the successive sub-bands induce, via the CD, a group delay proportional to the center frequency of each sub-band, such that the various sub-bands come out time-misaligned with timing offsets forming an arithmetic sequence. By fitting a straight line to the estimated coarse timing offsets, it is possible to estimate the amount of CD, providing an efficient CD monitoring means, however unlike in a conventional coherent Rx wherein CD monitoring and estimation is a very essential function, here explicit CD estimation is not required at all for Rx operation here (in conventional receivers where CD monitoring and estimation is indispensable and it is necessary to supply a separate means to estimate CD in the channel in order to correctly set the coefficients of the CD equalizer).

After dropping the CP, which is quite short here in our exemplary system using N=64 sub-carriers per sub-band (represented by 128 samples after 2×OS by the FB), the CP is just one sample, i.e. 1:128=0.78% overhead), the signal is conditioned for performing the OFDM FFT analysis in order to extract the sub-carrier complex amplitudes. The reason we are able keep the CP very short in our scheme (thus attain high spectral efficiency) is that the CD distortion causing loss of orthogonality of the sub-carriers, need only be considered over the restricted bandwidth of each sub-band. Once the filter bank separates out the sub-bands and processes each one of them separately, each sub-band is an effective narrow-band OFDM system in itself. Thus the delay spread induced by CD is very small per sub-band. This is one key advantage of MSB OFDM which achieves in effect reduced guard interval (reduced CP) without necessitating the heavy FDE pre-FFT channel equalizer required in optical long-haul implementations of OFDM transmission in order to keep the CP relatively short. Such pre-FFT equalizer is eliminated in our MSB OFDM Rx.

Continuing along the processing chain in FIG. 33 (which amounts to an expanded version of the sub-band OFDM Rx shown earlier in FIG. 8), the size of the FFT is 2N=128 points, and the FFT is followed by a 2-fold decimation step, performed by the EXTRACT HIGH/LOW HALF-BAND module, dropping one half of the FFT output points, retaining just N=64 points. This 2:1 step is part of the oversampled FB operation, as described in FIG. 8B, where we have seen that the dropped half-band alternates between the high and low half-bands: the high half-band is dropped for the even sub-band indexes and the low half-band is dropped for the odd sub-band indexes. At this point the rate has been halved, in our exemplary system down to 3.2 GS/s/2=1.66 GS/s per sub-band (we recall that each sub-band has bandwidth of S=1.66 GHZ so now we are now sampling at the Nyquist rate for each sub-band).

Next, as the received X and Y signals are linear combinations of the transmitted X and Y polarizations, 2×2 MIMO equalization is performed per sub-carrier. Each signal pair formed by n-th sub-carrier from the X polarization and n-th sub-carrier from the Y polarization for n=0, 1, . . . , N−1, is passed through a 2×2 MIMO transformation consisting of a butterfly of four complex multipliers as shown. The four complex tap values are set by a polarization adaptive tracking module.

Finally, the POL-cross-talk free sub-carriers for the X and Y POLs, emerging from the array of 2×2 MIMO EQZs, are presented in parallel to two Carrier Recovery modules one for each polarization. In the preferred embodiment we would use Multi-Symbol Delay Detection (MSDD) for the Carrier Recovery method [see our other patent application], however other methods may be used to estimate and mitigate the residual phase noise in each POL of each sub-band prior to decision (decision, i.e. slicing, is performed at the back end of each CR module).

The outputs of the CR+decision modules in the sub-band processor array represent the decided symbols for each of the X and Y polarizations of each of the sub-bands. Demapping each of the QAM sub-carrier symbols and multiplexing all resulting bit-streams yields the total bit-stream representing the equivalent of the 2×25 GBd signal.

Recapping the overall operation and rationale of the sub-band Rx, the processing is significantly improved, in terms of complexity as well as performance, by the fact that each sub-band is narrowband, hence it is frequency-flat. Therefore no memory (no FIR filtering) is required in the MIMO equalization, which may be accomplished by a simple 2×2 matrix consisting of four complex multipliers. Moreover, the sole effect of CD within the spectral extent of each sub-band is essentially a pure delay (corresponding to the group delay of the sub-band at its center frequency), while the distortion due to CD is negligible, provided that the sub-band is sufficiently spectrally narrow (in our exemplary system, the 1.66 GHz bandwidth per sub-band satisfies this condition as a measure of the negligible CD distortion, the number of taps necessary to equalize CD is less than a single tap for 2000 Km standard fiber over 1.66 GHz spectral window).

Thus, the CTO compensation is simply performed by an integer delay equal to the group delay of the sub-band rounded off to a multiple of the sampling interval. The estimation of CTO is more robust for the narrowband sub-bands than for a conventional OFDM receiver operating broadband over the full channel. Such CTO estimation may be carried out by the Schmidl-Cox algorithm or by the Minn algorithm, both used in wireless communication, as further detailed below in FIG. 43 addressing the impairment parameters estimation aspects. The Minn algorithm has not been used before in optical communication, but the fact that we apply it per sub-band facilitates its advantageous usage. As for the residual FTO (fine timing offset less than one sample interval), its compensation in the OFDM Rx is well known to amount to one-tap equalization (in the scalar case). In our dual-polarization vectorial case, the four complex multipliers would automatically assume a common value automatically compensating of FTO compensation, under the control of the adaptive tracking algorithm driven by a training sequence or decision directed. It follows that FTO estimation is not even necessary in our MSB OFDM Rx. There is no need to estimate FTO separately, as the POL ADAPTIVE TRACKING module which is training sequence based (e.g. using the LMS algorithm, or for QAM a decision-radius directed algorithm) automatically adjusts the linear phase resulting from the FTO, lumping it with the per sub-carrier phase deviation resulting from other impairments, such as residual CD or any residual frequency response along the channel or in the electro-optic Tx BE or in the Rx FE.

This completes the description of the MSB OFDM sub-band Rx. The overall Rx processing is seen to consist of a "divide&conquer" approach, with the top layer comprising the two filter banks (one per POL) which perform the "divide" of the wide channel spectrum into multiple narrowband sub-bands. The "conquer" occurs in the sub-band Rx processor array, as the sub-bands are easier to contend with individually, rather than processing the overall full channel at once.

In fiber communication, the CD-induced impairments grow quadratically in bandwidth, thus reducing bandwidth by a factor of M yields a beneficial CD-impairment reduction by a factor of $M^2$. The narrow-band frequency-flat sub-bands also imply that adaptive equalization algorithm are going to better convergence and attain faster convergence rates. Therefore, basing the optical coherent OFDM Rx on the OS analysis filter banks is very beneficial in terms of performance. It may be shown by counting the heaviest processing elements, namely the multipliers, that the OS analysis FB Rx of this figure has a substantial complexity reduction advantage over conventional prior art OFDM Rx.

Novel MSB DFT-S OFDM

Figure 34:
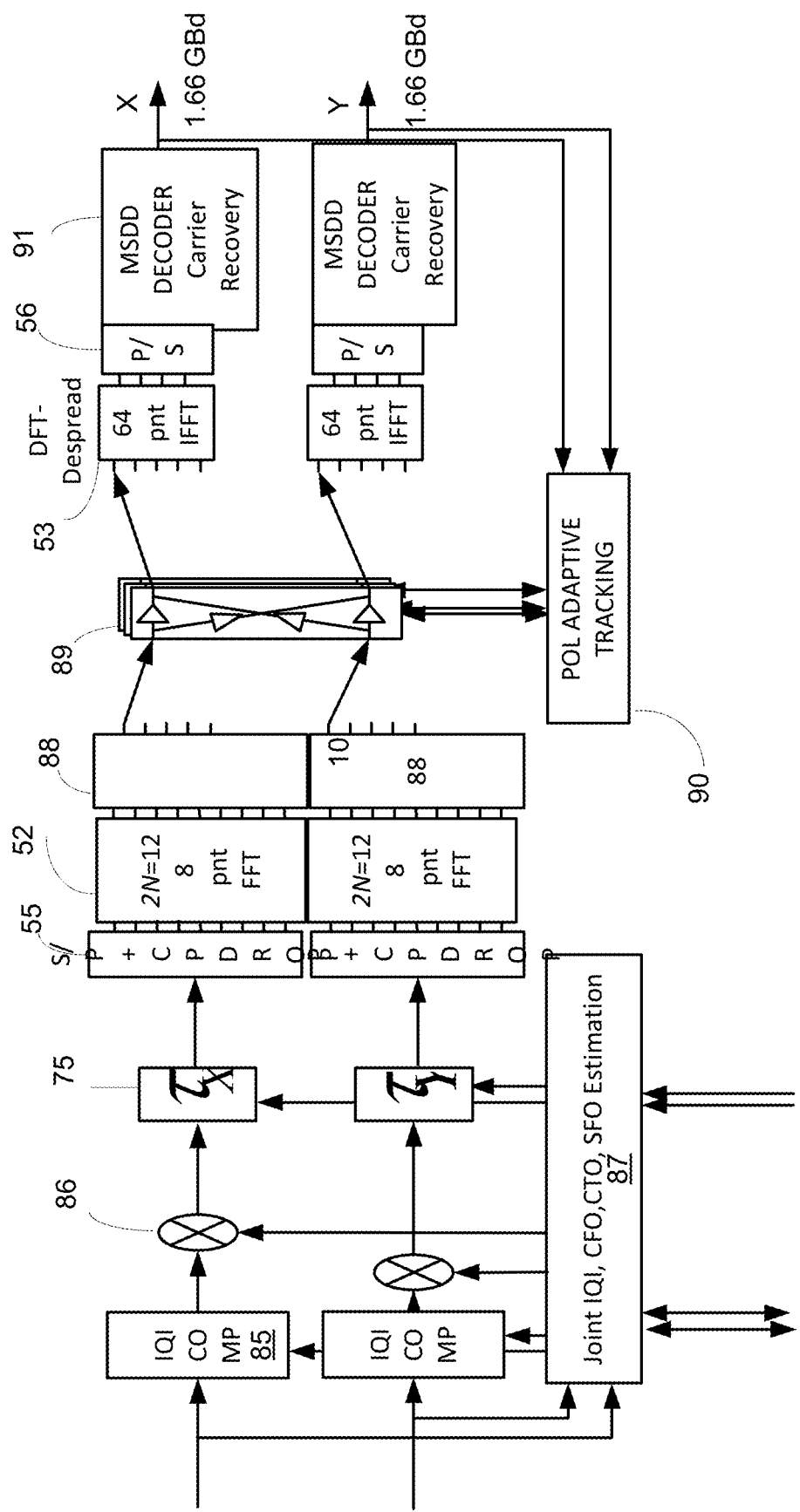

FIG. 34 presents the sub-band DFT-S Rx associated with our MSB DFT-S OFDM PDM Rx, as per the teaching of this invention. Notice that the top level of the MSB-DFT-S OFDM Rx is identical to the top level of the MSB OFDM Rx (without DFT-S) as shown in FIG. 32, which doubles up as both MSB OFDM Rx and MSB DFT-S OFDM Rx, with the two versions differing in the sub-band level OFDM Rx-s.

Our MSB DFT-S OFDM PDM Rx is driven by a prior art DFT-S PDM OFDM transmitter. Both our MSB OFDM and MSB DFT-S OFDM embodiments use the same top level Rx structure as shown FIG. 32, the difference between the two embodiments being in the respective sub-band Rx-s in FIGS. 33 and 34. In fact the only difference between our sub-band Rx embodiments (without and with DFT-S) is only in the incorporation of the N-pnt IFFTs used for DFT-despreading (one for X and one for Y) in the MSB DFT-S OFDM sub-band Rx of FIG. 34, at the outputs of the POL-demux modules. The spectral handling of the overall MSB DFT-S OFDM Rx is generally identical to a conventional prior-art DFT-S OFDM Rx, in the sense that multiple sub-single-carriers (SSC) each coinciding with a sub-band, which are multiplexed by a conventional prior art DFT-S OFDM Tx with its number of bands equal to the number of sub-bands in the OS analysis FB based MSB Rx, are each demultiplexed by the MSB Rx shown in FIG. 32 and the sub-bands are processed in parallel by the sub-band DFT-S OFDM Rx-s of FIG. 34. The realization complexity of our MSB DFT-S OFDM Rx is lower than that of the prior art DFT-S OFDM Rx.

Figure 35:
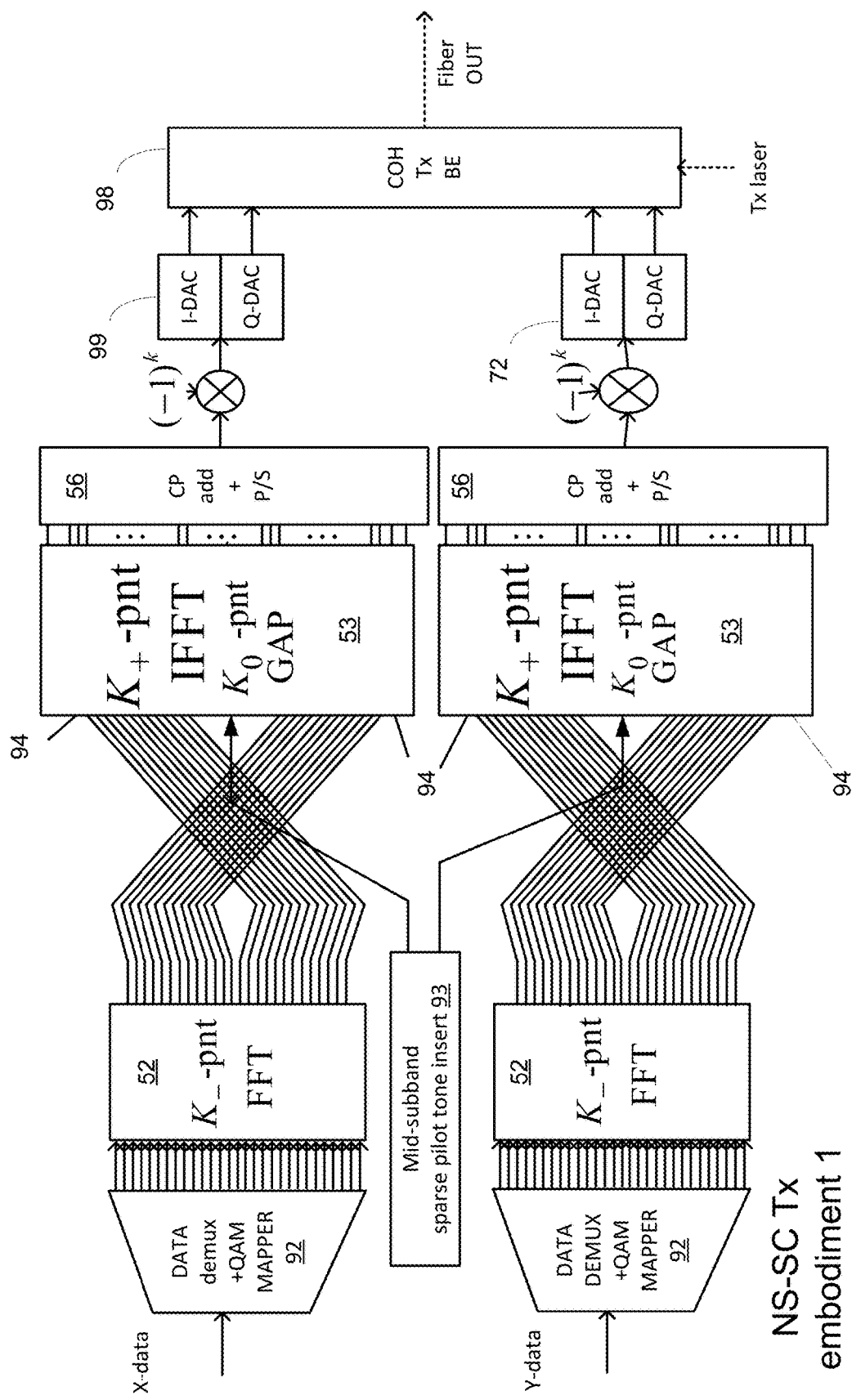
Figure 36:
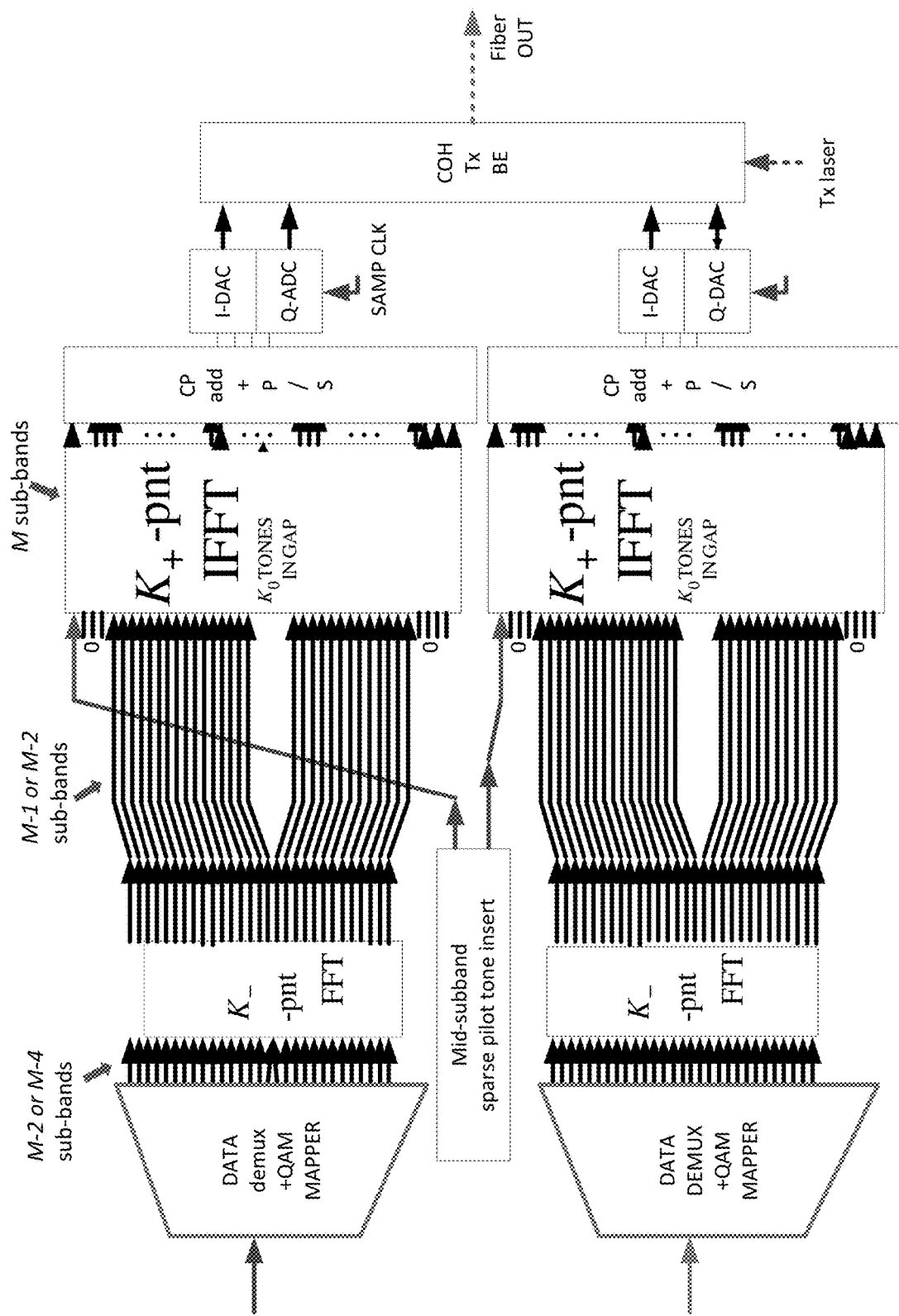

FIGS. 35,36 present alternative embodiments of our Nyquist-Shaped Single-Carrier (NS-SC) PDM Tx, as per the teaching of this invention. The term Nyquist-Shaped refers to a channel spectrum which is near-rectangular, enabling highly spectrally efficient packing of multiple channels tightly in frequency, in a coherent WDM system. Moreover, the transmitted signal after suitable reception should not in principle exhibit ISI. Furthermore, the ICI between adjacent NS-SC signals forming a WDM multiplex should also be zero in principle. These conditions are only approximately satisfied in practice, yet nominally the amounts of ISI and ICI would be lowered in the Nyquist shaped design.

The NS-SC Tx is innovatively realized here as a special case of DFT-S OFDM in the unconventional limiting case of having just one sub-single-carrier, with a few adjustments in terms of the sub-carriers mapping, comprising an innovative method of pilot sub-band insertion. As shown in FIG. 35, the disclosed Tx back-to-back connects a single $K_-$-pnt FFT with a $K_+$-pnt IFFT. Here $K_-<K_+$. Unlike in prior art DFT-S OFDM, here however there is a single DFT-spreading FFT, rather than multiple ones. In addition, also per the teaching of this invention, the method shown for pilot sub-band insertion is to insert a gap in the mapping of the outputs of the $K_-$-pnt FFT onto the inputs of the $K_+$-pnt IFFT. This gap provides the pilot sub-band, within which the training signal consisting of one or more pilots or other band-limited training sequences may be inserted. By a similar technique, other gaps may be introduced, providing other training or service channels. Notice that there are additional inputs at the extremities of the IFFT input record which are set to null (zero-padded) in order to provide anti-aliasing filter guard bands for the DACs. These gaps are actually symmetrically applied with $K_{ENDS}/2$ inputs nulled out at either end. As the signal generated by this transmitter is intended to be used with a sub-banded based Rx, it is worth setting all spectral widths (counted as integer sub-carrier numbers) equal to multiples of the sub-band spectral width, which equals N. In addition, it would be convenient to make the ratio $K_-/K_+ < 1$ as close to unity as possible, i.e. the total guard band $K_0+K_{ENDS}$ be small. Moreover, it is convenient to select one of the (I)FFTs to have a size which is a power-of-two, for ready implementation according to the Cooley-Tuckey (I)FFT algorithm (as $K_-/K_+ \approx 1$ it is not possible to have both $K_-$, $K_+$ be powers-of-two, but we should strive to make just one of them be a power-of-two, while letting the other one consist of a power-of-two times a small prime number different than 2 such as 3, 5 or 7. All these requirements are reconciled for the following exemplary designs (all with N=64) wherein M is the raw sub-bands number, N is the number of sub-carriers per sub-band $K_-=(M-2)N=14N=896$,      $K_+=MN=16N=1024$,
$K_0=N=64=K_{ENDS}$, M=16
$K_-=(M-2)N=16N=1024$;      $K_+=MN=18N=1152$,
$K_0=N=64=K_{ENDS}$, M=18
$K_-=(M-4)\cdot N=16N=1024$;      $K_+=MN=20N=1280$,
$K_0=2N=128=K_{ENDS}$, M=20

In the following figures we assume the first exemplary design with 896-pnt DFT-spread FFT feeding into the 1024-pnt FFT. This designs apparently has somewhat lower complexity than the other two designs. The pilot and the end intervals are then precisely one sub-band interval wide. This Tx is compatible with SC-MSBE Rx of FIGS. 37A-37B below.

Notice the permuted mapping of output ports of the FFT into the input ports of the IFFT, including the insertion of the pilot, as well as the alternating sign modulation by the $(-1)^k$, all intended to work together such that a time-domain input of a certain frequency at the FFT input is mapped into the same time-domain output (albeit upsampled) at the DAC inputs.

FIG. 36 presents an alternative embodiment of our Nyquist-Shaped Single-Carrier (NS-SC) PDM Tx, as per the teaching of this invention, differing from that FIG. 35 in the different treatment of the mapping of output ports of the FFT into the input ports of the IFFT, including the insertion of the pilot. Now, the modulation by $(-1)^k$ of FIG. 35 is eliminated and the two FFT halves of the output are not crossed over, however the pilot sub-band must now be inserted at the edge inputs of the IFFT, whereas the DAC transition spectral region corresponds to leaving a gap in the center IFFT inputs as shown.

Figure 37A:
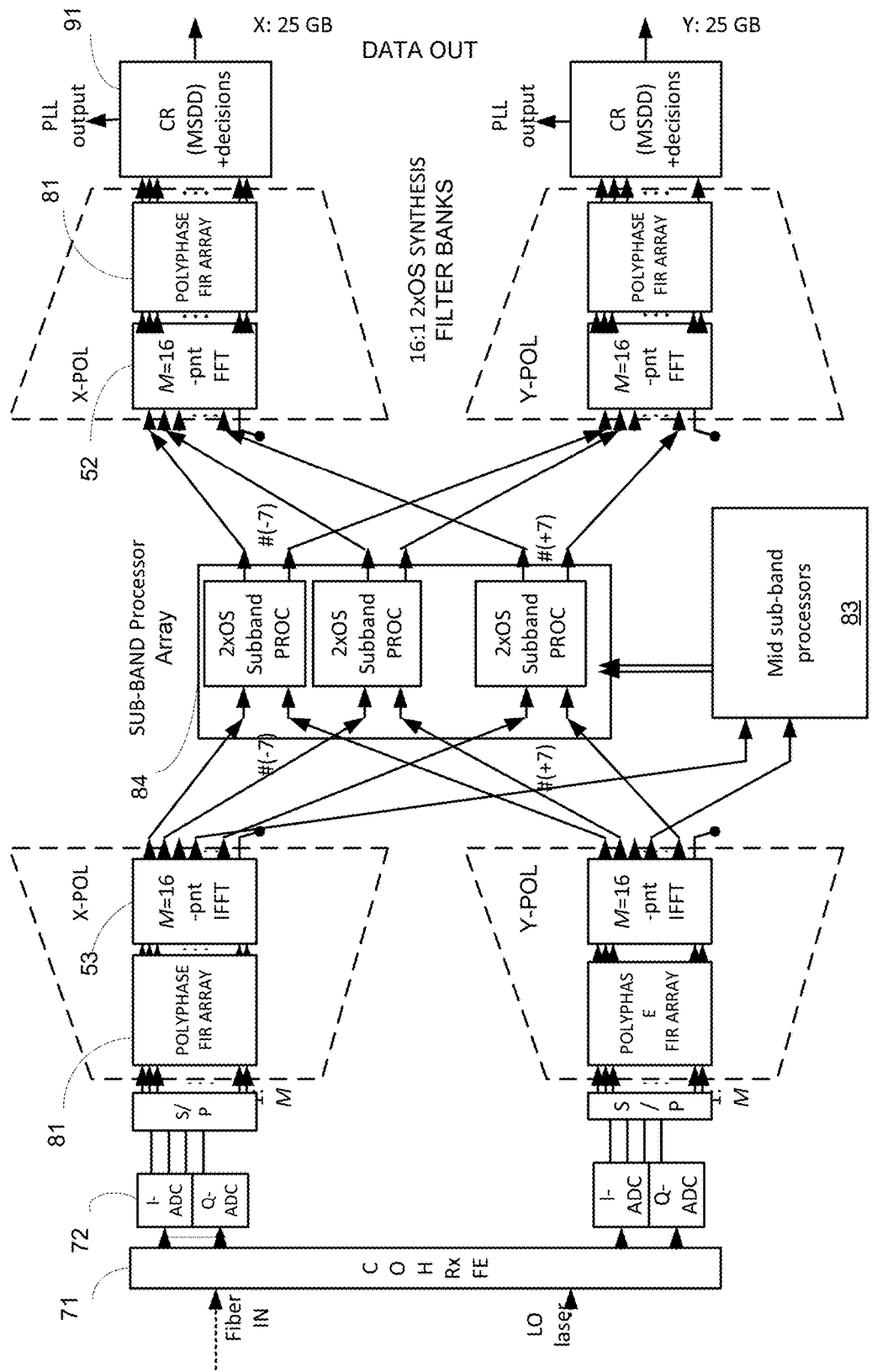
Figure 37B:
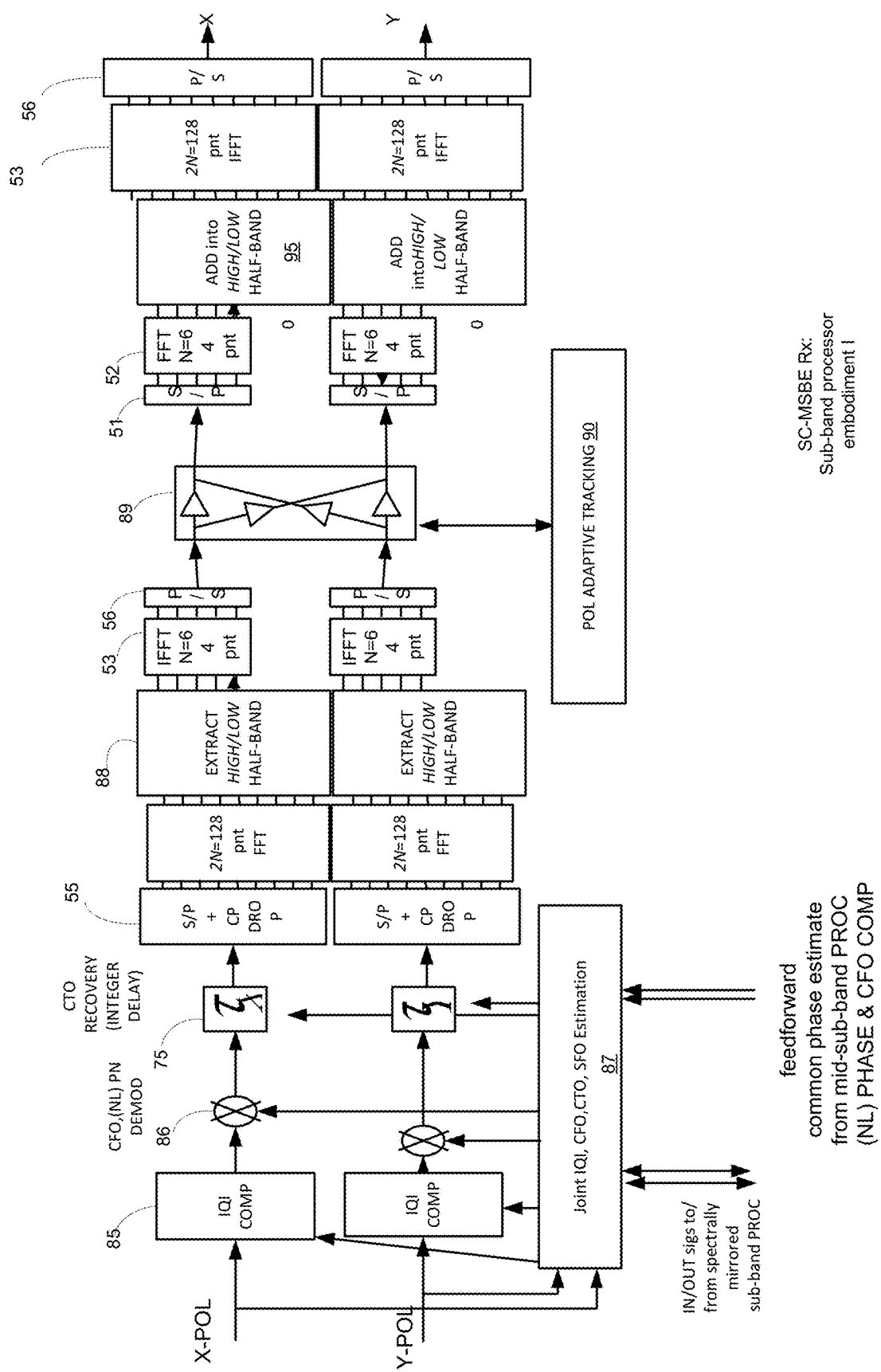

FIGS. 37A-37B disclose an embodiment of a single-carrier (SC) Rx using our novel multi-sub-band (MSB) processing. This receiver is referred to here as SC-MSBE Rx, where MSBE stands for MSB Equalization. According to the teachings of this invention, the Rx may operate with the single carrier spectrally sharp Tx of FIGS. 35,36 or with a conventional single-carrier Tx (provided certain measures are taken in the prior art Tx to provide training sequences as required for the initialization and channel estimation of our disclosed Rx).

The Rx disclosed in FIG. 37A is based on Single-Carrier Multi-Sub-Band-Equalization (SC-MSBE), as the received single-carrier signal is decomposed (spectrally analyzed) into sub-bands, and each sub-band is separately processed for impairments removal, then the sub-bands are assembled together to form a single carrier, which is further processed for phase noise equalization. FIG. 37B shows the detail of one possible embodiment of the sub-band processors (2×OS Sub-band PROC) appearing in the top level SC-MSBE Rx of FIG. 37A. Notice that although these processors contain (I)FFTs they have nothing to do with OFDM, as these (I)FFTs are associated with the decimation/interpolation at the sub-band level of two OS analysis and OS synthesis filter banks placed back-to-back, according to the principle of operation of the top level SC-MSBE Rx structure of FIG. 37A, as described next.

The top level receiver structure of FIG. 37A and particular sub-band processor version shown in FIG. 37B are not the preferred ones, however these particular versions initiate progressive derivation of our final preferred embodiment for the SC-MSBE Rx. The initial embodiment of FIG. 37A is based on the cascade of three sub-systems, namely Analysis FB→sub-bands processing→synthesis FB.

The Analysis FB separates out the channel into sub-bands. The demultiplexed sub-bands are processed in the array of MSB processors, having the timing of all sub-bands mutually aligned, and removing other impairments, including POL cross-talk. Then the 'cleaned-up' sub-bands are re-assembled to form a cleaned-up overall single-carrier filling the entire channel. This is accomplished by a Synthesis FB, which is the dual of the analysis FB, and may also be efficiently realized using any of our embodiments of novel 2×OS analysis FB. Each sub-band processor (PROC) unit of the sub-band processor array feeds a corresponding output of one of the two synthesis FBs for the X and Y POLs, as shown. The i-th sub-band PROC X output feeds the i-th input port of the X-POL synthesis FB, while the i-th sub-band PROC Y output feeds the i-th input port of the Y-POL synthesis FB. The output of each synthesis filter bank (one per POL) is finally processed in a wideband carrier recovery (CR) system, which generates the decisions. Our preferred embodiment for the CR is also MSDD based, but we use a block-parallelized version of this MSDD called poly-block. One advantage of bringing the signal back to higher rate (by re-assembling the sub-bands by means of the synthesis filter bank) prior to applying the MSDD, is that the enhanced sampling rate implies better tolerance to laser phase noise (laser phase noise tolerance is a monotonically decreasing function of the sampling rate, due to the random walk of the phase which picks up more variance over longer sampling intervals, decorrelating the phase samples and degrading the quality of the phase estimation).

FIG. 37B presents the detail of the initial sub-band processor embodiment for the SC-MSBE Rx. The first three quarters of this processor are identical to the three quarters of the sub-band Rx used in FIGS. 33,34 for MSB (DFT-S) OFDM. Following estimation and compensation of the IQI, CFO, (NL) PN, and CTO impairments, we perform the 2:1 decimation by means of a pair of a 2N-pnt FFT back-to-back with an N-pnt FFT, extracting half the oversampled band while dropping the other half, as shown in FIG. 8 (the EXTRACT HIGH/LOW HALF-BAND modules). This is then followed by adaptive polarization tracking of the time-domain received X and Y signals band-passed to a spectral content limited to the particular 1.66 GHz sub-band. Thus the 2:1 FFT-IFFT based decimator completes the 2×OS filter bank action, cleaning up the imperfection of the bandpass filters of the filter-bank. In the remainder of the sub-band processor, having mitigated the polarization and other impairments of each sub-band, we proceed to the re-assembly the sub-bands to a complete (cleaned up) single-carrier signal, by means of the 2×OS synthesis FB, aided by the preliminary processing already performed in the back-end of the sub-band processor, namely 1:2 IFFT-FFT based interpolation (an N-pnt IFFT feeding a 2N-pnt IFFT). Here we also need to perform a cyclic shift of half-band for the odd numbered sub-band indexes, in order to conform with the synthesis FB action shown in FIG. 8. This operation is performed by the ADD into HIGH/LOW HALF-BAND module.

Figure 38:
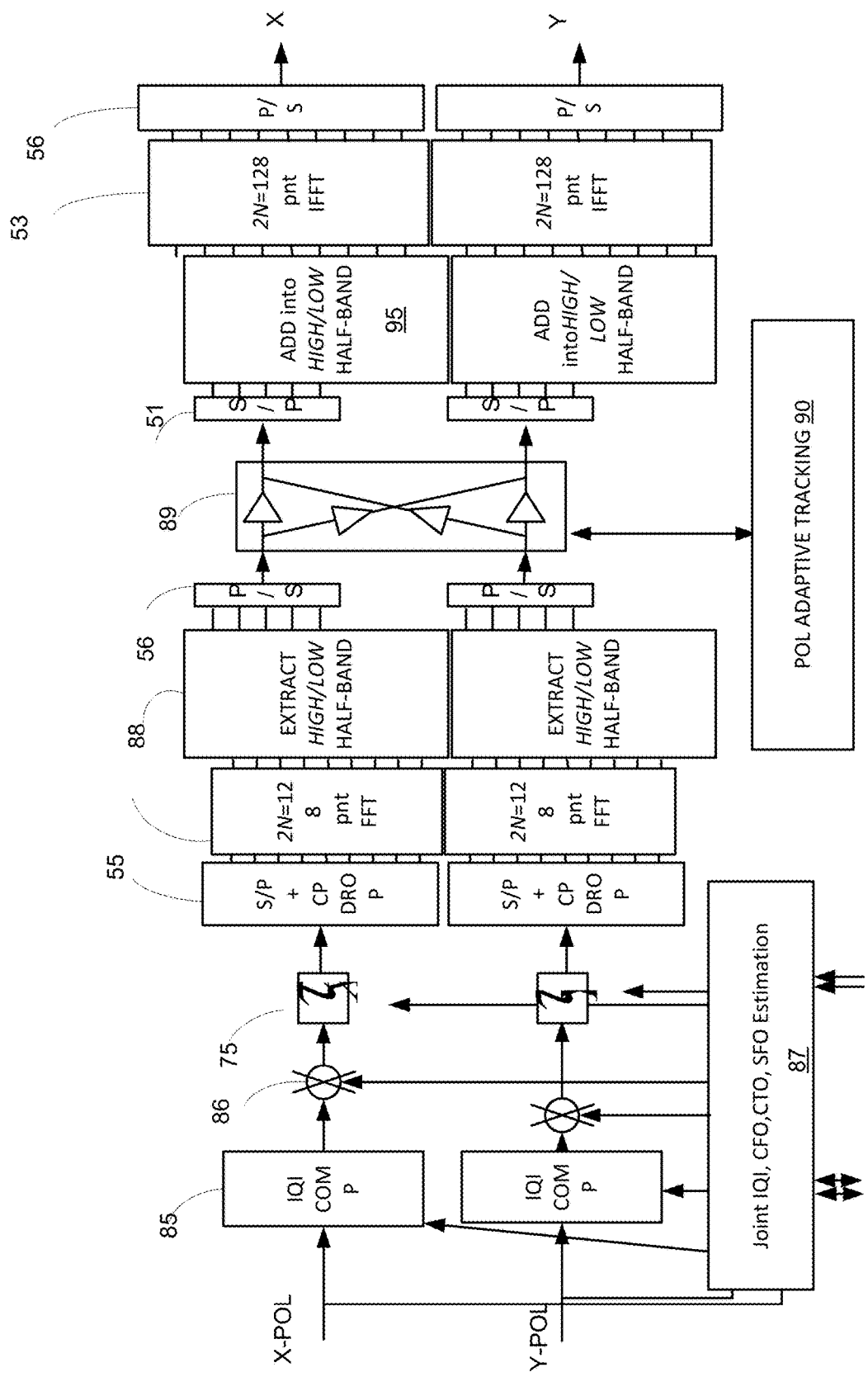

FIG. 38 starts from FIG. 37B and proceeds to derive an alternative embodiment of the sub-band PROC. Using the linearity of the (I)DFT and the 2×2 MIMO transformation, we perform the following simplification:

$$v_n^X = DFT_{64}\{W_{XX} \cdot IDFT_{64}\{u_n^X\} + W_{YX} \cdot IDFT_{64}\{u_n^Y\}\} =$$
$$W_{XX} \cdot DFT_{64}\{IDFT_{64}(u_n^X)\} + W_{YX} \cdot DFT_{64}\{IDFT_{64}\{u_n^Y\}\} =$$
$$W_{XX} \cdot u_n^X + W_{YX} \cdot u_n^Y$$
$$v_n^Y = DFT_{64}\{W_{XY} \cdot IDFT_{64}\{u_n^X\} + W_{YY} \cdot IDFT_{64}\{u_n^Y\}\} =$$
$$W_{XY} \cdot DFT_{64}\{IDFT_{64}(u_n^X)\} + W_{YY} \cdot DFT_{64}\{IDFT_{64}\{u_n^Y\}\} =$$
$$W_{XY} \cdot u_n^X + W_{YY} \cdot u_n^Y$$

The significance of this result is that the back to back N-pnt (I)FFTs may be discarded in FIG. 37B, yielding the system of the current FIG. 38, performing the MIMO operation directly on the serialized the half-band of the 2N-FFT output, and mapping the two outputs onto half-bands of the 2N-pnt IFFT inputs.

Figure 39:
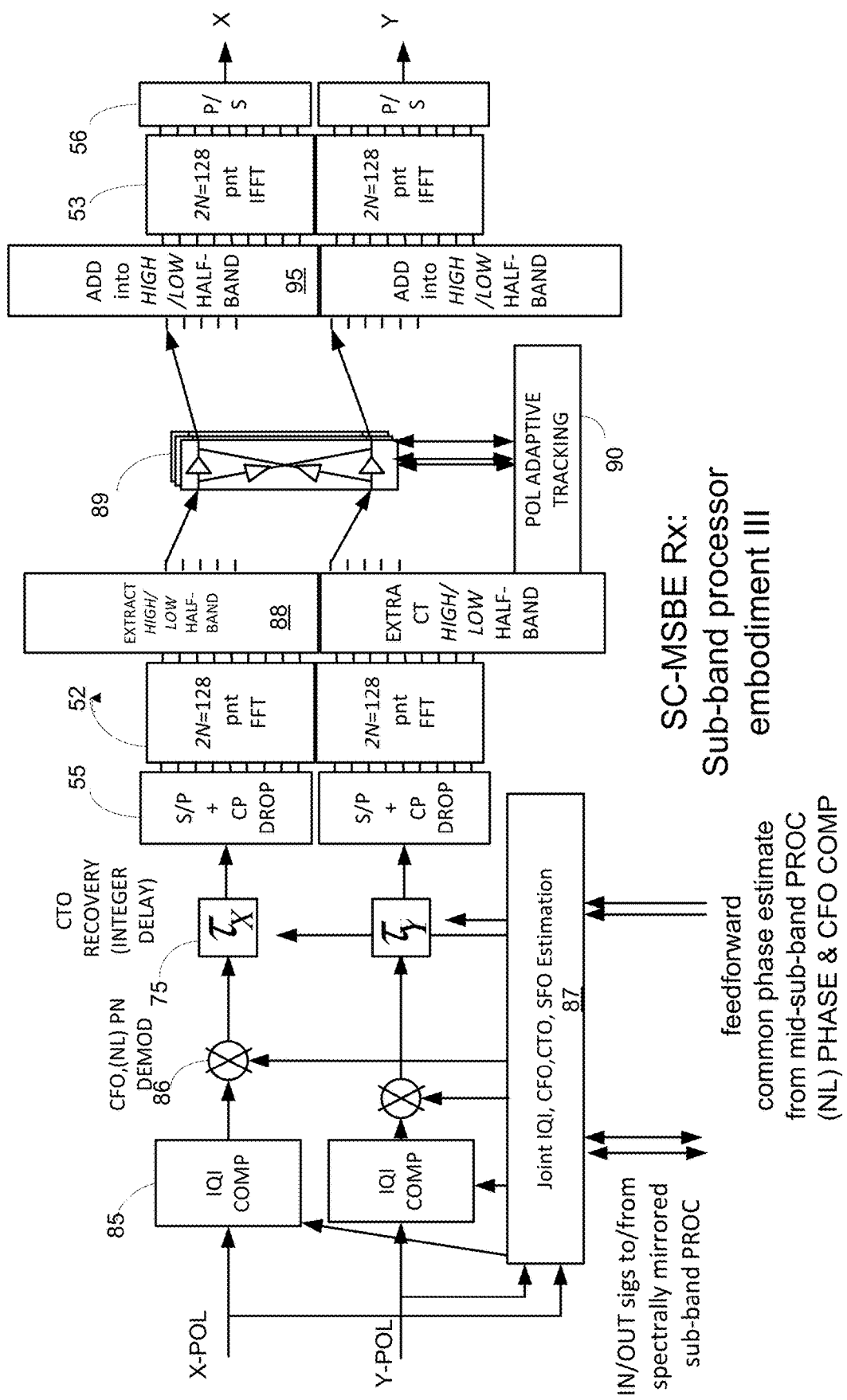

FIG. 39 continues the further simplification of the embodiment of the sub-band PROC derived in FIG. 38. Rather than serializing the parallel outputs of the DROP HIGH/LOW SUB-BAND modules, performing the 2×2 MIMO processing at the serialized rate of 1.66 GS/s, and then parallelizing again for application to the inputs of the ADD into HIGH/LOW HALF-BAND module, as in FIG. 38, it is more convenient, as shown in the current FIG. 39, to parallelize the MIMO operation, applying it onto each sub-carrier X,Y pair at lower rate by a factor of N (but now require N such parallel 2×2 MIMO modules). The figure then describes the preferred embodiment of the sub-band processor for SC-MSBE, to be used in conjunction with the top level SC-MSBE Rx structure of FIG. 37A. In the following two figures we present an even simpler embodiment of the SC-MSBE Rx top level of FIG. 37A, thus achieving simplification of the overall SC-MSBE Rx at both at the top level and the sub-processor level.

Figure 40A:
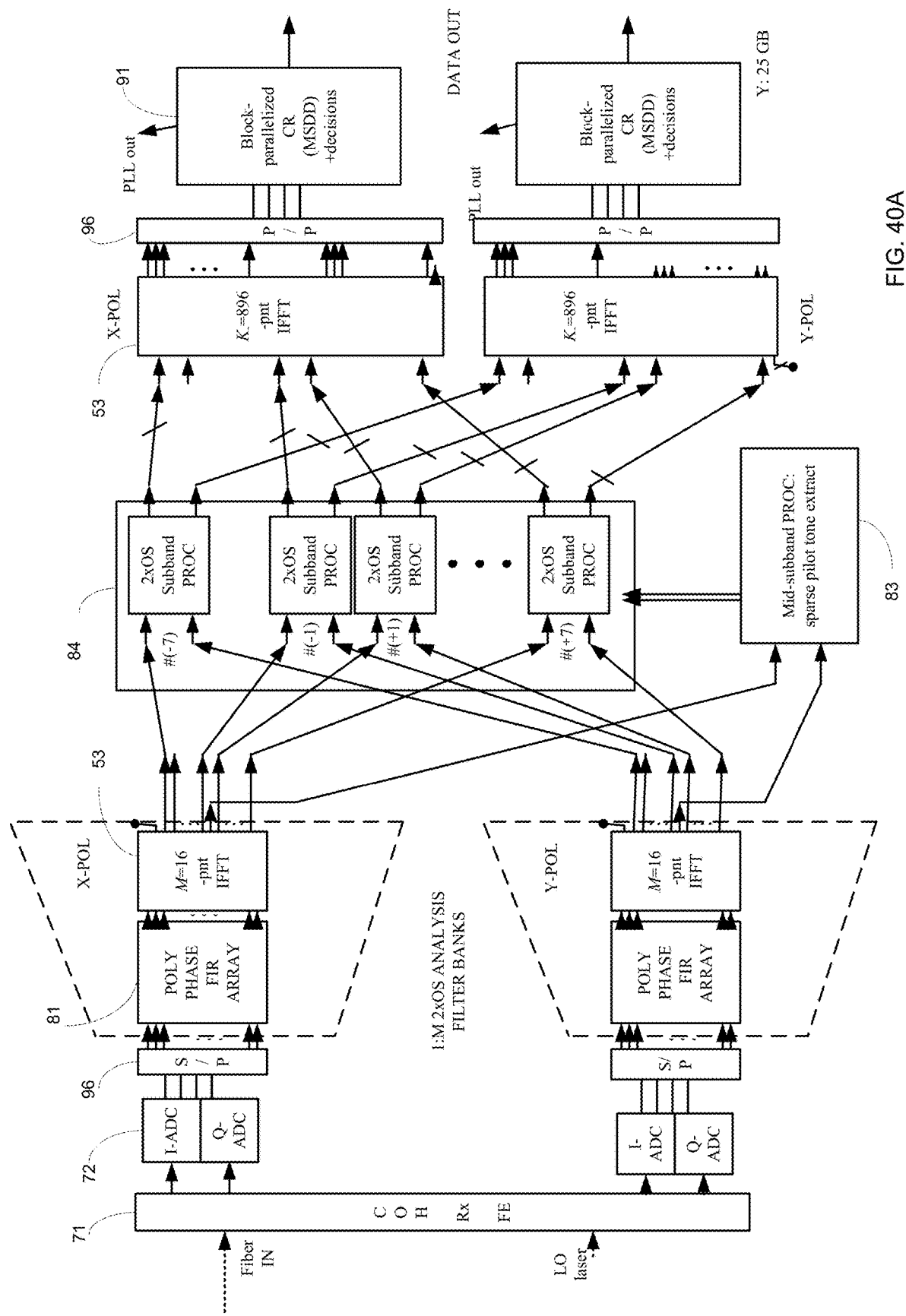
Figure 40B:
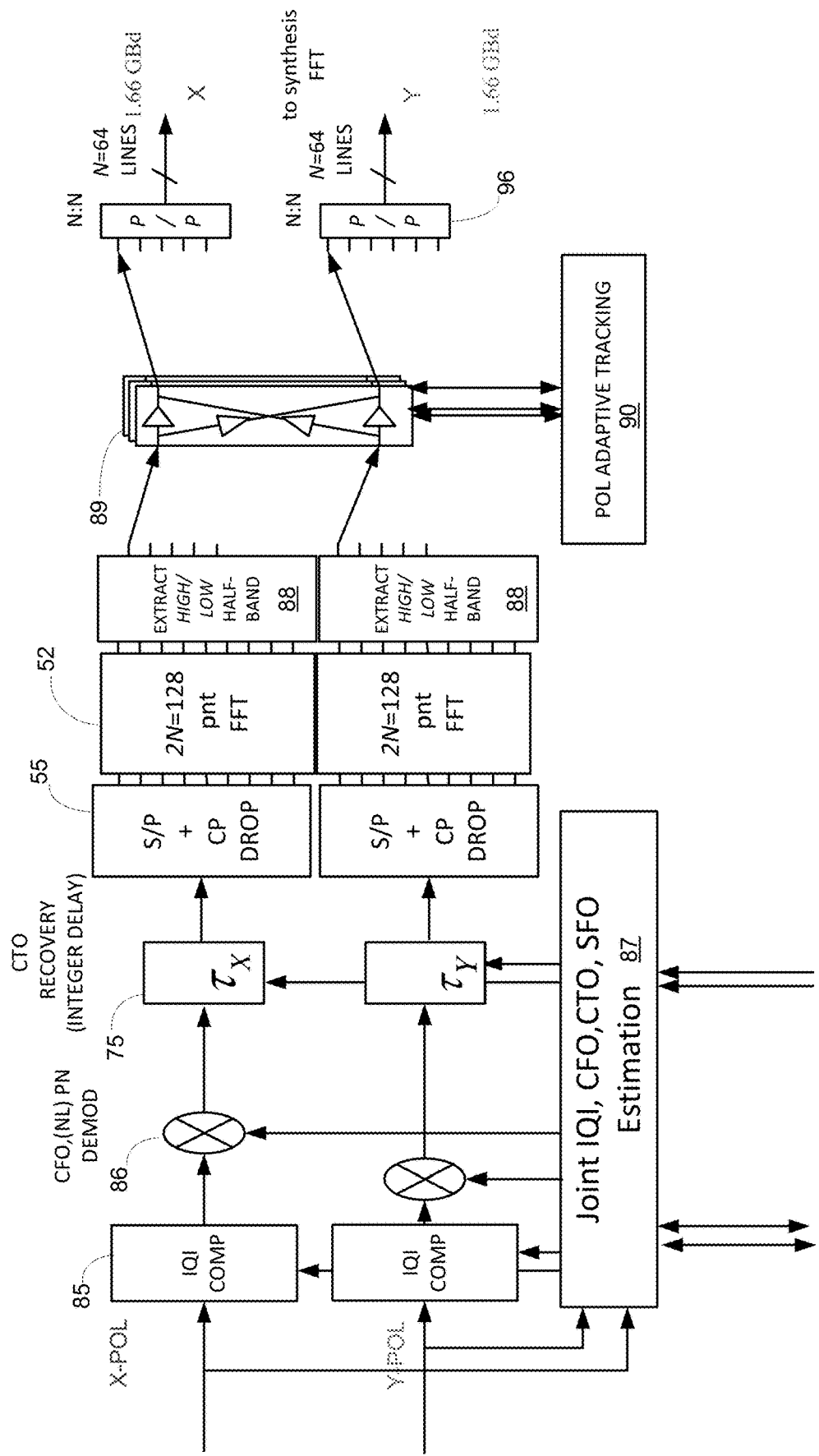

FIG. 40A presents the top level of our preferred embodiment of the SC-MSBE PDM Rx, applicable for single carrier transmission. FIG. 40B details the preferred embodiment of the associated sub-band processors. This SC-MSBE Rx system is compatible with our Single-Carrier Nyquist Shaped PDM Tx embodiments of FIG. 35,36, however the SC-MSBE Rx of FIG. 40A,B may also compatibly function with any conventional SC PDM Tx which is DACs based, provided that suitable training sequences are digitally inserted in the time domain via the DACs to enable the operation of the Joint IQI, CFO, CTO, SFO. As shown in FIG. 40A, with this Rx we achieve single carrier processing by recombining the individually processed sub-bands into an overall single-carrier broadband signal occupying the whole channel. However, unlike in the embodiment of the SC-MSBE Rx of FIG. 37A, the re-assembly of sub-bands is not performed here with synthesis FBs, but is accomplished using instead a DFT-despreading-like IFFT (of size L=896 points in this exemplary system), one such IFFT per polarization. The inputs to this IFFT are derived from the assembling the parallel outputs of the X (Y) OFDM sub-band processors. Thus the synthesis filter banks of FIG. 37A for the two POLs, have been replaced by the IC-pnt IFFTs in the current FIG. 40A. The reason this is possible is that the CTO compensation function in the sub-band processors re-aligns the spread in timing of the sub-bands, thus the overall delay spread is now well within the CP, therefore the may be used at this point to undo the corresponding $K_-$-pnt FFT action in the NS-SC Tx of FIG. 35 or 36.

The sub-bands re-assembly (or synthesis) $K_-$-pnt IFFT at the top level of the SC-MSBE Rx of FIG. 40A also performs the role of the previously used 2N-pnt IFFT in each of the sub-band processors in FIG. 39. Thus, this 2N-pnt IFFT in the SC-MSBE sub-band processor embodiment of FIG. 39 may be simply discarded, yielding the preferred SC-MSBE sub-band processor embodiment of FIG. 40B.

We reiterate that the top level SC-MSBE Rx of FIG. 40A along with the SC-MSBE sub-band processor embodiment of FIG. 40B form our preferred embodiment for single-carrier detection.

Also notice that the mid-sub-band which was interspersed by our NS-SC Tx with the data the inputs into the $K_+$-pnt FFT is routed to the Mid-sub-band processor, hence no sub-band processor is provided for it in the sub-band PROC array, thus the remaining data-carrying sub-bands become contiguous, indicating that the insertion of the pilot sub-band in the SC Tx of FIG. 35 or 36 does not disturb the inevitability of the $K_-$-pnt FFT action in the NS-SC Tx by means of the $K_-$-pnt IFFT of the current figure. The outputs of the $K_-$-pnt IFFT, carrying in effect single carrier transmission, are parallelized and presented to the block-parallelized CR, just as in FIG. 37A.

Next we present a family of embodiments referred to as bonded-MSBE (B-MSBE). This is a variant of our MSB DFT-S OFDM, enhanced such that the number $N_{SSC}$ of DFT-S sub-single-carriers (SSC) need no longer coincide with the number M of sub-bands (in our MSB DFT-S OFDM embodiment each sub-band carried a sub-single-carrier as generated by a prior art DFT-S OFDM Tx with precisely M DFT-S FFTs (same number as the number of sub-bands in the OS analysis FB based Rx). The new B-MSBE Rx may also be viewed as a generalized version of an DFT-S OFDM Rx wherein the processing of the individual SSCs is carried out by assigning multiple sub-bands per SSC (rather than precisely one sub-band per SSC as in our earlier MSB DFT-S OFDM embodiment).

Figure 41:
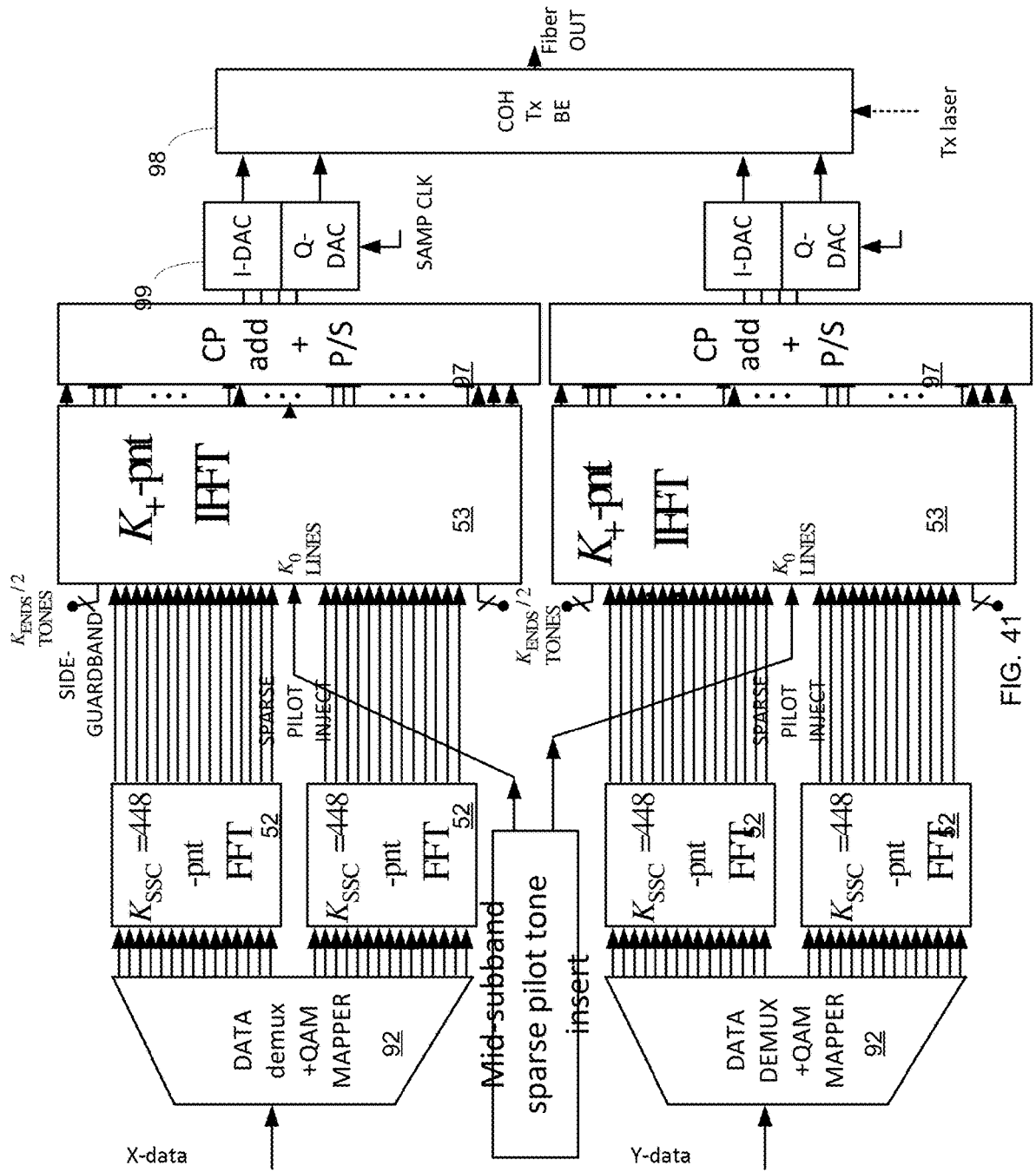

FIG. 41 presents an exemplary embodiment of a prior art DFT-S Tx [DFT-Spread OFDM for Fiber Nonlinearity Mitigation Yan Tang, William Shieh, and Brian S. Krongold, IEEE PHOTONICS TECHNOLOGY LETTERS, VOL. 22, pp. 1250-1252, 2010], enhanced by inclusion of mid-band sparse pilot tone injection, used here to generate transmission compatible with for the novel B-MSBE Rx, presently introduced in FIG. 42 below. Here the DFT-S Tx uses $N_{SSC}$ DFT-S FFTs, i.e., it is configured to generate a number $N_{SSC}$ ($N_{SSC}$=2 in this exemplary case) of DFT-S sub-single carriers which is less than the number M of "MSB sub-bands" used in the B-MSBE Rx of FIG. 42 below. Generally the size of each of the $N_{SSC}$ (here two) DFT-spreading FFTs is $K_{SCC}=K_-/N_{SSC}=(K_+-K_0-K_{ENDS})/N_{SSC}$-pnts.

Figure 42:
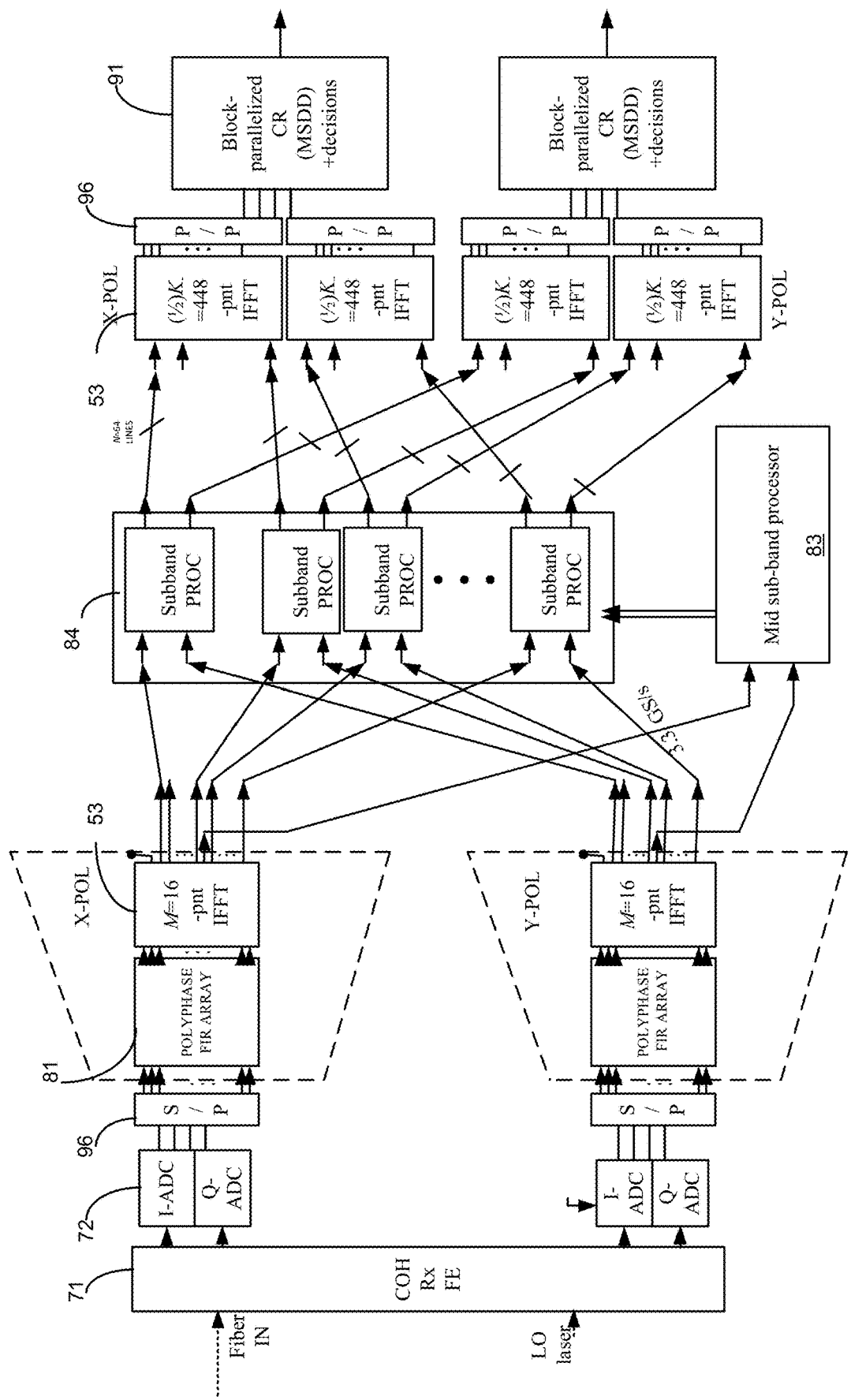

In anticipation of comprehending the reception of this signal by the B-MSBE Rx disclosed in FIG. 42, each DFT-S band generated by the DFT-S OFDM Tx of FIG. 41, carrying a sub-single-carrier (SSC), is to be interpreted here as effectively having a sub-banded internal structure, i.e. viewed as bonding together $M/N_{SSC}$ sub-bands. The bonded sub-bands form $N_{SSC}$ Sub-Single-Carriers (SSC) (here two of them) which are tightly packed in frequency, as generated by the DFT-spreading FFTs of the DFT-S Tx of FIG. 41, forming the transmitted optical channel (evidently the prior art DFT-S Tx is not cognizant of the sub-band structure, yet its sub-single carriers may effectively be viewed as composed of several sub-bands bonded together). However, this transmission is not to be decoded with a conventional DFT-S Rx, but is rather received more conveniently with the novel B-MSBE Rx of the next figure.

FIG. 42 presents, according to the teachings of this invention, a Bonded-Multi-Sub-Band-Equalized (B-MSBE) Rx compatible with the prior art DFT-S OFDM PDM Tx of FIG. 41, which is viewed as the corresponding B-MSBE Tx, and with the sub-band processors used here for B-MSBE shown in FIG. 40B, coinciding with the SC-MSBE sub-band processors.

The Rx disclosed in this figure differs from the MSB DFT-S OFDM Rx (FIG. 32 for the top level and FIG. 34 for the sub-band Rx-s) in that the reception is no longer constrained to require that the number of processed sub-bands coincide with the number of SSCs. Rather, each SSC may now have a spectral width equal to any integer multiple of the sub-band width, i.e. may contain an integer number of sub-bands. In the exemplary system shown, the number of sub-bands per SSC happens to be M/2, where M is the total number of sub-bands, however other ratios are possible, e.g. M/4 or M/8 sub-bands per SSC, implying that there are 4 or 8 SSCs conveyed per channel. The process of grouping several sub-bands together to form an SSC is referred to as sub-bands bonding. Remarkably, in this approach we have decoupled the spectral supports of the sub-bands and SSCs (which now amount to bonded sub-bands). This enables for example extraction of a subset of SSC by a specialized "drop" Rx. Moreover, synthesizing a lower number of SSCs, while maintaining the same number (say M=16) of sub-bands per FB, allows to decouple the DSP hardware considerations, e.g., as driven by complexity considerations, from the optimization the SSC spectral widths (and numbers) driven by optimal performance considerations, e.g. improve PAPR and non-linear tolerance. As shown by [DFT-Spread OFDM for Fiber Nonlinearity Mitigation Yan Tang, William Shieh, and Brian S. Krongold, IEEE PHOTONICS TECHNOLOGY LETTERS, VOL. 22, pp. 1250-1252, 2010], the spectral width of the sub-bands in DFT-S OFDM must be carefully optimized for best non-linear performance, thus having it constrained to the precise value S=B/M as dictated by signal processing considerations, as in the MSB DFT-S OFDM embodiment of FIG. 34, might be too restrictive. The disclosed method enables selecting any number $N_{SSC}$ of sub-single-carriers subject to $N_{SSC}$ dividing the number M of sub-bands. This provides flexibility and an improved tradeoff between complexity and performance, as the number of sub-bands is typically selected according to DSP complexity considerations, whereas the number of the SSC bands is independently selected according to other considerations such as the PAPR and non-linear tolerance (subject to the requirement that that number of SSC bands which are be a divisor of the number M of sub-bands).

We now have a continuum of Rx structures from conventional OFDM via DFT-S OFDM (viewed as multiplexed transmission of multiple SSCs) all the way to single-carrier transmission, with number of SSCs selected at will to be any divisor of M from 1 to M, and with an underlying sub-band processing structure underneath, which in turn is constructed over an OFDM sub-carrier infrastructure.

FIG. 43A-F presents the Joint IQI, CFO, CTO E&C and its sub-systems and modules key elements in the SC-MSBE sub-band PROC.

FIG. 43 presents the JOINT IQI, CFO, CTO E&C and its sub-systems and modules which are key elements in the MSB (DFT-S) OFDM sub-band Rx and SC-MSBE sub-band PROC of FIGS. 33, 34, 40B. According to the teachings of this invention, the E&C functionality above should be performed not on per-sub-band basis but rather be jointly performed on pairs of sub-bands with center frequencies symmetrical around the mid-band frequency. Thus, in the bi-polar indexing convention for the sub-bands, whereby the index 0 denotes the sub-band at the mid-band frequency, the two sub-bands indexed +i and −i are symmetrically placed around zero-frequency of the complex-envelope, and should be processed together (these sub-bands are referred to here as mirror sub-bands). Referring to FIG. 43A, the signals associated with the two mirror sub-bands are denoted $r_k^{(\pm i)}$.

These signals are degraded IQI, CFO and CTO impairments and are therefore sequentially passed through the IQI COMP, CFO(+PN) COMP and CTO COMP modules, in this order, for the three types of impairments to be compensated for. It turns out that the ordering of the three compensation modules is critical; the selection of the optimal ordering out of the six possible orderings is non-trivial. The reason why impairments compensation order is important is that there is coupling between the three types of impairments which mutually affect one another, while also affecting the ability to estimate and compensate these impairments. The procedure for estimation of the operating parameters to be further input into the three compensator modules (namely estimates of the amounts of IQI, CFO and CTO impairments) occurs in the novel module marked 'JOINT IQI, CFO, CTO Estimation' and will be detailed further below. First, let us describe the operation of the three comp modules. Actually, compensations of CFO and CTO are well known (provided good estimates of these parameters have been derived). The CFO is simply compensated by demodulating the signal with an estimate of the time-evolving rotating phasor. This phasor may be available from the sparse pilot tone or may be generated from estimates of the phase increments by a numerically controlled oscillator (NCO), the functionality of which is fully defined by the mapping $\hat{\theta}[k'] \to \exp\{j\Sigma_{k'=0}^{k}\hat{\theta}[k']\}$. In this case the challenge is to estimate the phase increments $\hat{\theta}[k']$ in the wake of coupling between the CFO target impairment and the other two impairments, but the estimation task will be addressed below. We also mention that the estimated phase associated with CFO is common phase equally affecting all sub-bands, thus it is to be equally applied for demodulation to both mirror sub-bands, as reflected in the CFO COMP structure which multiplies both outputs of the first IQI COMP block (corresponding to the two mirror sub-bands) by the conjugate of the rotating phasor above. As for CTO compensation, once the amount $\hat{\tau}^{(\pm i)}$ of coarse timing offset has been estimated (in integer units at the sub-band sampling rate) then the CTO COMP module simply applies the opposite integer delays $-\hat{\tau}^{(\pm i)}$ as shown. The CFO and CTO estimates are derived from the estimation module D&C based CTO&CFO joint EST' (D&C stands for "Delay&Correlate") to be described below.

Describing now the IQI COMP module, this novel module is specified by the following non-linear transformation of the two sub-band signals, comprising linear combinations but also complex conjugations (CC), denoted by an overbar here (making it non-linear):

$$R_k^{(i)} = \overline{r_k^{(i)} - \hat{\gamma}^{(-i)} r_k^{(-i)}} = \overline{r_k^{(i)}} - \hat{\gamma}^{(-i)} \overline{r_k^{(-i)}} \quad (4)$$
$$R_k^{(-i)} = -\hat{\gamma}^{(i)} \overline{r_k^{(i)}} + r_k^{(-i)}$$

The parameters $\hat{\gamma}^{(\pm i)}$, representing the amounts of IQI imbalance in the two respective mirror sub-bands, are estimated by the IQI EST module. The justification for this IQI COMP structure is that the model for the generation of IQI imbalance impairment in the coherent optical Rx front-end is as follows. Considering all sub-band spectral slices as being conceptually superposed to form the optically detected broadband signal at the optical Rx FE input, then this signal is written as $$\rho_k = \sum_{i=1}^{M/2-1} \Sigma_{\pm} \rho_k^{(\pm i)}.$$

In particular, the input sub-bands $\rho_k^{(\pm i)}$ generate their own IQI impairments at the output of the Rx FE, yielding the following impaired contributions to the overall broadband output $r_k$ of the Rx FE:

$$\rho_k^{(\pm i)IQI} = \alpha^{(\pm i)}\rho_k^{(\pm i)} + \beta^{(\pm i)}\overline{\rho_k^{(\mp i)}} \propto \rho_k^{(\pm i)} + \gamma^{(\pm i)}$$
$$\overline{\rho_k^{(\mp i)}}; \gamma^{(\pm i)} = \beta^{(\pm i)}/\alpha^{(\pm i)} \quad (5)$$

The first equality above is a well-known model of IQ imbalance, e.g. [J. Tubbax et al., Proc. GLOBECOM'03, (2003)]. The proportionality relation is obtained by dividing and multiplying by $\alpha^{(\pm i)}$ and introducing the definition of $\gamma^{(\pm i)}$ as a single complex parameter defining the imbalance, as constants $\alpha^{(\pm i)}$ in the E&C chain do not matter (the carrier recovery and polarization demux modules compensate for any undermined multiplicative constants in the processing chain). Now the signal components $\rho_k^{(\pm i)IQI}$ within the broadband signal $r_k$ at the Rx FE output are no longer confined to the respective $\pm i$ sub-bands. Indeed, considering first $\rho_f^{(i)IQI} \propto \rho_k^{(i)} + \gamma^{(i)}\overline{\rho_k^{(i)}}$, the CC on $\overline{\rho_k^{(i)}}$ corresponds to conjugate inversion in the spectral domain, thus the contribution $\gamma^{(i)}\overline{\rho_k^{(i)}}$ will actually appear in the $-i^{th}$ sub-band output after filtering through the filter bank. Similarly, inspecting $\rho_k^{(-i)IQI} \propto \rho_k^{(-i)} + \gamma^{(-i)}\overline{\rho_k^{(-i)}}$, the CC on $\overline{\rho_k^{(-i)}}$ implies that the contribution $\gamma^{(-i)}\overline{\rho_k^{(-i)}}$ will be spectrally CC-ed and mirrored over and will actually appear in the $+i^{th}$ sub-band output after filtering through the filter bank. Thus, the two CC-ed contributions $\gamma^{(\pm i)}\overline{\rho_k^{(\pm i)}}$ actually "cross-over" to the mirror sub-band output, whereas the contributions $\rho_k^{(\pm i)}$ actually "stay put" appearing in the corresponding sub-bands at the FB output. It follows that the following signals are obtained at the two mirror sub-band outputs of the FB:

$$r_k^{(i)} = \rho_k^{(i)} \pm \gamma^{(-i)}\overline{\rho_k^{(-i)}}; \; r_k^{(-i)} = \rho_k^{(-i)} + \gamma^{(i)}\overline{\rho_k^{(i)}} \tag{6}$$

This completes our model, derived for the first time to our knowledge, of the interaction between IQI and sub-band filtering via a FB. At this point we may verify that our novel embodiment of IQI COMP as described in Eq. (4) is indeed able to compensate for the IQI impairment of Eq. (6). This is accomplished by substituting Eqs. (6) into Eqs. (4) and simplifying, yielding $$R_k^{(i)} = \rho_k^{(i)} + \gamma^{(-i)}\overline{\rho_k^{(i)}} - \hat{\gamma}^{(-i)}\left[\overline{\rho_k^{(-i)}} + \overline{\gamma^{(i)}\overline{\rho_k^{(i)}}}\right] = \tag{7}$$

$$\left(1 + \hat{\gamma}^{(-i)}\overline{\gamma^{(i)}}\right)\rho_k^{(i)} + (\gamma^{(-i)} - \hat{\gamma}^{(-i)})\overline{\rho_k^{(-i)}}$$

$$R_k^{(-i)} = -\gamma^{(-i)}\left[\overline{\rho_k^{(i)}} + \overline{\gamma^{(-i)}\overline{\rho_k^{(-i)}}}\right] =$$

$$\rho_k^{(-i)} + \gamma^{(i)}\overline{\rho_k^{(i)}} = (\gamma^{(i)} - \hat{\gamma}^{(i)})\overline{\rho_k^{(i)}} + \left(1 + \hat{\gamma}^{(i)}\overline{\gamma^{(-i)}}\right)\rho_k^{(-i)}$$

It is now apparent that if our estimates of IQI parameters are precise, i.e. if $\gamma^{(\pm i)} \cong \hat{\gamma}^{(\pm i)}$ then the coefficients $(\gamma^{(\pm i)} - \hat{\gamma}^{(\pm i)})$ multiplying the IQI-cross-talk terms $\overline{\rho_k^{(mi)}}$ in the two equations are then very small, and the amount of IQI-cross-talk will have been suppressed. Ideally, if the estimates are perfect, $\gamma^{(\pm i)} = \hat{\gamma}^{(\pm i)}$, then we obtain $R_k^{(\pm i)} \propto \rho_k^{(\pm i)}$, we attain perfect compensation.

At this point we consider whether the presence of CFO affects the IQI COMP procedure just described. It turns out that it does not, as can be seen from the following argument: CFO due to the offset between the optical LO frequency and the incoming carrier frequency is a common phase impairment identically affecting all sub-bands, amounting to multiplication by the linear phase factor $e^{j\theta k}$. Thus $\rho_k^{(\pm i)}$ is to be replaced by $\rho_k^{(\pm i)}e^{j\theta k}$ in the derivation above. Defining effective bandpass signals $\rho_k^{'(\pm i)} = \rho_k^{(\pm i)}e^{j\theta k}$ and redoing the derivation above with $\rho_k^{'(\pm i)}$ replacing $\rho_k^{(\pm i)}$ everywhere, it is seen that the derivation still holds. The only caveat is whether the $\rho_k^{'(\pm i)}$, which have their spectra shifted from their nominal positions, make it without distortion through the bank filters. We assume small CFO (as can be achieved by tracking the CFO by feedback to the laser or digital feedback to a demodulator ahead of the FB, essentially using a PLL), and moreover we recall that the roll-off of the filter banks is not sharp but is mildly sloping out-of-sub-band. Therefore, the slightly shifted spectra, as induced my small CFO, will make it through the bank filters, and the (I)FFT based decimation will also allow the slightly shifted spectra through, by virtue of the cyclic prefix guardband. Next, we may consider whether the simultaneous presence of CTO will affect the IQI COMP operation. In this case we may again define new effective signals $\rho_k^{''(\pm i)} = \rho_{k-\tau^{(\pm i)}}^{(\pm i)} e^{j\theta k}$ including the different CTO delays on the two sub-bands signals which propagate at different center frequencies hence experience different group delays due to CD as well as including the CFO (the double-prime indicates the simultaneous presence of CFO and CTO). The IQI COMP derivation is still valid with $\rho_k^{(\pm i)}$ being replaced by the effective signals $\rho_k^{''(\pm i)}$.

This completes the proof that the disclosed IQI comp structure indeed achieves compensation of IQI even in the presence of CFO+CTO, provided that reasonable estimates of the IQI parameters may be obtained. Next we disclose in FIG. 43B a novel IQI EST module structure, along a novel training sequence procedure which are able to generate good estimates of the IQI parameters $\gamma^{(\pm i)}$. In this case it is no longer true that the joint presence of CFO and CTO will not affect the estimation of IQI (though we have seen that these impairment do not affect the compensation of ICI).

The novel disclosed IQI EST training sequence procedure actually also assists in joint estimation of CFO and CTO, but those aspects will be described further below. To overview the novel data-aided algorithm for joint estimation of IQI, CTA and CFO, this algorithm is based on training sequences with half their spectrum nulled out at a time, first the lower half then the upper half, which results in the filter bank diverting the IQI interference to the mirror-image output port, where it may be readily estimated by comparison with the unperturbed signal in the original output port, on which the SCA may be further applied to extract CTO and CFO with high precision. Our joint estimation procedure is based on periodically launching training sequences, transmitted into either the upper or lower sub-band while nulling the other sub-band. A training sequence $A_{-k}^{(\pm i)TR}$ is launched into either the +i or −i sub-bands at the Tx but not in both; upon the TS being launched in the ±i sub-band then a null is simultaneously launched in the m mirror sub-band. Actually all pairs of signals are treated this way simultaneously, meaning that TS are first launched into all sub-bands with index i>0 then into all sub-bands with index i<0. As a result a broadband upper-single-side-band (USSB) occupying half of the channel spectrum (to the right of the optical carrier) is generated, followed by a broadband lower-single-side-band (LSSB) signal occupying the lower half of the channel spectrum (to the left of the optical carrier). The USSB launch is followed by the LSSB launch or vice versa.

Each training sequence (TS) launched at the Tx into a particular sub-band port (while nulling out its mirror sub-band input) is designed to serve for joint estimation of all three impairments, and in particular to assist in estimating CTO according to the Delay&Correlate (D&C) principles (e.g. using the Schmidl-Cox Algorithm (SCA) or Minn CTO estimation algorithms used in wireless communication). The training sequences then consist of pairs of related consecutive or separated training symbols, in particular for SCA we shall consider for the pairs of identical OFDM symbols or two identical halves of a single OFDM symbol, with each of the two identical records having length L, whereas for the Minn algorithm we shall consider four consecutive records with the first two records identical, and the last two records identical to the first two up to a sign inversion.

Assuming no IQI is generated at the Tx (and the optical links also do not generate IQI, and also ignoring the link nonlinearity) then we receive at the Tx input the following pairs of signals, in the spectral ranges corresponding +i and −i sub-bands, for the US and LS launches respectively:

$$\left[\rho_{k-\tau(i)}^{(i)}, 0\right]_{USSB}, \left[0, \rho_{k-\tau(-i)}^{(-i)}\right]_{LSSB},$$

where the first/second component of each pair correspond to the ±i sub-bands. These signals are already affected by CTO as evident in their different delays. According to Eq. (6), as a result of the IQI and CFO in the Rx FE, the signals received at the two ±i filter bank outputs while the respective TS is on, are given by:

$$\left[\rho_{k-\tau(i)}^{(i)} e^{j\theta k}, \gamma^{(i)} \overline{\rho_k^{(i)}} e^{-j\theta k}\right]_{USSB}, \left[\gamma^{(-i)} \overline{\rho_k^{(-i)}} e^{-j\theta k}, \rho_{k-\tau(-i)}^{(-i)} e^{j\theta k}\right]_{LSSB}$$

In contrast, when data is transmitted rather than U/L-SSB sequences, the pair of FB mirror outputs is given, per Eq. (6) by $$[\rho_k^{(i)} + \gamma^{(-i)} \overline{\rho_k^{(-i)}}, \rho_k^{(-i)} + \gamma^{(i)} \overline{\rho_k^{(-i)}}]_{two-sided\ data}$$

Significantly, under U/L-SSB launch, the +i/−i sub-band receives it signal free of IQI, whereas its mirror sub-band −i/+i just receives interference from the original sub-band conjugated, scaled by the appropriate IQI coefficient. Thus the conjugate leakage due to the IQ imbalance is routed to the mirror-image sub-band, resulting in the original sub-band launched signal and its scaled CC interference being separated out to two different sub-band outputs of the FB. In each of the two training cases, both filter bank mirror outputs experience a single delay and a single CFO (albeit of opposite sign). This is in contrast to the case of concurrent excitation of the two filter banks wherein each filter-bank output would contain a mixture of two delays and a mixture of the two opposite sign CFOs. This suggests simple data-aided joint processing of the two filter-bank outputs obtained under the respective USSB- and LS-launches, jointly estimating IQ imbalance, CTO and CFO. We note that the two +i/−i FB outputs are CC of each other up to a constant. To estimate the IQ imbalance parameters in the data-aided training mode, we simply divide one filter bank output by the CC of the other one, yielding:

$$\begin{cases} USSB\text{-launch: } r_k^{(-i)}/\overline{r_k^{(-i)}} = \left[\overline{r_k^{(-i)}}/r_k^{(i)}\right]^* = \left[\left(e^{j\theta k} \overline{\gamma^{(i)}} \rho_{k-\tau(i)}^{(i)}\right)\left(e^{j\theta k} \rho_{k-\tau(i)}^{(i)}\right)\right]^* = \gamma^{(i)} \\ LSSB\text{-launch: } r_k^{(i)}/\overline{r_k^{(-i)}} = \left(e^{j\theta k} \gamma^{(-i)} \overline{\rho_{k-\tau(-i)}^{(-i)}}\right)\left(e^{-j\theta k} \overline{\rho_{k-\tau(-i)}^{(-i)}}\right) = \gamma^{(-i)} \end{cases} \quad (8)$$

This is compactly written as

IQI estim:

$$\hat{\gamma}^{(\pm i)} = r_k^{(mi)}/\overline{r_k^{(\pm i)}} \quad (9)$$

Remarkably, the conjugate-divisions cancel out the common delay and common CFO present in the two sub-bands under either launch (irrespective of the value of the delay and CFO), while recovering just the IQ imbalance parameters. As the last equation holds for each of the discrete-time instants, k, over the duration of the US/LS-launch training sequence, and since the noises in the different samples are largely independent, it is possible to average the conjugate ratios over the 2L samples of the training sequence duration, yielding the following improved estimates for the IQ imbalance parameters in the two sub-bands:

USSB-launch:

$$\hat{\gamma}^{(i)} = \frac{1}{T}\sum_{k=0}^{T-1} r_k^{(-i)}/\overline{r_k^{(i)}}; \; LSSB\text{-launch: } \hat{\gamma}^{(-i)} \equiv \frac{1}{T}\sum_{k=0}^{T-1} r_k^{(i)}/\overline{r_k^{(-i)}} \quad (10)$$

where T is the total duration (in discrete-time units) of the training sequence (e.g., consisting of two symbols for the SCA (T=2L) and of four symbols for the Minn Algorithm (T=4L)).

Figure 43A:
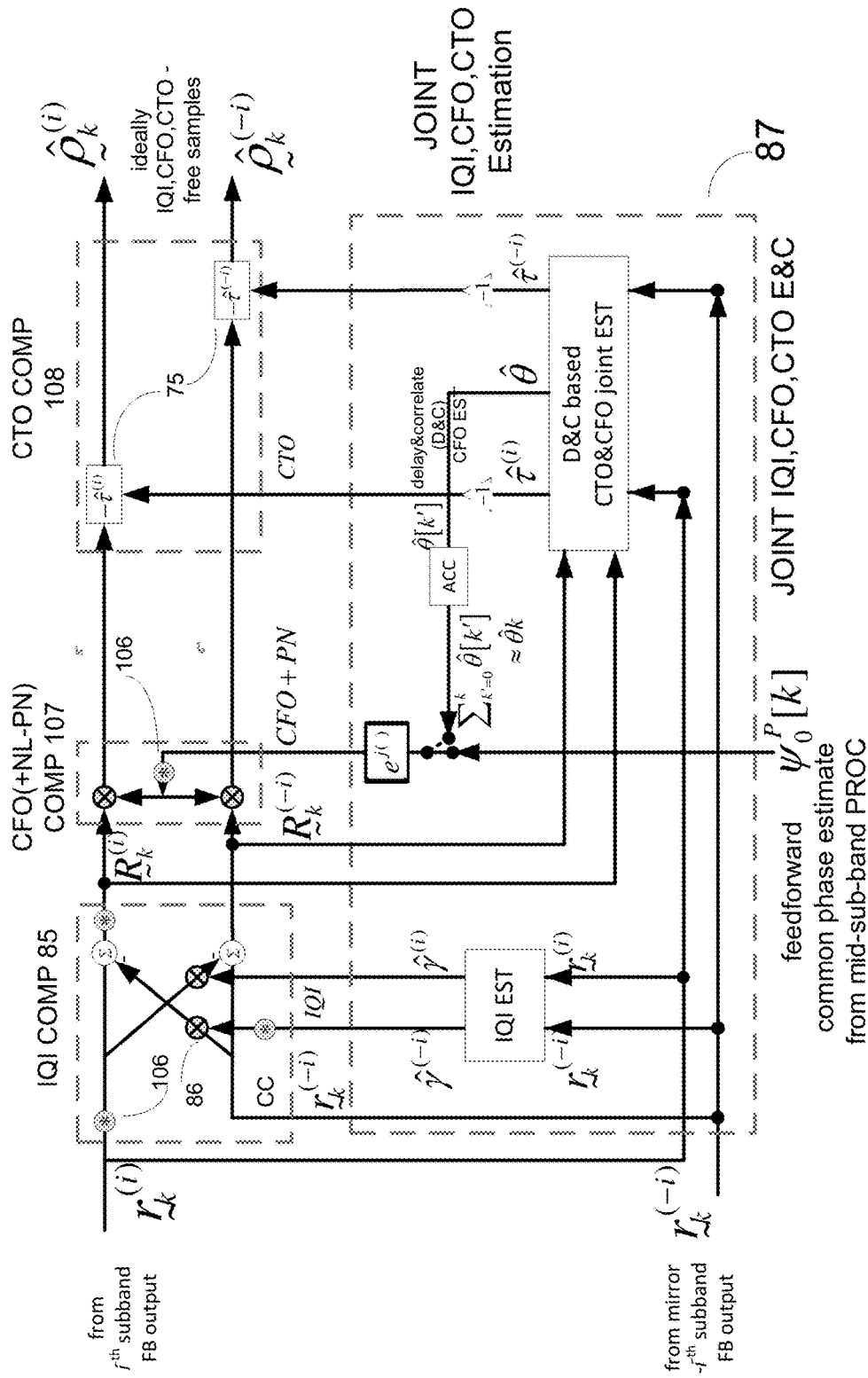
FIGS. 43A-43F illustrate compensation modules.
Figure 43B:
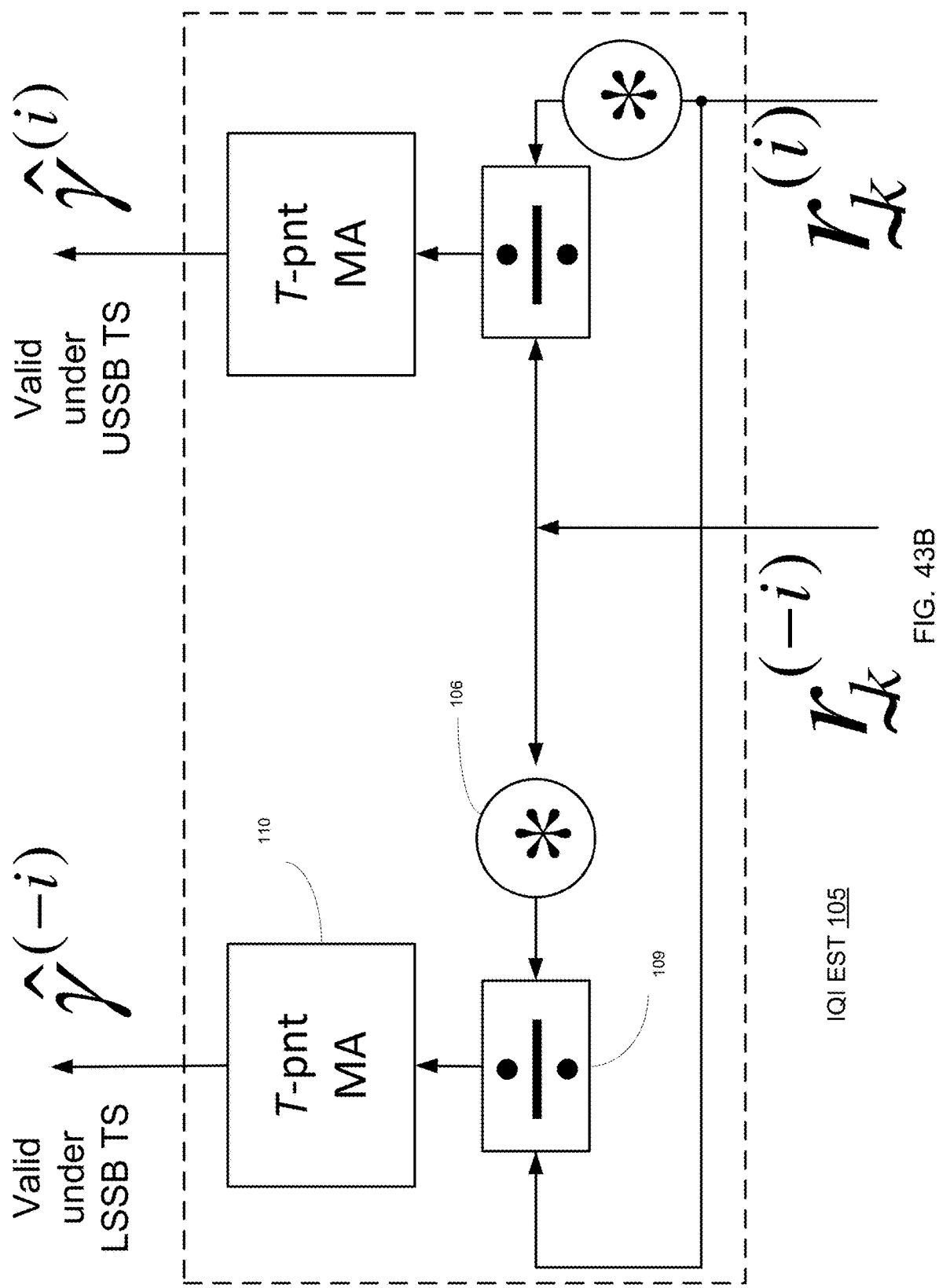

This completes the mathematical description of the IQI EST module, the block diagram of which is shown in FIG. 43B. In that sub-figure the divider blocks are defined as taking the ratio of the left input to right input, and the MA blocks are moving averages. Notice that the estimates are valid while the proper training sequences are on, as indicated.

Figure 43C:
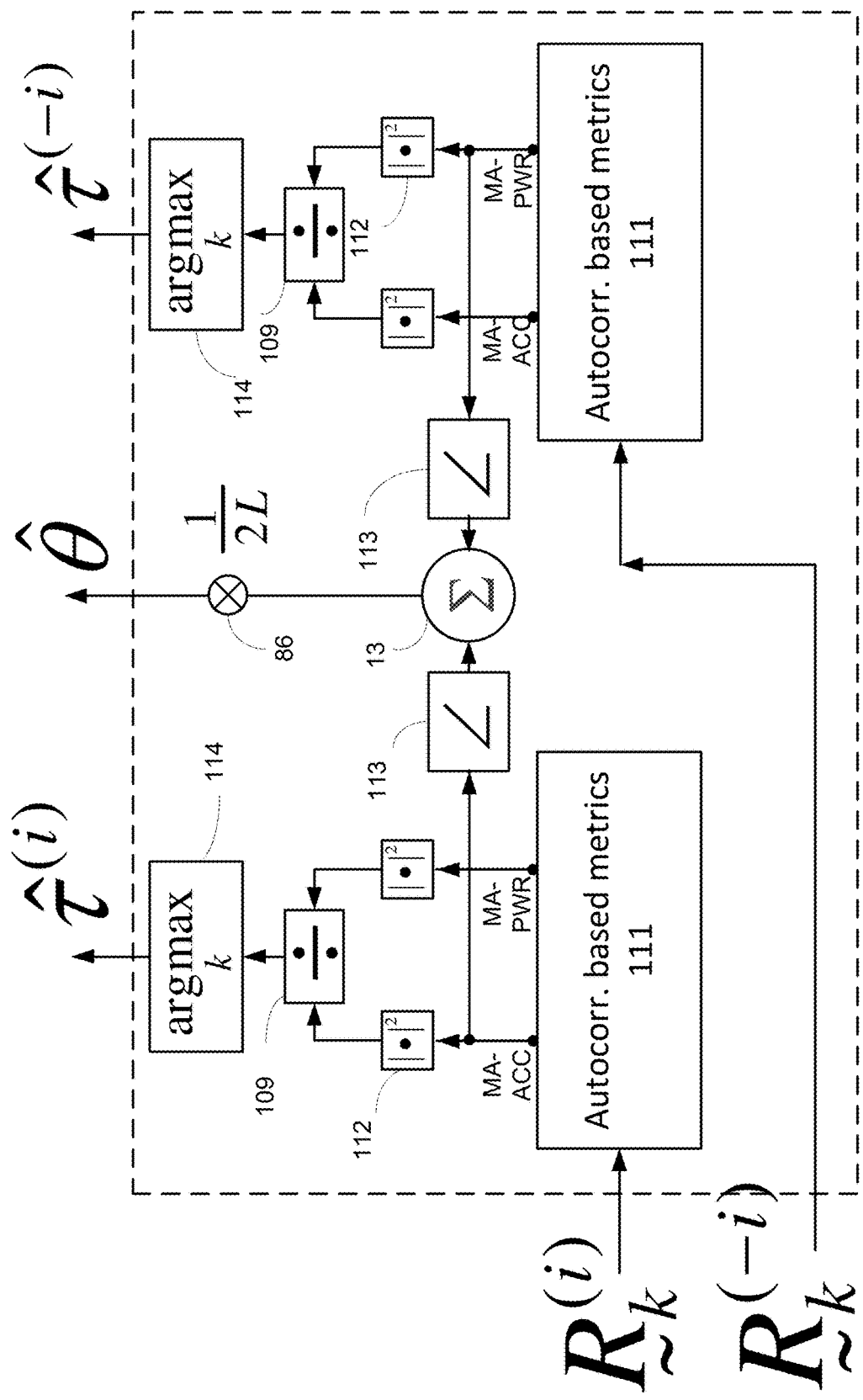
Figure 43D:
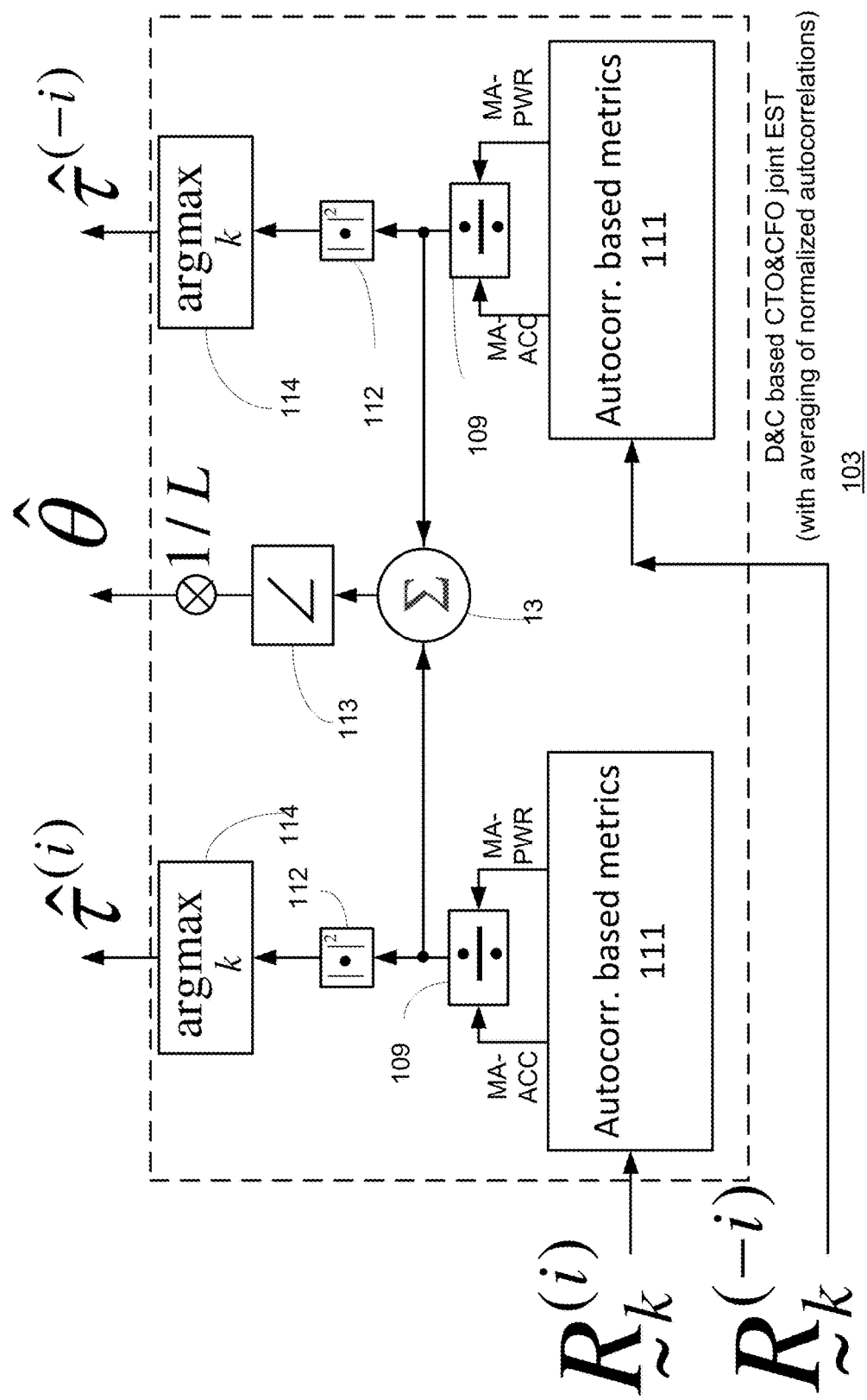
Figure 43E:
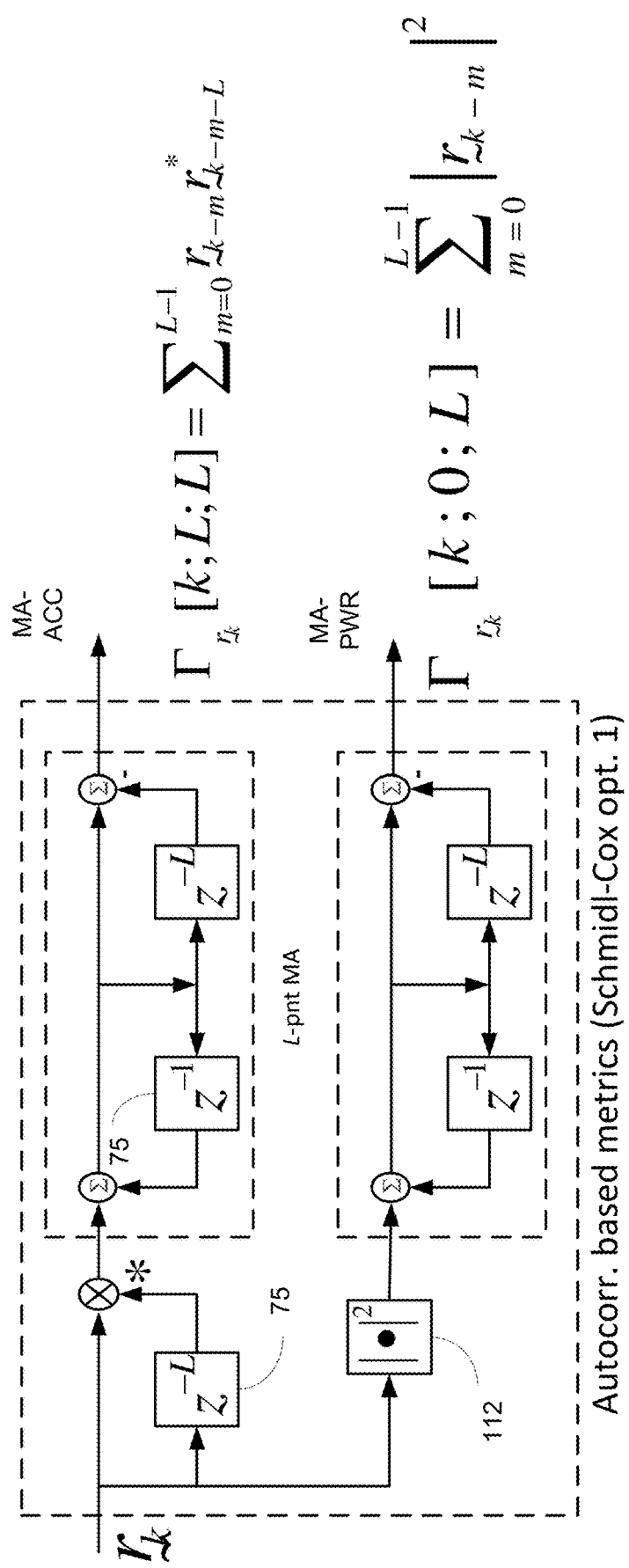

It remains to describe the joint estimation of CFO and CTO, occurring in the 'D&C based CTO&CFO joint EST' module, for which two possible alternative embodiments are detailed in FIGS. 43C,D. In turn these novel modules resort to the 'Autocorr. based metrics' prior art modules described in FIGS. 43E,F for the two alternative algorithms of Schmidl-Cox algorithm (SCA) and Minn algorithm. The SCA module of FIG. 43E generates the complex-valued moving average autocorrelation $$(MA\text{-}ACC)\Gamma_{r_k}[k; L; L] = \sum_{m=0}^{L-1} r_{k-m} r_{k-m-L}^*$$

as well as the real-valued moving average power $$(MA\text{-}PWR)\Gamma_{r_k}[k; 0; L] = \sum_{m=0}^{L-1} |r_{k-m}|^2$$

where these formulas are particular forms of the following general moving average autocorrelation definition with a lag of L over a moving window $$W: \Gamma_{r_{k_{\phi_0}}}[k; L; W] \equiv \sum_{m=0}^{W-1} r_{k_{\phi_0}-m} r^*_{k_{\phi_0}-L-m}.$$

Figure 43F:
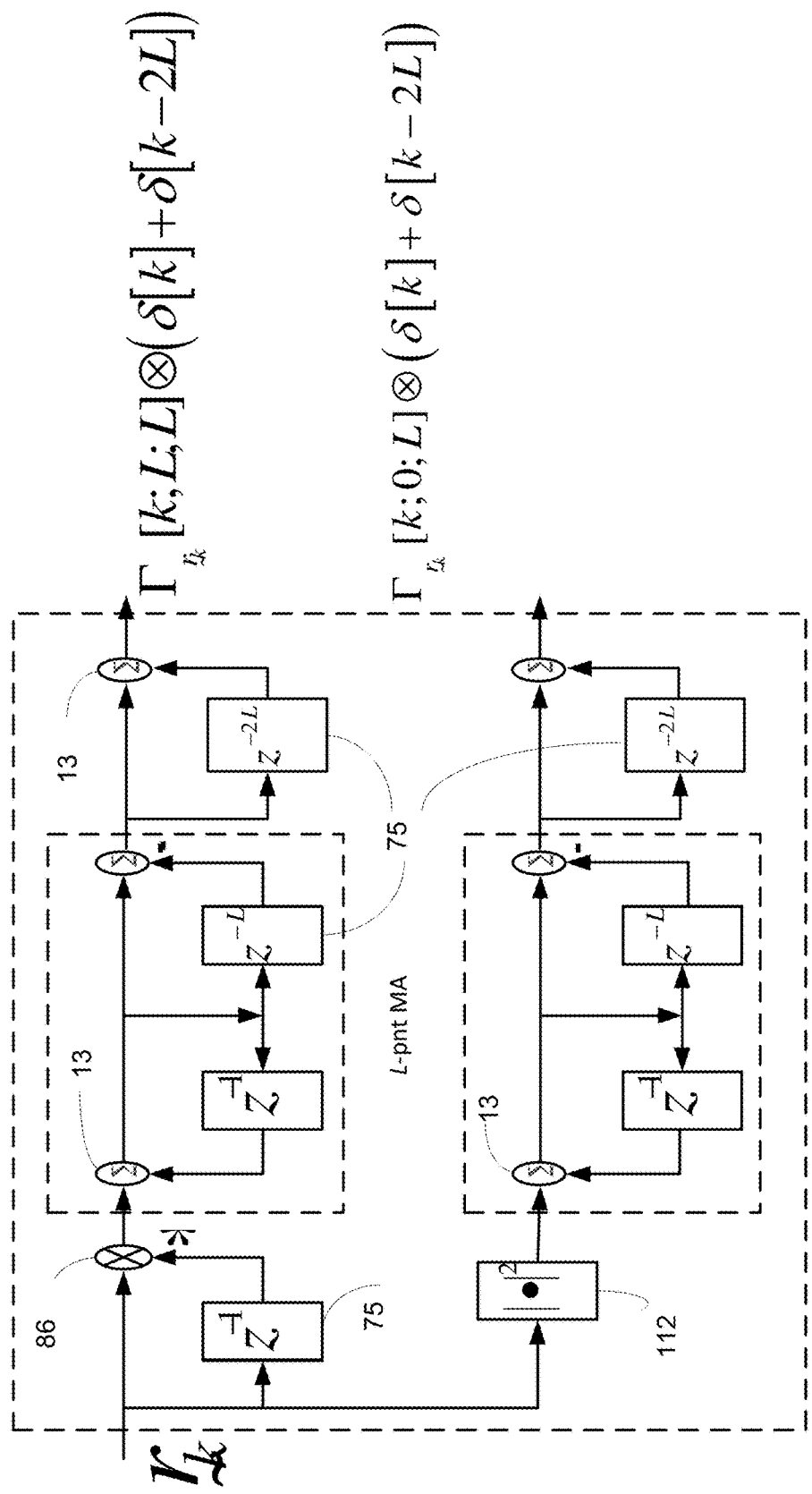

For the Minn algorithm module of FIG. 43F, the two output metrics, also referred to as MA-ACC and MA-PWR are generalized to mean the moving average autocorrelation and power metrics as generated under the SCA further filtered through the L-pnt delay&add impulse response $\delta[k]+\delta[k-2L]$ (in effect this filtering amounts to adding the SCA autocorrelation/power to a 2L-pnt delay version of itself).

Back to FIGS. 43C,D notice that initially each of the two IQI-compensated inputs $R_k^{(\pm i)}$ are individually applied to its own 'Autocorr. based metrics' block. The normalized absolute-squared MA-ACC is generated by calculating $|MA\text{-}ACC|^2/|MA\text{-}PWR|^2$. The two embodiments 43C and 43D differ in the order in which the division and absolute squaring are performed, but yield identical results for the normalized absolute-squared MA-ACC, which is input into the argmax operation, determining the time-index k whereat this normalized metric peaks to its highest value. The output of the argmax operation provides the sought $\hat{\tau}^{(\pm i)}$ CTO estimate. As for the estimation of phase, this is also specified in the SCA and Minn algorithm in terms of the angle (complex number argument) of the complex-valued MA-ACC (it does not matter if the angle is extracted prior to or after normalization). The extracted angle is to be divided by L, the lag involved in repeating the training symbols, in order to extract the angle estimate $\hat{\theta}$. Our embodiments of FIG. 43C,D are distinguished from plain processing of the MA-ACC and MA-PWR metrics under the prior art D&R joint CTO and CFO estimation, in that our embodiments also perform joint processing of the CFO estimates derived from the two sub-band signals by averaging over the two sub-bands (which is an aspect unique to our FB approach). To this end there are two alternatives, as detailed in 43C,D: The first alternative shown in C is to average across the two mirror sub-bands either in the real-valued angular domain, extracting the angle of MA-ACC first, then taking the arithmetic average of the two angles (the ½ of arithmetic average is absorbed with the 1/L normalization). The second alternative shown in D is to average the MA-ACCs in the complex domain (actually just sum them up) then extract the angle. The performance of these two alternative angle averaging scheme is very similar and results in roughly 3 dB of SNR improvement vs. not averaging over the two mirror sub-bands.

We now consider the usage of the feedforward phase estimate, $\psi_0^P[k]$, input at the bottom of the JOINT IQI, CFO, CTO E&C module in order to demodulate CFO and (NL) phase noise. As shown in FIG. 43A this estimate is exponentiated, generating $e^{j\psi_0^P[k]}$, which complex signal is input into the CFO(+PN) COMP module in order to demodulate the $$R_{k_{\phi_0}}^{(\pm i)}$$

sub-band signals (which already underwent IQI compensation). This demodulating signal is alternative to that obtained from the D&C based CTO&CFO joint EST signal, which is accumulated and exponentiated. The optional use of one the two signals is shown by means of the switch feeding the exponentiation module. Actually, it is possible to mix the two signals, switching between them or even generate weighted moving average weighted combinations, though the simplest strategy is to use one signal or the other. The feedforward common phase signal $\psi_0^P[k]$ is available right away, and can also correct other types of phase impairments in addition to CFO, as explained in FIG. 45, thus in the preferred embodiment we shall use this signal for demodulation, using the D&C based algorithm solely for CTO estimation (meaning that the portions of FIG. 43C,D using the angle extractors ($\angle$) may be removed.

This completes the description of all modules in FIG. 43A-43F.

Synchronization from IQI EST Independent of the CTO EST

One issue which arises is how the receiver knows when the two types of training sequences (U/L-SSB) are transmitted, as only then does the IQI EST module generate a valid output one of its output ports or another. One could suggest that the output of the CTO module provides proper synchronization of the training sequences, however this seems somewhat of a 'chicken&egg' problem, as unless IQI is compensated first then the results of the CTO estimation are not accurate, and viceversa. However, the system may still converge as even with an imperfect CTO estimate the moving average of Eq. (10) will yield a relatively precise estimate of IQI even if the averaging window is somewhat off (provided the window is sufficiently long). Once this estimate is derived, the next TS launch will experience less IQI and therefore the CTO estimate will improve, and so forth, indicating potential convergence of the system despite the coupling between the two impairment types.

Yet another approach to synchronizing the TS window for IQI estimation is to realize that the event of SSB TS transmission may be detected by the FB based system which acts as a coarse spectrum analyzer. Thus, a strong imbalance in the powers detected in mirror sub-bands is an indication of the presence of training sequence. In fact we already provide the computational means to detect such imbalance, as we take the conjugate ratio of the signals in mirror sub-bands and average all signals. If we were to monitor the powers (absolute squares) of the averaged ratios corresponding to our estimates $\hat{\gamma}^{(\pm i)}$, i.e. the quantities $|\hat{\gamma}^{(\pm i)}|^2$ or even better their sum, then we would experience a sharp drop in value whenever the moving average window coincides with the TS window. To understand this notice that from Eq. (6) it follows that the ratio $$r_k^{(-i)}/\bar{r}_{k_{\phi_0}}^{(i)}$$

(or its mirror image obtained by substituting −i for I and conjugating) is generally expressed as $$\hat{\gamma}_k^{(i)} \equiv r_k^{(-i)}/\bar{r}_{k_{\phi_0}}^{(i)} = \frac{\rho_k^{(-i)} + \gamma^{(i)}\overline{\rho_k^{(i)}}}{\rho_k^{(i)} + \overline{\gamma^{(-i)}}\rho_k^{(-i)}}.$$

(Here we do not interpret $\hat{\gamma}_k^{(i)}$ as IQ imbalance but rather as the metric obtained by taking the indicated ratio).

When SSB signals are generated, this expression reduces to Eqs. (8) as seen above. However, when the data is on and the launch is two sided, then this expression is approximated by dropping the IQI interference terms (as the $\gamma^{(\pm i)}$ coefficients are small).

$$|\hat{\gamma}_k^{(i)}|^2 \equiv \frac{1}{T}\left|\sum_{k=0}^{T-1} r_k^{(-i)}/r_k^{(i)}\right|^2 = \quad (11)$$

$$\frac{1}{T}\left|\sum_{k=0}^{T-1} \frac{\rho_k^{(-i)} + \gamma^{(i)}\overline{\rho_k^{(i)}}}{\rho_k^{(i)} + \overline{\gamma^{(-i)}}\rho_k^{(-i)}}\right|^2 \cong \frac{1}{T}\left|\sum_{k=0}^{T-1} \frac{\rho_k^{(-i)}}{\rho_k^{(i)}}\right|^2$$

The power of this squared ratio signal, still fluctuates, mainly under the influence of the randomness of the transmitted signal, however the average value of this ratio is unity, and under the moving average, this signal is likely to converge to unity with fairly high accuracy.

Alternatively, we may generate the absolute square of the sample-by-sample ratio, then apply an MA, in effect reversing the order of squaring and averaging:

$$G_k^{(i)} \equiv \frac{1}{T}\sum_{k=0}^{T-1}\left|r_k^{(-i)}/r_k^{(i)}\right|^2 = \quad (12)$$

$$\frac{1}{T}\sum_{k=0}^{T-1}\left|\frac{\rho_k^{(-i)} + \gamma^{(i)}\overline{\rho_k^{(i)}}}{\rho_k^{(i)} + \overline{\gamma^{(-i)}}\rho_k^{(-i)}}\right|^2 \cong \frac{1}{T}\sum_{k=0}^{T-1}\left|\frac{\rho_k^{(-i)}}{\rho_k^{(i)}}\right|^2$$

Thus, when we are perfectly synchronized with the TS then either of these signals will be low whereas when there is no overlap with the DS then either of these signals will be very close to unity. Thus, as the moving window advances, the system will go through a minimum, which will indicate when the window is synched, then it will come back up again/

By generating the mirror image ratios, $$|\hat{\gamma}_k^{(-i)}|^2 \equiv \frac{1}{T}\left|\sum_{k=0}^{T-1} r_k^{(i)}/r_k^{(-i)}\right|^2 \text{ or } G_k^{(-i)} \equiv \frac{1}{T}\sum_{k=0}^{T-1}\left|r_k^{(i)}/r_k^{(-i)}\right|^2$$

we may obtain the timing under the LSSB launch, which corresponds to the CTO for the −I sub-band. Thus, we have two alternative CTO estimates:

$$|\hat{\tau}_\gamma^{(\pm i)}|^2 \equiv \underset{k}{\mathrm{argmin}}\{|\hat{\gamma}_k^{(\pm i)}|^2\}; \; |\hat{\tau}_G^{(\pm i)}|^2 \equiv \underset{k}{\mathrm{argmin}}\{|G_k^{(\pm i)}|^2\} \quad (13)$$

The description above discloses a novel method to derive CTO by an alternative method differing from the D&C based methods (SCA and Minn algorithms), free of the chicken&egg coupling between CTO and IQI.

In additional embodiments (not shown) it is possible to further merge this CTO estimation method with the D&C methods (SCA and Minn algorithm) e.g. by subtracting the moving average metrics of Eq. (11) and (12) from the D&C based metrics and taking the argmax of the difference in order to derive improved coarse timing estimates.

Figure 44A:
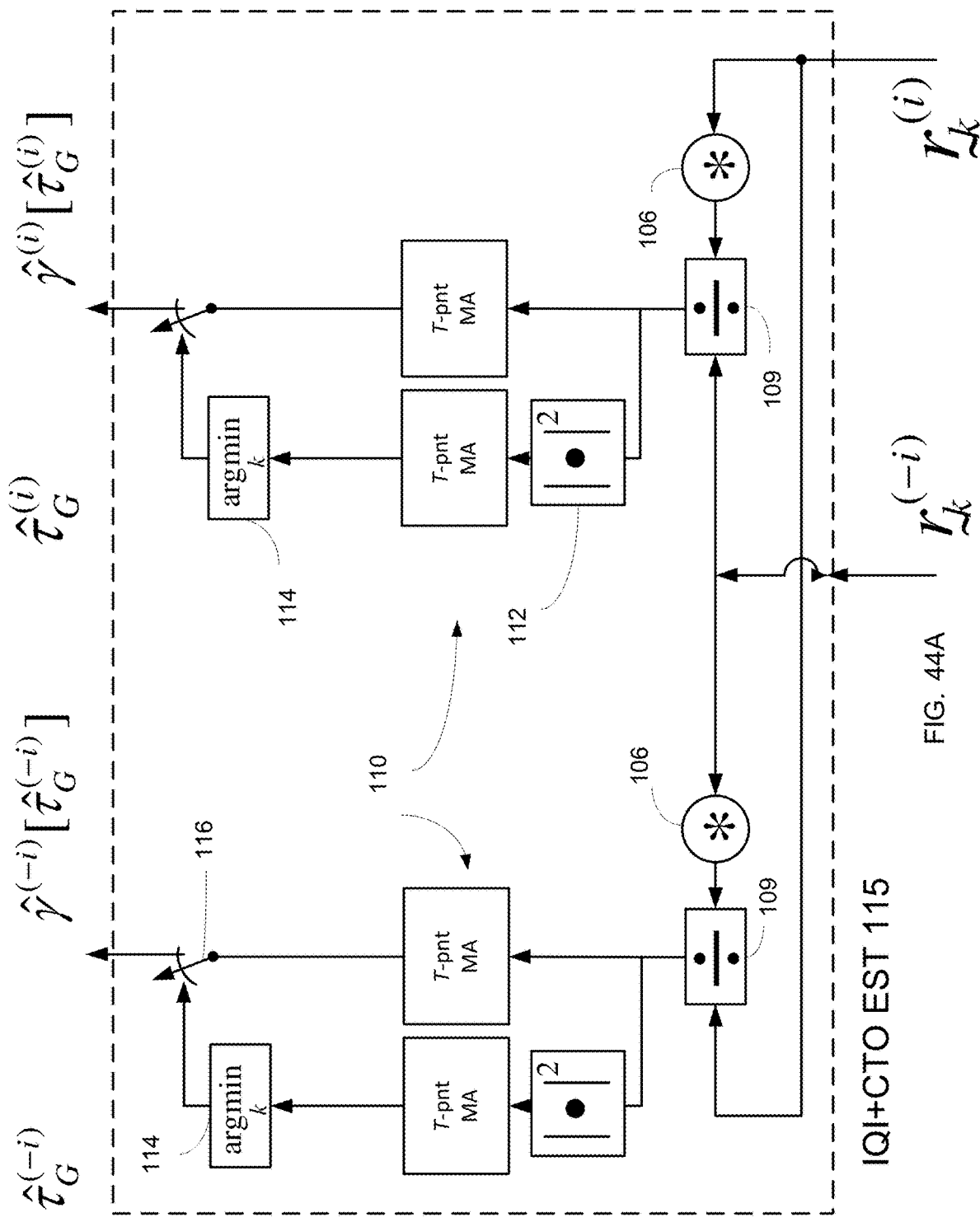
FIGS. 44A and 44B illustrates examples of joint to intersymbol interference (ISI) and coarse timing offset (CTO) modules.
Figure 44B:
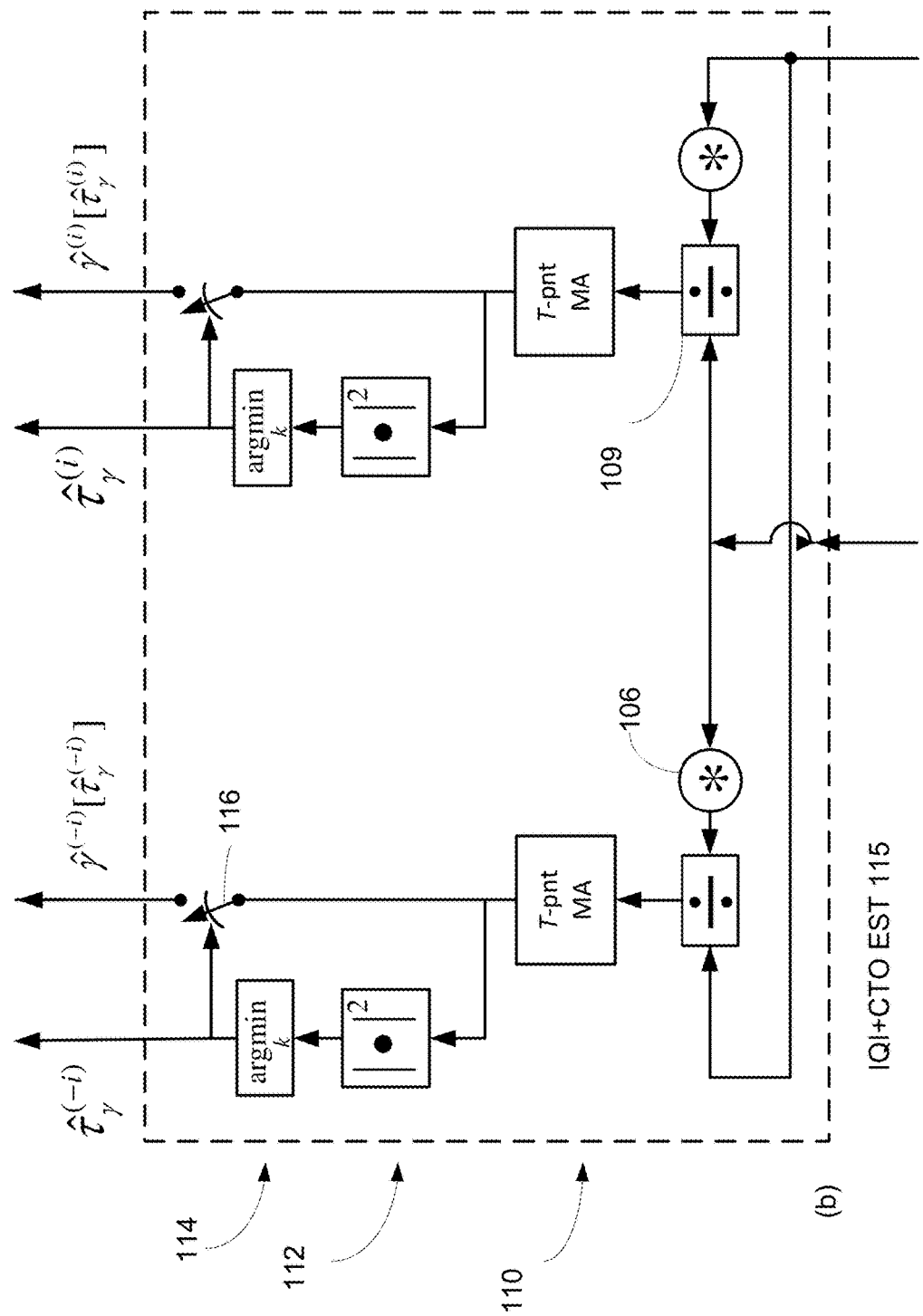

FIG. 44A-44B presents a block diagram extending the IQI of FIG. 43B to provide joint IQI+CTO by implementing the CTO procedure of Eqs. (13) along with Eqs. (11) and (12). The block diagrams of FIG. 44A,B precisely implements the functions described in these equations. In FIG. 44C we embed the IQI+CTO EST module embodiments of FIG. 44A,B into the complete JOINT IQI, CFO, CTO E&C system, obtaining a second embodiment of this system, differing from the one we disclosed in FIG. 43A. Notice that the CFO+PN estimation is derived in the system of FIG. 44C from the feedforward common phase estimate as generated in the next FIG. 45.

Figure 45:
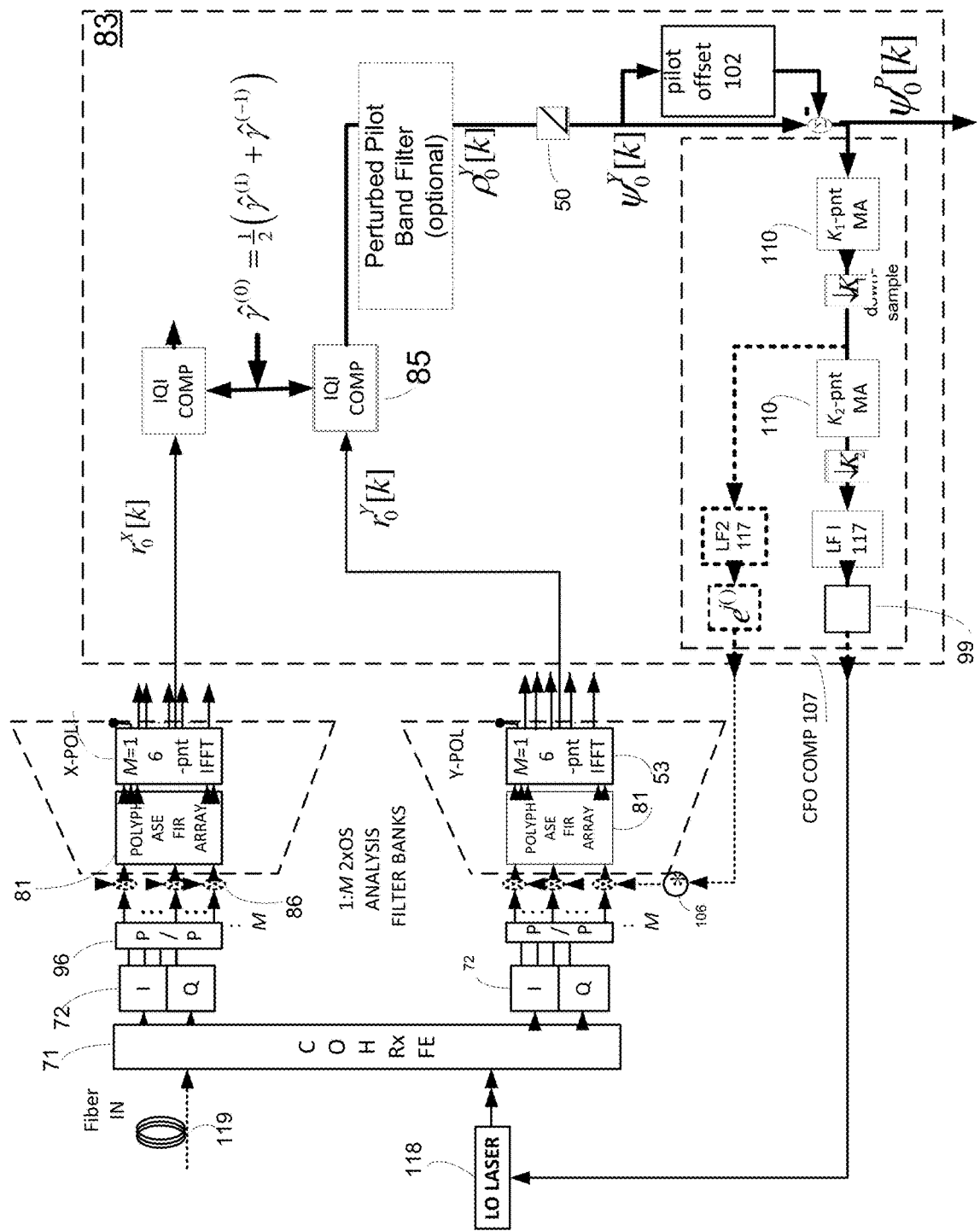
FIG. 45 illustrates a mid-sub band processor.

FIG. 45 shows the detailed internal block diagram of the mid-sub-band PROC appearing in the top level views of the MSB (DFT-S) OFDM and SC-MSBE Rx shown in FIGS. 37, 40A and 42A. This figure also details all the interfaces of the mid-sub-band PROC to other modules in the Rx system. The mid-sub-band PROC is fed by the 0-th sub-band output signals from the X-POL and Y-POL OS analysis filter banks. These sub-bands carry the received signal due to sparse pilot signals launched in the corresponding mid-sub-band of each polarization at the Tx.

Detailing the Tx-side sparse pilot generation, the mid-sub-band (in our sub-bands bi-polar labeling convention the 0th sub-band) for each of the X-POL and Y-POL paths at the Tx is fed by a pilot signal positioned in frequency either at the center (DC) or somewhat offset from the center of the sub-band. The rest of the band is null. This is achieved for OFDM transmission (FIG. 31) by setting one of the OFDM sub-carriers, at or close to the center of the mid-sub-band to a non-zero amplitude (say a real-valued one) $A_p$, while the other sub-carriers in the mid-sub-band are set to null. For DFT-S OFDM transmission (FIG. 33), the sparse pilot tone launch consists of removing the N-pnt DFT-S FFT ahead of the MN-pnt IFFT for the particular mid-sub-band, and also setting one of the OFDM sub-carriers, at or close to the center of the mid-sub-band (center segment of the IFFT inputs) to a non-zero amplitude (say a real-valued one), while the other sub-carriers in the mid-sub-band are set to null. This describes the case where the sparse pilot tone (including its sparse guardband) fills up the entire mid-sub-band. It is also possible for the sparse pilot tone to fill up just a portion of the mid-sub-band, with the rest of the sub-band filled up with data-carrying sub-carriers. This case, referred to as 'partial sparse pilot', allows a variable tradeoff between the quality of (NL) phase noise mitigation and the system spectral efficiency.

In order to mitigate potential generation of Stimulated Brillouin Scattering (SBS) due to the intense pilot tone, we may optionally apply at the Tx dithering of the laser frequency, typically at a rate of at least several MHz. This would yield the functional form $e^{j(\Theta_p k + \beta \; sin(\Theta_d k))}$ for the transmitted sparse pilot (momentarily assuming an ideal laser source). Another mechanism to generate a similar phase dithering may also result not from intentional SBS mitigation, but rather due to the internal operation of the coherent tunable laser source used as the laser source (tunable laser sources are often locked to an etalon the free spectral range of which is dithered in order to enable locking the laser frequency). A similar phase dither term may be present at the Rx, due to the LO laser etalon locking. Thus, overall we may end up at the Rx with several phase dither terms superposed, corresponding to the Tx and Rx laser etalons and the SBS suppression $\Sigma_l \beta_d^{Tx}[l] sin(\Theta_d^{Tx}[l]k + \varphi_d^{Tx}[l])$ Considering now the structure for reception and processing of the pilot tone in the Rx, main processing path in the mid-sub-band PROC receives the mid-sub-band signal $r_o^{X/Y}[k]$ of each POL (we follow the Y-POL in the drawing, as for the X-POL the processing structure is identical) and applies IQI COMP, correcting for the IQ imbalance of this sub-band. For simplicity the preferred embodiment of the mid-band IQI COMP does not generate its own estimation of the IQI parameter $\hat{\gamma}^{(0)}$. Rather this parameter is simply obtained as the arithmetic mean $\hat{\gamma}^{(0)}=\frac{1}{2}(\hat{\gamma}^{(1)}+\hat{\gamma}^{(-1)})$ of the two IQI parameter estimates from the two $i=\pm 1$ neighboring sub-bands. In the optional case of partial sparse pilot (i.e., when the sparse pilot fills up just part of the mid-sub-band) a low-pass or band-pass filter is further inserted to extract perturbed pilot band (this is the pilot and the sparse band around it, as injected at the Tx, perturbed over propagation by noise and impairments) generating a signal denoted by $\rho_0^{X/Y}[k]$. The phase $\angle \rho_0^{X/Y}[k]$ of this signal is extracted and passed to the 'pilot offset+optional dither phase cancellation stage' which generates and subtracts phase waveform corrections related to the pilot frequency offset (the pilot subcarrier spectral position relative to the sub-carrier at DC which is mapped to the Tx laser carrier) and optional dither phase if present, as specified further below. The resulting phase $\psi_0^P[k]$ is output as a feedforward common phase estimate to all M−2 sub-band Rx-s/PROCs providing (NL) phase & CFO compensation per sub-band.

In addition, the common phase signal is also applied to the stage named CFO PLLs which provides a pair of parallel phase-locked-loops (PLL) estimating CFO by heavily low-pass filtering the common phase signal $\psi_0^P[k]$ (which includes the phase ramps due to the CFO terms) feeding back the filtered CFO estimates to the LO laser analog frequency input and to a digital demodulator at the input of the filter bank.

Notice that this method is a feedforward one, requiring precise synchronization of the paths experienced by the i-th sub-band and the zeroth sub-band such that they arrive aligned in time, allowing to cancel the common phases. By applying sufficient appropriate relative delays to the data sub-bands and the mid-sub-band output ports of the analysis FB, this feedforward time-alignment condition may be readily met for all the sub-bands.

We now analyze the phase noise and frequency offset mechanisms affecting the phase of the perturbed pilot, explaining why this mid-sub-band processor, operating in conjunction with the processing activated by it in the rest of the system, substantially mitigates phase noise and CFO. In order to improve SNR, it is desirable to have the amplitude $A_p$ of the sparse pilot tone as high as possible, at least higher than the average amplitude of the data-carrying sub-carriers.

As a result of optical propagation, the sparse pilot acquires optical phase noise and amplitude modulation, due to the transmit and receive (LO) laser phase noises as well as due to the linear and non-linear phase noises induced in the optical link, the received sparse pilot signal is given by $\rho_0^{X/Y}[k]=A_0[k]e^{j\psi_0^{X/Y}[k]}$, where $A_0[k]$ is amplitude noise and $\psi_0^{X/Y}[k]$ is the total phase noise experienced by the perturbed pilot band, expressed as the sum of multiple contributions as follows (discarding the superscript X/Y which ought to have labeled this phase):

$$\psi_0[k]=\theta_{CFO}k+\theta_p k+\Sigma_l \beta_d^{Tx}[l]\sin(\theta_d^{Tx}[l]k+\varphi_d^{Tx}[l])+ \phi_0^{X/Y-FWM}[k]+\phi_0^{X/Y-SPM}[k]+\phi_0^{X/Y-XPM}[k]+ \phi_0^{X/Y-ASE}[k]+\phi_0^{Tx-LPN}[k]+\phi_0^{Rx-LPN}[k] \quad (14)$$

where $\theta_p k$ is the phase ramp due to the frequency offset of the pilot tone frequency relative to the Tx laser frequency; $\theta_{CFO}k$ is the phase ramp due to the offset of the Tx laser frequency relative to the LO laser frequency (thus the frequency offset between the received pilot and the LO induces a phase increment of $\theta_{CFO}+\theta_p$ per discrete-time unit); $\beta_d^{Tx}\sin(\theta_d^{Tx}k)$ and $\beta_d^{Rx}\sin(\theta_d^{Rx}k)$ are the phase dithers applied at the Tx (either for SBS suppression or due to etalon dithering in the Tx laser and at the Rx due to etalon dithering in the LO laser); $\phi_0^{X/Y-FWM}[k]$, $\phi_0^{X/Y-SPM}[k]$, $\phi_0^{X/Y-XPM}[k]$ are respectively non-linear phase noises (NL-PN) due to inter-sub-bands Four-Wave-Mixing (FWM), intra-mid-sub-band Self-Phase-Modulation (SPM) and inter-sub-bands Cross-Phase Modulation (XPM) all induced within the zero-th sub-band to the interaction of all other sub-bands of the given channel as well as all co-propagating channels in the WDM multiplex; $\phi_0^{X/Y-ASE}[k]$ is linear phase noise induced due to the ASE additive noise injected by all optical amplifiers along the link; $\phi_0^{Tx-LPN}[k]$, $\phi_0^{Rx-LPN}[k]$ are the laser phase noise induced by the Tx laser and the LO Rx laser. Moreover, the term $\theta_p k$ associated with the offset of the mid-band pilot tone is evidently missing in this expression.

If the total phase impairment were common to all the sub-bands, then we would have ideal phase noise and frequency offset cancellation. However, in practice, the phase noises affecting the various sub-bands are not fully correlated. Let us represent the phase and frequency offset impairment of the i-th sub-band by conducting a similar analysis for the total phase noise $\psi_i^{X/Y}[k]$ affecting the i-th sub-band signal $\rho_i^{X/Y}[k]=A_i[k]e^{j\psi_i^{X/Y}[k]}$ which is output by the FB, which is expressed as follows (discarding the superscript X/Y which ought to have labeled this phase):

$$\psi_i[k]=\theta_{CFO}k+\Sigma_l \beta_d^{Tx}[l]\sin(\theta_d^{Tx}[l]k+\varphi_d^{Tx}[l])+ \phi_i^{X/Y-FWM}[k]+\phi_i^{X/Y-SPM}[k]+\phi_0^{X/Y-XPM}[k]+ \phi_i^{X/Y-ASE}[k]+\phi_0^{Tx-LPN}[k-\tau^{(i)}]+\phi_0^{Rx-LPN}[k] \quad (15)$$

Notice here that some of the subscripts, but not all, have been modified from 0 to i, indicative of some the noise sources being sub-band dependent; those phase noise sources which are constant across all sub-bands qualify as 'common phase' (in the sub-band domain). In particular, the LO laser phase noise $\phi_0^{Rx-LPN}[k]$ is a common phase contribution as it equally affects all sub-bands by the nature of the modulation process, as the time-domain superposition of received sub-bands is mixed with the LO laser field $\propto \exp\{j\phi_0^{Rx-LPN}[k]\}$, meaning each sub-band is individually mixed by the LO laser field. However, the Tx laser phase noise contributions are not identical in all received sub-bands, but are relatively delayed across sub-bands, as indicated by the argument of the Tx-LPN expression $\phi_0^{Tx-LPN}[k-\tau^{(i)}]$. Indeed, while Tx-LPN is common to all transmitted sub-bands (by the argument made above for the LO), nevertheless, in the course of optical propagation, due to CD, each of the sub-bands accumulates a different delay, $\tau^{(i)}$ for the i-th sub-band. Thus, simultaneous arrivals at the Rx in different sub-bands at discrete-time k correspond to relatively delayed temporal samples of the Tx laser phase noise. It follows that there is dependence of the Tx-LPN contributions at the Rx on the index i via the delays $\tau^{(i)}$. Also notice that the CFO and pilot frequency offsets and the Tx and Rx phase dithers are all common phase contributions. Finally, we may verify that by setting i=0 in Eq. (15) we retrieve Eq. (14), as we have implicitly assumed without loss of generality that $\tau^{(0)}=0$, as the zeroth sub-band delay is taken as the time origin at the Rx.

Another key term which to a very good approximation constitutes common phase equally affecting all the sub-bands is the inter-sub-band XPM which depends on the total power of all 'the other' sub-bands (i.e. for the effect on the i-th sub-band, the powers of all the sub-bands with an index different than i should be summed up. The total power affecting sub-band i may be expressed as the total power of the full WDM signal minus the power of the i-th sub-band. As the WDM signal includes multiple channels each having multiple sub-bands, the power of a single sub-band may be of the order of 1% of the total power of the WDM signal, thus the total power affecting each of the sub-bands is nearly constant. This justifies why we were able to set the index of the XPM phase noise term to 0.

Finally notice that it is just the non-linear phase noise contributions which have a dependence on polarization.

We now describe the functionality and operation of the 'pilot offset +optional dither phase cancellation stage'. The role of this module, operating in the angular domain, after the 'angle extract' operation, is to cancel out the phase term $\theta_p k$ out of $\psi_0[k]$ (Eq. (14)) yielding the reduced pilot phase output, labeled by a P subscript:

$$\psi_0^P[k] = \psi_0[k] - \theta_p k = \theta_{CFO} k + \qquad (16)$$
$$\sum_l \beta_d^{Tx}[l]\sin(\theta_d^{Tx}[l]k + \varphi_d^{Tx}[l]) + \phi_0^{X/Y-FWM}[k] + \phi_0^{X/Y-SPM}[k] +$$
$$\phi_0^{X/Y-XPM}[k] + \phi_0^{X/Y-ASE}[k] + \phi_0^{Tx-LPN}[k] + \phi_0^{Rx-LPN}[k]$$

The phase ramp term $\theta_p k$ associated with the carrier frequency offset, which was canceled out is deterministically known, as the phase offset $\theta_p$ is determined by the pilot sub-carrier index, counted relative to the DC sub-carrier, as follows:

$$\theta_p = \text{(sparse pilot sub-carrier index)} \cdot 2\pi/\text{(IFFT size)}$$

As for the sinusoidal phase modulation dither terms, those also have known frequencies as the dither is deterministically induced (but unknown amplitudes and phases due to unknown propagation losses and delays) therefore a pair of narrowband offset PLLs may readily lock onto these phases and derive accurate estimates of these phase domain sinusoidal waveforms. Therefore the entire signal $\theta_p k + \Sigma_l \beta_d^{Tx}[l]\sin(\theta_d^{Tx}[l]k + \varphi_d^{Tx}[l])$ is readily estimated and is subtracted out as indicated in Eq. (16), yielding the reduced common phase estimate $\varphi_0^P[k]$ to be passed on to each of the sub-bands for demodulation, and also to be input into the CFO PLLs stage of the mid-sub-band PROC. The processing in the i-th sub-band has already been described in FIG. 43A which is revisited in order to derive the residual phase noise after CFO(+PN) COMP, in light of the analysis above.

The processed sub-band signals $R_{-k}^{(\pm i)}$ are both multiplied by the conjugate of the exponentiated feedforward common phase estimate $e^{j\varphi_0^P[k]}$, yielding at the CFO(+PN) COMP in FIG. 44A, (following just the positive index, +i):

$$R_k^{(i)} e^{-j\psi_0^P[k]} = \left|R_k^{(i)}\right| e^{j\psi_i[k]} e^{-j\psi_0^P[k]} = \left|R_k^{(i)}\right| e^{j\Delta\psi_i[k]}; \qquad (17)$$
$$\Delta\psi_i[k] \equiv \psi_i[k] - \psi_0^P[k]$$

The demodulation then amounts to subtracting the reduced phase of the $0^{th}$ sub-band as generated by the mid-sub-band PROC (Eq. (16)) out of the total phase of the i-th sub-band (Eq. (15)). Performing the subtraction of the two equations term by term, it is apparent that several terms cancel out, yielding the following residual phase difference in the i-th output of the CFO(+PN) COMP stage:

$$\Delta\psi_i[k] \equiv \psi_i[k] - \psi_0^P[k] = \qquad (18)$$
$$\Delta\phi_i^{X/Y-FWM}[k] + \Delta\phi_i^{X/Y-SPM}[k] + \Delta\phi_i^{X/Y-ASE}[k] + \Delta\phi_i^{Tx-LPN}[k]$$

where

-continued
$$\Delta\phi_i^{X/Y-FWM}[k] \equiv \phi_i^{X/Y-FWM}[k] - \phi_0^{X/Y-FWM}[k];$$
$$\Delta\phi_i^{X/Y-SPM}[k] \equiv \phi_i^{X/Y-SPM}[k] - \phi_0^{X/Y-SPM}[k];$$
$$\Delta\phi_i^{X/Y-ASE}[k] \equiv \phi_i^{X/Y-ASE}[k] - \phi_0^{X/Y-ASE}[k];$$
$$\Delta\phi_i^{Tx-LPN}[k] \equiv \phi_i^{Tx-LPN}[k - \tau^{(i)}] - \phi_0^{Tx-LPN}[k]$$

The terms which have been cancelled out are the phases common to all sub-bands, namely the CFO, the phase dithers, the XPM phase noise and the Rx LO laser phase noise. Significantly, the cancellation of the Rx LO LPN implies that LO equalization enhanced phase noise (LO-EEPN) is gone. LO-EEPN is a type of phase noise impairment in conventional coherent receivers, whereby the CD group delay equalization in the Rx generates extra phase noise due to the LO LPN being delayed differently at each frequency in the process of CD equalization. In principle, LO-EEPN is also present in the sub-band processing based Rx-s, whenever there is LO PN, as the CTO varies per sub-band, hence the CTO comp induces different delays onto the Rx LO LPN (notice that the Tx LPN experiences no net enhancement due to CD equalization, since the various transmitted sub-bands are relatively delayed in the fiber link but they are then relatively delayed in the opposite sense in the CTO COMP modules of each sub-band, such that the net delay on the Tx phase noise is zero). Now, by virtue of using the sparse pilot tone, the Rx LO LPN is nearly ideally cancelled hence the EEPN impairment is essentially absent from our Rx-s.

The four phase noise terms which are not cancelled out, and may be even enhanced, are the FWM, the SPM, the ASE and the Tx-LPN. As the two FWM terms in sub-bands 0 and i are correlated, their subtraction $\Delta\phi_i^{X/Y-FWM}[k]$ may result in either smaller or larger variance of the fluctuations, depending on their coefficient of correlation. Additional FWM cancellation measures, outside the scope of this application may be applied. As for the SPM terms, these are uncorrelated, as each is generated solely from subcarriers in its own band, hence the fluctuation variance of $\Delta\phi_i^{X/Y-SPM}[k]$ is doubled due to the pilot phase subtraction, however the SPM contribution may be small to begin with, hence this term might not significant.

As for the two ASE terms subtracted to yield $\Delta\phi_i^{X/Y-ASE}[k]$, these are also uncorrelated, however by selecting the power of the sub-carrier to be at least as large as the average power of each data sub-band, this term may be made quite negligible. E.g., if the sparse pilot power is taken to be precisely equal to the average power of each data sub-band, then that implies that the sparse pilot amplitude be $\sqrt{N}$ larger than the RMS amplitude of the data sub-carriers, where N is the number of sub-carriers per sub-band, e.g. N=64. Therefore, for OFDM detection, the linear phase noise variance due to the additive circular Gaussian noise added to the sub-carrier phasors, is N times smaller for the sparse pilot than for the i-th data sub-band, and the ASE-induced LPN enhancement factor is just $1+N^{-1}$, which is negligible for a large value of N.

The remaining Tx-LPN term $\Delta\phi_i^{Tx-LPN}[k] = \phi_i^{Tx-LPN}[k-\tau^{(i)}] - \phi_i^{Tx-LPN}[k]$ has an interesting behavior due to the various delays. To see this we substitute Eq. (18) into Eq. (17), yielding the following input into the CTO COMP module, $$\left|R_k^{(i)}\right|e^{j\Delta\psi_i[k]} = \left|R_k^{(i)}\right|e^{j\Delta\phi_i^{X/Y-FWM}[k]}e^{j\Delta\phi_i^{X/Y-SPM}[k]},$$

$$e^{j\Delta\phi_i^{X/Y-ASE}[k]}, e^{j\Delta\phi_i^{Tx-LPN}[k]}$$

therefore the CTO COMP output is a time-advance of this signal (substituting $k+\tau^{(i)}$ for $k$) as follows $$\left|R_k^{(i)}\right|e^{j\Delta\psi_i[k+\tau^{(i)}]} = \left|R_k^{(i)}\right|e^{j\Delta\phi_i^{X/Y-FWM}[k+\tau^{(i)}]}e^{j\Delta\phi_i^{X/Y-SPM}[k+\tau^{(i)}]},$$

$$e^{j\Delta\phi_i^{X/Y-ASE}[k+\tau^{(i)}]}, e^{j\Delta\phi_i^{Tx-LPN}[k+\tau^{(i)}]}$$

The time-advance has no significant impact on the four terms on the RHS of the last equation but it does wield an interesting effect onto the last Tx-LPN term, which is singled out below:

$$e^{j\Delta\phi_i^{Tx-LPN}[k+\tau^{(i)}]} = \qquad (19)$$
$$e^{j\left\{\phi_i^{Tx-LPN}[k+\tau^{(i)}]-\phi_0^{Tx-LPN}[k]\right\}}\bigg|_{k\to k+\tau^{(i)}} = e^{j\left\{\phi_i^{Tx-LPN}[k]-\phi_0^{Tx-LPN}[k+\tau^{(i)}]\right\}}$$

It is now seen that the Tx-LPN of the i-th sub-band has been time-realigned but now the subtracted Tx-LPN of the mid-sub-band, $\phi_0^{Tx-LPN}[k+\tau^{(i)}]$ has been advanced (negative delayed) in time. The overall phase noise is now the sum of these two contributions which tend to be more uncorrelated the longer the delay $\tau^{(i)}$ is, i.e., the higher the absolute value $|i|$ is. Thus more remoted from the center frequency sub-bands tend to generated more phase noise.

In fact, this phase noise impairment is the dual of the LO-EEPN phase noise impairment described above, and may be referred to as Tx-EEPN phase noise impairment. So, we see that while we have suppressed LO PN altogether, we have replaced the LO-EEPN impairment in our system by an analogous Tx-EEPN impairment. Now the LO phase noise has been eliminated altogether, but in a sense the zeroth sub-band plays the role previously played by the LO, as the zeroth sub-band is used to demodulate the received signal, which contains Tx phase noise (but the zeroth sub-band contains phase noise itself).

The residual Tx-EEPN phase noise of Eq. (19) in the worst case (most extreme sub-band) should be qualitatively compared with the overall LO-EEPN phase noise in a "full-band" coherent Rx (i.e., without using FB based sub-banding).

The residual Tx-EEPN phase noise may be partially mitigated in our MSB (DFT-S) ODM by the carrier recovery system further downstream, just prior to the decision stage in each sub-band Rx. In our SC-MSBE Rx (FIG. 40) the sub-bands are re-assembled into a complete single-carrier full-band system and a block parallelized CR system (in the preferred embodiment of the MSDD type) is applied on the synthesized single carrier signal, thus the phase noise tolerance in this case should be identical to that of a conventional SC Rx also using the same block parallelized CR.

The method disclosed here of using a sparse pilot tone in the mid-sub-band in order to demodulate the other sub-bands with it and thus cancel impairments such as the CFO and the non-linear phase noise, will also work if the sparse pilot tone is transmitted in another sub-band with index $i\ne 0$ such that its center frequency does not coincide with the center frequency of the whole channel, However, when using a sub-band other than the mid-sub-band for pilot transmission, the performance might be somewhat degraded as the maximal spectral distance between the pilot and each of the other sub-bands is increased, and the sub-band farthest away may have less correlation between its phase and the phase of the sub-carrier.

Finally, the method disclosed here of using a sparse pilot tone in the mid-sub-band in order to demodulate the other sub-bands at the output of the OS analysis FB should be compared with prior art usage of the sparse pilot tone to compensate laser phase noise and non-linear phase noise, as described in references [REF. A, REF. B] and other references there in. REF. A refers to Randel, S.; Adhikari, S.; Jansen, S. L.; "Analysis of RF-Pilot-Based Phase Noise Compensation for Coherent Optical OFDM Systems," Photonics Technology Letters, IEEE, vol. 22, no. 17, pp. 1288-1290, Sep. 1, 2010. REF. B refers to Liang B. Y. Du and Arthur J. Lowery, "Pilot-based XPM nonlinearity compensator for CO-OFDM systems,", Optics Express, Vol. 19, pp. B862-B867 (2011).

In prior art, wherein FB based sub-banding is not used, the sparse pilot tone (i.e., a pilot tone with null guardbands on either side) is extracted by means of a bandpass filter and used to demodulate the entire broadband optical channel. Thus a relatively narrowband pilot band is extracted out of the full bandwidth of the channel. The bandpass filter (BPF) and the demodulator should in principle operate at a sampling rate R equal to or higher than the bandwidth B of the entire channel. In order to prevent loss of spectral efficiency, the pilot extracting BPF should be spectrally sharp, and relatively narrowband, but not too narrow, so as to capture the bandwidth of the disturbance imparted upon the pilot tone in the course of optical propagation.

Initially, a pilot band of the order of tens of MHz was suggested in [Ref. A], aimed at mitigating laser phase noise, however in later works [Ref. B] the sparse pilot band was increased to the order of magnitude of GHz in order to capture the non-linear phase noise spectral width around the pilot.

The problem with the prior work approach is the prohibitive complexity incurred in digitally implementing a sharp narrowband filter of bandwidth of the order of B/M, where the bandwidth ratio M is typically in the range 10 . . . 20, operating at the full channel sampling rate $R\ge B$. Because of the sharpness of the pilot extracting filter, a large number of taps, P, will be required in this filter, operating at full rate R, thus the number of complex taps per second is PR.

It turns out that the complexity of this filter is much larger than the complexity of the polyphase filters array of a reference CS FB which has its number of sub-bands set to be equal to M, and even larger than the complexity of an OS FB.

Indeed, comparing first with the CS FB complexity, a CS FB has M polyphase components each with P/M taps at the output of the S/P, i.e., operating at the rate R/M. Thus, the total number of complex multiplications per second in the polyphase array of the filter bank plus the IFFT is $$M\cdot\frac{P}{M}\cdot\frac{R}{M}+\left(\frac{M}{2}\log M\right)\frac{R}{M} = \frac{1}{M}PR+\frac{R}{2}\log M = \left(\frac{P}{M}+\frac{1}{2}\log M\right)R$$

This is the complexity of the CS FB to be compared with the complexity PR for the pilot-extracting BPF, i.e. the complexities ratio is $$\frac{taps_{CSFB}}{taps_{PILOTBPF}} = \frac{\left(\frac{P}{M} + \frac{1}{2}\log M\right)R}{PR} = \frac{1}{M} + \frac{1}{2P}\log M \cong \frac{1}{M}$$

and this ratio is much less than unity for typical values of M and P which can be required to be of the order of tens of taps.

Notice that the complexity of an OS analysis FB will be even smaller than that of the CS analysis FB, thus in turn the OS analysis FB is substantially less complex than the pilot extracting FB. Moreover, in our solution for pilot extraction we just use one of the sub-bands of the OS analysis FB which is there anyway to perform the main function of channel processing for detection, therefore there is no incremental extra complexity penalty in extracting the sparse pilot in our approach (as the FB hardware used to do it is already there). It follows that usage of the OS filter bank entails a substantial complexity advantage over prior art extraction of the sparse pilot tone.

This completes the description of the mid-sub-band processor of FIG. 45 providing inputs for CFO(+PN) estimation and compensation in all other sub-band processors. as well as CFO compensation via analog/digital PLLs to the LO laser/digital demodulator ahead of the OS analysis FB.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A transmitter that comprises:
a set of first filters with outputs connected to a summing node;
a set of upsamplers;
a set of sub-band processors, wherein each sub-band processor comprises an interpolator, a cyclic shifter and a second filter;
wherein each cyclic shifter is coupled between an interpolator and an upsampler;
wherein each first filter follows an upsampler;
wherein different interpolators are arranged to receive different sets of signals and perform up-sampling;
wherein the set of first filters is arranged to output virtual sub-channels of information occupying disjoint spectral sub-bands;
wherein each sub-band is associated with a pair of filters that comprises a first filter and a second filter, wherein the first filter has a milder frequency response outside the sub-band than a frequency response of the second filter outside the sub-band;
wherein each interpolator comprises:
a serial to parallel converter;
a N point fast Fourier transform (FFT) module arranged to output N element vectors;
a zero padding and circular shift module arranged to perform a zero padding operation and a circular shift operation on the N element vectors to provide V*N element circled vectors;
a N*V point inverse FFT (IFFT) module; and
a parallel to serial conversion and cyclic prefix adder coupled to an output of the N*V point IFFT module.

2. The transmitter according to claim 1, wherein each second filter substantially nullifies spectral components outside the sub-band associated with the second filter; wherein each first filter passes spectral components that belong to at least one sub-band that differs from a sub-band associated with the first filter.

3. The transmitter according to claim 1, wherein each upsampler performs a L-factor upsampling, and wherein each interpolator performs a V-factor upsampling; wherein L and V are positive numbers.

4. The transmitter according to claim 3, wherein L and V differ from a number (M) of the sub-bands.

5. The transmitter according to claim 3, wherein V equals 4/3.

6. The transmitter according to claim 1, wherein the zero padding and circular shift module is a routing fabric arranged to implement the circular shift operation and the zero padding operation by performing a mapping between outputs of the N point FFT module and inputs of the N*V point IFFT module.

7. The transmitter according to claim 6, wherein the routing fabric is arranged to implement the circular shift operation and the zero padding operation without storing any elements of a N element output vectors within a buffer and without performing data transfers between different locations of the buffer.

8. The transmitter according to claim 7, wherein the routing fabric is arranged to couple between some groups of outputs of the N point FFT module and some groups of inputs of the N*V point IFFT module.

9. A transmitter that comprises:
a set of first filters with outputs connected to a summing node;
a set of upsamplers;
a set of sub-band processors, wherein each sub-band processor comprises an interpolator, a cyclic shifter and a second filter;
wherein each cyclic shifter is coupled between an interpolator and an upsampler;
wherein each first filter follows an upsampler;
wherein different interpolators are arranged to receive different sets of signals and perform up-sampling;
wherein the set of first filters is arranged to output virtual sub-channels of information occupying disjoint spectral sub-bands;
wherein each sub-band is associated with a pair of filters that comprises a first filter and a second filter, wherein the first filter has a milder frequency response outside the sub-band than a frequency response of the second filter outside the sub-band;
wherein each virtual sub-channel of information that occupies a sub-band is an Orthogonal Frequency Division Modulation (OFDM) compliant sub-channel of information; wherein each interpolator is coupled to an OFDM transmitter module; wherein a combination of each interpolator and OFDM transmitter module comprises:
a serial to parallel converter;
a zero padding and circular shift module arranged to perform a zero padding operation and a circular shift operation on output vectors of the serial to parallel converter to provide zero padded and rotated vectors;
an N*V point inverse FFT (IFFT) module;
a parallel to serial conversion and cyclic prefix adder coupled to an output of the N*V point IFFT module.

* * * * *